US011587982B2

(12) United States Patent
Ohsawa et al.

(10) Patent No.: US 11,587,982 B2
(45) Date of Patent: Feb. 21, 2023

(54) LIGHT-EMITTING DEVICE INCLUDING A PLURALITY OF TRANSISTORS BELOW A PLURALITY OF OPTICAL ELEMENTS

(71) Applicant: Semiconductor Energy Laboratory Co., Ltd., Atsugi (JP)

(72) Inventors: Nobuharu Ohsawa, Zama (JP); Satoshi Seo, Sagamihara (JP); Toshiki Sasaki, Isehara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 16/934,349

(22) Filed: Jul. 21, 2020

(65) Prior Publication Data
US 2020/0350373 A1 Nov. 5, 2020

Related U.S. Application Data

(63) Continuation of application No. 15/410,063, filed on Jan. 19, 2017, now Pat. No. 10,797,113.

(30) Foreign Application Priority Data

Jan. 25, 2016 (JP) ................................ 2016-011518
Jan. 29, 2016 (JP) ................................ 2016-015550

(51) Int. Cl.
*H01L 27/32* (2006.01)
*H01L 51/50* (2006.01)
(Continued)

(52) U.S. Cl.
CPC ........ *H01L 27/3213* (2013.01); *H01L 27/322* (2013.01); *H01L 27/323* (2013.01);
(Continued)

(58) Field of Classification Search
CPC ............... H01L 27/3213; H01L 27/322; H01L 27/323; H01L 51/5203; H01L 51/5262;
(Continued)

(56) References Cited

U.S. PATENT DOCUMENTS 7,030,553 B2   4/2006  Winters et al.
7,531,958 B2   5/2009  Nishikawa
(Continued)

FOREIGN PATENT DOCUMENTS

JP   2005-129510 A   5/2005
JP   2007-503093     2/2007
(Continued)

*Primary Examiner* — Lex H Malsawma
*Assistant Examiner* — Laura M Dykes
(74) *Attorney, Agent, or Firm* — Robinson Intellectual Property Law Office; Eric J. Robinson

(57) ABSTRACT

One object of this invention is to provide a novel light-emitting device with low power consumption. The light-emitting device includes a first light-emitting element and a second light-emitting element. The first light-emitting element includes a first electrode, a second electrode, and a light-emitting layer. The second light-emitting element includes the first electrode, a third electrode, and the light-emitting layer. The second electrode comprises only a first conductive film, and the third electrode comprises a second conductive film and a third conductive film. The first electrode has a function of reflecting light. The second conductive film has functions of reflecting light and transmitting light. The first conductive film and the third conductive film each have a function of transmitting light.

13 Claims, 52 Drawing Sheets

(51) Int. Cl.
  *H01L 51/52* (2006.01)
  *H01L 51/00* (2006.01)
(52) U.S. Cl.
  CPC ...... *H01L 27/3244* (2013.01); *H01L 51/5088* (2013.01); *H01L 51/5203* (2013.01); *H01L 51/5265* (2013.01); *H01L 51/5271* (2013.01); *H01L 51/006* (2013.01); *H01L 51/0052* (2013.01); *H01L 51/0054* (2013.01); *H01L 51/0058* (2013.01); *H01L 51/0061* (2013.01); *H01L 51/0072* (2013.01); *H01L 51/0073* (2013.01); *H01L 51/0074* (2013.01); *H01L 51/0085* (2013.01); *H01L 51/0091* (2013.01); *H01L 51/5278* (2013.01); *H01L 2251/558* (2013.01)

(58) Field of Classification Search
  CPC ............. H01L 27/3244; H01L 51/5088; H01L 51/5265; H01L 51/5271; H01L 51/0052; H01L 51/0054; H01L 51/0058; H01L 51/006; H01L 51/0061; H01L 51/0072; H01L 51/0073; H01L 51/0074; H01L 51/0085; H01L 51/0091; H01L 51/5278; H01L 2251/558
  USPC ........................................ 257/40, 89, E51.022
  See application file for complete search history.

(56) References Cited

U.S. PATENT DOCUMENTS

| | | |
|---|---|---|
| 7,732,808 B2 | 6/2010 | Ikeda et al. |
| 7,839,084 B2 | 11/2010 | Nishikawa et al. |
| 8,242,837 B2 | 8/2012 | Yamazaki et al. |
| 8,664,655 B2 | 3/2014 | Lee et al. |
| 8,766,906 B2 | 7/2014 | Yoshida et al. |
| 8,803,136 B2 | 8/2014 | Yamazaki et al. |
| 9,019,320 B2 | 4/2015 | Yamazaki et al. |
| 9,172,059 B2 | 10/2015 | Seo et al. |
| 9,755,001 B2 | 9/2017 | Seo et al. |
| 10,504,966 B2 | 12/2019 | Seo et al. |
| 2003/0174106 A1* | 9/2003 | Tanada ................. G09G 3/3275 345/83 |
| 2004/0195963 A1* | 10/2004 | Choi ..................... H01L 27/322 313/506 |
| 2005/0225232 A1 | 10/2005 | Boroson et al. |
| 2005/0231946 A1 | 10/2005 | Guthrie |
| 2006/0082295 A1 | 4/2006 | Chin et al. |
| 2007/0035243 A1 | 2/2007 | Lee |
| 2007/0058182 A1 | 3/2007 | Huibers |
| 2007/0090350 A1* | 4/2007 | Lee ..................... H01L 51/5275 257/40 |
| 2007/0286944 A1 | 12/2007 | Yokoyama et al. |
| 2008/0118743 A1* | 5/2008 | Lee ......................... H01L 51/56 445/24 |
| 2008/0143247 A1* | 6/2008 | Kim ......................... C03C 27/06 313/504 |
| 2009/0091238 A1 | 4/2009 | Cok et al. |
| 2010/0006845 A1* | 1/2010 | Seo ....................... H01L 27/322 257/E33.003 |
| 2010/0025678 A1* | 2/2010 | Yamazaki ........... H01L 29/7869 257/43 |
| 2010/0066242 A1 | 3/2010 | Lee et al. |
| 2010/0231484 A1 | 9/2010 | Cok et al. |
| 2011/0267381 A1 | 11/2011 | Yamazaki et al. |
| 2012/0052624 A1* | 3/2012 | Yamazaki ......... H01L 29/78606 257/E21.459 |
| 2012/0223346 A1 | 9/2012 | Ohsawa et al. |
| 2013/0082589 A1 | 4/2013 | So et al. |
| 2013/0112955 A1 | 5/2013 | Yamazaki et al. |
| 2013/0264549 A1 | 10/2013 | Yamazaki et al. |
| 2013/0265320 A1 | 10/2013 | Yamazaki et al. |
| 2014/0117339 A1 | 5/2014 | Seo |
| 2014/0134771 A1 | 5/2014 | Noda et al. |
| 2014/0183499 A1 | 7/2014 | Kim et al. |
| 2014/0203244 A1 | 7/2014 | Hack et al. |
| 2014/0225102 A1 | 8/2014 | Ikeda et al. |
| 2014/0284575 A1 | 9/2014 | Sugisawa et al. |
| 2014/0284576 A1 | 9/2014 | Sugisawa et al. |
| 2014/0291648 A1 | 10/2014 | Yamazaki et al. |
| 2014/0306201 A1 | 10/2014 | Yamazaki et al. |
| 2014/0332831 A1 | 11/2014 | Ohsawa et al. |
| 2014/0339526 A1 | 11/2014 | Inoue et al. |
| 2015/0144945 A1 | 5/2015 | Kusunoki et al. |
| 2015/0144946 A1 | 5/2015 | Kusunoki et al. |
| 2015/0255520 A1 | 9/2015 | Seo et al. |
| 2015/0263076 A1 | 9/2015 | Seo et al. |
| 2015/0318334 A1 | 11/2015 | Kim et al. |
| 2015/0340410 A1 | 11/2015 | Hack et al. |
| 2016/0190212 A1* | 6/2016 | Takii ..................... H01L 27/322 257/40 |
| 2017/0250231 A1 | 8/2017 | Maeda et al. |
| 2018/0090721 A1* | 3/2018 | Wang ..................... H01L 27/12 |

FOREIGN PATENT DOCUMENTS

| | | |
|---|---|---|
| JP | 2007-053090 A | 3/2007 |
| JP | 2007-115626 A | 5/2007 |
| JP | 2011-119091 A | 6/2011 |
| JP | 2011-165664 A | 8/2011 |
| JP | 2012-182127 A | 9/2012 |
| JP | 2015-233001 A | 12/2015 |
| WO | WO-2005/020344 | 3/2005 |

* cited by examiner

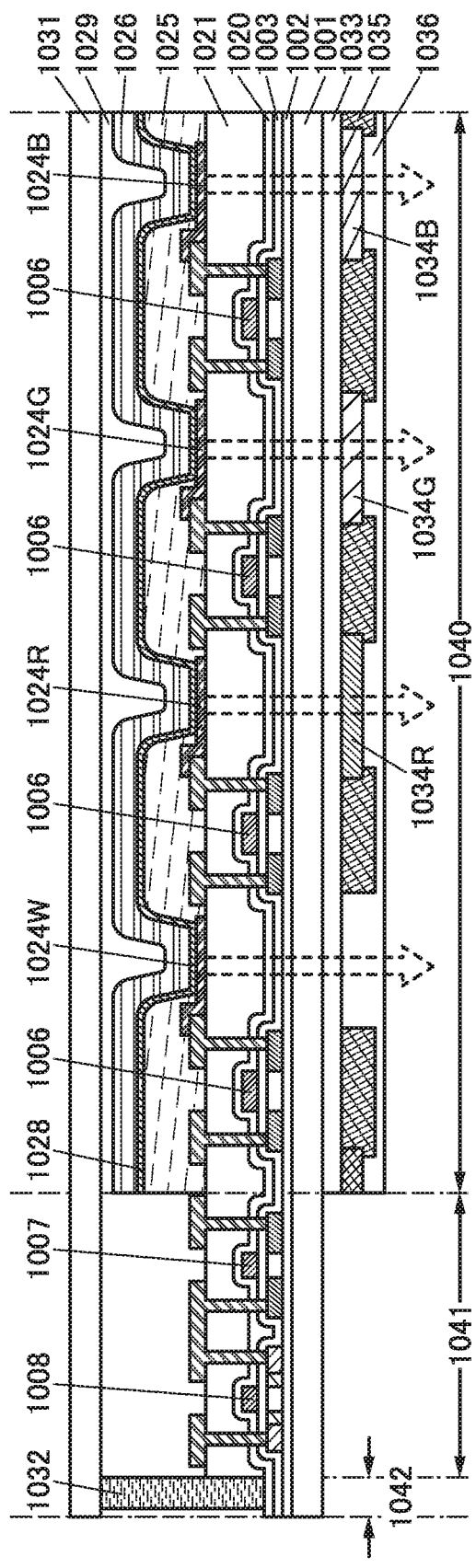
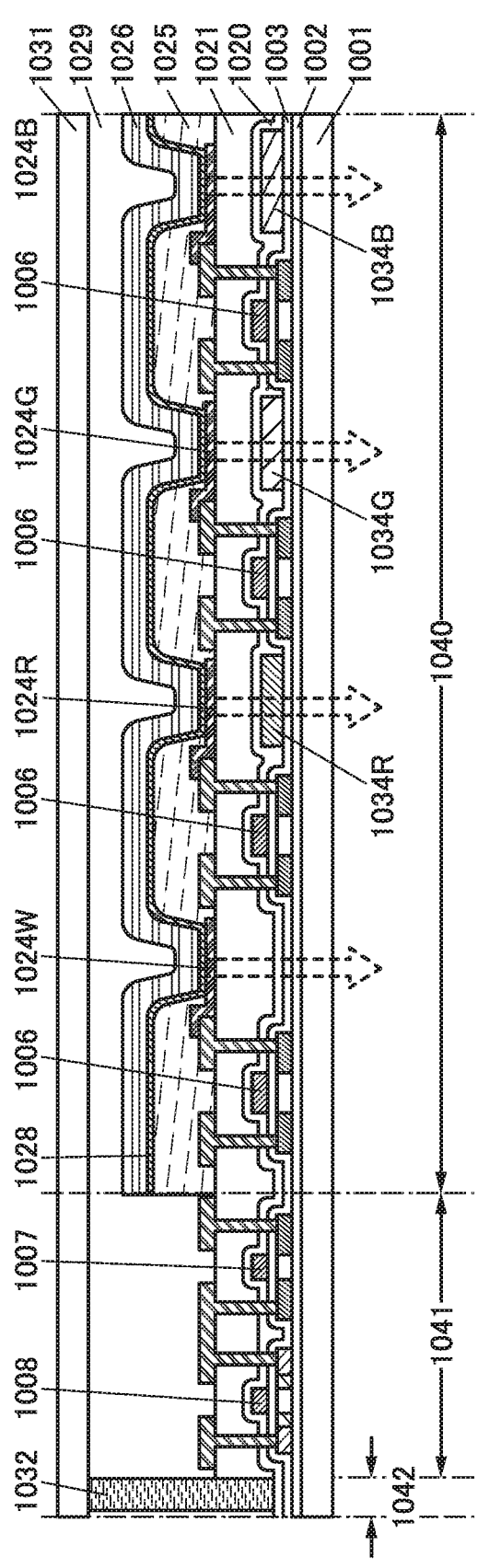

LIGHT-EMITTING DEVICE INCLUDING A PLURALITY OF TRANSISTORS BELOW A PLURALITY OF OPTICAL ELEMENTS

BACKGROUND OF THE INVENTION

1. Field of the Invention

One embodiment of the present invention relates to a light-emitting device, or a display device, an electronic device, and a lighting device each including the light-emitting device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, and a composition of matter. Specifically, examples of the technical field of one embodiment of the present invention disclosed in this specification include a semiconductor device, a display device, a liquid crystal display device, a light-emitting device, a lighting device, a power storage device, a memory device, a method for driving any of them, and a method for manufacturing any of them.

2. Description of the Related Art

In recent years, research and development of light-emitting devices using electroluminescence (EL) have been actively carried out. In a basic structure of such a light-emitting device, a layer containing a light-emitting substance (an EL layer) is interposed between a pair of electrodes. By application of a voltage between the electrodes of this element, light emission from the light-emitting substance can be obtained.

Since the above light-emitting device is a self-luminous type, a display device using this light-emitting device has advantages such as high visibility, no necessity of a backlight, and low power consumption. Furthermore, such a light-emitting device also has advantages in that the element can be formed to be thin and lightweight, and that response time is high.

In the case where the above light-emitting device is used for a display device, there are the following two methods: a method of providing subpixels in a pixel with EL layers having functions of emitting light of different colors (hereinafter referred to as a separate coloring method) and a method of providing subpixels in a pixel with, for example, a common EL layer having a function of emitting white light and color filters each having a function of transmitting light of a different color (hereinafter referred to as a color filter method).

One of the advantages of the color filter method is that the EL layer can be shared by all of the subpixels. Therefore, compared with the separate coloring method, loss of a material of the EL layer is small and the number of steps needed for formation of the EL layer can be reduced; thus, display devices can be manufactured at low cost with high productivity. Further, although it is necessary, in the separate coloring method, to provide a space between the subpixels to prevent mixture of the materials of the EL layers in the subpixels, the color filter method does not need such a space and therefore enables a high-resolution display device having higher pixel density.

The light-emitting device can emit light of a variety of colors depending on the kind of light-emitting substances included in the EL layer. In the view of application of the light-emitting device to lighting devices, a light-emitting device that emits white light or light of color close to white and has high efficiency is demanded. In the view of application of the light-emitting device to fill-color display devices, a high efficiency light-emitting device emitting light with high color purity is demanded. In addition, for the light-emitting device used for the lighting device and the display device, low power consumption is needed.

Increasing the extraction efficiency of light from a light-emitting device is important for higher emission efficiency of the light-emitting device. In order to increase the extraction efficiency of light from a light-emitting device, a method has been proposed, in which a micro optical resonator (microcavity) structure utilizing a resonant effect of light between a pair of electrodes is used to increase the intensity of light having a specific wavelength (e.g., see Patent Document 1).

As a light-emitting device that emits white light, an element including a charge-generation layer between a plurality of EL layers (a tandem element) has been proposed.

REFERENCE

Patent Document

[Patent Document 1] Japanese Published Patent Application No. 2012-182127

SUMMARY OF THE INVENTION

When a display device that allows full-color display is manufactured by a separate coloring method, a step of evaporating a light-emitting layer only on a required subpixel with a shadow mask having minute openings is necessary; therefore, the openings of the shadow mask need to be arranged (aligned) at desired positions with high accuracy (alignment accuracy). Moreover, when a light-emitting layer is separately formed in the required subpixel, a light-emitting substance enters an adjacent subpixel in some cases, which causes a problem of a decrease in yield in manufacturing display devices. A display device that has high pixel density and allows high-resolution display requires higher alignment accuracy, which leads problems of a reduction in yield in manufacturing a display device and a cost increase.

In contrast, the color filter method does not need such a shadow mask having minute openings; thus, a display device can be manufactured with high productivity. However, since a light-emitting layer for emitting white light is shared by subpixels in the color filter method, for example, light of color which need not be emitted from the subpixels is included, in addition to light of a desired color. Thus, the color filter method has a problem of low color purity of light and low light use efficiency, as compared with the separate coloring method.

A light-emitting device having excellent productivity is required. Furthermore, a light-emitting device having high emission efficiency is required. Furthermore, a light-emitting device having high light use efficiency is required. Furthermore, a light-emitting device having high color purity of light is required.

Thus, an object of one embodiment of the present invention is to provide a light-emitting device with high emission efficiency. Another object of one embodiment of the present invention is to provide a light-emitting device with low power consumption. Another object of one embodiment of the present invention is to provide a light-emitting device which is easily formed in a relatively small number of steps for forming films. Another object of one embodiment of the present invention is to provide a light-emitting device emitting light with high color purity. Another object of one embodiment of the present invention is to provide a light-emitting device with high color reproducibility. Another object of one embodiment of the present invention is to provide a novel light-emitting device. Another object of one embodiment of the present invention is to provide a novel display device.

Note that the description of the above object does not disturb the existence of other objects. In one embodiment of the present invention, there is no need to achieve all the objects. Other objects are apparent from and can be derived from the description of the specification and the like.

One embodiment of the present invention is a light-emitting device including a plurality of light-emitting elements with different electrode structures from each other. The light-emitting device includes a light-emitting element with a microcavity structure and a light-emitting element without a microcavity structure.

Another embodiment of the present invention is a light-emitting device including a first light-emitting element and a second light-emitting element, where the first light-emitting element includes a first electrode, a second electrode, and a first light-emitting layer, where the second light-emitting element includes the first electrode, a third electrode, and the first light-emitting layer, where the second electrode is formed using only a first conductive film, where the third electrode includes a second conductive film and a third conductive film over the second conductive film, where the first electrode is configured to reflect light, where the second conductive film is configured to reflect light and transmit light, and where the first conductive film and the third conductive film are configured to transmit light.

In the above structure, the first light-emitting element is preferably configured to emit light having a peak of an emission spectrum in at least one of a blue wavelength range, a green wavelength range, a yellow wavelength range, and a red wavelength range, and the second light-emitting element is preferably configured to emit light having a peak of an emission spectrum in at least one of a blue wavelength range, a green wavelength range, and a red wavelength range.

Another embodiment of the present invention is a light-emitting device including a first light-emitting element, a second light-emitting element, a third light-emitting element, and a fourth light-emitting element, where the first light-emitting element includes a first electrode, a second electrode, a first light-emitting layer, and a second light-emitting layer, where the second light-emitting element includes the first electrode, a third electrode, the first light-emitting layer, and the second light-emitting layer, where the third light-emitting element includes the first electrode, a fourth electrode, the first light-emitting layer, and the second light-emitting layer, where the fourth light-emitting element includes the first electrode, a fifth electrode, the first light-emitting layer, and the second light-emitting layer, where the second electrode is formed using only a first conductive film, where the third electrode includes a second conductive film and a third conductive film over the second conductive film, where the fourth electrode includes the second conductive film and a fourth conductive film over the second conductive film, where the fifth electrode includes the second conductive film and a fifth conductive film over the second conductive film, where the third conductive film has a thicker region than the fourth conductive film, where the first electrode is configured to reflect light, where the second conductive film is configured to reflect light and transmit light, and where the first conductive film, the third conductive film, the fourth conductive film, and the fifth conductive film are configured to transmit light.

In the above structure, the fourth conductive film preferably has a thicker region than the fifth conductive film, and the first conductive film preferably has a thicker region than the fifth conductive film.

The above structure preferably has a region where a distance between the first electrode and the first conductive film, a distance between the first electrode and the third conductive film, a distance between the first electrode and the fourth conductive film, and a distance between the first electrode and the fifth conductive film are equal to each other.

Another embodiment of the present invention is a light-emitting device including a first light-emitting element, a second light-emitting element, a third light-emitting element, and a fourth light-emitting element, where the first light-emitting element includes a first electrode, a second electrode, a first carrier-injection layer over the second electrode, a first light-emitting layer, and a second light-emitting layer, where the second light-emitting element includes the first electrode, a third electrode, a second carrier-injection layer over the third electrode, the first light-emitting layer, and the second light-emitting layer, where the third light-emitting element includes the first electrode, the third electrode, a third carrier-injection layer over the third electrode, the first light-emitting layer, and the second light-emitting layer, where the fourth light-emitting element includes the first electrode, the third electrode, a fourth carrier-injection layer over the third electrode, the first light-emitting layer, and the second light-emitting layer, where the second electrode is formed using only a first conductive film, where the third electrode includes a second conductive film and a third conductive film over the second conductive film, where the second carrier-injection layer includes a thicker region than the third carrier-injection layer, where the first electrode is configured to reflect light, where the second conductive film is configured to reflect light and transmit light, and where the first conductive film and the third conductive film are configured to transmit light.

In the above structure, the third carrier-injection layer preferably has a thicker region than the fourth carrier-injection layer, and a sum of thicknesses of the first conductive film and the first carrier-injection layer is preferably larger than a sum of the thicknesses of the third conductive film and the fourth carrier-injection layer.

The above structure preferably has a region where a distance between the first electrode and the first carrier-injection layer, a distance between the first electrode and the second carrier-injection layer, a distance between the first electrode and the third carrier-injection layer, and a distance between the first electrode and the fourth carrier-injection layer are equal to each other.

In the above structure, each of the first carrier-injection layer, the second carrier-injection layer, the third carrier-injection layer, and the fourth carrier-injection layer preferably includes a metal oxide.

In the above structure, the first light-emitting element is preferably configured to emit light having a peak of an emission spectrum in at least one of a blue wavelength range, a green wavelength range, a yellow wavelength range, and a red wavelength range, the second light-emitting element is preferably configured to emit light having a peak of an emission spectrum in a red wavelength range, the third light-emitting element is preferably configured to emit light having a peak of an emission spectrum in a green wavelength range, and the fourth light-emitting element is preferably configured to emit light having a peak of an emission spectrum in a blue wavelength range.

In the above structure, the first light-emitting element, the second light-emitting element, the third light-emitting element, and the fourth light-emitting element preferably include a charge-generation layer between the first light-emitting layer and the second light-emitting layer.

In the above structure, the first light-emitting element, the second light-emitting element, the third light-emitting element, and the fourth light-emitting element preferably include a third light-emitting layer. In addition, the above structure preferably includes a region where the second light-emitting layer and the third light-emitting layer are in contact with each other.

In the above structure, the second conductive film preferably includes a metal with a thickness greater than or equal to 1 nm and less than or equal to 30 nm. In addition, the second conductive film preferably includes Ag.

In the above structure, each of the first conductive film, the third conductive film, the fourth conductive film, and the fifth conductive film preferably includes a metal oxide or organic conductor. In addition, each of the first conductive film, the third conductive film, the fourth conductive film, and the fifth conductive film preferably includes at least one of In and Zn.

In the above structure, the first electrode preferably includes a metal. The first electrode preferably includes at least one of Ag and Al.

One embodiment of the present invention is a light-emitting device having any of the above structures, and at least one of a color filter and a transistor. Another embodiment of the present invention is an electronic device including the display device, and at least one of a housing and a touch sensor. One embodiment of the present invention is a lighting device including the light-emitting device having any of the above structures, and at least one of a housing and a touch sensor. The category of one embodiment of the present invention includes not only a light-emitting device including a light-emitting element but also an electronic device including a light-emitting device. Accordingly, a light-emitting device in this specification refers to an image display device or a light source (including a lighting device). The light-emitting device may be included in a display module in which a connector such as a flexible printed circuit (FPC) or a tape carrier package (TCP) is connected to a light-emitting device, a display module in which a printed wiring board is provided on the tip of a TCP, or a display module in which an integrated circuit (IC) is directly mounted on a light-emitting device by a chip on glass (COG) method.

According to one embodiment of the present invention, a light-emitting device with high emission efficiency can be provided. With one embodiment of the present invention, a light-emitting device with low power consumption can be provided. With one embodiment of the present invention, a light-emitting device that is easily formed in a relatively small number of steps for forming films can be provided. With one embodiment of the present invention, a light-emitting device emitting light with high color purity can be provided. With one embodiment of the present invention, a light-emitting device with color reproducibility can be provided. With one embodiment of the present invention, a novel light-emitting device can be provided. With one embodiment of the present invention, a novel display device can be provided.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

FIGS. 18A and 18B are cross-sectional schematic views of a display device of one embodiment of the present invention.

FIGS. 33A, 33B-1, and 33B-2 illustrate a structure of a display device of one embodiment of the present invention.

DETAILED DESCRIPTION OF THE INVENTION

Figure 1:
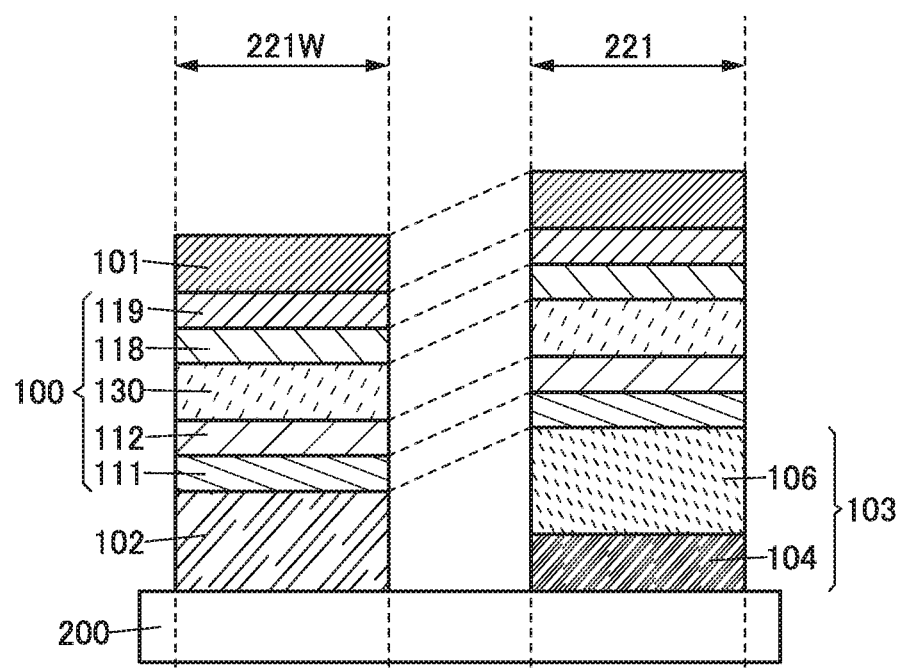
FIG. 1 is a cross-sectional schematic view of a light-emitting device of one embodiment of the present invention.

Embodiments and an example of the present invention will be described below with reference to the drawings. However, the present invention is not limited to the following description, and the mode and details can be variously changed unless departing from the scope and spirit of the present invention. Accordingly, the present invention should not be interpreted as being limited to the content of the embodiments below.

Note that the position, the size, the range, or the like of each structure illustrated in the drawings and the like are not accurately represented in some cases for easy understanding. Therefore, the disclosed invention is not necessarily limited to the position, size, range, or the like as disclosed in the drawings and the like.

Note that the ordinal numbers such as "first", "second", and the like in this specification and the like are used for convenience and do not denote the order of steps or the stacking order of layers. Therefore, for example, description can be made even when "first" is replaced with "second" or "third", as appropriate. In addition, the ordinal numbers in this specification and the like are not necessarily the same as those which specify one embodiment of the present invention.

In the description of modes of the present invention in this specification and the like with reference to the drawings, the same components in different diagrams are commonly denoted by the same reference numeral in some cases.

In this specification and the like, the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

In this specification and the like, a singlet excited state refers to a singlet state having excited energy. The lowest level of the singlet excited energy level (S1 level) refers to the excited energy level of the lowest singlet excited state (S1 state). A triplet excited state means a triplet state with excited energy. The lowest level of the triplet excited energy level (T1 level) refers to the excited energy level of the lowest triplet excited state (T1 state). Note that in this specification and the like, simple expressions "singlet excited state" and "singlet excitation energy level" mean the S1 state and the S1 level, respectively, in some cases. In addition, expressions "triplet excited state" and "triplet excitation energy level" mean the T1 state and the T1 level, respectively, in some cases.

In this specification and the like, a fluorescent material refers to a material that emits light in the visible light region when the singlet excited state relaxes to the ground state. A phosphorescent material refers to a material that emits light in the visible light region at room temperature when the triplet excited state relaxes to the ground state. That is, a phosphorescent material refers to a material that can convert triplet excitation energy into visible light.

Note that in this specification and the like, "room temperature" refers to a temperature higher than or equal to 0° C. and lower than or equal to 40° C.

In general, color is defined by three aspects of hue (corresponding to the wavelength of light of a single color), chroma (saturation, i.e., the degree to which it differs from white), and value (brightness, i.e., the intensity of light). In this specification and the like, color may be defined by only one of the above three aspects or two of the aspects which are selected arbitrarily. In this specification, a difference between two colors of light means a difference in at least one of the above three aspects and includes a difference in the shape between two spectra of light or in the distribution of the relative intensity of the peaks between two spectra of light.

In this specification and the like, a wavelength range of blue refers to a wavelength range which is greater than or equal to 400 nm and less than 480 nm, and blue light has at least one peak in that wavelength range in an emission spectrum. A wavelength range of green refers to a wavelength range which is greater than or equal to 480 nm and less than 550 nm, and green light has at least one peak in that wavelength range in an emission spectrum. A wavelength range of yellow refers to a wavelength range which is greater than or equal to 550 nm and less than 600 nm, and yellow light has at least one peak in that wavelength range in an emission spectrum. A wavelength range of red refers to a wavelength range which is greater than or equal to 600 nm and less than or equal to 740 nm, and red light has at least one peak in that wavelength range in an emission spectrum.

Embodiment 1

In this embodiment, a light-emitting device of one embodiment of the present invention will be described below with reference to FIG. 1, FIG. 2, FIG. 3, FIG. 4, FIG. 5, FIG. 6, FIG. 7, FIG. 8, FIG. 9, FIG. 10, FIGS. 11A and 11B, FIGS. 12A to 12C, and FIGS. 13A to 13C.

<Structural Example 1 of Light-Emitting Device>

First, a structure of the light-emitting device of one embodiment of the present invention will be described with reference to FIG. 1.

FIG. 1 is a cross-sectional schematic view of a light-emitting device 150 of one embodiment of the present invention.

The light-emitting device 150 includes a light-emitting element 221W and a light-emitting element 221 over a substrate 200.

The light-emitting element 221W includes an electrode 101, an electrode 102, and an EL layer 100 provided between the electrodes. The light-emitting element 221 includes the electrode 101, an electrode 103, and the EL layer 100 provided between the electrodes. The electrode 102 includes a conductive film, and the electrode 103 includes a conductive film 104 and a conductive film 106. The EL layer 100 includes at least a light-emitting layer 130.

The EL layer 100 illustrated in FIG. 1 includes functional layers such as a hole-injection layer 111, a hole-transport layer 112, an electron-transport layer 118, and an electron-injection layer 119, in addition to the light-emitting layer 130.

In this embodiment, although description is given assuming that the electrode 101 serves as a cathode and the electrode 102 and the electrode 103 each serve as an anode, they are not limited thereto for the structure of the light-emitting device 150. The electrode 101 serves as anode, and the electrode 102 and the electrode 103 each serve as a cathode, and the layers in the EL layer 100 may be stacked in the reverse order. In other words, the hole-injection layer, the hole-transport layer, the light-emitting layer, the electron-transport layer, and the electron-injection layer may be stacked in this order from the anode side.

The structure of the EL layer 100 is not limited to the structure illustrated in FIG. 1, and a structure including at least one layer selected from the hole-injection layer 111, the hole-transport layer 112, the electron-transport layer 118, and the electron-injection layer 119 may be employed. Alternatively, the EL layer 100 may include a functional layer which is capable of lowering a carrier (hole or electron) injection barrier, improving a carrier (hole or electron)-transport property, inhibiting a carrier (hole or electron)-transport property, or suppressing a quenching phenomenon by an electrode, for example. Note that the functional layers may each be a single layer or stacked layers.

FIG. 1 illustrates an example in which the hole-injection layer 111, the hole-transport layer 112, the light-emitting layer 130, the electron-transport layer 118, the electron-injection layer 119, and the electrode 101 are independently provided for each light-emitting element; however, the layers can be shared without being separated between the light-emitting elements.

In the light-emitting device 150 of one embodiment of the present invention, when a voltage is applied between a pair of electrodes (the electrodes 101 and 102) of the light-emitting element 221W and is applied between a pair of electrodes (the electrode 101 and the electrode 103) of the light-emitting element 221, electrons and holes are injected to the EL layer 100 from the cathode and the anode, respectively, and thus current flows. By recombination of the injected carriers (electrons and holes), excitons are formed. When carriers (electrons and holes) recombine and excitons are formed in the light-emitting layer 130 including light-emitting materials, the light-emitting materials in the light-emitting layer 130 are brought into an excited state, causing light emission from the light-emitting materials.

The light-emitting layer 130 preferably includes a light-emitting material of at least one color selected from violet, blue, blue green, green, yellow green, yellow, yellow orange, orange, and red.

The light-emitting layer 130 may have a stacked structure of two layers. The two light-emitting layers each including two kinds of light-emitting materials (a first compound and a second compound) for emitting light of different colors enable emission of light of a plurality of colors concurrently. It is particularly preferable to select the light-emitting materials of the light-emitting layers so that white light or light of color close to white can be obtained from the light-emitting layer 130.

The light-emitting layer 130 may have a stacked structure of three or more layers, in which a layer not including a light-emitting material may be included.

The electrode 101 has a function of reflecting visible light. The conductive film in the electrode 102 and the conductive film 106 each have a function of transmitting visible light. The conductive film 104 has functions of reflecting visible light and transmitting visible light. Accordingly, the electrode 102 has a function of transmitting visible light, and the electrode 103 has function of reflecting visible light and transmitting visible light.

Thus, light from the light-emitting element 221W and light from the light-emitting element 221 are emitted to the outside through the electrode 102 and the electrode 103, respectively. In other words, the light-emitting device 150 is a bottom-emission light-emitting device. However, one embodiment of the present invention is not limited to this, and a dual-emission light-emitting device in which light is extracted in both top and bottom directions of the substrate 200 where the light-emitting element is formed may be employed.

Furthermore, the light-emitting element 221 has a microcavity structure.

<<Microcavity Structure>>

Light emitted from the light-emitting layer 130 resonates between a pair of electrodes (the electrode 101 and the electrode 103). The light-emitting layer 130 is formed at such a position as to increase the intensity of light of a desired wavelength among light to be emitted. For example, by adjusting an optical length from a reflective region of the electrode 101 to the light-emitting region of the light-emitting layer 130 and an optical length from a reflective region of the electrode 103 to the light-emitting region of the light-emitting layer 130, the intensity light of a desired wavelength among light emitted from the light-emitting layer 130 can be increased.

Note the optical length from the reflective region of the electrode 101 to the light-emitting region of the light-emitting layer 130 is represented by the product of the refractive index and the distance from the reflective region of the electrode 101 to the light-emitting region of the light-emitting layer 130. The optical length from the reflective region of the electrode 103 to the light-emitting region of the light-emitting layer 130 is represented by the product of the refractive index and the distance from the reflective region of the electrode 103 to the light-emitting region of the light-emitting layer 130. Thus, in the light-emitting element 221, the thickness of the conductive film 106 is adjusted, whereby the intensity of light of a desired wavelength among light emitted from the light-emitting layer 130 can be increased. Note that the thickness of at least one of the hole-injection layer 111 and the hole-transport layer 112 or at least one of the electron-injection layer 119 and the electron-transport layer 118 may be adjusted to increase the intensity of light of a desired wavelength among the light emitted from the light-emitting layer 130.

For example, in the case where the refractive index of the conductive film having a function of reflecting light in the electrodes 101 and 103 is lower than the refractive index of the light-emitting layer 130, the thickness of the conductive film 106 in the electrode 103 is adjusted so that the optical length between the electrode 101 and the electrode 103 is $m\lambda/2$ (m is a natural number and $\lambda$ is the wavelength of light intensified in the light-emitting element 221).

In the case where it is difficult to precisely determine the reflective regions of the electrodes 101 and 103, the optical length for intensifying light emitted from the light-emitting layer 130 may be derived on the assumption that certain regions of the electrodes 101 and 103 are the reflective regions. In the case where it is difficult to precisely determine the light-emitting region of the light-emitting layer 130, the optical length for intensifying light emitted from the light-emitting layer 130 may be derived on the assumption that certain region of the light-emitting layer 130 is the light-emitting region. That is, in this specification and the like, "around $\lambda$" is $\lambda \pm 20$ nm.

With a microcavity structure, the intensity of light of a desired wavelength is increased. Thus, light emitted from the light-emitting element 221 has a peak of an emission spectrum in a wavelength range of any one of colors selected from violet, blue, blue green, green, yellow green, yellow, yellow orange, orange, and red. In the case where the light-emitting device 150 is used in a display device, light emitted from the light-emitting element 221 preferably has a peak of emission spectrum in a wavelength range of any one of blue, green, and red.

In the above manner, with the microcavity structure in which the optical length between the pair of electrodes is adjusted, scattering and absorption of light in the vicinity of the electrodes can be suppressed, resulting in high efficiency of extraction of light of a desired wavelength. In addition, the intensity of light of a desired wavelength is increased, and accordingly light emission with high color purity can be obtained.

In contrast, the electrode 102 in the light-emitting element 221W is formed from only a conductive film having a light-transmitting function. The light-emitting element 221W has no microcavity structure, and through extraction of light emitted from the light-emitting layer 130 to the outside, the intensity of light of a specific wavelength is not increased. Thus, light in a visible light region, particularly white light or light of color close to white, can be extracted to the outside efficiently. Note that white light or light of color close to white preferably has a peak of an emission spectrum in a wavelength range of at least one of blue, green, yellow, and red.

Therefore, the light-emitting device 150 that includes the light-emitting element 221 with a microcavity structure and the light-emitting element 221W without a microcavity structure enables light with high color purity and white light or light of color close to white to be extracted with high light-extraction efficiency. In other words, with the structure of the light-emitting device 150, a light-emitting device with high color purity and high emission efficiency can be provided.

The EL layer 100 included in the light-emitting element 221 and the EL layer 100 included in the light-emitting element 221W can be formed in the same step. Thus, the light-emitting device 150 is easily manufactured.

In the above structure, a material used for a conductive film in the electrode 102 and a material used for the conductive film 106 may be the same or different from each other. It is preferable to use the same material for the conductive film in the electrode 102 and the conductive film 106 because patterning by etching in the formation process of the electrode 102 and the electrode 103 can be performed easily. Each of the conductive film in the electrode 102 and the conductive film 106 may have a stacked-layer structure of two or more layers.

In the light-emitting device 150, a material of the electrode 101 and a material of the conductive film 104 may be the same or different from each other. In the case where the same material is used for the electrode 101 and the conductive film 104, a manufacturing cost of the light-emitting device 150 can be reduced. Each of the electrode 101 and the conductive film 104 may have a stacked-layer structure of two or more layers.

For the conductive film 104, a metal with a thickness (e.g., greater than or equal to 1 nm and less than or equal to 30 nm) through which light can be transmitted is preferably used. It is preferable to use silver (Ag) or an alloy including Ag as the metal because the reflectance of the conductive film 104 can be increased, and the emission efficiency of the light-emitting element can be increased. Having a low absorptance of light in the visible light region, Ag having a thickness that allows transmission of light is used, whereby a reflective film having functions of transmitting light and reflecting light can be formed.

When the electrode 101 is formed using a material including aluminum (Al) or silver (Ag), the reflectance of the electrode 101 can be increased and the emission efficiency of the light-emitting element can be increased. Note that Al is preferable because material cost is low, patterning can be easily performed, and manufacturing cost of a light-emitting element can be reduced. In addition, Ag is preferable because its particularly high reflectance makes it possible to increase the emission efficiency of a light-emitting element.

For the electrode 102 and the conductive film 106, a metal oxide is preferably used. The metal oxide preferably contains at least one of indium (In) and zinc (Zn). With the metal oxides containing In and/or Zn, conductivity and light transmittance can be improved. Moreover, manufacturing cost of the light-emitting element can be reduced with the use of Zn for the conductive film because of a low material cost of Zn.

Note that in the case where a material containing Al is in direct contact with an oxide containing In, the material containing Al and the oxide containing In differ in ionization tendency; thus, electrons are donated and accepted between the material and the oxide, resulting in electrolytic corrosion between electrodes containing the material and the oxide. Therefore, it is preferable that the material containing Al be not in direct contact with the oxide containing In. From the above, as a metal contained in the conductive film 104, Ag is particularly preferable.

When the above-described light-emitting device 150 is used for a pixel in a display device, the display device can have high color purity and high emission efficiency. Thus, the display device including the light-emitting device 150 achieves low power consumption.

<Structural Example 2 of Light-Emitting Device>

Next, a structural example different from that of the light-emitting device 150 illustrated in FIG. 1 will be described below with reference to FIG. 2.

Figure 2:
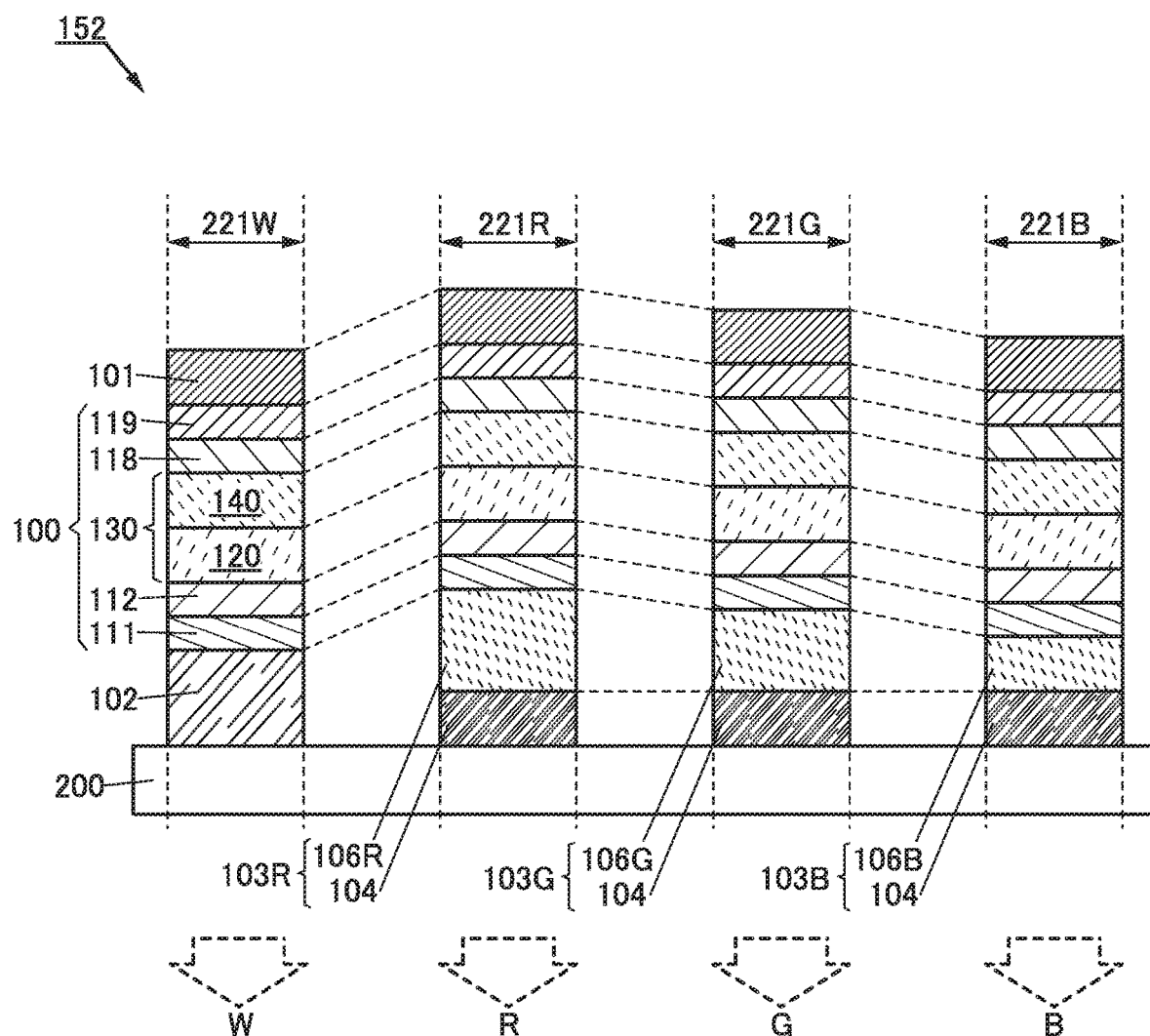
FIG. 2 is a cross-sectional schematic view of a light-emitting device of one embodiment of the present invention.

FIG. 2 is a schematic cross-sectional view of a light-emitting device of one embodiment of the present invention. In FIG. 2, a portion having a function similar to that in FIG. 1 is represented by the same hatch pattern as in FIG. 1 and not especially denoted by a reference numeral in some cases. In addition, common reference numerals are used for portions having similar functions, and a detailed description of the portions is omitted in some cases.

A light-emitting device 152 illustrated in FIG. 2 includes, over the substrate 200, the light-emitting element 221W, a light-emitting element 221R, a light-emitting element 221G, and a light-emitting element 221B.

The light-emitting element 221W includes the electrode 101, the electrode 102, and the EL layer 100 provided between the electrodes. The light-emitting element 221R includes the electrode 101, an electrode 103R, and the EL layer 100 provided between the electrodes. The light-emitting element 221G includes the electrode 101, an electrode 103G, and the EL layer 100 provided between the electrodes. The light-emitting element 221B includes the electrode 101, an electrode 103B, and the EL layer 100 provided between the electrodes. The electrode 102 includes a conductive film. The electrode 103R includes the conductive film 104 and a conductive film 106R. The electrode 103G includes the conductive film 104 and a conductive film 106G. The electrode 103B includes the conductive film 104 and a conductive film 106B. The EL layer 100 includes at least the light-emitting layer 130, and the light-emitting layer 130, for example, includes a light-emitting layer 120 and a light-emitting layer 140.

The EL layer 100 illustrated in FIG. 2 includes functional layers such as the hole-injection layer 111, the hole-transport layer 112, the electron-transport layer 118, and the electron-injection layer 119, in addition to the light-emitting layer 120 and the light-emitting layer 140.

In FIG. 2, the hole-injection layer 111, the hole-transport layer 112, the light-emitting layer 120, the light-emitting layer 140, the electron-transport layer 118, the electron-injection layer 119, and the electrode 101 are independently provided for each light-emitting element; however, they can be shared without being separated between the light-emitting elements.

One of the light-emitting layer 120 and the light-emitting layer 140 preferably includes a light-emitting material of at least one color selected from violet, blue, and blue green. The other of the light-emitting layer 120 and the light-emitting layer 140 preferably includes a light-emitting material of at least one color selected from green, yellow green, yellow, yellow orange, orange, and red.

Either or both of the light-emitting layers 120 and 140 may have a stacked structure of two layers. The two light-emitting layers each including two kinds of light-emitting materials (a first compound and a second compound) for emitting light of different colors enable emission of light of a plurality of colors. In particular, light-emitting materials used for the light-emitting layer 120 and the light-emitting layer 140 are preferably selected so that light emitted from each of the light-emitting layer 120 and the light-emitting layer 140 is white light or light of color close to white.

Either or both of the light-emitting layers 120 and 140 may have a stacked structure of three or more layers, in which a layer not including a light-emitting material may be included.

The electrode 101 has a function of reflecting visible light. The conductive film in the electrode 102, the conductive film 106R, the conductive film 106G, and the conductive film 106B each has a function of transmitting visible light. The conductive film 104 has functions of reflecting visible light and transmitting visible light. Thus, the electrode 102 has a function of transmitting visible light, and each of the electrode 103R, the electrode 103G, and the electrode 103B has functions of reflecting visible light and transmitting visible light.

Light from the light-emitting element 221W, light from the light-emitting element 221R, light from the light-emitting element 221G, and light from the light-emitting element 221B are emitted through the electrode 102, the electrode 103R, the electrode 103G, and the electrode 103B, respectively, to the outside. Thus, the light-emitting device 152 is a light-emitting device with a bottom-emission structure. In FIG. 2, white light or light of color close to white (W), red light (R), green light (G), and blue light (B) are each represented schematically by dashed arrows. The same applies to light-emitting devices described later. Note that one embodiment of the present invention is not limited to the above light-emitting device, and may employ a light-emitting device with a dual emission structure in which light is extracted in both top and bottom directions of the substrate 200 where a light-emitting element is formed.

The light-emitting element 221W has no microcavity structure, and each of the light-emitting element 221R, the light-emitting element 221G, and the light-emitting element 221B has a microcavity structure.

In the light-emitting element 221R, it is preferable to adjust a distance between the electrode 101 and the electrode 103R so that light in a red wavelength range is intensified with the microcavity structure. In the light-emitting element 221G, it is preferable to adjust a distance between the electrode 101 and the electrode 103G so that light in a green wavelength range is intensified with the microcavity structure. In the light-emitting element 221B, it is preferable to adjust a distance between the electrode 101 and the electrode 103B so that light in a blue wavelength range is intensified with the microcavity structure.

The thickness of the conductive film 106R is adjusted in the light-emitting element 221R, the thickness of the conductive film 106G is adjusted in the light-emitting element 221G, and the thickness of the conductive film 106B is adjusted in the light-emitting element 221B, which makes it possible to increase the intensity of light of a desired wavelength among light emitted from the light-emitting layer 120 and the light-emitting layer 140 in each light-emitting element.

The conductive film 106R, the conductive film 106G, and the conductive film 106B have different thicknesses from each other. For example, in the case where the refractive index of the conductive film having a function of reflecting light is smaller than those of the light-emitting layer 120 and the light-emitting layer 140 in each of the electrode 101, the electrode 103R, the electrode 103G, and the electrode 103B, the thickness of the conductive film in each light-emitting element is adjusted. Specifically, the thickness of the conductive film 106R in the electrode 103R is adjusted so that the optical length between the electrode 101 and the electrode 103R is around $m_R \lambda_R/2$ ($m_R$ represents a natural number, and $\lambda_R$ represents a wavelength of light intensified in the light-emitting element 221R). The thickness of the conductive film 106G in the electrode 103G is adjusted so that the optical length between the electrode 101 and the electrode 103G is around $m_G \lambda_G/2$ ($m_G$ represents a natural number, and $\lambda_G$ represents a wavelength of light intensified in the light-emitting element 221G). The thickness of the conductive film 106B in the electrode 103B is adjusted so that the optical length between the electrode 101 and the electrode 103B is around $m_B \lambda_B/2$ ($m_B$ represents a natural number, and $\lambda_B$ represents a wavelength of light intensified in the light-emitting element 221B).

With the microcavity structures, light emitted from the light-emitting element 221R has a peak of an emission spectrum in a red wavelength range, light emitted from the light-emitting element 221G has a peak of an emission spectrum in a green wavelength range, and light emitted from the light-emitting element 221B has a peak of an emission spectrum in a blue wavelength range.

In the above manner, with the microcavity structure, in which the optical length between the pair of electrodes in the respective regions is adjusted, scattering and absorption of light in the vicinity of the electrodes can be suppressed, resulting in high efficiency of extraction of light of a desired wavelength. In addition, the intensity of light of a desired wavelength is increased, and accordingly light emission with high color purity can be obtained.

In contrast, the electrode 102 in the light-emitting element 221W is formed from only a conductive film having a light-transmitting function. The light-emitting element 221W has no microcavity structure, and through extraction of light emitted from the light-emitting layer 120 and the light-emitting layer 140 to the outside, the intensity of light of a specific wavelength is not increased. Thus, light in a visible light region, particularly white light or light of color close to white, can be extracted to the outside efficiently. Note that white light or light of color close to white preferably has a peak of an emission spectrum in a wavelength range of at least one of blue, green, yellow, and red.

Therefore, the light-emitting device 152 that includes light-emitting elements 221R, 221G, and 221B with the microcavity structures and the light-emitting element 221W without a microcavity structure enables extraction of light with high color purity and white light or light of color close to white with high light-extraction efficiency. In other words, with the structure of the light-emitting device 152, a light-emitting device with high color purity and high emission efficiency can be provided.

The EL layer 100 included in the light-emitting element 221R, the EL layer 100 included in the light-emitting element 221G, the EL layer 100 included in the light-emitting element 221B, and the EL layer 100 included in the light-emitting element 221W can be formed in the same step. Thus, the light-emitting device 152 is a light-emitting device that is easily manufactured.

In the above structure, a material used for the conductive film in the electrode 102 and materials used for the conductive films 106R, 106G, and 106B may be the same material or different from each other. It is preferable to use the same material for the conductive film in the electrode 102 and the conductive films 106R, 106G, and 106B because patterning by etching in the formation process of the electrode 102, the electrode 103R, the electrode 103G, and the electrode 103B can be performed easily. Each of the conductive film in the electrode 102 and the conductive films 106R, 106G, and 106B may have a stacked-layer structure of two or more layers.

In the light-emitting device 152, a material of the electrode 101 and a material of the conductive film 104 may be the same or different from each other. In the case where the same material is used for the electrode 101 and the conductive film 104, a manufacturing cost of the light-emitting device 152 can be reduced. Each of the electrode 101 and the conductive film 104 may have a stacked-layer structure of two or more layers.

When the above-described light-emitting device 152 is used for a pixel in a display device, the display device can have high color purity and high emission efficiency. Thus, the display device including the light-emitting device 152 achieves low power consumption.

Note that the structure of the light-emitting device 150 may be referred to for the other part in the light-emitting device 152.

<Structural Example 3 of Light-Emitting Device>

Next, a structural example different from that of the light-emitting device 152 illustrated in FIG. 2 will be described below with reference to FIG. 3 and FIG. 4.

Figure 3:
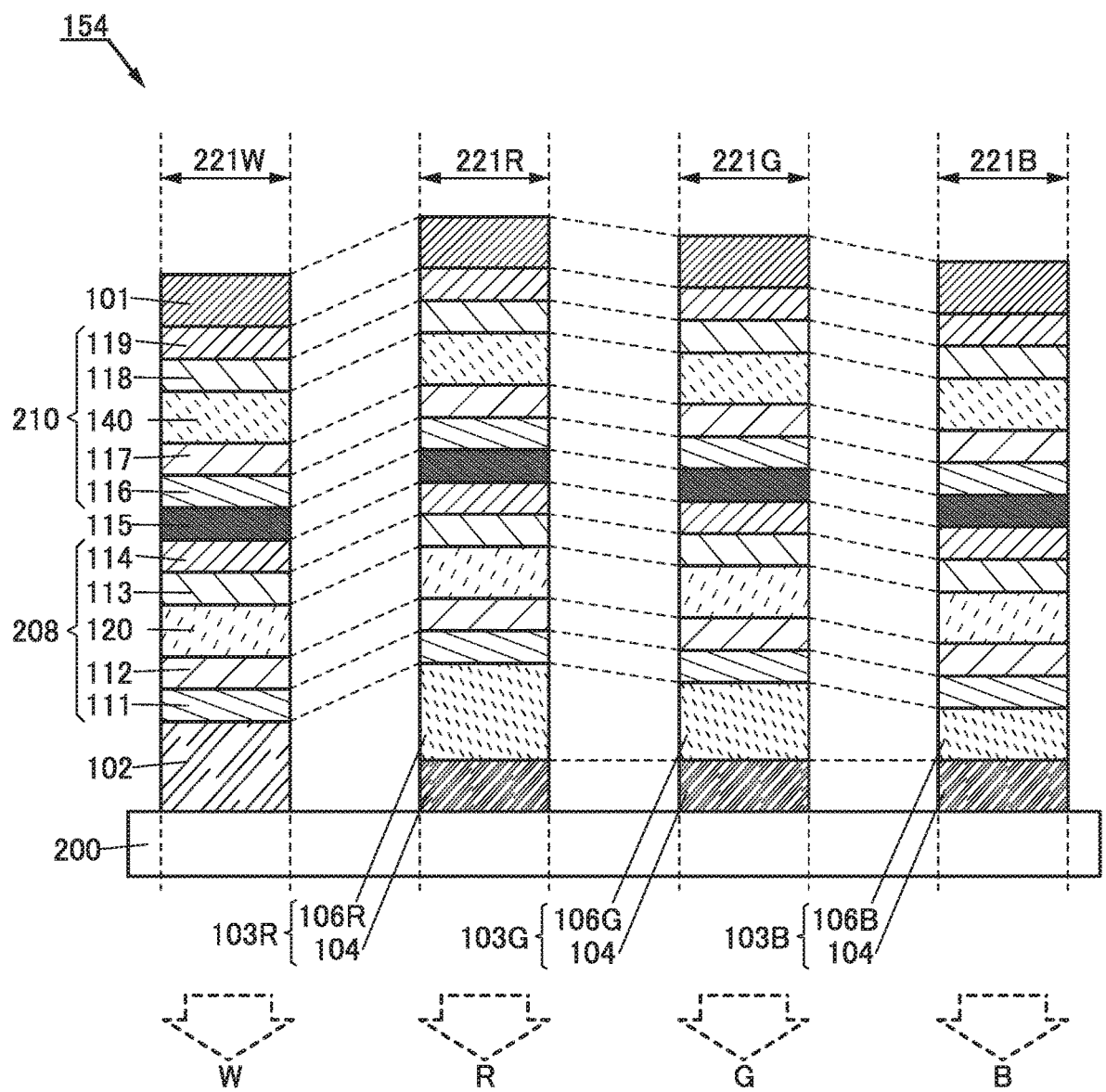
FIG. 3 is a cross-sectional schematic view of a light-emitting device of one embodiment of the present invention.
Figure 4:
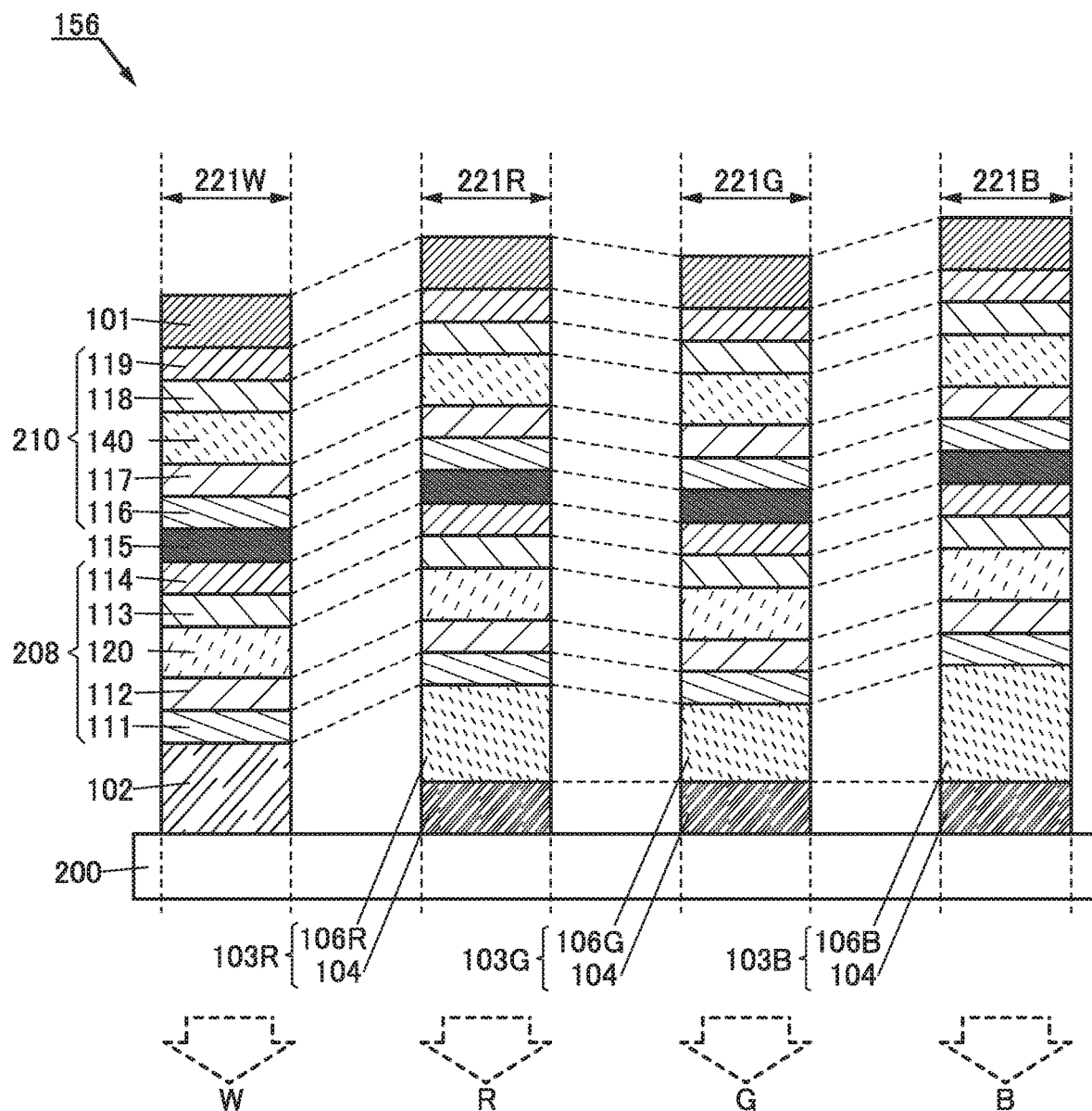
FIG. 4 is a cross-sectional schematic view of a light-emitting device of one embodiment of the present invention.

FIG. 3 and FIG. 4 are each a cross-sectional schematic view of a light-emitting device of one embodiment of the present invention. In FIG. 3 and FIG. 4, a portion having a function similar to that in FIG. 1 and FIG. 2 is represented by the same hatch pattern as in FIG. 1 and FIG. 2 and not especially denoted by a reference numeral in some cases. In addition, common reference numerals are used for portions having similar functions, and a detailed description of the portions is omitted in some cases.

Each of a light-emitting device 154 illustrated in FIG. 3 and a light-emitting device 156 illustrated in FIG. 4 includes, over the substrate 200, the light-emitting element 221W, the light-emitting element 221R, the light-emitting element 221G, and the light-emitting element 221B.

The light-emitting element 221W includes the electrode 101, the electrode 102, and a plurality of light-emitting units (a light-emitting unit 208 and a light-emitting unit 210) provided between the electrodes. The light-emitting element 221R includes the electrode 101, the electrode 103R, and the plurality of light-emitting units (the light-emitting unit 208 and the light-emitting unit 210) provided between the electrodes. The light-emitting element 221G includes the electrode 101, the electrode 103G, and the plurality of light-emitting units (the light-emitting unit 208 and the light-emitting unit 210) provided between the electrodes. The light-emitting element 221B includes the electrode 101, the electrode 103B, and the plurality of light-emitting units (the light-emitting unit 208 and the light-emitting unit 210) provided between the electrodes. Any one of the light-emitting units preferably has the same structure as the EL layer 100. The electrode 102 includes a conductive film having a function of transmitting visible light. The electrode 103R includes the conductive film 104 having functions of reflecting visible light and transmitting visible light and the conductive film 106R having a function of transmitting visible light. The electrode 103G includes the conductive film 104 having functions of reflecting visible light and transmitting visible light and the conductive film 106G having a function of transmitting visible light. The electrode 103B includes the conductive film 104 having functions of reflecting visible light and transmitting visible light and the conductive film 106B having a function of transmitting visible light.

In each of the light-emitting device 154 and the light-emitting device 156, the light-emitting unit 208 and the light-emitting unit 210 are stacked, and a charge-generation layer 115 is provided between the light-emitting unit 208 and the light-emitting unit 210.

The light-emitting unit 208 includes the light-emitting layer 120, and the light-emitting unit 210 includes the light-emitting layer 140. The light-emitting unit 208 includes the hole-injection layer 111, the hole-transport layer 112, an electron-transport layer 113, and an electron-injection layer 114 in addition to the light-emitting layer 120. The light-emitting unit 210 includes a hole-injection layer 116, a hole-transport layer 117, the electron-transport layer 118, and the electron-injection layer 119 in addition to the light-emitting layer 140.

The charge-generation layer 115 provided between the light-emitting unit 208 and the light-emitting unit 210 may have any structure as long as electrons can be injected to the light-emitting unit on one side and holes can be injected into the light-emitting unit on the other side when a voltage is applied between the electrode 101 and the electrode 102. For example, in FIG. 3, the charge-generation layer 115 injects electrons into the light-emitting unit 208 and holes into the light-emitting unit 210 when a voltage is applied such that the potential of the electrode 101 is higher than that of the electrode 102.

Note that when a surface of a light-emitting unit on the anode side is in contact with the charge-generation layer 115 like the light-emitting unit 210, the charge-generation layer 115 can also serve as a hole-injection layer or a hole-transport layer of the light-emitting unit; thus, a hole-injection layer or a hole-transport layer need not be included in the light-emitting unit. When a surface of a light-emitting unit on the cathode side is in contact with the charge-generation layer 115 like the light-emitting unit 208, the charge-generation layer 115 can also serve as an electron-injection layer or an electron-transport layer of the light-emitting unit; thus, an electron-injection layer or an electron-transport layer need not be included in the light-emitting unit.

The light-emitting element having two light-emitting units has been described with reference to FIG. 3 and FIG. 4; however, a similar structure can be applied to a light-emitting element in which three or more light-emitting units are stacked. With a plurality of light-emitting units partitioned by the charge-generation layer between a pair of electrodes as in the light-emitting device 154 and the light-emitting device 156, it is possible to provide a light-emitting element which can emit light with high luminance with the current density kept low and has a long lifetime. In addition, a light-emitting element with low power consumption can be achieved.

Note that the electrode 101, the electrode 102, the electrode 103R, the electrode 103G, the electrode 103B, the hole-injection layers 111 and 116, the hole-transport layers 112 and 117, the light-emitting layers 120 and 140, the electron-transport layers 113 and 118, and the electron-injection layers 114 and 119 in each of the light-emitting device 154 and the light-emitting device 156 have functions similar to those of the electrode 101, the electrode 102, the electrode 103R, the electrode 103G, the electrode 103B, the hole-injection layer 111, the hole-transport layer 112, the light-emitting layers 120 and 140, the electron-transport layer 118, and the electron-injection layer 119 in the light-emitting device 152, respectively. Therefore, the detailed description of the above components is omitted.

The light-emitting element 221W is a light-emitting element without a microcavity structure, and the light-emitting element 221R, the light-emitting element 221G, and the light-emitting element 221B are each a light-emitting element with a microcavity structure.

In the light-emitting element 221R, it is preferable to adjust a distance between the electrode 101 and the electrode 103R so that light in a red wavelength range is intensified with the microcavity structure. In the light-emitting element 221G, it is preferable to adjust a distance between the electrode 101 and the electrode 103G so that light in a green wavelength range is intensified with the microcavity structure. In the light-emitting element 221B, it is preferable to adjust a distance between the electrode 101 and the electrode 103B so that light in a blue wavelength range is intensified with the microcavity structure. At this time, as the light-emitting device 154 illustrated in FIG. 3, the conductive film 106R preferably has a region thicker than that in the conductive film 106G, and the conductive film 106G preferably has a region thicker than that in the conductive film 106B. Alternatively, as the light-emitting device 156 illustrated in FIG. 4, the conductive film 106R preferably has a region thicker than that in the conductive film 106G, and the conductive film 106B preferably has a region thicker than that in the conductive film 106R. When in the light-emitting element 221B, the optical length between the electrode 101 and the electrode 103B is around $m_B \lambda_B/2$ ($m_B$ is a natural number greater than 2) and the conductive film 106B has a large thickness, it is possible to suppress an influence of a phenomenon where the light extraction efficiency is reduced by light scattering or absorption in the vicinity of a surface of the conductive film 104 (the phenomenon is referred to as surface plasmon resonance: SPR). That is, a high efficiency of light extraction can be achieved. Thus, blue light can be extracted efficiently from the light-emitting element 221B.

Each of the light-emitting device 154 and the light-emitting device 156 that includes the light-emitting elements 221R, 221G, and 221B each having a microcavity structure and the light-emitting element 221W without a microcavity structure enables extraction of light with high color purity and white light or light of a color close to white with high light-extraction efficiency. Thus, with the structures of the light-emitting device 154 and the light-emitting device 156, a light-emitting device with high color purity and high emission efficiency can be provided.

Note that the structure of the light-emitting device 150 or 152 may be referred to for the other part in the light-emitting devices 154 and 156.

<Structural Example 4 of Light-Emitting Device>

Next, a structural example different from that of the light-emitting device 152 illustrated in FIG. 2 will be described below with reference to FIG. 5.

Figure 5:
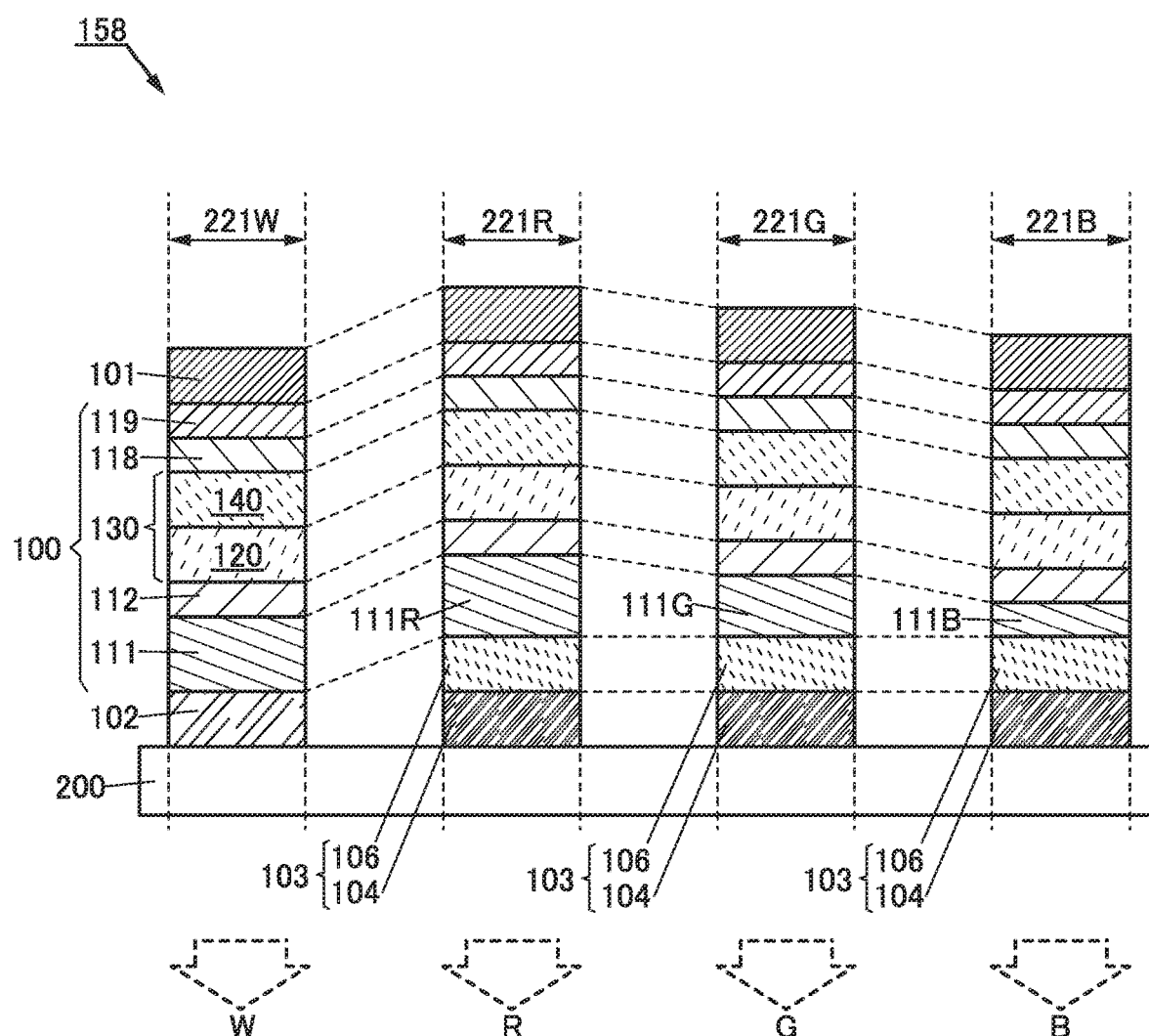
FIG. 5 is a cross-sectional schematic view of a light-emitting device of one embodiment of the present invention.

FIG. 5 is a cross-sectional schematic view of a light-emitting device of one embodiment of the present invention. In FIG. 5, a portion having a function similar to that in FIG. 1, FIG. 2, FIG. 3, and FIG. 4 is represented by the same hatch pattern as in FIG. 1, FIG. 2, FIG. 3, and FIG. 4 and not especially denoted by a reference numeral in some cases. In addition, common reference numerals are used for portions having similar functions, and a detailed description of the portions is omitted in some cases.

A light-emitting device 158 illustrated in FIG. 5 includes, over the substrate 200, the light-emitting element 221W, the light-emitting element 221R, the light-emitting element 221G, and the light-emitting element 221B.

The light-emitting element 221W includes the electrode 101, the electrode 102, and the EL layer 100 provided between the electrodes. The light-emitting element 221R includes the electrode 101, the electrode 103, and the EL layer 100 provided between the electrodes. The light-emitting element 221G includes the electrode 101, the electrode 103, and the EL layer 100 provided between the electrodes. The light-emitting element 221B includes the electrode 101, the electrode 103, and the EL layer 100 provided between the electrodes. The electrode 102 includes a conductive film having a function of transmitting visible light. The electrode 103 includes the conductive film 104 having functions of reflecting visible light and transmitting visible light and the conductive film 106 having a function of transmitting visible light. The EL layer 100 includes at least the light-emitting layer 130, and the light-emitting layer 130 includes, for example, the light-emitting layer 120 and the light-emitting layer 140.

The EL layer 100 illustrated in FIG. 5 includes functional layers such as the hole-injection layer 111, the hole-transport layer 112, the electron-transport layer 118, the electron-injection layer 119, in addition to the light-emitting layer 120 and the light-emitting layer 140.

The electrode 101, the electrode 102, the conductive film 104, the hole-transport layer 112, the light-emitting layer 120, the light-emitting layer 140, the electron-transport layer 118, and the electron-injection layer 119 in the light-emitting device 158 have functions similar to those of the electrode 101, the electrode 102, the conductive film 104, the hole-transport layer 112, the light-emitting layer 120, the light-emitting layer 140, the electron-transport layer 118, and the electron-injection layer 119 in the light-emitting device 152, respectively. Thus, the detailed description of the above components is omitted.

The EL layer 100 in the light-emitting element 221W includes the hole-injection layer 111. The EL layer 100 in the light-emitting element 221R includes a hole-injection layer 111R. The EL layer 100 in the light-emitting element 221G includes a hole-injection layer 111G. The EL layer 100 in the light-emitting element 221B includes a hole-injection layer 111B.

The light-emitting element 221W is a light-emitting element without a microcavity structure. The light-emitting element 221R, the light-emitting element 221G, and the light-emitting element 221B are each a light-emitting element with a microcavity structure.

It is preferable to adjust a distance between the electrode 101 and the electrode 103 in the light-emitting element 221R so that light in a red wavelength range is intensified with the microcavity structure. It is preferable to adjust a distance between the electrode 101 and the electrode 103 in the light-emitting element 221G so that light in a green wavelength range is intensified with the microcavity structure. It is preferable to adjust a distance between the electrode 101 and the electrode 103 in the light-emitting element 221B so that light in a blue wavelength range is intensified with the microcavity structure. The thickness of the hole-injection layer 111R is adjusted in the light-emitting element 221R, the thickness of the hole-injection layer 111G is adjusted in the light-emitting element 221G, and the thickness of the hole-injection layer 111B is adjusted in the light-emitting element 221B, whereby each of the light-emitting element enables the intensity of light of a desired wavelength among light emitted from the light-emitting layer 120 and the light-emitting layer 140 to be increased. The hole-injection layer 111R, the hole-injection layer 111G, and the hole-injection layer 111B may have different thicknesses from each other. For example, in the case where the conductive film having a function of reflective light in the electrodes 101 and 103 has smaller refractive index than the light-emitting layer 120 and the light-emitting layer 140, the thicknesses of the hole-injection layers are adjusted. Specifically, the thickness of the hole-injection layer 111R is adjusted so that the optical length between the electrode 101 and the electrode 103 becomes around $m_R \lambda_R/2$ ($m_R$ is a natural number and $\lambda_R$ represents a wavelength of light intensified in the light-emitting element 221R). The thickness of the hole-injection layer 111G is adjusted so that the optical length between the electrode 101 and the electrode 103 becomes around $m_G \lambda_G/2$ ($m_G$ is a natural number and $\lambda_G$ represents a wavelength of light intensified in the light-emitting element 221G). The thickness of the hole-injection layer 111B is adjusted so that the optical length between the electrode 101 and the electrode 103 becomes around $m_B \lambda_G/2$ ($m_B$ is a natural number and AB represents a wavelength of light intensified in the light-emitting element 221B).

With use of the microcavity structures, light emitted from the light-emitting element 221R has a peak of an emission spectrum in the red wavelength range, light emitted from the light-emitting element 221G has a peak of an emission spectrum in the green wavelength range, and light emitted from the light-emitting element 221B has a peak of an emission spectrum in the blue wavelength range.

The light-emitting device 158 that includes the light-emitting elements 221R, 221G, and 221B each having a microcavity structure and the light-emitting element 221W without a microcavity structure enables extraction of light with high color purity and white light or light of a color close to white with high light-extraction efficiency. Thus, with the structure of the light-emitting device 158, a light-emitting device with high color purity and high emission efficiency can be provided.

In the above structure, the hole-injection layer 111, the hole-injection layer 111R, the hole-injection layer 111G, and the hole-injection layer 111B may be formed using the same material or different materials. In the case where the same material is used for the hole-injection layers, the manufacturing cost of the light-emitting device 158 can be reduced. Note that one or a plurality of these hole-injection layers may have a stacked structure including two or more layers.

Note that the structure of the light-emitting device 150 or the light-emitting device 152 may be referred to for the other part in the light-emitting device 158.

<Structural Example 5 of Light-Emitting Device>

Next, a structural example different from that of the light-emitting device 158 in FIG. 5 will be described below with reference to FIG. 6 and FIG. 7.

Figure 6:
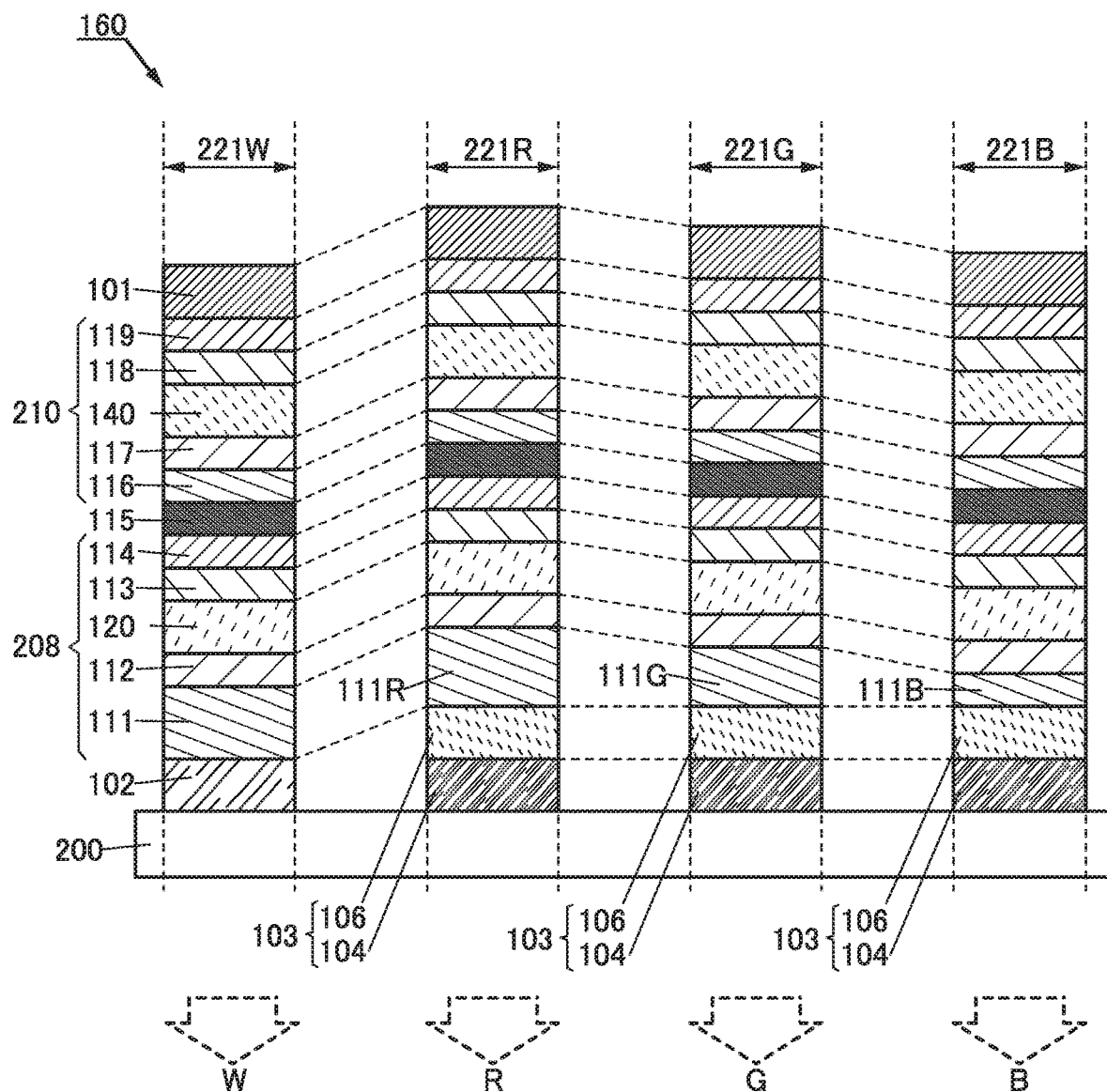
FIG. 6 is a cross-sectional schematic view of a light-emitting device of one embodiment of the present invention.
Figure 7:
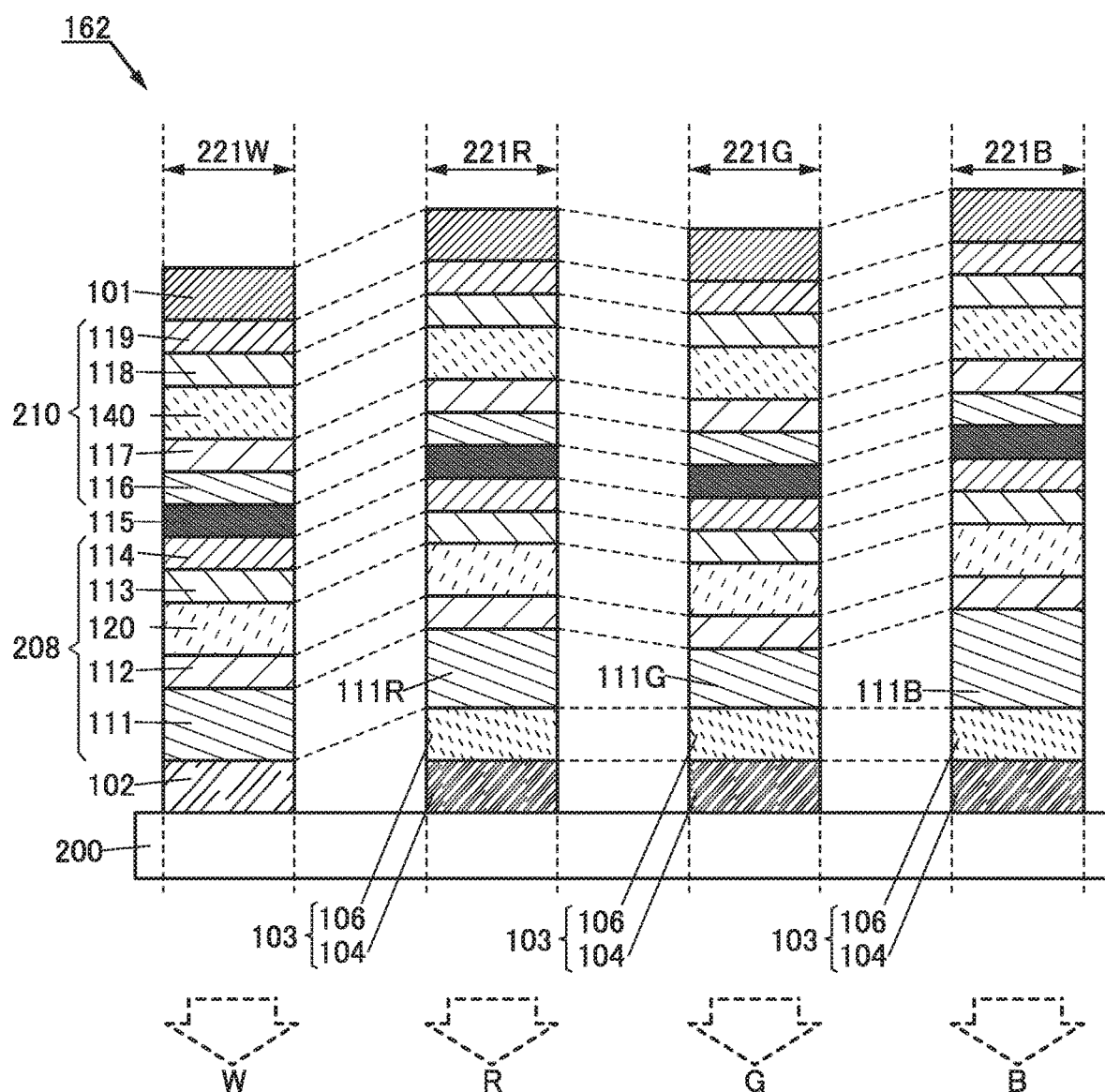
FIG. 7 is a cross-sectional schematic view of a light-emitting device of one embodiment of the present invention.

FIG. 6 and FIG. 7 are each a cross-sectional schematic view of a light-emitting device of one embodiment of the present invention. In FIG. 6 and FIG. 7, a portion having a function similar to that in FIGS. 1 to 5 is represented by the same hatch pattern as in FIGS. 1 to 5 and not especially denoted by a reference numeral in some cases. In addition, common reference numerals are used for portions having similar functions, and a detailed description of the portions is omitted in some cases.

A light-emitting device 160 illustrated in FIG. 6 and a light-emitting device 162 illustrated in FIG. 7 each include, over the substrate 200, the light-emitting element 221W, the light-emitting element 221R, the light-emitting element 221G, and the light-emitting element 221B.

The light-emitting element 221W includes the electrode 101, the electrode 102, and a plurality of light-emitting units (the light-emitting unit 208 and the light-emitting unit 210) provided between the electrodes. The light-emitting element 221R includes the electrode 101, the electrode 103, and a plurality of light-emitting units (the light-emitting unit 208 and the light-emitting unit 210) provided between the electrodes. The light-emitting element 221G includes the electrode 101, the electrode 103, and a plurality of light-emitting units (the light-emitting unit 208 and the light-emitting unit 210) provided between the electrodes. The light-emitting element 221B includes the electrode 101, the electrode 103, and a plurality of light-emitting units (the light-emitting unit 208 and the light-emitting unit 210) provided between the electrodes. The electrode 102 includes a conductive film having a function of transmitting visible light. The electrode 103 includes the conductive film 104 having functions of reflecting visible light and transmitting visible light and the conductive film 106 having a function of transmitting visible light.

In each of the light-emitting device 160 and the light-emitting device 162, the light-emitting unit 208 and the light-emitting unit 210 are stacked, and the charge-generation layer 115 is provided between the light-emitting unit 208 and the light-emitting unit 210.

The light-emitting unit 208 includes the light-emitting layer 120, and the light-emitting unit 210 includes the light-emitting layer 140. The light-emitting unit 208 includes the hole-injection layer 111, the hole-transport layer 112, the electron-transport layer 113, and the electron-injection layer 114 in addition to the light-emitting layer 120. The light-emitting unit 210 includes the hole-injection layer 116, the hole-transport layer 117, the electron-transport layer 118, and the electron-injection layer 119 in addition to the light-emitting layer 140.

The electrode 101, the electrode 102, the electrode 103, the hole-transport layers 112 and 117, the light-emitting layer 120, the light-emitting layer 140, and the electron-transport layers 113 and 118, and the electron-injection layers 114 and 119 in each of the light-emitting device 160 and the light-emitting device 162 have functions similar to those of the electrode 101, the electrode 102, the electrode 103, the hole-transport layer 112, the light-emitting layer 120, the light-emitting layer 140, the electron-transport layer 118, and the electron-injection layer 119 in the light-emitting device 158. Thus, the detailed description of the above components is omitted.

The light-emitting element 221W is a light-emitting element without a microcavity structure, and each of the light-emitting element 221R, the light-emitting element 221G, and the light-emitting element 221B is a light-emitting element with a microcavity structure.

It is preferable to adjust a distance between the electrode 101 and the electrode 103 in the light-emitting element 221R so that light in a red wavelength range is intensified with the microcavity structure. It is preferable to adjust a distance between the electrode 101 and the electrode 103 in the light-emitting element 221G so that light in a green wavelength range is intensified with the microcavity structure. It is preferable to adjust a distance between the electrode 101 and the electrode 103 in the light-emitting element 221B so that light in a blue wavelength range is intensified with the microcavity structure. At this time, as the light-emitting device 160 illustrated in FIG. 6, the hole-injection layer 111R preferably has a region thicker than that in the hole-injection layer 111G, and the hole-injection layer 111G preferably has a region thicker than that in the hole-injection layer 111B. Alternatively, as the light-emitting device 162 illustrated in FIG. 7, the hole-injection layer 111R preferably has a region thicker than that in the hole-injection layer 111G, and the hole-injection layer 111B preferably has a region thicker than that in the hole-injection layer 111R. When in the light-emitting element 221B, the optical length between the electrode 101 and the electrode 103 is around $m_B \lambda_B / 2$ ($m_B$ is a natural number greater than 2) and the hole-injection layer 111B has a large thickness, it is possible to suppress an influence of a phenomenon where the light extraction efficiency is reduced by light scattering or absorption in the vicinity of a surface of the conductive film 104 (the phenomenon is referred to as surface plasmon resonance). That is, a high efficiency of light extraction can be achieved. Thus, blue light can be extracted efficiently from the light-emitting element 221B.

With use of the microcavity structures, light emitted from the light-emitting element 221R has a peak of an emission spectrum in the red wavelength range, light emitted from the light-emitting element 221G has a peak of an emission spectrum in the green wavelength range, and light emitted from the light-emitting element 221B has a peak of an emission spectrum in the blue wavelength range.

Each of the light-emitting devices 160 and 162 that include the light-emitting elements 221R, 221G, and 221B each having a microcavity structure and the light-emitting element 221W without a microcavity structure enables extraction of light with high color purity and white light or light of a color close to white with high light-extraction efficiency. Thus, with the structures of the light-emitting devices 160 and 162, a light-emitting device with high color purity and high emission efficiency can be provided.

In the above structure, the hole-injection layer 111, the hole-injection layer 111R, the hole-injection layer 111G, and the hole-injection layer 111B may be formed using the same material or different materials. In the case where the same material is used for the hole-injection layers, the manufacturing cost of the light-emitting devices 160 and 162 can be reduced. Note that one or a plurality of these hole-injection layers may have a stacked structure including two or more layers.

Note that the structures of the light-emitting device 154, 156, or 158 may be referred to for the other part in the light-emitting devices 160 and 162.

<Structural Example 6 of Light-Emitting Device>

Next, a structural example different from that of the light-emitting device 154 illustrated in FIG. 3 is described below with reference to FIG. 8, FIG. 9, and FIG. 10.

Figure 8:
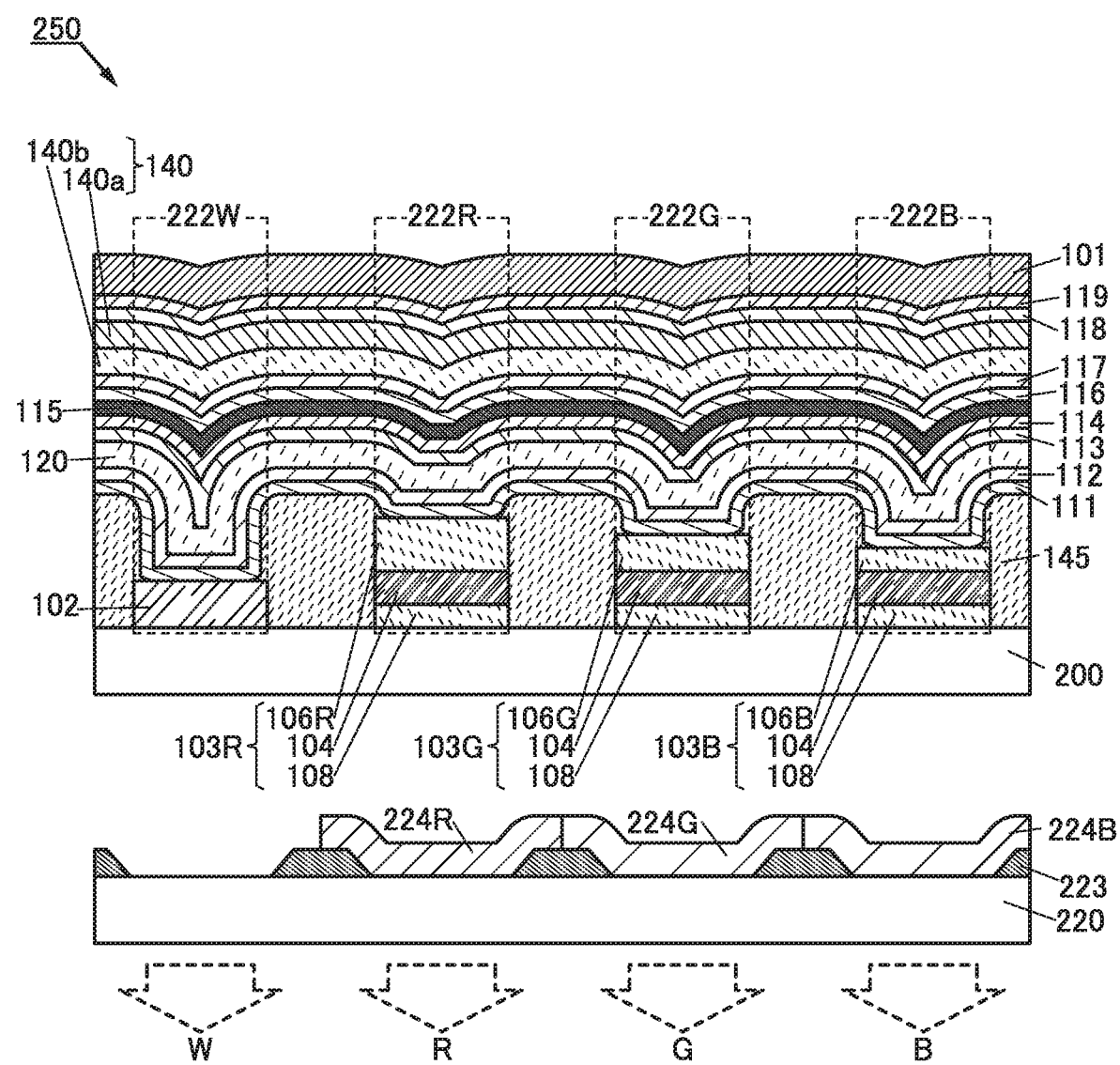
FIG. 8 is a cross-sectional schematic view of a light-emitting device of one embodiment of the present invention.
Figure 9:
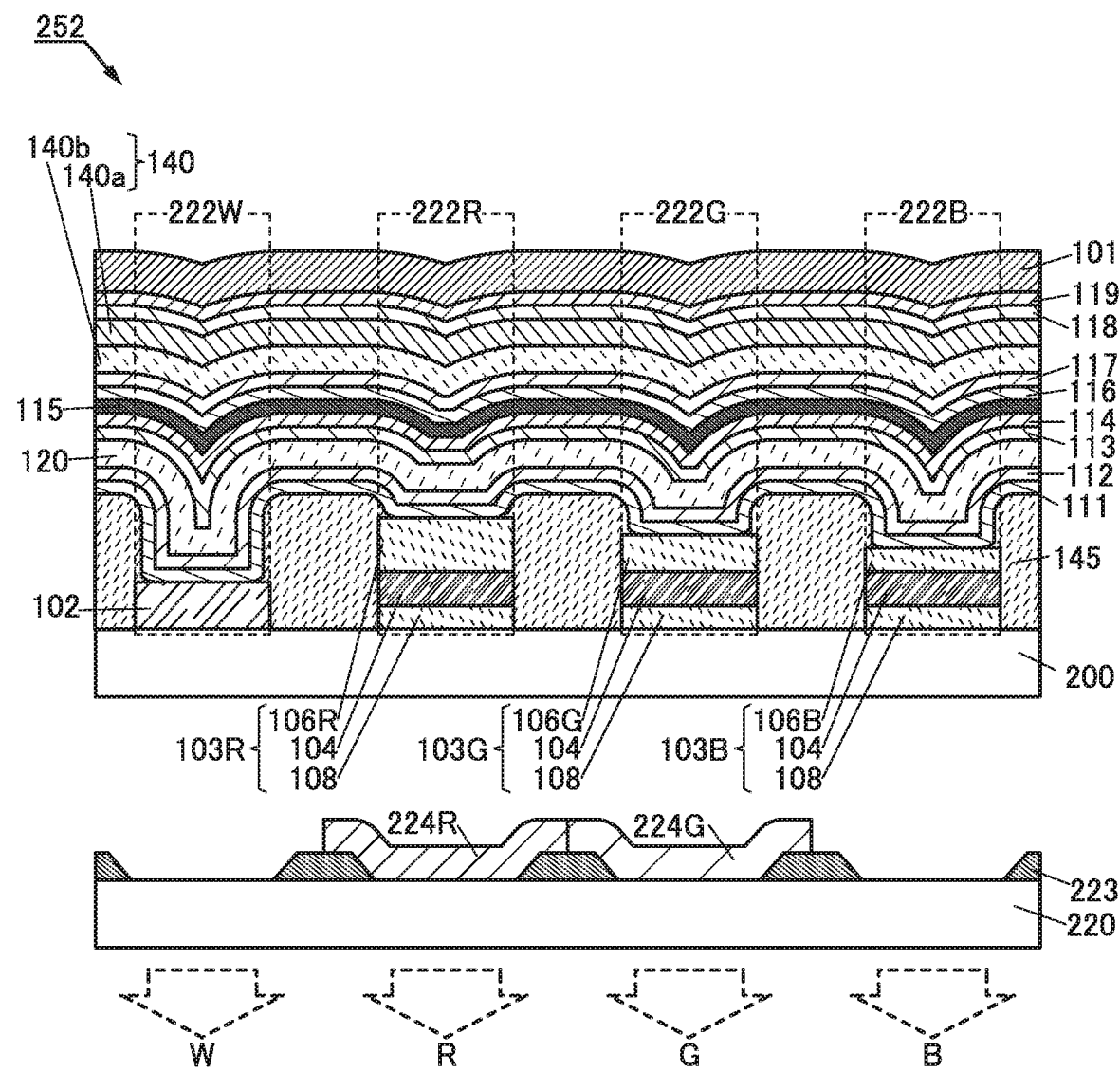
FIG. 9 is a cross-sectional schematic view of a light-emitting device of one embodiment of the present invention.
Figure 10:
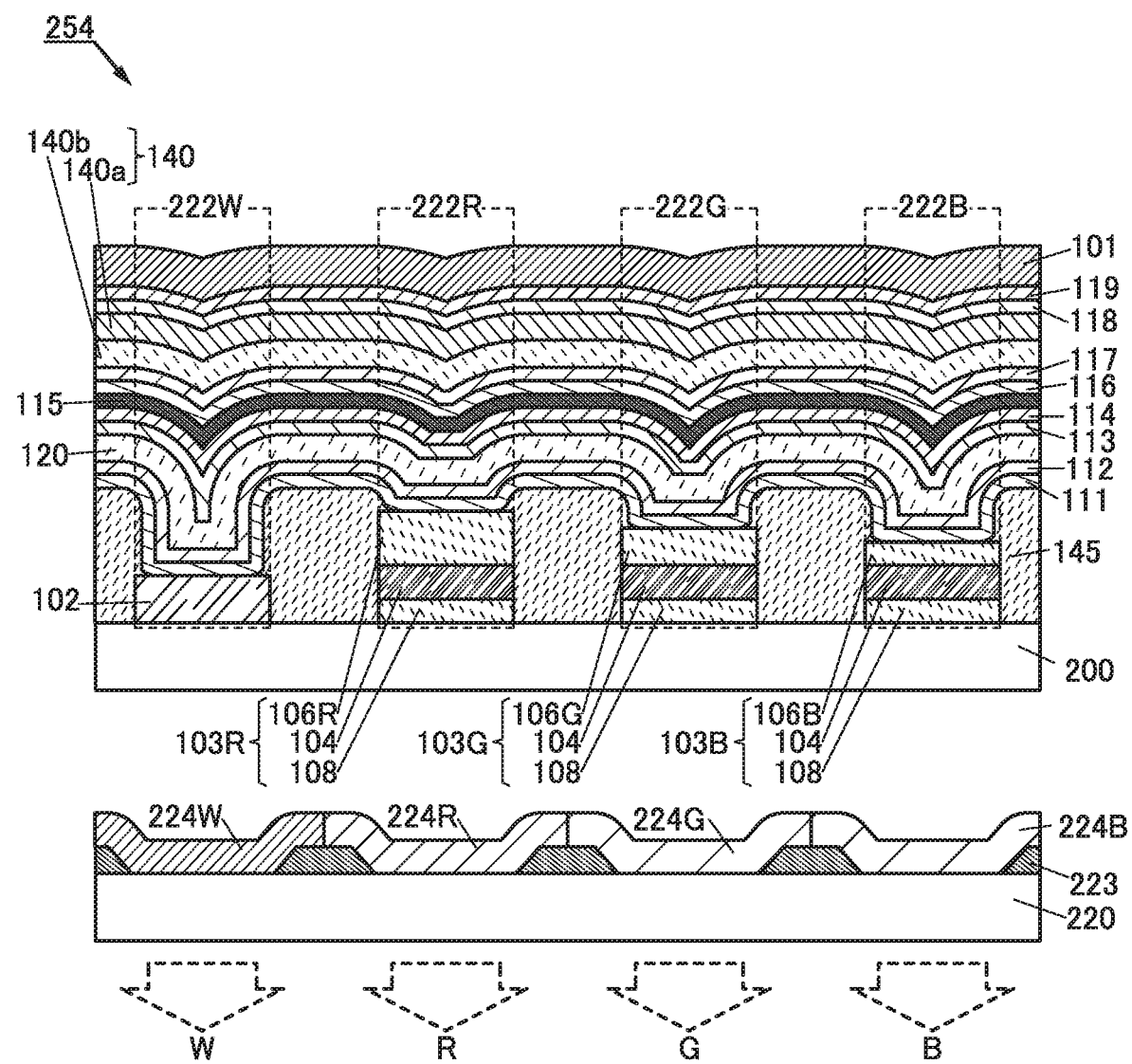
FIG. 10 is a cross-sectional schematic view of a light-emitting device of one embodiment of the present invention.

FIG. 8, FIG. 9, and FIG. 10 are each a cross-sectional schematic view of a light-emitting device of one embodiment of the present invention. In FIG. 8, FIG. 9, and FIG. 10, a portion having a function similar to that in FIGS. 1 to 7 is represented by the same hatch pattern as in FIGS. 1 to 7 and not especially denoted by a reference numeral in some cases. In addition, common reference numerals are used for portions having similar functions, and a detailed description of the portions is omitted in some cases.

A light-emitting device 250 in FIG. 8, a light-emitting device 252 in FIG. 9, and a light-emitting device 254 in FIG. 10 each include, over the substrate 200, a light-emitting element 222W, a light-emitting element 222R, a light-emitting element 222G, and a light-emitting element 222B.

The light-emitting element 222W includes the electrode 101, the electrode 102, and a plurality of light-emitting units between the electrodes. The light-emitting element 222R includes the electrode 101, the electrode 103R, and a plurality of light-emitting units between the electrodes. The light-emitting element 221G includes the electrode 101, the electrode 103G, and a plurality of light-emitting units between the electrodes. The light-emitting element 221B includes the electrode 101, the electrode 103B, and a plurality of light-emitting units between the electrodes.

Each of the light-emitting device 250, the light-emitting device 252, and the light-emitting device 254 includes the light-emitting layer 120 and the light-emitting layer 140. In addition to the light-emitting layer 120 and the light-emitting layer 140, each of the light-emitting device 250, the light-emitting device 252, and the light-emitting device 254 includes the hole-injection layer 111, the hole-transport layer 112, the electron-transport layer 113, the electron-injection layer 114, the charge-generation layer 115, the hole-injection layer 116, the hole-transport layer 117, the electron-transport layer 118, and the electron-injection layer 119.

The light-emitting material included in the light-emitting layer 120 and the light-emitting material included in the light-emitting layer 140 preferably emit different colors of light from each other. Either or both of the light-emitting layers 120 and 140 may have a stacked structure of two layers like light-emitting layers 140a and 140b, for example. The two light-emitting layers including two kinds of light-emitting materials for emitting different colors of light enable light emissions of a plurality of colors at the same time. It is particularly preferable to select the light-emitting materials of the light-emitting layers so that white light or light of color close to white can be obtained by combining light emissions from the light-emitting layers 120 and 140. Either or both of the light-emitting layers 120 and 140 may have a stacked structure of three or more layers, in which a layer not including a light-emitting material may be included.

The electrode 102 includes a conductive film.

The electrode 103R includes a conductive film 108, the conductive film 104 in contact with a top surface of the conductive film 108, and the conductive film 106R in contact with a top surface of the conductive film 104. The electrode 103G includes the conductive film 108, the conductive film 104 in contact with a top surface of the conductive film 108, and the conductive film 106G in contact with a top surface of the conductive film 104. The electrode 103B includes the conductive film 108, the conductive film 104 in contact with a top surface of the conductive film 108, and the conductive film 106B in contact with a top surface of the conductive film 104.

Each of the light-emitting device 250, the light-emitting device 252, and the light-emitting device 254 has a bottom-emission structure. Thus, each of the electrode 102, the electrode 103R, the electrode 103G, and the electrode 103B preferably has a function of transmitting light, and the electrode 101 has a function of reflecting light.

Each of the light-emitting device 250, the light-emitting device 252, and the light-emitting device 254 includes a partition wall 145 provided between the light-emitting element 222W, the light-emitting element 222R, the light-emitting element 222G, and the light-emitting element 222B. The partition wall 145 has an insulating property. The partition wall 145 covers end portions of the electrode 102, the electrode 103R, the electrode 103G, and the electrode 103B and has openings to overlap with the electrodes. With the partition wall 145, the electrodes provided over the substrate 200 can be separated into island shapes like the electrodes 102, 103R, 103G, and 103B.

The partition wall 145 has an insulating property and is formed using an inorganic or organic material. Examples of the inorganic material include silicon oxide, silicon oxynitride, silicon nitride oxide, silicon nitride, aluminum oxide, and aluminum nitride. Examples of the organic material include photosensitive resin materials such as an acrylic resin and a polyimide resin.

Note that a silicon oxynitride film refers to a film in which the proportion of oxygen is higher than that of nitrogen. The silicon oxynitride film preferably contains oxygen, nitrogen, silicon, and hydrogen in the ranges of 55 atomic % to 65 atomic %, 1 atomic % to 20 atomic %, 25 atomic % to 35 atomic %, and 0.1 atomic % to 10 atomic %, respectively. A silicon nitride oxide film refers to a film in which the proportion of nitrogen is higher than that of oxygen. The silicon nitride oxide film preferably contains nitrogen, oxygen, silicon, and hydrogen in the ranges of 55 atomic % to 65 atomic %, 1 atomic % to 20 atomic %, 25 atomic % to 35 atomic %, and 0.1 atomic % to 10 atomic %, respectively.

When the light-emitting layer 120 includes a light-emitting material having a peak of an emission spectrum in a wavelength range of at least one color selected from violet, blue, and blue green, the light-emitting element 222B can emit blue light. When the light-emitting layer 140 includes a light-emitting material having a peak of an emission spectrum in a wavelength range of at least one color selected from green, yellow green, yellow, yellow orange, orange, and red, the light-emitting element 222G can emit green light, and the light-emitting element 222R can emit red light. The light-emitting device 250, 252, or 254 having such a structure is used in a pixel of a display device, whereby a full-color display device can be fabricated. Note that the thicknesses of the light-emitting layers may be the same or different.

The light-emitting device 250 includes a substrate 220 provided with optical elements 224R, 224G, and 224B in the direction where light emitted from the light-emitting elements 222R, 222G, and 222B is extracted. The light emitted from each light-emitting element is emitted outside the light-emitting device through each optical element. In other words, the light from the light-emitting element 222R, the light from the light-emitting element 222G, and the light from the light-emitting element 222B are emitted through the optical element 224R, the optical element 224G, and the optical element 224B, respectively.

The optical elements 224R, 224G, and 224B each have a function of selectively transmitting light of a specific color out of incident light. For example, the light emitted from the light-emitting element 222R through the optical element 224R is red light, the light emitted from the light-emitting element 222G through the optical element 224G is green light, and the light emitted from the light-emitting element 222B through the optical element 224B is blue light.

For example, a coloring layer (also referred to as color filter), a band pass filter, a multilayer filter, or the like can be used for the optical elements 224R, 224G, and 224B. Alternatively, color conversion elements can be used as the optical elements. A color conversion element is an optical element that converts incident light into light having a longer wavelength than the incident light. As the color conversion elements, quantum-dot elements can be favorably used. The usage of the quantum dot can increase color reproducibility and color purity of the display device.

A plurality of optical elements may also be stacked over each of the optical elements 224R, 224G, and 224B. As another optical element, a circularly polarizing plate, an anti-reflective film, or the like can be provided, for example. A circularly polarizing plate provided on the side where light emitted from the light-emitting device of the display device is extracted can prevent a phenomenon in which light from the outside of the display device is reflected inside the display device and returned to the outside. An anti-reflective film can weaken external light reflected by a surface of the display device. This leads to clear observation of light emitted from the display device.

As the light-emitting device 252 illustrated in FIG. 9, the optical element 224B is not necessarily provided. With a structure without the optical element 224B, the light extraction efficiency from the light-emitting element 222B can be increased. Note that the light-emitting element 222B has a microcavity structure as described later. Thus, among light emitted from the light-emitting element 222B, the intensity of light of a specific wavelength is increased, and the color purity of the light is high enough even in the structure without the optical element 224B.

As the light-emitting device 254 illustrated in FIG. 10, an optical element 224W may be provided in the direction where light emitted from the light-emitting element 222W is extracted. The light emitted from the light-emitting element 222W is emitted outside the light-emitting device through the optical element 224W. With the optical element 224W, light from the light-emitting element 222W can be close to white light or light of a desired color. In addition, the contrast ratio of the light-emitting device can be increased.

In FIG. 8, FIG. 9, and FIG. 10, light emitted from the light-emitting elements (white light or light of color close to white (W), red light (R), and green light (G), and blue light (B)) is schematically denoted by arrows of dashed lines.

A light-blocking layer 223 is provided between the optical elements. The light-blocking layer 223 has a function of blocking light emitted from the adjacent regions. Note that a structure without the light-blocking layer 223 may also be employed.

The light-blocking layer 223 has a function of reducing the reflection of external light. The light-blocking layer 223 has a function of preventing mixture of light emitted from an adjacent light-emitting device. As the light-blocking layer 223, a metal, a resin containing black pigment, carbon black, a metal oxide, a composite oxide containing a solid solution of a plurality of metal oxides, or the like can be used.

The light-emitting element 222W is preferably a light-emitting element without a microcavity structure, and each of the light-emitting element 222R, the light-emitting element 222G, and the light-emitting element 222B is preferably a light-emitting element with a microcavity structure.

Light emitted from the light-emitting layer 120 and the light-emitting layer 140 resonates between a pair of electrodes (e.g., the electrode 101 and the electrode 103R). The light-emitting layer 120 and the light-emitting layer 140 are formed at such a position as to increase the intensity of light of a desired wavelength among light to be emitted. For example, by adjusting the optical length from a reflective region of the electrode 101 to the light-emitting region of the light-emitting layer 120 and the optical length from a reflective region of the electrode 103B to the light-emitting region of the light-emitting layer 120, the intensity of light emitted from the light-emitting layer 120 can be increased. Furthermore, by adjusting the optical length from a reflective region of the electrode 103G or the electrode 103R to the light-emitting region of the light-emitting layer 140 and the optical length from a reflective region of the electrode 101 to the light-emitting region of the light-emitting layer 140, the intensity of light emitted from the light-emitting layer 140 can be increased. In the case of a light-emitting device in which a plurality of light-emitting layers (here, the light-emitting layers 120 and 140) are stacked, each of the optical lengths of the light-emitting layers 120 and 140 is preferably optimized.

For example, in the case where the refractive indexes of the conductive films having a function of reflecting light in the electrodes 101, 103R, 103G, and 103B are lower than the refractive index of the light-emitting layer 120 or 140, the thickness of the conductive film 106R in the electrode 103R is adjusted so that the optical length between the electrode 101 and the electrode 103R is $m_R \lambda_R/2$ ($m_R$ is a natural number and $\lambda_R$ is a wavelength of light intensified in the light-emitting element 222R). Similarly, the thickness of the conductive film 106G in the electrode 103G is adjusted so that the optical length between the electrode 103G and the electrode 101 is $m_G \lambda_G/2$ ($m_G$ is a natural number and $\lambda_G$ is the wavelength of light intensified in the light-emitting element 222G). Furthermore, the thickness of the conductive film 106B in the electrode 103B is adjusted so that the optical length between the electrode 103B and the electrode 101 is $m_B \lambda_B/2$ ($m_B$ is a natural number and $\lambda_B$ is a wavelength of light intensified in the light-emitting element 222B).

In the above-described structure, the wavelength of the intensified light differs among the light-emitting element 222R, the light-emitting element 222G, and the light-emitting element 222B and accordingly the optical length differs among the light-emitting elements.

With the microcavity structure, light emitted from the light-emitting element 222R has a peak of an emission spectrum in the red wavelength range, light emitted from the light-emitting element 222G has a peak of an emission spectrum in the green wavelength range, and light emitted from the light-emitting element 222B has a peak of an emission spectrum in the blue wavelength range.

In the above manner, with the microcavity structure in which the optical length between the pair of electrodes in the respective light-emitting elements is adjusted, scattering and absorption of light in the vicinity of the electrodes can be suppressed, resulting in high extraction of light of a desired wavelength. Furthermore, the intensity of light of a desired wavelength is increased, and this light emission with high color purity can be obtained.

Each of the light-emitting devices 250, 252, and 254 that includes the light-emitting elements 222R, 222G, and 222B each having a microcavity structure and the light-emitting element 222W without a microcavity structure enables light with high color purity and white light or light of a color close to white to be extracted with high light-extraction efficiency. Thus, with the structure of the light-emitting device 250, 252, or 254, a light-emitting device with high color purity and high emission efficiency can be provided.

In the above structure, the conductive film in the electrode 102, the conductive film 106R, the conductive film 106G, and the conductive film 106B preferably have a function of transmitting light. In addition, the conductive film in the electrode 102 and the conductive films 106R, 106G, and 106B may be formed using the same material or different materials.

In addition, it is preferable that the conductive film 104 have functions of transmitting light and reflecting light. Moreover, it is preferable that the electrode 101 have a function of reflecting light.

The conductive film 108 may be formed using the same material as or a different material from that of the conductive film 106R, 106G, or 106B. It is preferable that the conductive films 108, 106R, 106G, and 106B be formed using the same material and the electrodes 103R, 103G, and 103B be formed using the same conductive material because the formation of a pattern in the etching step can be easily performed. In addition, the manufacturing costs of the light-emitting devices 250, 252, and 254 can be reduced. The conductive film 108 may have a stacked structure including two or more layers.

Note that each of the light-emitting devices 250, 252, and 254 is not necessarily provided with the conductive film 108.

When the above-described light-emitting devices 250, 252, and 254 are used for pixels in a display device, the display device can have high color purity and high emission efficiency. In other words, a display device including the light-emitting device 250, 252 or 254 can have low power consumption.

Note that the structures of the light-emitting devices 150, 152, 154 and 156 may be referred to for the other part in the light-emitting devices 250, 252, and 254.

<Structural Example 7 of Light-Emitting Device>

Next, structural examples different from that of the light-emitting device 250 illustrated in FIG. 8 will be described below with reference to FIGS. 11A and 11B.

Figure 11A:
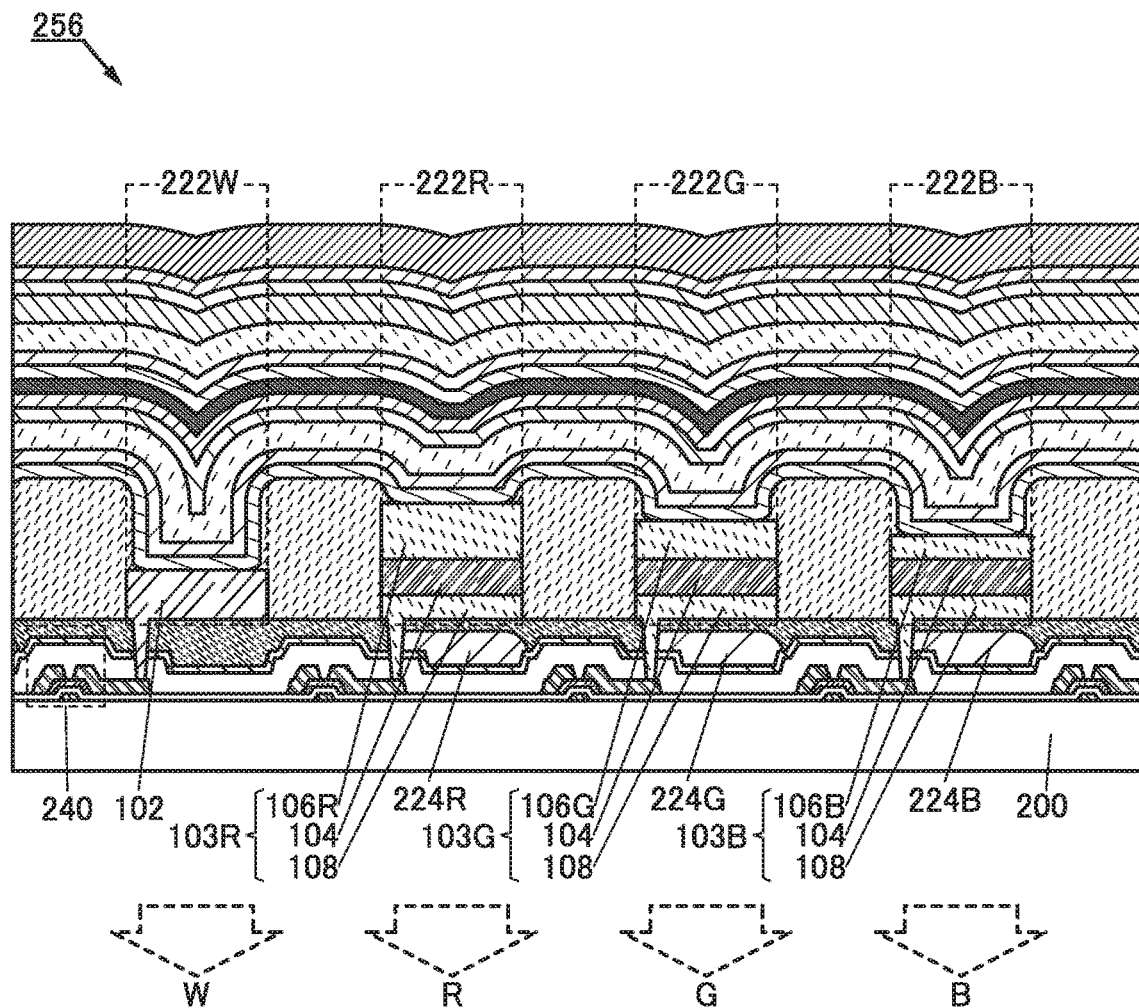
FIGS. 11A and 11B are cross-sectional schematic views of a light-emitting device of one embodiment of the present invention.

FIG. 11A is a cross-sectional schematic view of a light-emitting device of one embodiment of the present invention. In FIG. 11A, a portion having a function similar to that in FIGS. 1 to 10 is represented by the same hatch pattern as in FIGS. 1 to 10 and not especially denoted by a reference numeral in some cases. In addition, common reference numerals are used for portions having similar functions, and a detailed description of the portions is omitted in some cases.

A light-emitting device 256 illustrated in FIG. 11A includes, over the substrate 200, a transistor 240, the light-emitting element 222W, the light-emitting element 222R, the light-emitting element 222G, and the light-emitting element 222B.

The light-emitting element 222W is preferably a light-emitting element without a microcavity structure, and each of the light-emitting element 222R, the light-emitting element 222G, and the light-emitting element 222B is preferably a light-emitting element with a microcavity structure.

When each of the light-emitting element 222R, the light-emitting element 222G, and the light-emitting element 222B has a microcavity structure, each of the conductive film 106R, the conductive film 106G, and the conductive film 106B preferably has a function of transmitting light. In this case, the thickness of the conductive film (the conductive films 106R, 106G, and 106B) is adjusted, whereby the intensity of light of a desired wavelength among light emitted from the light-emitting element (the light-emitting elements 222R, 222G, and 222B) can be increased.

The conductive film 104 preferably has functions of reflecting light and transmitting light.

In the light-emitting device 256, the optical element 224R, the optical element 224G, and the optical element 224B are provided between the transistor 240 and the electrode 103R, between the transistor 240 and the electrode 103G, and between the transistor 240 and the electrode 103B. The light emitted from each light-emitting element is emitted outside the light-emitting device through each optical element. In other words, the light from light-emitting element 222R, the light from the light-emitting element 222G, and the light from the light-emitting element 222B are emitted through the optical element 224R, the optical element 224G, and the optical element 224B, respectively.

When the substrate 200 is provided with the optical element, the thickness of the light-emitting device 256 can be reduced. Moreover, the manufacturing cost of the light-emitting device 256 can be reduced.

The electrode 102, the electrode 103R, the electrode 103G, and the electrode 103B are electrically connected to the transistors 240.

An example of the transistor 240 in the light-emitting device 256 in FIG. 11A is described with reference to FIG. 11B. FIG. 11B is a cross-sectional schematic view of the transistor 240.

Figure 11B:
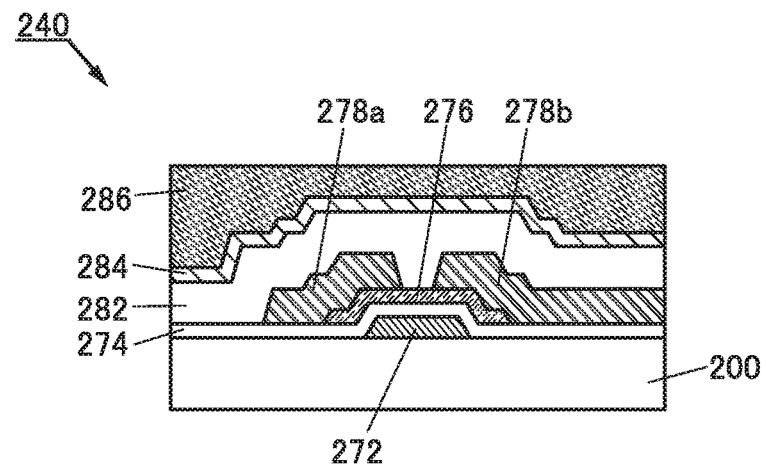

As the transistor 240 in FIG. 11B, for example, a field-effect transistor (FET) can be used. The transistor 240 includes a gate electrode 272 over the substrate 200, a gate insulating layer 274 over the substrate 200 and the gate electrode 272, a semiconductor layer 276 over the gate insulating layer 274, a source electrode 278a over the gate insulating layer 274 and the semiconductor layer 276, and a drain electrode 278b over the gate insulating layer 274 and the semiconductor layer 276. An insulating layer 282 is provided over the transistor 240, an insulating layer 284 is provided over the insulating layer 282, and an insulating layer 286 is provided over the insulating layer 284.

The insulating layer 282 has a region in contact with the semiconductor layer 276. The insulating layer 282 can be formed using an oxide insulating material, for example. The insulating layer 284 has a function of suppressing entry of impurities into the transistor 240. The insulating layer 284 can be formed using a nitride insulating material, for example. The insulating layer 286 has a function of planarizing an unevenness surface and the like due to the transistor 240 and the like. The insulating layer 286 can be formed using an organic insulating material, for example.

An opening is provided in the insulating layer 282, the insulating layer 284, and the insulating layer 286, and the drain electrode 278b of the transistor 240 is electrically connected to the electrode 102, the electrode 103R, the electrode 103G, or the electrode 103B through the opening. When the transistor 240 is driven, current or voltage in the electrode 102, the electrode 103R, the electrode 103G, and the electrode 103B can be controlled. In this manner, an active matrix display device in which the driving of the light-emitting device 256 is controlled by the transistor can be provided.

The structure of the light-emitting device 250 may be referred to for the other part of structure of the light-emitting device 256.

<Components of Light-Emitting Device>

Next, components of a light-emitting device of one embodiment of the present invention are described in detail below.

<<Hole-Injection Layer>>

Each of the hole-injection layers 111 and 116 has a function of reducing a barrier for hole injection from one of the pair of electrodes and the charge-generation layer 115 to promote hole injection and is formed using a transition metal oxide, a phthalocyanine derivative, or an aromatic amine, for example. As the transition metal oxide, molybdenum oxide, vanadium oxide, ruthenium oxide, tungsten oxide, manganese oxide, or the like can be given, for example. As the phthalocyanine derivative, phthalocyanine (abbreviation: $H_2Pc$), metal phthalocyanine such as copper phthalocyanine (abbreviation: CuPC), or the like can be given, for example. As the aromatic amine, a benzidine derivative, a phenylenediamine derivative, or the like can be given. It is also possible to use a high molecular compound such as polythiophene or polyaniline; a typical example thereof is poly(ethylenedioxythiophene)/poly(styrenesulfonic acid) (abbreviation: PEDOT/PSS), which is self-doped polythiophene. In addition, polyvinylcarbazole and a derivative thereof, polyarylene including an aromatic amine skeleton or a π-electron rich heteroaromatic skeleton in a side chain or a main chain and a derivative thereof, and the like are given as examples.

As the hole-injection layer, a layer containing a composite material of a hole-transport material (donor material) and a material having a property of accepting electrons from the hole-transport material can also be used. Alternatively, a stack of a layer containing a material having an electron accepting property and a layer containing a hole-transport material may also be used. In a steady state or in the presence of an electric field, electric charge can be transferred between these materials. As examples of the material having an electron-accepting property, organic acceptors such as a quinodimethane derivative, a chloranil derivative, and a hexaazatriphenylene derivative can be given. A specific example is a compound having an electron-withdrawing group (a halogen group or a cyano group), such as 7,7,8,8-tetracyano-2,3,5,6-tetrafluoroquinodimethane (abbreviation: $F_4$-TCNQ), chloranil, or 2,3,6,7,10,11-hexacyano-1,4,5,8,9,12-hexaazatriphenylene (abbreviation: HAT-CN). Alternatively, a transition metal oxide such as an oxide of a metal from Group 4 to Group 8 can also be used. Specifically, vanadium oxide, niobium oxide, tantalum oxide, chromium oxide, molybdenum oxide, tungsten oxide, manganese oxide, rhenium oxide, or the like can be used. In particular, molybdenum oxide is preferable because it is stable in the air, has a low hygroscopic property, and is easily handled.

A material having a property of transporting more holes than electrons can be used as the hole-transport material, and a material having a hole mobility of $1 \times 10^{-6}$ cm$^2$/Vs or higher is preferable. Specifically, an aromatic amine, a carbazole derivative, an aromatic hydrocarbon, a stilbene derivative, or the like can be used, for example. Furthermore, the hole-transport material may be a high molecular compound.

Examples of the aromatic amine compounds having a high hole-transport property are N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), N,N'-bis{4-[bis(3-methylphenyl)amino]phenyl}-N,N'-diphenyl-(1,1'-biphenyl)-4,4'-diamine (abbreviation: DNTPD), 1,3,5-tris[N-(4-diphenylaminophenyl)-N-phenylamino]benzene (abbreviation: DPA3B), and the like.

Specific examples of the carbazole derivative are 3-[N-(4-diphenylaminophenyl)-N-phenylamino]-9-phenylcarbazole (abbreviation: PCzDPA1), 3,6-bis[N-(4-diphenylaminophenyl)-N-phenylamino]-9-phenylcarbazole (abbreviation: PCzDPA2), 3,6-bis[N-(4-diphenylaminophenyl)-N-(1-naphthyl)amino]-9-phenylcarbazole (abbreviation: PCzTPN2), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), and the like.

Other examples of the carbazole derivative are 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), 1,4-bis[4-(N-carbazolyl)phenyl]-2,3,5,6-tetraphenylbenzene, and the like.

Examples of the aromatic hydrocarbon are 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, and the like. Other examples are pentacene, coronene, and the like. The aromatic hydrocarbon having a hole mobility of $1 \times 10^{-6}$ cm$^2$/Vs or higher and having 14 to 42 carbon atoms is particularly preferable.

The aromatic hydrocarbon may have a vinyl skeleton. As the aromatic hydrocarbon having a vinyl group, the following are given for example: 4,4'-bis(2,2-diphenylvinyl)biphenyl (abbreviation: DPVBi); 9,10-bis[4-(2,2-diphenylvinyl)phenyl]anthracene (abbreviation: DPVPA); and the like.

Other examples are high molecular compounds such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), and poly[N,N'-bis(4-butylphenyl)-N,N'-bis(phenyl)benzidine] (abbreviation: poly-TPD).

Examples of the material having a high hole-transport property are aromatic amine compounds such as 4,4'-bis[N-(1-naphthyl)-N-phenylamino]biphenyl (abbreviation: NPB or a-NPD), N,N'-bis(3-methylphenyl)-N,N'-diphenyl-[1,1'-biphenyl]-4,4'-diamine (abbreviation: TPD), 4,4',4"-tris(carbazol-9-yl)triphenylamine (abbreviation: TCTA), 4,4',4"-tris[N-(1-naphthyl)-N-phenylamino]triphenylamine (abbreviation: 1'-TNATA), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), N-(9,9-dimethyl-9H-fluoren-2-yl)-N-{9,9-dimethyl-2-[N-phenyl-N-(9,9-dimethyl-9H-fluoren-2-yl)amino]-9H-fluoren-7-yl}phenylamine (abbreviation: DFLADFL), N-(9,9-dimethyl-2-diphenylamino-9H-fluoren-7-yl)diphenylamine (abbreviation: DPNF), 2-[N-(4-diphenylaminophenyl)-N-phenylamino]spiro-9,9'-bifluorene (abbreviation: DPASF), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 4-phenyldiphenyl-(9-phenyl-9H-carbazol-3-yl)amine (abbreviation: PCA1BP), N,N'-bis(9-phenylcarbazol-3-yl)-N,N'-diphenylbenzene-1,3-diamine (abbreviation: PCA2B), N,N,N"-triphenyl-N,N,N'-tris(9-phenylcarbazol-3-yl)benzene-1,3,5-triamine (abbreviation: PCA3B), N-(4-biphenyl)-N-(9,9-dimethyl-9H-fluoren-2-yl)-9-phenyl-9H-carbazol-3-amine (abbreviation: PCBiF), N-(1,1'-biphenyl-4-yl)-N-[4-(9-phenyl-9H-carbazol-3-yl)phenyl]-9,9-dimethyl-9H-fluor en-2-amine (abbreviation: PCBBiF), 9,9-dimethyl-N-phenyl-N-[4-(9-phenyl-9H-carbazol-3-yl)phenyl]fluoren-2-amine (abbreviation: PCBAF), N-phenyl-N-[4-(9-phenyl-9H-carbazol-3-yl)phenyl]spiro-9,9'-bifluoren-2-amine (abbreviation: PCBASF), 2-[N-(9-phenylcarbazol-3-yl)-N-phenylamino]spiro-9,9'-bifluorene (abbreviation: PCASF), 2,7-bis[N-(4-diphenylaminophenyl)-N-phenylamino]-spiro-9,9'-bifluorene (abbreviation: DPA2SF), N-[4-(9H-carbazol-9-yl)phenyl]-N-(4-phenyl)phenylaniline (abbreviation: YGA1BP), and N,N'-bis[4-(carbazol-9-yl)phenyl]-N,N'-diphenyl-9,9-dimethylfluorene-2,7-diamine (abbreviation: YGA2F). Other examples are amine compounds, carbazole compounds, thiophene compounds, furan compounds, fluorene compounds; triphenylene compounds; phenanthrene compounds, and the like such as 3-[4-(1-naphthyl)-phenyl]-9-phenyl-9H-carbazole (abbreviation: PCPN), 3-[4-(9-phenanthryl)-phenyl]-9-phenyl-9H-carbazole (abbreviation: PCPPn), 3,3'-bis(9-phenyl-9H-carbazole) (abbreviation: PCCP), 1,3-bis(N-carbazolyl)benzene (abbreviation: mCP), 3,6-bis(3,5-diphenylphenyl)-9-phenylcarbazole (abbreviation: CzTP), 4-{3-[3-(9-phenyl-9H-fluoren-9-yl)phenyl]phenyl}dibenzofuran (abbreviation: mmDBFFLBi-II), 4,4',4"-(benzene-1,3,5-triyl)tri(dibenzofuran) (abbreviation: DBF3P-II), 1,3,5-tri(dibenzothiophen-4-yl)-benzene (abbreviated as DBT3P-II), 2,8-diphenyl-4-[4-(9-phenyl-9H-fluoren-9-yl)phenyl]dibenzothiophene (abbreviation: DBTFLP-III), 4-[4-(9-phenyl-9H-fluoren-9-yl)phenyl]-6-phenyldibenzothiophene (abbreviation: DBTFLP-IV), and 4-[3-(triphenylen-2-yl)phenyl]dibenzothiophene (abbreviation: mDBTPTp-II). The substances listed here are mainly ones that have a hole mobility of $1\times10^{-6}$ cm$^2$/Vs or higher. Note that other than these substances, any substance that has a property of transporting more holes than electrons may be used.

<<Hole-Transport Layer>>

The hole-transport layer 112 and 117 contain a hole-transport material. As hole-transport material, any of the materials for the hole-injection layer described above can be used. In order that the hole-transport layer has a function of transporting holes injected into the hole-injection layer to the light-emitting layer, the highest occupied molecular orbital (HOMO) level of the hole-transport layer is preferably equal or close to the HOMO level of the hole-injection layer.

The hole-transport material described above preferably has a hole mobility of $1\times10^{-6}$ cm$^2$/Vs or higher. Note that other than these substances, any substance that has a property of transporting more holes than electrons may be used. Note that the hole-transport layer is not limited to a single layer and may be a stack of two or more layers including any of the above-mentioned substances.

<<Electron-Injection Layer>>

Each of the electron-injection layers 114 and 119 has a function of reducing a barrier for electron injection from one of the pair of electrodes and the charge-generation layer 115 to promote electron injection and can be formed using a Group 1 metal or a Group 2 metal, or an oxide, a halide, or a carbonate of any of the metals, for example. Alternatively, a composite material containing an electron-transport material and a material having a property of donating electrons to the electron-transport material can also be used. As the material having an electron-donating property, a Group 1 metal, a Group 2 metal, an oxide of any of these metals, or the like can be given. Specific examples are an alkali metal, an alkaline earth metal, and a compound thereof, such as lithium fluoride (LiF), cesium fluoride (CsF), calcium fluoride (CaF$_2$), and lithium oxide (LiOx). A rare earth metal compound like erbium fluoride (ErF$_3$) can also be used. Electride may also be used for the electron-injection layer. Examples of the electride include a substance in which electrons are added at high concentration to calcium oxide-aluminum oxide.

The electron-injection layers may be formed using a composite material in which an organic material (acceptor material) and an electron donor (donor material) are mixed. The composite material is superior in an electron-injection property and an electron-transport property, since electrons are generated in the organic material by the electron donor. The organic compound here is preferably a material excellent in transporting the generated electrons (electron-transport material); specifically, for example, an electron-transport material such as a metal complex or a heteroaromatic compound can be used. As the electron donor, a substance showing an electron-donating property with respect to the organic compound may be used. Specifically, an alkali metal, an alkaline earth metal, and a rare earth metal are preferable, and for example, lithium, cesium, magnesium, calcium, erbium, ytterbium, and the like can be given. Further, an alkali metal oxide or an alkaline earth metal oxide is preferable, and for example, lithium oxide, calcium oxide, barium oxide, and the like can be given. Alternatively, Lewis base such as magnesium oxide can be used. An organic material such as tetrathiafulvalene (abbreviation: TTF) can also be used.

As the electron-transport material, a material having a property of transporting more electrons than holes can be used, and a material having an electron mobility of $1\times10^{-6}$ cm$^2$/Vs or higher is preferable. A z-electron deficient heteroaromatic compound such as a nitrogen-containing heteroaromatic compound, a metal complex, or the like can be used. Specific examples include a metal complex having a quinoline ligand, a benzoquinoline ligand, an oxazole ligand, and a thiazole ligand. Other examples include an oxadiazole derivative, a triazole derivative, a phenanthroline derivative, a pyridine derivative, a bipyridine derivative, a pyrimidine derivative, and the like.

Specific examples include metal complexes having a quinoline or benzoquinoline skeleton, such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato) (4-phenylphenolato)aluminum(III) (abbreviation: BAlq) and bis(8-quinolinolato)zinc(II) (abbreviation: Znq), and the like. Alternatively, a metal complex having an oxazole-based or thiazole-based ligand, such as bis[2-(2-benzoxazolyl)phenolato]zinc(II) (abbreviation: ZnPBO) or bis[2-(2-benzothiazolyl)phenolato]zinc(II) (abbreviation: ZnBTZ) can be used. Other than such metal complexes, any of the following can be used: heterocyclic compounds such as 2-(4-biphenylyl)-5-(4-tert-butylphenyl)-1,3,4-oxadiazole (abbreviation: PBD), 1,3-bis [5-(p-tert-butylphenyl)-1,3,4-oxadiazol-2-yl]benzene (abbreviation: OXD-7), 9-[4-(5-phenyl-1,3,4-oxadiazol-2-yl) phenyl]-9H-carbazole (abbreviation: CO11), 3-(4-biphenylyl)-4-phenyl-5-(4-tert-butylphenyl)-1,2,4-triazole (abbreviation: TAZ), 2,2',2"-(1,3,5-benzenetriyl)tris(1-phenyl-1H-benzimidazole) (abbreviation: TPBI), 2-[3-(dibenzothiophen-4-yl)phenyl]-1-phenyl-1H-benzimidazole (abbreviation: mDBTBIm-II), bathophenanthroline (abbreviation: BPhen), and bathocuproine (abbreviation: BCP); heterocyclic compounds having a diazine skeleton such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl) biphenyl-3-yl]dibenzo[f,h]quinoxaline (abbreviation: 2mCzBPDBq), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation: 7mDBTPDBq-II), 6-[3-(dibenzothiophen-4-yl)phenyl]dibenzo[f,h]quinoxaline (abbreviation: 6mDBTPDBq-II), 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), and 4,6-bis[3-(9H-carbazol-9-yl)phenyl]pyrimidine (abbreviation: 4,6mCzP2Pm); heterocyclic compounds having a triazine skeleton such as 2-{4-[3-(N-phenyl-9H-carbazol-3-yl)-9H-carbazol-9-yl]phenyl}-4,6-diphenyl-1,3,5-triazine (abbreviation: PCCzPTzn); heterocyclic compounds having a pyridine skeleton such as 3,5-bis[3-(9H-carbazol-9-yl)phenyl]pyridine (abbreviation: 35DCzPPy) and 1,3,5-tris[3-(3-pyridyl)-phenyl]benzene (abbreviation: TmPyPB); and heteroaromatic compounds such as 4,4'-bis(5-methylbenzoxazol-2-yl)stilbene (abbreviation: BzOs). Further alternatively, a high molecular compound such as poly(2,5-pyridinediyl) (abbreviation: PPy), poly[(9,9-dihexylfluorene-2,7-diyl)-co-(pyridine-3,5-diyl)] (abbreviation: PF-Py) or poly[(9,9-dioctylfluorene-2,7-diyl)-co-(2,2'-bipyridine-6,6'-diyl)] (abbreviation: PF-BPy) can be used. The substances listed here are mainly ones that have an electron mobility of $1\times10^{-6}$ cm$^2$/Vs or higher. However, any substance other than the above-described substances may be used as long as it is a substance whose electron-transport property is higher than the hole-transport property.

<<Electron-Transport Layer>>

Each of the electron-transport layers 113 and 118 has a function of transporting, to the light-emitting layer, electrons injected from the other of the pair of electrodes through the electron-injection layer 119. A material having a property of transporting more electrons than holes can be used as an electron-transport material, and a material having an electron mobility of $1\times10^{-6}$ cm$^2$/Vs or higher is preferable. As the electron-transport material, a z-electron deficient heteroaromatic compound such as a nitrogen-containing heteroaromatic compound, a metal complex, or the like can be used, for example. Specifically, there are metal complexes having a quinoline ligand, a benzoquinoline ligand, an oxazole ligand, and a thiazole ligand, which are described as the electron-transport materials that can be used in the electron-injection layer. In addition, an oxadiazole derivative, a triazole derivative, a phenanthroline derivative, a pyridine derivative, a bipyridine derivative, a pyrimidine derivative, and the like can be given. Note that a substance other than the above substances may be used as long as it has a higher electron-transport property than a hole-transport property. The electron-transport layer is not limited to a single layer and may include two or more stacking layers containing the above substances.

A layer for controlling transport of electron carriers may be provided between the electron-transport layer and the light-emitting layer. This is a layer formed by addition of a small amount of a substance having a high electron-trapping property to a material having a high electron-transport property as described above, and the layer is capable of adjusting carrier balance by suppressing transport of electron carriers. Such a structure is very effective in preventing a problem (such as a reduction in element lifetime) caused when electrons pass through the light-emitting layer.

An n-type compound semiconductor may also be used, and an oxide such as titanium oxide, zinc oxide, silicon oxide, tin oxide, tungsten oxide, tantalum oxide, barium titanate, barium zirconate, zirconium oxide, hafnium oxide, aluminum oxide, yttrium oxide, or zirconium silicate; a nitride such as silicon nitride; cadmium sulfide; zinc selenide; or zinc sulfide can be used, for example.

<<Light-Emitting Layer>>

One of the light-emitting layers 120 and 140 includes a light-emitting material having a peak of an emission spectrum in a wavelength range of at least one color selected from violet, blue, and blue green. The other thereof includes a light-emitting material having a peak of an emission spectrum in a wavelength range of at least one color selected from green, yellow green, yellow, yellow orange, orange, and red. Each light-emitting layer includes a host material in addition to the light-emitting material. The host material preferably includes one or both of an electron-transport material and a hole-transport material.

As the light-emitting material used in the light-emitting layer, a light-emitting material having a function of converting the singlet excitation energy into light emission or a light-emitting material having a function of converting the triplet excitation energy into light emission can be used. Examples of the light-emitting materials are given below.

Examples of the light-emitting material having a function of converting singlet excitation energy into light emission include substances that emit fluorescence (fluorescent compound). Although there is no particular limitation on the fluorescent compound, an anthracene derivative, a tetracene derivative, a chrysene derivative, a phenanthrene derivative, a pyrene derivative, a perylene derivative, a stilbene derivative, an acridone derivative, a coumarin derivative, a phenoxazine derivative, a phenothiazine derivative, or the like is preferably used, and for example, any of the following substances can be used.

Specifically, examples of such materials include 5,6-bis [4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), 4-(10-phenyl-9-anthryl)-4'-(9-phenyl-9H-carbazol-3-yl)triphenylamine (abbreviation:

PCBAPA), 4-[4-(10-phenyl-9-anthryl)phenyl]-4'-(9-phenyl-9H-carbazol-3-yl)triphenylamine (abbreviation: PCBAPBA), perylene, 2,5,8,11-tetra(tert-butyl)perylene (abbreviation: TBP), N,N'-diphenyl-N,N'-bis[4-(9-phenyl-9H-fluoren-9-yl)phenyl]pyrene-1,6-diamine (abbreviation: 1,6FLPAPrn), N,N'-bis(3-methylphenyl)-N,N'-bis[3-(9-phenyl-9H-fluoren-9-yl)phenyl]-pyrene-1,6-diamine (abbreviation 1,6mMemFLPAPrn), N,N'-bis(dibenzofuran-2-yl)-N,N'-diphenylpyrene-1,6-diamine (abbreviation: 1,6FrAPrn), N,N'-bis(dibenzothiophen-2-yl)-N,N'-diphenylpyrene-1,6-diamine (abbreviation: 1,6ThAPrn), N,N'-(2-tert-butylanthracene-9,10-diyldi-4,1-phenylene)bis[N,N',N'-triphenyl-1,4-phen ylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N',N'',N''',N'''-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-(9,10-diphenyl-2-anthryl)-N,N',N'-triphenyl-1,4-phenylenediamine (abbreviation: 2DPAPA), N,N,9-triphenylanthracen-9-amine (abbreviation: DPhAPhA), coumarin 6, coumarin 545T, N,N'-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM), and 5,10,15,20-tetraphenylbisbenzo[5,6]indeno[1,2,3-cd:1',2',3'-lm]perylene.

As the light-emitting material having a function of converting triplet excitation energy into light emission (phosphorescent compound), an iridium-, rhodium-, or platinum-based organometallic complex or metal complex can be used; in particular, an organoiridium complex such as an iridium-based ortho-metalated complex is preferable. As an ortho-metalated ligand, a 4H-triazole ligand, a 1H-triazole ligand, an imidazole ligand, a pyridine ligand, a pyrimidine ligand, a pyrazine ligand, an isoquinoline ligand, or the like can be given. As the metal complex, a platinum complex having a porphyrin ligand or the like can be given.

Examples of the substance that has an emission peak in the blue or green wavelength range include organometallic iridium complexes having a 4H-triazole skeleton, such as tris{2-[5-(2-methylphenyl)-4-(2,6-dimethylphenyl)-4H-1,2,4-triazol-3-yl-κN2]phenyl-κC}iridium(III) (abbreviation: Ir(mpptz-dmp)$_3$), tris(5-methyl-3,4-diphenyl-4H-1,2,4-triazolato)iridium(III) (abbreviation: Ir(Mptz)$_3$), tris[4-(3-biphenyl)-5-isopropyl-3-phenyl-4H-1,2,4-triazolato]iridium (III) (abbreviation: Ir(iPrptz-3b)$_3$), and tris[3-(5-biphenyl)-5-isopropyl-4-phenyl-4H-1,2,4-triazolato]iridium(III) (abbreviation: Ir(iPr5btz)$_3$); organometallic iridium complexes having a 1H-triazole skeleton, such as tris[3-methyl-1-(2-methylphenyl)-5-phenyl-1H-1,2,4-triazolato]iridium (III) (abbreviation: Ir(Mptz1-mp)$_3$) and tris(1-methyl-5-phenyl-3-propyl-TH-1,2,4-triazolato)iridium(III) (abbreviation: Ir(Prptz1-Me)$_3$); organometallic iridium complexes having an imidazole skeleton, such as fac-tris[1-(2,6-diisopropylphenyl)-2-phenyl-1H-imidazole]iridium(III) (abbreviation: Ir(iPrpmi)$_3$) and tris[3-(2,6-dimethylphenyl)-7-methylimidazo[1,2-f]phenanthridinato]iridium(III) (abbreviation: Ir(dmpimpt-Me)$_3$); and organometallic iridium complexes in which a phenylpyridine derivative having an electron-withdrawing group is a ligand, such as bis[2-(4',6'-difluorophenyl)pyridinato-N,C$^{2'}$]iridium(III) tetrakis(1-pyrazolyl)borate (abbreviation: FIr6), bis[2-(4',6'-difluorophenyl)pyridinato-N,C$^{2'}$]iridium(III) picolinate (abbreviation: FIrpic), bis{2-[3',5'-bis(trifluoromethyl)phenyl]pyridinato-N,C$^{2'}$}iridium(III)picolinate (abbreviation: Ir(CF$_3$ppy)$_2$(pic)), and bis[2-(4',6'-difluorophenyl)pyridinato-N,C$^{2'}$]iridium(III) acetylacetonate (abbreviation: FIr(acac)). Among the materials given above, the organometallic iridium complexes having a 4H-triazole skeleton have high reliability and high emission efficiency and are thus especially preferable.

Examples of the substance that has an emission peak in the green or yellow wavelength range include organometallic iridium complexes having a pyrimidine skeleton, such as tris(4-methyl-6-phenylpyrimidinato)iridium(III) (abbreviation: Ir(mppm)$_3$), tris(4-t-butyl-6-phenylpyrimidinato)iridium(III) (abbreviation: Ir(tBuppm)$_3$), (acetylacetonato)bis(6-methyl-4-phenylpyrimidinato)iridium(III) (abbreviation: Ir(mppm)$_2$(acac)), (acetylacetonato)bis(6-tert-butyl-4-phenylpyrimidinato)iridium(III) (abbreviation: Ir(tBuppm)$_2$(acac)), (acetylacetonato)bis[4-(2-norbornyl)-6-phenylpyrimidinato]iridium(III) (abbreviation: Ir(nbppm)$_2$(acac)), (acetylacetonato)bis[5-methyl-6-(2-methylphenyl)-4-phenylpyrimidinato]iridium(III) (abbreviation: Ir(mpmppm)$_2$(acac)), (acetylacetonato)bis{4,6-dimethyl-2-[6-(2,6-dimethylphenyl)-4-pyrimidinyl-κN3]phenyl-κC}iridium(III) (abbreviation: Ir(dmppm-dmp)$_2$(acac)), (acetylacetonato)bis(4,6-diphenylpyrimidinato)iridium(III) (abbreviation: Ir(dppm)$_2$(acac)); organometallic iridium complexes having a pyrazine skeleton, such as (acetylacetonato)bis(3,5-dimethyl-2-phenylpyrazinato)iridium(III) (abbreviation: Ir(mppr-Me)$_2$(acac)) and (acetylacetonato)bis(5-isopropyl-3-methyl-2-phenylpyrazinato)iridium(III) (abbreviation: Ir(mppr-iPr)$_2$(acac)); organometallic iridium complexes having a pyridine skeleton, such as tris(2-phenylpyridinato-N,C$^{2'}$)iridium(III) (abbreviation: Ir(ppy)$_3$), bis(2-phenylpyridinato-N,C$^{2'}$)iridium(III)acetylacetonate (abbreviation:Ir(ppy)$_2$(acac)), bis(benzo[h]quinolinato)iridium(III) acetylacetonate (abbreviation: Ir(bzq)$_2$(acac)), tris(benzo[h]quinolinato)iridium(III) (abbreviation: Ir(bzq)$_3$), tris(2-phenylquinolinato-N,C$^{2'}$)iridium(III) (abbreviation: Ir(pq)$_3$), and bis(2-phenylquinolinato-N,C$^{2'}$)iridium(III) acetylacetonate (abbreviation: Ir(pq)$_2$(acac)); organometallic iridium complexes such as bis(2,4-diphenyl-1,3-oxazolato-N,C$^{2'}$)iridium(III) acetylacetonate (abbreviation: Ir(dpo)$_2$(acac)), bis{2-[4'-(perfluorophenyl)phenyl]pyridinato-N,C$^{2'}$}iridium(III) acetylacetonate (abbreviation: Ir(p-PF-ph)$_2$(acac)), and bis(2-phenylbenzothiazolato-N,C$^{2'}$) iridium(III) acetylacetonate (abbreviation: Ir(bt)$_2$(acac)); and a rare earth metal complex such as tris(acetylacetonato)(monophenanthroline)terbium(III)(abbreviation: Tb(acac)$_3$ (Phen)). Among the materials given above, the organometallic iridium complexes having a pyrimidine skeleton have distinctively high reliability and emission efficiency and are thus particularly preferable.

Examples of the substance that has an emission peak in the yellow or red wavelength range include organometallic iridium complexes having a pyrimidine skeleton, such as (diisobutyrylmethanato)bis[4,6-bis(3-methylphenyl)pyrimidinato]iridium(III) (abbreviation: Ir(5mdppm)$_2$(dibm)), bis[4,6-bis(3-methylphenyl)pyrimidinato](dipivaloylmethanato)iridium(III) (abbreviation: Ir(5mdppm)$_2$(dpm)), and (dipivaloylmethanato)bis[4,6-di(naphthalen-1-yl)pyrimidinato]iridium(III) (abbreviation: Ir(dlnpm)$_2$(dpm)); organometallic iridium complexes having a pyrazine skeleton, such as (acetylacetonato)bis(2,3,5-triphenylpyrazinato)iridium (III) (abbreviation: Ir(tppr)$_2$(acac)), bis(2,3,5-triphenylpyrazinato)(dipivaloylmethanato)iridium(III) (abbreviation: Ir(tppr)$_2$(dpm)), and (acetylacetonato)bis[2,3-bis(4-fluorophenyl)quinoxalinato]iridium(III) (abbreviation: Ir(Fdpq)$_2$(acac)); organometallic iridium complexes having a pyridine skeleton, such as tris(1-phenylisoquinolinato-N,C$^{2'}$)iridium(III) (abbreviation: Ir(piq)$_3$) and bis(1-phenylisoquinolinato-N,C$^{2'}$)iridium(III) acetylacetonate (abbreviation: Ir(piq)$_2$(acac)); a platinum complex such as 2,3,7,8,12,13,17,18-octaethyl-21H,23H-porphyrin platinum(II) (abbreviation: PtOEP); and rare earth metal complexes such as tris(1,3-diphenyl-1,3-propanedionato)(monophenanthroline)europium(III) (abbreviation: Eu(DBM)$_3$(Phen)) and tris[1-(2-thenoyl)-3,3,3-trifluoroacetonato](monophenanthroline)europium(III) (abbreviation: Eu(TTA)$_3$(Phen)). Among the materials given above, the organometallic iridium complexes having a pyrimidine skeleton have distinctively high reliability and emission efficiency and are thus particularly preferable. Furthermore, the organometallic iridium complexes having a pyrazine skeleton can provide red light emission with favorable chromaticity.

Although there is no particular limitation on a material that can be used as a host material of the light-emitting layer, for example, any of the following substances can be used for the host material: metal complexes such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2"-(1,3,5-benzenetriyl)tris(1-phenyl-1H-benzimidazole) (abbreviation: TPBI), bathophenanthroline (abbreviation: Bphen), bathocuproine (abbreviation: BCP), and 9-[4-(5-phenyl-1,3,4-oxadiazol-2-yl)phenyl]-9H-carbazole (abbreviation: CO11); and aromatic amine compounds such as NPB, TPD, and BSPB. In addition, condensed polycyclic aromatic compounds such as anthracene derivatives, phenanthrene derivatives, pyrene derivatives, chrysene derivatives, and dibenzo[g,p]chrysene derivatives can be used. Specific examples of the condensed polycyclic aromatic compound include 9,10-diphenylanthracene (abbreviation: DPAnth), N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), YGAPA, PCAPA, N,9-diphenyl-N-{4-[4-(10-phenyl-9-anthryl)phenyl]phenyl}-9H-carbazol-3-amine (abbreviation: PCAPBA), 2PCAPA, 6,12-dimethoxy-5,11-diphenylchrysene, DBC1, 9-[4-(10-phenyl-9-anthracenyl)phenyl]-9H-carbazole (abbreviation: CzPA), 3,6-diphenyl-9-[4-(10-phenyl-9-anthryl)phenyl]-9H-carbazole (abbreviation: DPCzPA), 9-phenyl-3-[4-(10-phenyl-9-anthryl)phenyl]-9H-carbazole (abbreviation: PCzPA), 7-[4-(10-phenyl-9-anthryl)phenyl]-7H-dibenzo[c,g]carbazole (abbreviation: cgDBCzPA), 6-[3-(9,10-diphenyl-2-anthryl)phenyl]-benzo[b]naphtho[1,2-d]furan (abbreviation: 2mBnfPPA), 9-phenyl-10-{4-(9-phenyl-9H-fluoren-9-yl)biphenyl-4'-yl}anthracene (abbreviation: FLPPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 1,3,5-tri(1-pyrenyl)benzene (abbreviation: TPB3), 5,12-diphenyltetracene, 5,12-bis(biphenyl-2-yl)tetracene, and the like. One or more substances having a wider energy gap than the above-described light-emitting material is preferably selected from these substances and a variety of substances. Moreover, in the case where the light-emitting material emits phosphorescence, a substance having triplet excitation energy (energy difference between a ground state and a triplet excited state) which is higher than that of the light-emitting material is preferably selected as the host material.

In the case where a plurality of materials are used as the host material of the light-emitting layer, it is preferable to use a combination of two kinds of compounds which form an exciplex. In this case, a variety of carrier-transport materials can be used as appropriate. In order to form an exciplex efficiently, it is particularly preferable to combine an electron-transport material and a hole-transport material.

This is because in the case where the combination of an electron-transport material and a hole-transport material which form an exciplex is used as a host material, the carrier balance between holes and electrons in the light-emitting layer can be easily optimized by adjustment of the mixture ratio of the electron-transport material and the hole-transport material. The optimization of the carrier balance between holes and electrons in the light-emitting layer can prevent a region in which electrons and holes are recombined from existing on one side in the light-emitting layer. By preventing the region in which electrons and holes are recombined from existing on one side, the reliability of the light-emitting element can be improved.

As the electron-transport material, a π-electron deficient heteroaromatic compound such as a nitrogen-containing heteroaromatic compound, a metal complex, or the like can be used. Specifically, an electron-transport material that can be used for an electron-injection layer or an electron-transport layer can be used. Among such materials, heterocyclic compounds having a pyridine skeleton, a diazine skeleton, or a triazine skeleton have high reliability and are thus preferable. Heterocyclic compounds having a diazine (pyrimidine or pyrazine) skeleton or a triazine skeleton have a high electron-transport property and contribute to a reduction in drive voltage.

As the hole-transport material, a π-electron rich heteroaromatic compound (e.g., a carbazole derivative or an indole derivative), an aromatic amine compound, or the like can be favorably used. Specifically, the hole-transport material that can be used for the hole-injection layer or the hole-transport layer can be used. Among such materials, a compound having an aromatic amine skeleton and a compound having a carbazole skeleton are preferable because these compounds are highly reliable and have high hole-transport properties to contribute to a reduction in drive voltage.

Note that the combination of the materials which form an exciplex and is used as a host material is not limited to the above-described compounds, as long as they can transport carriers, the combination can form an exciplex, and light emission of the exciplex overlaps with an absorption band on the longest wavelength side in an absorption spectrum of a light-emitting substance (an absorption corresponding to the transition of the light-emitting substance from the singlet ground state to the singlet excited state), and other materials may be used.

In order that the above-described hole-transport material and the electron-transport material efficiently form an exciplex, it is preferable that the HOMO level of the hole-transport material be higher than that of the electron-transport material and the lowest unoccupied molecular orbital (LUMO) level of the hole-transport material be higher than the LUMO level of the electron-transport material. Specifically, the difference between the HOMO level of the hole-transport material and the HOMO level of the electron-transport material is preferably 0.05 eV or more, further preferably 0.1 eV or more, and still further preferably 0.2 eV or more. In addition, the difference between the LUMO level of the hole-transport material and the LUMO level of the electron-transport material is preferably 0.05 eV or more, further preferably 0.1 eV or more, and still further preferably 0.2 eV or more.

As the light-emitting material or host material of the light-emitting layer, a thermally activated delayed fluorescent (TADF) substance may be used. The thermally activated delayed fluorescent substance is a material having a small difference between the level of the triplet excitation energy and the level of the singlet excitation energy and a function of converting triplet excitation energy into singlet excitation energy by reverse intersystem crossing. Conditions for efficiently obtaining thermally activated delayed fluorescence are as follows: the energy difference between the S1 level and the T1 level is preferably greater than 0 eV and less than or equal to 0.3 eV, further preferably greater than 0 eV and less than or equal to 0.2 eV, still further preferably greater than 0 eV and less than or equal to 0.1 eV.

The thermally activated delayed fluorescent substance may be composed of one kind of material or a plurality of materials. For example, in the case where the thermally activated delayed fluorescent substance is composed of one kind of material, any of the following materials can be used, for example.

First, a fullerene, a derivative thereof, an acridine derivative such as proflavine, eosin, and the like can be given. Furthermore, a metal-containing porphyrin, such as a porphyrin containing magnesium (Mg), zinc (Zn), cadmium (Cd), tin (Sn), platinum (Pt), indium (In), or palladium (Pd), can be given. Examples of the metal-containing porphyrin include a protoporphyrin-tin fluoride complex ($SnF_2$(Proto IX)), a mesoporphyrin-tin fluoride complex ($SnF_2$(Meso IX)), a hematoporphyrin-tin fluoride complex ($SnF_2$(Hemato IX)), a coproporphyrin tetramethyl ester-tin fluoride complex ($SnF_2$(Copro III-4Me)), an octaethylporphyrin-tin fluoride complex ($SnF_2$(OEP)), an etioporphyrin-tin fluoride complex ($SnF_2$(Etio I)), and an octaethylporphyrin-platinum chloride complex ($PtCl_2$OEP).

Alternatively, a heterocyclic compound having a π-electron rich heteroaromatic ring and a π-electron deficient heteroaromatic ring, such as 2-(biphenyl-4-yl)-4,6-bis(12-phenylindolo[2,3-a]carbazol-11-yl)-1,3,5-triazine (abbreviation: PIC-TRZ), 2-{4-[3-(N-phenyl-9H-carbazol-3-yl)-9H-carbazol-9-yl]phenyl}-4,6-diphenyl-1,3,5-triazine (abbreviation: PCCzPTzn), 2-[4-(10H-phenoxazin-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), or 10-phenyl-10H,10'H-spiro[acridin-9,9'-anthracen]-10'-one (abbreviation: ACRSA), can be used for example as the thermally activated delayed fluorescent substance composed of one kind of material. The heterocyclic compound is preferably used because of the π-electron rich heteroaromatic ring and the π-electron deficient heteroaromatic ring, for which the electron-transport property and the hole-transport property are high. Note that a substance in which the π-electron rich heteroaromatic ring is directly bonded to the π-electron deficient heteroaromatic ring is particularly preferably used because the donor property of the π-electron rich heteroaromatic ring and the acceptor property of the π-electron deficient heteroaromatic ring are both increased and the difference between the level of the singlet excitation energy and the level of the triplet excitation energy becomes small.

In the case where the thermally activated delayed fluorescent substance is used as the host material, it is preferable to use a combination of two kinds of materials which form an exciplex. In this case, it is particularly preferable to use the above-described combination of an electron-transport material and a hole-transport material, which forms an exciplex.

In one of both of the light-emitting layer 120 and the light-emitting layer 140, a material other than the host material and the light-emitting material may be contained.

Note that the light-emitting layer, the hole-injection layer, the hole-transport layer, the electron-transport layer, the electron-injection layer, and the charge-generation layer described above can each be formed by an evaporation method (including a vacuum evaporation method), an ink-jet method, a coating method, a nozzle-printing method, a gravure printing method, or the like. Besides the above-mentioned materials, an inorganic compound such as a quantum dot or a high molecular compound (e.g., an oligomer, a dendrimer, or a polymer) may be used in the light-emitting layer, the hole-injection layer, the hole-transport layer, the electron-transport layer, and the electron-injection layer.

As a light-emitting material, a quantum dot can be used. A quantum dot is a semiconductor nanocrystal with a size of several nanometers to several tens of nanometers and contains approximately $1\times10^3$ to $1\times10^6$ atoms. Since energy shift of quantum dots depend on their size, quantum dots made of the same substance emit light with different wavelengths depending on their size. Thus, emission wavelengths can be easily adjusted by changing the size of quantum dots.

Since a quantum dot has an emission spectrum with a narrow peak, emission with high color purity can be obtained. In addition, a quantum dot is said to have a theoretical internal quantum efficiency of 100%, which far exceeds that of a fluorescent organic compound, i.e., 25%, and is comparable to that of a phosphorescent organic compound. Therefore, a quantum dot can be used as a light-emitting material to obtain a light-emitting element having high luminous efficiency. Furthermore, since a quantum dot which is an inorganic material has high inherent stability, a light-emitting element which is favorable also in terms of lifetime can be obtained.

Examples of a material of a quantum dot include a Group 14 element in the periodic table, a Group 15 element in the periodic table, a Group 16 element in the periodic table, a compound of a plurality of Group 14 elements in the periodic table, a compound of an element belonging to any of Groups 4 to 14 in the periodic table and a Group 16 element in the periodic table, a compound of a Group 2 element in the periodic table and a Group 16 element in the periodic table, a compound of a Group 13 element in the periodic table and a Group 15 element in the periodic table, a compound of a Group 13 element in the periodic table and a Group 17 element in the periodic table, a compound of a Group 14 element in the periodic table and a Group 15 element in the periodic table, a compound of a Group 11 element in the periodic table and a Group 17 element in the periodic table, iron oxides, titanium oxides, spinel chalcogenides, and semiconductor clusters.

Specific examples include, but are not limited to, cadmium selenide (CdSe); cadmium sulfide (CdS); cadmium telluride (CdTe); zinc selenide (ZnSe); zinc oxide (ZnO); zinc sulfide (ZnS); zinc telluride (ZnTe); mercury sulfide (HgS); mercury selenide (HgSe); mercury telluride (HgTe); indium arsenide (InAs); indium phosphide (InP); gallium arsenide (GaAs); gallium phosphide (GaP); indium nitride (InN); gallium nitride (GaN); indium antimonide (InSb); gallium antimonide (GaSb); aluminum phosphide (AlP); aluminum arsenide (AlAs); aluminum antimonide (AlSb); lead(II) selenide (PbSe); lead(II) telluride (PbTe); lead(II) sulfide (PbS); indium selenide ($In_2Se_3$); indium telluride ($In_2Te_3$); indium sulfide ($In_2S_3$); gallium selenide ($Ga_2Se_3$); arsenic(III) sulfide ($As_2S_3$); arsenic(III) selenide ($As_2Se_3$); arsenic(III) telluride ($As_2Te_3$); antimony(III) sulfide ($Sb_2S_3$); antimony(III) selenide ($Sb_2Se_3$); antimony(III) telluride ($Sb_2Te_3$); bismuth(III) sulfide ($Bi_2S_3$); bismuth(III) selenide ($Bi_2Se_3$); bismuth(III) telluride ($Bi_2Te_3$); silicon (Si); silicon carbide (SiC); germanium (Ge); tin (Sn); selenium (Se); tellurium (Te); boron (B); carbon (C); phosphorus (P); boron nitride (BN); boron phosphide (BP); boron arsenide (BAs); aluminum nitride (AN); aluminum sulfide ($A_2S_3$); barium sulfide (BaS); barium selenide (BaSe); barium telluride (BaTe); calcium sulfide (CaS); calcium selenide (CaSe); calcium telluride (CaTe); beryllium sulfide (BeS); beryllium selenide (BeSe); beryllium telluride (BeTe); magnesium sulfide (MgS); magnesium selenide (MgSe); germanium sulfide (GeS); germanium selenide (GeSe); germanium telluride (GeTe); tin(IV) sulfide ($SnS_2$); tin(II) sulfide (SnS); tin(II) selenide (SnSe); tin(II) telluride (SnTe); lead(II) oxide (PbO); copper(I) fluoride (CuF); copper(I) chloride (CuCl); copper(I) bromide (CuBr); copper(I) iodide (CuI); copper(I) oxide ($Cu_2O$); copper(I) selenide ($Cu_2Se$); nickel(II) oxide (NiO); cobalt(II) oxide (CO); cobalt(II) sulfide (CoS); triiron tetraoxide ($Fe_3O_4$); iron(II) sulfide (FeS); manganese(II) oxide (MnO); molybdenum (IV) sulfide ($MoS_2$); vanadium(II) oxide (VO); vanadium (IV) oxide ($VO_2$); tungsten(IV) oxide ($WO_2$); tantalum(V) oxide ($Ta_2O_5$); titanium oxide (e.g., $TiO_2$, $Ti_2O_5$, $Ti_2O_3$, or $Ti_5O_9$); zirconium oxide ($ZrO_2$); silicon nitride ($Si_3N_4$); germanium nitride ($Ge_3N_4$); aluminum oxide ($Al_2O_3$); barium titanate ($BaTiO_3$); a compound of selenium, zinc, and cadmium (CdZnSe); a compound of indium, arsenic, and phosphorus (InAsP); a compound of cadmium, selenium, and sulfur (CdSeS); a compound of cadmium, selenium, and tellurium (CdSeTe); a compound of zinc, cadmium, and selenium (ZnCdSe); a compound of indium, gallium, and arsenic (InGaAs); a compound of indium, gallium, and selenium (InGaSe); a compound of indium, selenium, and sulfur (InSeS); a compound of copper, indium, and sulfur (e.g., $CuInS_2$); and combinations thereof. What is called an alloyed quantum dot, whose composition is represented by a given ratio, may be used. For example, an alloyed quantum dot represented by $CdS_xSe_{1-x}$ (where x is any number between 0 and 1 inclusive) is a means effective in obtaining blue light because the emission wavelength can be changed by changing x.

As the quantum dot, any of a core-type quantum dot, a core-shell quantum dot, a core-multishell quantum dot, and the like can be used. Note that when a core is covered with a shell formed of another inorganic material having a wider band gap, the influence of defects and dangling bonds existing at the surface of a nanocrystal can be reduced. Since such a structure can significantly improve the quantum efficiency of light emission, it is preferable to use a core-shell or core-multishell quantum dot. Examples of the material of a shell include zinc sulfide (ZnS) and zinc oxide (ZnO).

Quantum dots have a high proportion of surface atoms and thus have high reactivity and easily cohere together. For this reason, it is preferable that a protective agent be attached to, or a protective group be provided at the surfaces of quantum dots. The attachment of the protective agent or the provision of the protective group can prevent cohesion and increase solubility in a solvent. It can also reduce reactivity and improve electrical stability. Examples of the protective agent (or the protective group) include polyoxyethylene alkyl ethers such as polyoxyethylene lauryl ether, polyoxyethylene stearyl ether, and polyoxyethylene oleyl ether; trialkylphosphines such as tripropylphosphine, tributylphosphine, trihexylphosphine, and trioctylphosphine; polyoxyethylene alkylphenyl ethers such as polyoxyethylene n-octylphenyl ether and polyoxyethylene n-nonylphenyl ether; tertiary amines such as tri(n-hexyl)amine, tri(n-octyl)amine, and tri(n-decyl)amine; organophosphorus compounds such as tripropylphosphine oxide, tributylphosphine oxide, trihexylphosphine oxide, trioctylphosphine oxide, and tridecylphosphine oxide; polyethylene glycol diesters such as polyethylene glycol dilaurate and polyethylene glycol distearate; organic nitrogen compounds such as nitrogen-containing aromatic compounds, e.g., pyridines, lutidines, collidines, and quinolines; aminoalkanes such as hexylamine, octylamine, decylamine, dodecylamine, tetradecylamine, hexadecylamine, and octadecylamine; dialkylsulfides such as dibutylsulfide; dialkylsulfoxides such as dimethylsulfoxide and dibutylsulfoxide; organic sulfur compounds such as sulfur-containing aromatic compounds, e.g., thiophene; higher fatty acids such as a palmitin acid, a stearic acid, and an oleic acid; alcohols; sorbitan fatty acid esters; fatty acid modified polyesters; tertiary amine modified polyurethanes; and polyethyleneimines.

The quantum dots may be quantum rods, which are rod-like shape quantum dots. A quantum rod emits directional light polarized in the c-axis direction; thus, quantum rods can be used as a light-emitting material to obtain a light-emitting element with higher external quantum efficiency.

In the case of using quantum dots as the light-emitting material in the light-emitting layer, the thickness of the light-emitting layer is set to 3 nm to 100 nm, preferably 10 nm to 100 nm, and the light-emitting layer is made to contain 1 volume % to 100 volume % of the quantum dots. Note that it is preferable that the light-emitting layer be composed of the quantum dots. To form a light-emitting layer in which the quantum dots are dispersed as light-emitting materials in host materials, the quantum dots may be dispersed in the host materials, or the host materials and the quantum dots may be dissolved or dispersed in an appropriate liquid medium, and then a wet process (e.g., a spin coating method, a casting method, a die coating method, blade coating method, a roll coating method, an ink-jet method, a printing method, a spray coating method, a curtain coating method, or a Langmuir-Blodgett method) may be employed.

An example of the liquid medium used for the wet process is an organic solvent of ketones such as methyl ethyl ketone and cyclohexanone; fatty acid esters such as ethyl acetate; halogenated hydrocarbons such as dichlorobenzene; aromatic hydrocarbons such as toluene, xylene, mesitylene, and cyclohexylbenzene; aliphatic hydrocarbons such as cyclohexane, decalin, and dodecane; dimethylformamide (DMF); dimethyl sulfoxide (DMSO); or the like.

Examples of the high molecular compound that can be used for the light-emitting layer include a phenylenevinylene (PPV) derivative such as poly[2-methoxy-5-(2-ethylhexyloxy)-1,4-phenylenevinylene] (abbreviation: MEH-PPV) or poly(2,5-dioctyl-1,4-phenylenevinylene); a polyfluorene derivative such as poly(9,9-di-n-octylfluorenyl-2,7-diyl) (abbreviation: PF8), poly[(9,9-di-n-octylfluorenyl-2,7-diyl)-alt-(benzo[2,1,3]thiadiazole-4,8-diyl)](abbreviation: F8BT), poly(9,9-di-n-octylfluorenyl-2,7-diyl)-alt-(2,2'-bithiophene-5,5'-diyl)] (abbreviation: F8T2), poly[(9,9-dioctyl-2,7-divinylenefluorenylene)-alt-(9,10-anthracene)], or poly[(9,9-dihexylfluorene-2,7-diyl)-alt-(2,5-dimethyl-1,4-phenylene)]; a polyalkylthiophene (PAT) derivative such as poly(3-hexylthiophen-2,5-diyl) (abbreviation: P3HT); and a polyphenylene derivative. These high molecular compounds, poly(9-vinylcarbazole) (abbreviation: PVK), poly(2-vinylnaphthalene), poly[bis(4-phenyl) (2,4,6-trimethylphenyl)amine] (abbreviation: PTAA), or the like may be doped with a light-emitting low molecular compound and used for the light-emitting layer. As the light-emitting low molecular compound, any of the above-described light-emitting materials can be used.

<<Charge-Generation Layer>>

The charge-generation layer 115 may have either a structure in which an acceptor substance that is an electron acceptor is added to a hole-transport material or a structure in which a donor substance that is an electron donor is added to an electron-transport material. Alternatively, both of these structures may be stacked.

In the case where the charge-generation layer 115 contains a composite material of an organic compound and an acceptor substance, the composite material that can be used for the hole-injection layer may be used for the composite material. As the organic compound, a variety of compounds such as an aromatic amine compound, a carbazole compound, an aromatic hydrocarbon, and a high molecular compound (such as an oligomer, a dendrimer, or a polymer) can be used. An organic compound having a hole mobility of $1\times10^{-6}$ cm$^2$/Vs or higher is preferably used as the organic compound. Note that any other material may be used as long as it has a property of transporting more holes than electrons. Since the composite material of an organic compound and an acceptor substance has excellent carrier-injection and carrier-transport properties, low-voltage driving or low-current driving can be realized.

The charge-generation layer 115 may have a stacked structure of a layer containing the composite material of an organic compound and an acceptor substance and a layer containing another material. For example, the charge-generation layer 115 may be formed using a combination of a layer containing the composite material of an organic compound and an acceptor substance with a layer containing one compound selected from among donor materials and a compound having a high electron-transport property. Furthermore, the charge-generation layer 115 may be formed using a combination of a layer containing the composite material of an organic compound and an acceptor substance with a layer containing a transparent conductive material.

Note that in terms of light extraction efficiency, the charge-generation layer 115 preferably has a visible light transmittance (specifically, a visible light transmittance of higher than or equal to 40% with respect to the charge-generation layer 115). The charge-generation layer 115 functions even if it has lower conductivity than the pair of electrodes.

Forming the charge-generation layer 115 by using any of the above materials can suppress an increase in drive voltage caused by the stack of the light-emitting layers.

<<Pair of Electrodes>>

Each of the electrode 101, the electrode 102, and the electrode 103 (the electrode 103R, the electrode 103G, and the electrode 103B) has a function of injecting holes or electrons to the light-emitting layer. The electrode 101, the electrode 102, and the electrode 103 (the electrode 103R, the electrode 103G, and the electrode 103B) can be formed using a metal, an alloy, a conductive compound, a mixture thereof, or a stacked body thereof. A typical example of the metal is aluminum (Al); besides, a transition metal such as silver (Ag), tungsten, chromium, molybdenum, copper, or titanium, an alkali metal such as lithium (Li) or cesium, or a Group 2 metal such as calcium or magnesium (Mg) can be used. As the transition metal, a rare earth metal such as ytterbium (Yb) may be used. An alloy containing any of the above metals can be used as the alloy, and MgAg and AlLi can be given as examples. Examples of the conductive compound include metal oxides such as indium tin oxide (hereinafter, referred to as ITO), indium tin oxide containing silicon or silicon oxide (ITSO), indium oxide-zinc oxide (indium zinc oxide), indium oxide containing tungsten oxide and zinc oxide, and the like. It is also possible to use an inorganic carbon-based material such as graphene as the conductive compound. As described above, the electrode may be formed by stacking two or more of these materials.

Light emitted from the light-emitting layer is extracted through one of both of the electrodes. Thus, at least the electrode 102 and the electrode 103 (the electrode 103R, the electrode 103G, and the electrode 103B) have a function of transmitting visible light. As the conductive material transmitting light, a conductive material having a visible light transmittance higher than or equal to 40% and lower than or equal to 100%, preferably higher than or equal to 60% and lower than or equal to 100%, and a resistivity lower than or equal to $1\times10^2$ Ω·cm can be used. Furthermore, the conductive film 104 in the electrode 103 (the electrode 103R, the electrode 103G, and the electrode 103B) is preferably formed using a conductive material having functions of transmitting light and reflecting light. As the conductive material, a conductive material having a visible light reflectivity higher than or equal to 20% and lower than or equal to 80%, preferably higher than or equal to 40% and lower than or equal to 70%, and a resistivity lower than or equal to $1\times10^{-2}$ Ω·cm can be used. In the case where a material with low light transmittance, such as metal or alloy, is used, the conductive film 104 is formed to a thickness that is thin enough to transmit visible light (e.g., a thickness greater than or equal to 1 nm and less than or equal to 30 nm).

In this specification and the like, a material that transmits visible light and has conductivity is preferably used for the electrode 103 and the conductive film 106 (the conductive film 106R, the conductive film 106G, and the conductive film 106B). Examples of the material include, in addition to the above-described oxide conductor layer typified by an ITO, an oxide semiconductor layer and an organic conductor layer containing an organic substance. Examples of the organic conductive layer containing an organic substance include a layer containing a composite material in which an organic material (acceptor material) and an electron donor (donor material) are mixed and a layer containing a composite material in which an organic material (donor material) and an electron acceptor (acceptor material) are mixed. The resistivity of the transparent conductive film is preferably lower than or equal to $1\times10^5$ Ω·cm, further preferably lower than or equal to $1\times10^4$ Ω·cm.

As the method for forming the electrode 101, the electrode 102, and the electrode 103 (the electrode 103R, the electrode 103G, and the electrode 103B), a sputtering method, an evaporation method, a printing method, a coating method, a molecular beam epitaxy (MBE) method, a CVD method, a pulsed laser deposition method, an atomic layer deposition (ALD) method, or the like can be used as appropriate.

<<Substrate>>

A light-emitting device in one embodiment of the present invention may be formed over a substrate of glass, plastic, or the like. As the way of stacking layers over the substrate, layers may be sequentially stacked from the electrode 101 side or sequentially stacked from the electrode 102 side.

For the substrate over which the light-emitting device of one embodiment of the present invention can be formed, glass, quartz, plastic, or the like can be used, for example. Alternatively, a flexible substrate can be used. The flexible substrate is a substrate that can be bent, such as a plastic substrate made of polycarbonate or polyarylate, for example. A film, an inorganic film formed by evaporation, or the like can also be used. Another material may be used as long as the substrate functions as a support in a manufacturing process of the light-emitting device or the optical element. Another material having a function of protecting the light-emitting device or the optical element may be used.

In this specification and the like, a light-emitting device can be formed using any of a variety of substrates, for example. The type of a substrate is not limited particularly. Examples of the substrate include a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, cellulose nanofiber (CNF) and paper which include a fibrous material, a base material film, and the like. As an example of a glass substrate, a barium borosilicate glass substrate, an aluminoborosilicate glass substrate, a soda lime glass substrate, or the like can be given. Examples of the flexible substrate, the attachment film, the base material film, and the like are substrates of plastics typified by polyethylene terephthalate (PET), polyethylene naphthalate (PEN), polyether sulfone (PES), and polytetrafluoroethylene (PTFE). Another example is a resin such as acrylic. Alternatively, polypropylene, polyester, polyvinyl fluoride, polyvinyl chloride, or the like can be used. Alternatively, polyamide, polyimide, aramid, epoxy, an inorganic vapor deposition film, paper, or the like can be used. Specifically, the use of semiconductor substrates, single crystal substrates, SOI substrates, or the like enables the manufacture of small-sized transistors with a small variation in characteristics, size, shape, or the like and with high current capability. A circuit using such transistors achieves lower power consumption of the circuit or higher integration of the circuit.

Alternatively, a flexible substrate may be used as the substrate, and a transistor or a light-emitting device may be provided directly on the flexible substrate. Further alternatively, a separation layer may be provided between the substrate and the light-emitting device. The separation layer can be used when part or the whole of a light-emitting device formed over the separation layer is separated from the substrate and transferred onto another substrate. In such a case, the light-emitting device can be transferred to a substrate having low heat resistance or a flexible substrate as well. For the above separation layer, a stack including inorganic films, which are a tungsten film and a silicon oxide film, or a structure in which a resin film of polyimide or the like is formed over a substrate can be used, for example.

In other words, after the light-emitting device is formed using a substrate, the light-emitting device may be transferred to another substrate. Examples of a substrate to which the light-emitting device is transferred include, in addition to the above-described substrates, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester, or the like), a leather substrate, and a rubber substrate. When such a substrate is used, a light-emitting device with high durability, high heat resistance, reduced weight, or reduced thickness can be formed.

The light-emitting device may be formed over an electrode electrically connected to a field-effect transistor (FET), for example, which is formed over any of the above-described substrates. Accordingly, an active matrix display device in which the FET controls the driving of the light-emitting device can be manufactured.

<Method for Fabricating Light-Emitting Device>

Next, a method for manufacturing a light-emitting device of one embodiment of the present invention will be described below with reference to FIGS. 12A to 12C and FIGS. 13A to 13C. Here, a method for manufacturing the light-emitting device 250 illustrated in FIG. 8 will be described.

FIGS. 12A to 12C and FIGS. 13A to 13C are cross-sectional views for explaining the manufacturing method of the light-emitting device of one embodiment of the present invention.

The method for manufacturing the light-emitting device 250 described below includes first to seventh steps.

<<First Step>>

Figure 12A:
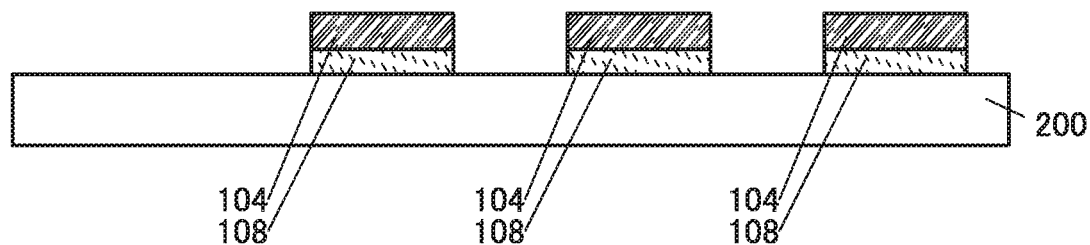
FIGS. 12A to 12C are cross-sectional schematic views of a method for manufacturing a light-emitting device of one embodiment of the present invention.
Figure 12B:
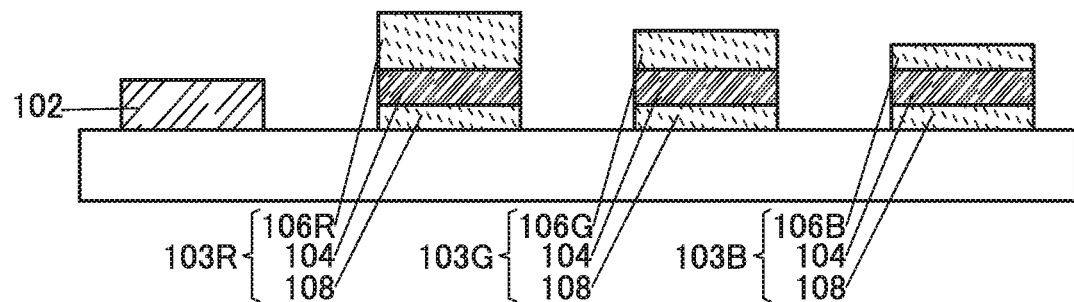

In the first step, part of electrodes (specifically, the conductive film 108 and the conductive film 104 included in the electrode 103R, the electrode 103G, and the electrode 103B) of the light-emitting device is formed over the substrate 200 (see FIG. 12A).

In this embodiment, a transmissive conductive film and a reflective conductive film are sequentially formed over the substrate 200 and processed into a desired shape; whereby the conductive films 108 and 104 are formed. As the transmissive conductive film and the reflective conductive film, for example, ITSO and an alloy film of silver, palladium, and copper (also referred to as Ag—Pd—Cu film or APC film) are used, respectively. The conductive films 108 and 104 are preferably formed and processed through one process in the above manner because the manufacturing cost can be reduced.

Note that a transistor may be formed over the substrate 200 before the first step. The transistor and the conductive film 108 may be electrically connected to each other.

<<Second Step>>

In the second step, a conductive film that is to be the electrode 102 over the substrate 200, the conductive film 106R over the conductive film 104 included in the electrode 103R, the conductive film 106G over the conductive film 104 included in the electrode 103G, and the conductive film 106B over the conductive film 104 included in the electrode 103B are formed. The conductive films 106R, 106G, and the 106B are formed over the conductive film 104 formed in the first step, whereby the electrode 103R, the electrode 103G, and the electrode 103B are formed. In this embodiment, an ITSO film is used for the conductive film that is to be the electrode 102, the conductive film 106R, the conductive film 106G, and the conductive film 106B (see FIG. 12B).

Note that the conductive film that is to be the electrode 102, the conductive film 106R, the conductive film 106G, and the conductive film 106B may be formed separately through a plurality of steps in the second step. When the electrode 102 and the conductive films are formed through a plurality of steps, the conductive film 106R, the conductive film 106G, and the conductive film 106B can be formed to have thicknesses suitable for the respective light-emitting elements with a microcavity structure.

Alternatively, the electrode 102 may be formed concurrently with any one or a plurality of the conductive film 108, the conductive film 106R, the conductive film 106G, and the conductive film 106B through one step or the plurality of steps.

<<Third Step>>

Figure 12C:
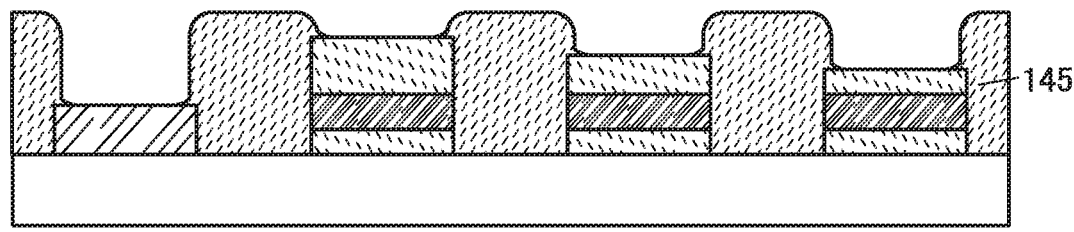

In the third step, the partition wall 145 that covers end portions of the electrodes of the light-emitting device is formed (see FIG. 12C).

The partition wall 145 includes an opening overlapping with the electrode. The conductive film exposed by the opening functions as the anode of the light-emitting device. As the partition wall 145, a polyimide-based resin is used in this embodiment.

In the first to third steps, since there is no possibility of damaging the EL layer (a layer containing an organic compound), a variety of film formation methods and micromachining technologies can be employed. In this embodiment, after the transmissive and reflective conductive films are formed by a sputtering method, a pattern of the conductive films are formed by a lithography method, and then the conductive film is processed into island shapes by a wet etching method to form the electrodes 102, 103R, 103G, and 103B.

<<Fourth Step>>

Figure 13A:
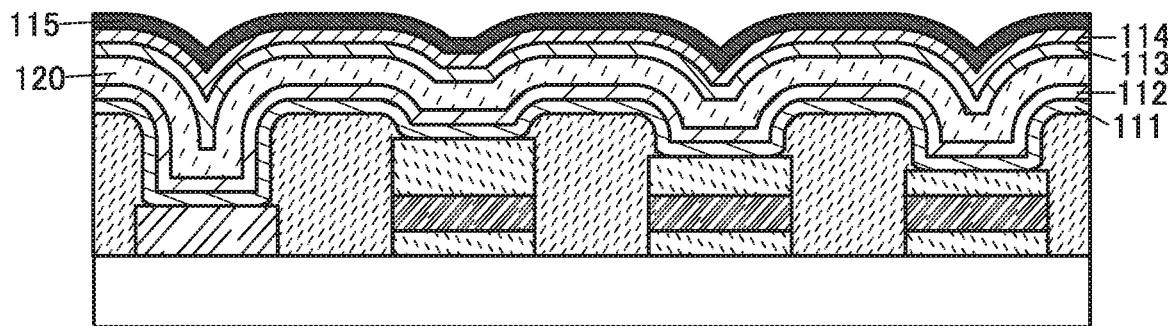
FIGS. 13A to 13C are cross-sectional schematic views of a method for manufacturing a light-emitting device of one embodiment of the present invention.

In the fourth step, the hole-injection layer 111, the hole-transport layer 112, the light-emitting layer 120, the electron-transport layer 113, the electron-injection layer 114, and the charge-generation layer 115 are formed (see FIG. 13A).

The hole-injection layer 111 can be formed by co-evaporating a hole-transport material and a material containing an acceptor substance. Note that co-evaporation is an evaporation method in which a plurality of different substances is concurrently vaporized from different evaporation sources.

Note that the hole-injection layer 111 may be formed through a plurality of steps. When the hole-injection layer 111 is formed in a plurality of steps, is can be formed to have a thickness which enables light-emitting elements to have a microcavity structure.

The hole-transport layer 112 can be formed by evaporating a hole-transport material.

The light-emitting layer 120 can be formed by evaporating the first light-emitting material that emits light having a wavelength for at least one color selected from violet, blue, and blue green. As the first light-emitting material, a fluorescent organic compound can be used. The fluorescent organic compound may be evaporated alone or the fluorescent organic compound mixed with another material may be evaporated. For example, the fluorescent organic compound may be used as a guest material, and the guest material may be dispersed into a host material having higher excitation energy than the guest material and evaporated.

The electron-transport layer 113 can be formed by evaporating a substance having a high electron-transport property. The electron-injection layer 114 can be formed by evaporating a substance having a high electron-injection property.

The charge-generation layer 115 can be formed by evaporating a material obtained by adding an electron acceptor (acceptor) to a hole-transport material or a material obtained by adding an electron donor (donor) to an electron-transport material.

<<Fifth Step>>

Figure 13B:
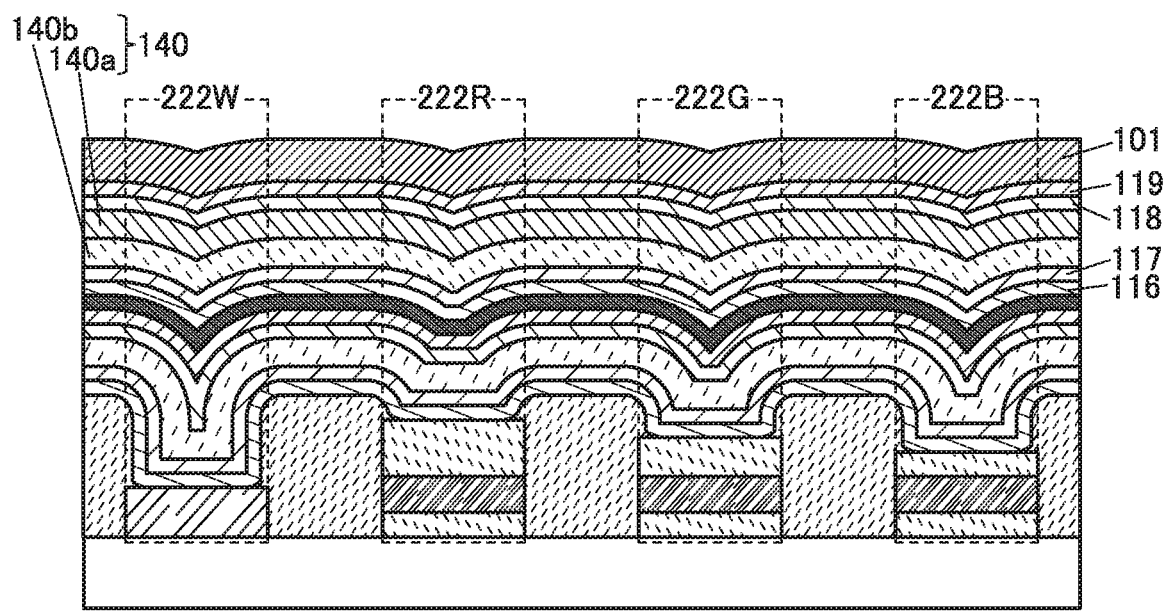

In the fifth step, the hole-injection layer 116, the hole-transport layer 117, the light-emitting layer 140, the electron-transport layer 118, the electron-injection layer 119, and the electrode 101 are formed (see FIG. 13B).

The hole-injection layer 116 can be formed by using a material and a method which are similar to those of the hole-injection layer 111. The hole-transport layer 117 can be formed by using a material and a method which are similar to those of the hole-transport layer 112.

The light-emitting layer 140 can be formed by evaporating a second light-emitting material that emits light having a wavelength for at least one color selected from green, yellow green, yellow, orange, and red. As the second light-emitting material, a phosphorescent organic compound can be used. The phosphorescent organic compound may be evaporated alone or the phosphorescent organic compound mixed with another material may be evaporated. For example, the phosphorescent organic compound may be used as a guest material, and the guest material may be dispersed into a host material having higher excitation energy than the guest material and evaporated. The light-emitting layer 140 may have a two-layer structure. In such a case, the two light-emitting layers each preferably contain a light-emitting material that emits light of a different color.

The electron-transport layer 118 can be formed by evaporating a substance having a high electron-transport property. The electron-injection layer 119 can be formed by evaporating a substance having a high electron-injection property.

The electrode 101 can be formed using a reflective conductive film. The electrode 101 may have a single-layer structure or a stacked structure.

Through the above step, the light-emitting device including the light-emitting element 222W over the electrode 102, the light-emitting element 222R over the electrode 103R, the light-emitting element 222G over the electrode 103G, and the light-emitting element 222B over the electrode 103B is formed over the substrate 200.

<<Sixth Step>>

Figure 13C:
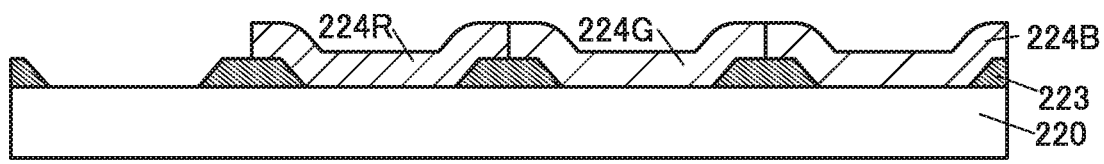

In the sixth step, the light-blocking layer 223, the optical element 224R, the optical element 224G, and the optical element 224B are formed over the substrate 220 (see FIG. 13C).

As the light-blocking layer 223, a resin film containing black pigment is formed in a desired region. Then, the optical element 224R, the optical element 224G, and the optical element 224B are formed over the substrate 220 and the light-blocking layer 223. As the optical element 224R, a resin film containing red pigment is formed in a desired region. As the optical element 224G, a resin film containing green pigment is formed in a desired region. As the optical element 224B, a resin film containing blue pigment is formed in a desired region.

<<Seventh Step>>

In the seventh step, the light-emitting element formed over the substrate 200 is attached to the light-blocking layer 223, the optical element 224R, the optical element 224G, and the optical element 224B formed over the substrate 220, and sealed with a sealant (not illustrated).

Through the above-described steps, the light-emitting device 250 illustrated in FIG. 8 can be formed.

In Embodiment 1, one embodiment of the present invention has been described. Other embodiments of the present invention are described in Embodiments 2 to 9. Note that one embodiment of the present invention is not limited to the above examples. In other words, various embodiments of the invention are described in this embodiment and the other embodiments, and one embodiment of the present invention is not limited to a particular embodiment. The example in which one embodiment of the present invention is applied to the light-emitting device is described; however, one embodiment of the present invention is not limited thereto. For example, depending on circumstances or conditions, one embodiment of the present invention is not necessarily used in a light-emitting device. For example, this embodiment shows the following example. The first light-emitting element includes the light-emitting layer and the first and second electrodes; the second light-emitting element includes the light-emitting layer and the first and third electrodes; the second electrode includes only the first conductive film; the third electrode includes the second conductive film and the third conductive film; the first electrode has a function of reflecting light; the first conductive film and the third conductive film have a function of transmitting light; and the second conductive film has functions of reflecting light and transmitting light. However, one embodiment of the present invention is not limited to this example. Depending on circumstances or conditions, for example, the second light-emitting element does not necessarily include the second conductive film or the third conductive film in one embodiment of the present invention. Alternatively, the first light-emitting element may include the second conductive film or the third conductive film. The light-emitting layers may be formed by a separate coloring method.

The structure described above in this embodiment can be combined with any of the structures described in the other embodiments as appropriate.

Embodiment 2

In this embodiment, a light-emitting element that can be employed for the light-emitting device described in Embodiment 1 and light emission mechanisms of the light-emitting element will be described below with reference to FIGS. 14A to 14C, FIGS. 15A and 15B, and FIGS. 16A to 16C. In FIGS. 14A to 14C, FIGS. 15A and 15B, and FIGS. 16A to 16C, a portion having a function similar to that in FIGS. 1 to 13 is represented by the same hatch pattern as in FIGS. 1 to 13 and not especially denoted by a reference numeral in some cases. In addition, common reference numerals are used for portions having similar functions, and a detailed description of the portions is omitted in some cases.

<Structure Example 1 of Light-Emitting Element>

Figure 14A:
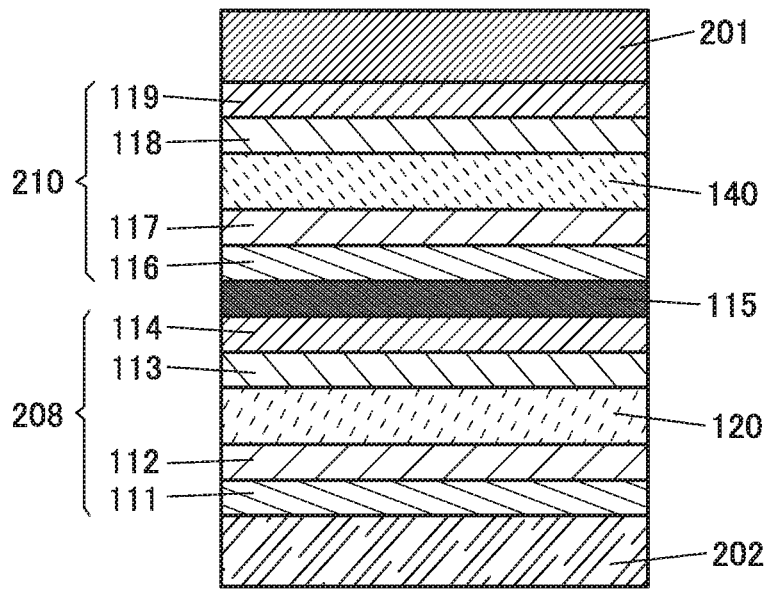
FIGS. 14A and 14B are cross-sectional schematic views of a light-emitting element of one embodiment of the present invention.

FIG. 14A is a schematic cross-sectional view of a light-emitting element 260.

The light-emitting element 260 illustrated in FIG. 14A includes a plurality of light-emitting units (the light-emitting unit 208 and the light-emitting unit 210 in FIG. 14A) between a pair of electrodes (an electrode 201 and an electrode 202). One of light-emitting units preferably has the same structure as the EL layer 100. Note that the electrode 201 functions as an anode and the electrode 202 functions as a cathode in the following description of the light-emitting element 260; however, the functions may be interchanged in the light-emitting element 260. For the electrode 202, the structure of the electrode 102 or the electrode 103 (the electrode 103R, the electrode 103G, and the electrode 103B) described in Embodiment 1 may be employed. For the electrode 201, the structure of the electrode 101 described in Embodiment 1 may be employed.

In the light-emitting element 260 illustrated in FIG. 14A, the light-emitting unit 208 and the light-emitting unit 210 are stacked, and the charge-generation layer 115 is provided between the light-emitting unit 208 and the light-emitting unit 210. Note that the light-emitting unit 208 and the light-emitting unit 210 may have the same structure or different structures.

The light-emitting element 260 includes the light-emitting layer 120 and the light-emitting layer 140. The light-emitting unit 208 includes the hole-injection layer 111, the hole-transport layer 112, the electron-transport layer 113, and the electron-injection layer 114 in addition to the light-emitting layer 120. The light-emitting unit 210 includes the hole-injection layer 116, the hole-transport layer 117, the electron-transport layer 118, and the electron-injection layer 119 in addition to the light-emitting layer 140.

Note that when a surface of a light-emitting unit on the anode side is in contact with the charge-generation layer 115, the charge-generation layer 115 can also serve as a hole-injection layer or a hole-transport layer of the light-emitting unit; thus, a hole-injection layer or a hole-transport layer is not necessarily included in the light-emitting unit. Alternatively, when a surface of the light-emitting unit on the cathode side is in contact with the charge-generation layer 115, the charge-generation layer 115 can also serve as an electron-injection layer or an electron-transport layer of the light-emitting unit; thus, an electron-injection layer or an electron-transport layer is not necessarily included in the light-emitting unit.

The charge-generation layer 115 provided between the light-emitting unit 208 and the light-emitting unit 210 may have any structure as long as electrons can be injected to the light-emitting unit on one side and holes can be injected into the light-emitting unit on the other side when a voltage is applied between the electrode 201 and the electrode 202. For example, in FIG. 14A, the charge-generation layer 115 injects electrons into the light-emitting unit 208 and holes into the light-emitting unit 210 when a voltage is applied such that the potential of the electrode 202 is higher than that of the electrode 201.

The light-emitting element having two light-emitting units has been described with reference to FIG. 14A; however, a similar structure can be applied to a light-emitting element in which three or more light-emitting units are stacked. With a plurality of light-emitting units partitioned by the charge-generation layer between a pair of electrodes as in the light-emitting element 260, it is possible to provide a light-emitting element which can emit light with high luminance with the current density kept low and has a long lifetime. In addition, a light-emitting element with low power consumption can be achieved.

Figure 14B:
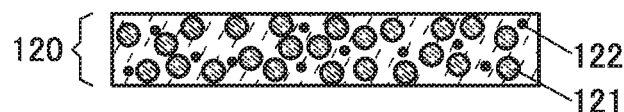
Figure 15A:
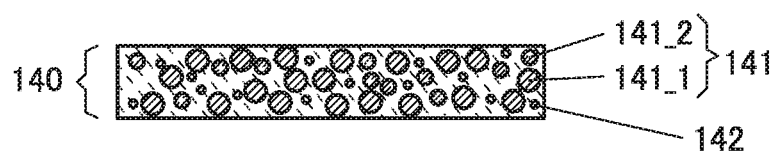
FIG. 15A is a cross-sectional schematic view of a light-emitting element of one embodiment of the present invention.

The light-emitting layer 120 included in the light-emitting unit 208 contains a host material 121 and a guest material 122 as illustrated in FIG. 14B. Note that the guest material 122 is described below as a fluorescent compound. The light-emitting layer 140 included in the light-emitting unit 210 includes a host material 141 and a guest material 142 as illustrated in FIG. 15A. The host material 141 includes an organic compound 141_1 and an organic compound 141_2. In the following description, the guest material 142 included in the light-emitting layer 140 is a phosphorescent compound.

<<Light Emission Mechanism of Light-Emitting Layer 120>>

The light emission mechanism of the light-emitting layer 120 is described below.

By recombination of the electrons and holes injected from the pair of electrodes (the electrode 201 and the electrode 202) or the charge-generation layer 115 in the light-emitting layer 120, excitons are formed. Because the amount of the host materials 121 is larger than that of the guest materials 122, most of the excited states formed by the exciton generation are those of the host material 121.

Note that the term "exciton" refers to a carrier (electron and hole) pair. Since excitons have energy, a material where excitons are generated is brought into an excited state.

In the case where the formed excited state of the host material 121 is a singlet excited state, singlet excitation energy transfers from the S1 level of the host material 121 to the S1 level of the guest material 122, thereby forming the singlet excited state of the guest material 122.

Since the guest material 122 is a fluorescent compound, when a singlet excited state is formed in the guest material 122, the guest material 122 immediately emits light. To obtain high luminous efficiency in this case, the fluorescence quantum yield of the guest material 122 is preferably high. The same can apply to a case where a singlet excited state is formed by recombination of carriers in the guest material 122.

Figure 14C:
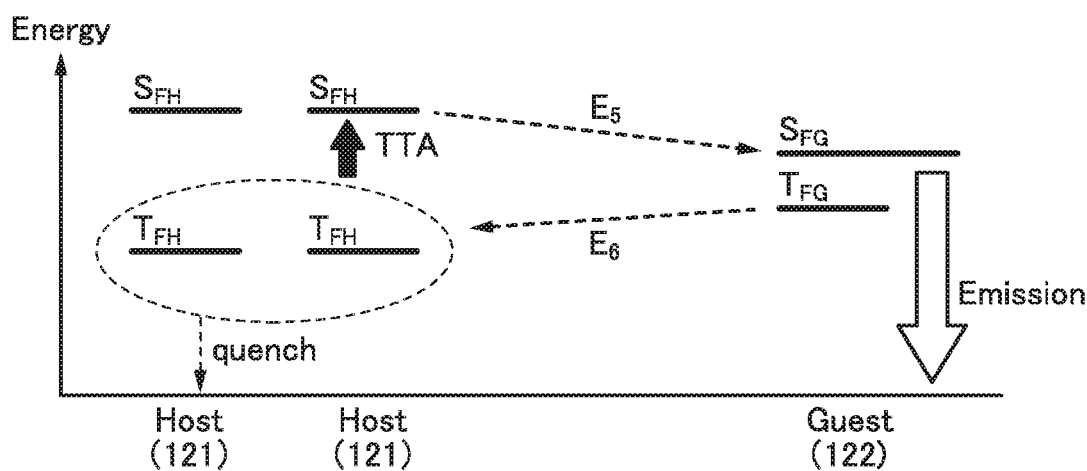
FIG. 14C illustrates a correlation between energy levels in a light-emitting layer.

Next, a case where recombination of carriers forms a triplet excited state of the host material 121 is described. The correlation between the energy levels of the host material 121 and the guest material 122 in this case is shown in FIG. 14C. The following explains what terms and signs in FIG. 14C represent. Note that because it is preferable that the T1 level of the host material 121 be lower than the T1 level of the guest material 122, FIG. 14C shows this preferable case. However, the T1 level of the host material 121 may be higher than the T1 level of the guest material 122.

FIG. 14C illustrates the correlation of energy levels of the host material 121 and the guest material 122 in the light-emitting layer 120. The following explains what terms and signs in FIG. 14C represent:

Host (121): the host material 121;
Guest (122): the guest material 122 (the fluorescent compound);
$S_{FH}$: the S1 level of the host material 121;
$T_{FH}$: the T1 level of the host material 121;
$S_{FG}$: the S1 level of the guest material 122 (the fluorescent compound); and
$T_{FG}$: the T1 level of the guest material 122 (the fluorescent compound).

As illustrated in FIG. 14C, triplet-triplet annihilation (TTA) occurs, that is, triplet excitons formed by carrier recombination interact with each other, and excitation energy is transferred and spin angular momenta are exchanged; as a result, a reaction in which the triplet excitons are converted into singlet excitons having energy of the S1 level of the host material 121 ($S_{FH}$) is caused (see TTA in FIG. 14C). The singlet excitation energy of the host material 121 is transferred from $S_{FH}$ to the S1 level of the guest material 122 ($S_{FG}$) having a lower energy than $S_{FH}$ (see Route $E_5$ in FIG. 14C), and a singlet excited state of the guest material 122 is formed, whereby the guest material 122 emits light.

Note that in the case where the density of triplet excitons in the light-emitting layer 120 is sufficiently high (e.g., $1\times10^{12}$ cm$^{-3}$ or higher), only the reaction of two triplet excitons close to each other can be considered whereas deactivation of a single triplet exciton can be ignored.

In the case where a triplet excited state of the guest material 122 is formed by carrier recombination, the triplet excited state of the guest material 122 is thermally deactivated and is difficult to use for light emission. However, in the case where the T1 level of the host material 121 ($T_{FH}$) is lower than the T1 level of the guest material 122 ($T_{FG}$), the triplet excitation energy of the guest material 122 can be transferred from the T1 level of the guest material 122 ($T_{FG}$) to the T1 level of the host material 121 ($T_{FH}$) (see Route $E_6$ in FIG. 14C) and then is utilized for TTA.

In other words, the host material 121 preferably has a function of converting triplet excitation energy into singlet excitation energy by causing TTA, so that the triplet excitation energy generated in the light-emitting layer 120 can be partly converted into singlet excitation energy by TTA in the host material 121. The singlet excitation energy can be transferred to the guest material 122 and extracted as fluorescence. In order to achieve this, the S level of the host material 121 ($S_{FH}$) is preferably higher than the S1 level of the guest material 122 ($S_{FG}$). In addition, the T1 level of the host material 121 ($T_{FH}$) is preferably lower than the T1 level of the guest material 122 ($T_{FG}$).

Note that particularly in the case where the T1 level ($T_{FG}$) of the guest material 122 is lower than the T1 level ($T_{FH}$) of the host material 121, the weight ratio of the guest material 122 to the host material 121 is preferably low. Specifically, the weight ratio of the guest material 122 to the host material 121 is preferably greater than 0 and less than or equal to 0.05, in which case the probability of carrier recombination in the guest material 122 can be reduced. In addition, the probability of energy transfer from the T1 level of the host material 121 ($T_{FH}$) to the T1 level of the guest material 122 ($T_{FG}$) can be reduced.

Note that the host material 121 may be composed of a single compound or a plurality of compounds.

<<Light Emission Mechanism of Light-Emitting Layer 140>>

Next, the light emission mechanism of the light-emitting layer 140 is described below.

The organic compound 141_1 and the organic compound 141_2 which are included in the light-emitting layer 140 preferably form an exciplex.

Although it is acceptable as long as the combination of the organic compound 141_1 and the organic compound 141_2 can form an exciplex, it is preferable that one of them be a compound having a hole-transport property and the other be a compound having an electron-transport property.

Figure 15B:
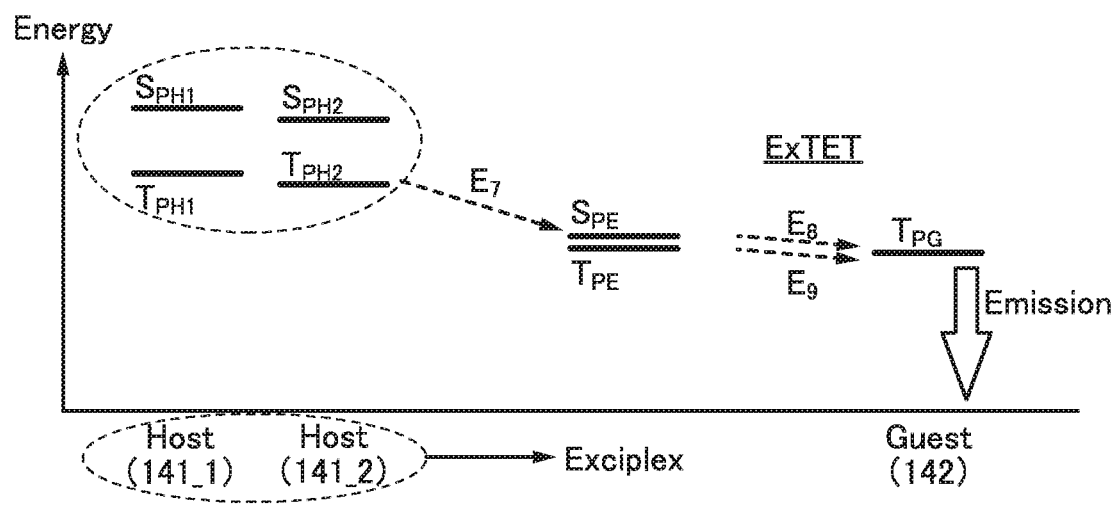
FIG. 15B illustrates a correlation between energy levels in a light-emitting layer.

FIG. 15B illustrates the correlation of energy levels of the organic compound 141_1, the organic compound 141_2, and the guest material 142 in the light-emitting layer 140. The following explains what terms and signs in FIG. 15B represent:

Host (141_1): the organic compound 141_1 (host material);

Host (141_2): the organic compound 141_2 (host material);

Guest (142): the guest material 142 (the phosphorescent compound);

$S_{PH1}$: the S1 level of the organic compound 141_1 (host material);

$T_{PH1}$: the T1 level of the organic compound 141_1 (host material);

$S_{PH2}$: the S1 level of the organic compound 141_2 (host material);

$T_{PH2}$: the T1 level of the organic compound 141_2 (host material);

$T_{PG}$: the T1 level of the guest material 142 (the phosphorescent compound);

$S_{PE}$: the S1 level of the exciplex; and $T_{PE}$: the T1 level of the exciplex.

The organic compound 141_1 and the organic compound 141_2 form an exciplex, and the S1 level ($S_{PE}$) and the T1 level ($T_{PE}$) of the exciplex are energy levels close to each other (see Route $E_7$ in FIG. 15B).

One of the organic compound 141_1 and the organic compound 141_2 receives a hole and the other receives an electron to readily form an exciplex. Alternatively, one of the organic compounds brought into an excited state immediately interacts with the other organic compound to form an exciplex. Therefore, most excitons in the light-emitting layer 140 exist as excited complexes. Because the excitation energy levels ($S_{PE}$ and $T_{PE}$) of the exciplex are lower than the S levels ($S_{PH1}$ and $S_{PH2}$) of the host materials (the organic compounds 141_1 and 141_2) that form the exciplex, the excited state of the host material 141 can be formed with lower excitation energy. This can reduce the driving voltage of the light-emitting element.

Both energies of $S_{PE}$ and $T_{PE}$ of the exciplex are then transferred to the T1 level of the guest material 142 (the phosphorescent compound); thus, light emission is obtained (see Routes $E_8$ and $E_9$ in FIG. 15B).

Furthermore, the T1 level ($T_{PE}$) of the exciplex is preferably higher than the T1 level ($T_{PG}$) of the guest material 142. In this way, the singlet excitation energy and the triplet excitation energy of the formed exciplex can be transferred from the S1 level ($S_{PE}$) and the T1 level ($T_{PE}$) of the exciplex to the T1 level ($T_{PG}$) of the guest material 142.

Note that in order to efficiently transfer excitation energy from the exciplex to the guest material 142, the T1 level ($T_{PE}$) of the exciplex is preferably lower than or equal to the T1 levels ($T_{PH1}$ and $T_{PH2}$) of the organic compounds (the organic compound 141_1 and the organic compound 141_2) which form the exciplex. Thus, quenching of the triplet excitation energy of the exciplex due to the organic compounds (the organic compounds 141_1 and 141_2) is less likely to occur, resulting in efficient energy transfer from the exciplex to the guest material 142.

In order that the organic compound 141_1 and the organic compound 141_2 efficiently form an exciplex, it is preferable to satisfy the following: the HOMO level of one of the organic compound 141_1 and the organic compound 141_2 is higher than that of the other and the LUMO level of the one of the organic compound 141_1 and the organic compound 141_2 is higher than that of the other. For example, when the organic compound 141_1 has a hole-transport property and the organic compound 141_2 has an electron-transport property, it is preferable that the HOMO level of the organic compound 141_1 be higher than the HOMO level of the organic compound 141_2 and the LUMO level of the organic compound 141_1 be higher than the LUMO level of the organic compound 141_2. Alternatively, when the organic compound 141_2 has a hole-transport property and the organic compound 141_1 has an electron-transport property, it is preferable that the HOMO level of the organic compound 141_2 be higher than the HOMO level of the organic compound 141_1 and the LUMO level of the organic compound 141_2 be higher than the LUMO level of the organic compound 141_1. Specifically, the energy difference between the HOMO level of the organic compound 141_1 and the HOMO level of the organic compound 141_2 is preferably greater than or equal to 0.05 eV, further preferably greater than or equal to 0.1 eV, and still further preferably greater than or equal to 0.2 eV. Alternatively, the energy difference between the LUMO level of the organic compound 141_1 and the LUMO level of the organic compound 141_2 is preferably greater than or equal to 0.05 eV, further preferably greater than or equal to 0.1 eV, and still further preferably greater than or equal to 0.2 eV.

In the case where the combination of the organic compounds 141_1 and 141_2 is a combination of a compound having a hole-transport property and a compound having an electron-transport property, the carrier balance can be easily controlled depending on the mixture ratio. Specifically, the weight ratio of the compound having a hole-transport property to the compound having an electron-transport property is preferably within a range of 1:9 to 9:1. Since the carrier balance can be easily controlled with the structure, a carrier recombination region can also be controlled easily.

<Energy Transfer Mechanism>

Next, factors controlling the processes of intermolecular energy transfer between the host material 141 and the guest material 142 will be described. As mechanisms of the intermolecular energy transfer, two mechanisms, i.e., Förster mechanism (dipole-dipole interaction) and Dexter mechanism (electron exchange interaction), have been proposed. Although the intermolecular energy transfer process between the host material 141 and the guest material 142 is described here, the same can apply to a case where the host material 141 is an exciplex.

<<Förster Mechanism>>

In Förster mechanism, energy transfer does not require direct contact between molecules and energy is transferred through a resonant phenomenon of dipolar oscillation between the host material 141 and the guest material 142. By the resonant phenomenon of dipolar oscillation, the host material 141 provides energy to the guest material 142, and thus, the host material 141 in an excited state is brought to a ground state and the guest material 142 in a ground state is brought to an excited state. Note that the rate constant $k_{h^* \to g}$ of Förster mechanism is expressed by Formula 1.

$$k_{h^* \to g} = \frac{9000 c^4 K^2 \phi \ln 10}{128 \pi^5 n^4 N \tau R^6} \int \frac{f'_h(v) \varepsilon_g(v)}{v^4} dv \qquad \text{[Formula 1]}$$

In Formula (1), v denotes a frequency, $f'_h(v)$ denotes a normalized emission spectrum of the host material 141 (a fluorescent spectrum in energy transfer from a singlet excited state, and a phosphorescent spectrum in energy transfer from a triplet excited state), $\varepsilon_g(v)$ denotes a molar absorption coefficient of the guest material 142, N denotes Avogadro's number, n denotes a refractive index of a medium, R denotes an intermolecular distance between the host material 141 and the guest material 142, τ denotes a measured lifetime of an excited state (fluorescence lifetime or phosphorescence lifetime), c denotes the speed of light, φ denotes a luminescence quantum yield (a fluorescence quantum yield in energy transfer from a singlet excited state, and a phosphorescence quantum yield in energy transfer from a triplet excited state), and K² denotes a coefficient (0 to 4) of orientation of a transition dipole moment between the host material 141 and the guest material 142. Note that K²=⅔ in random orientation.

<<Dexter Mechanism>>

In Dexter mechanism, the host material 141 and the guest material 142 are close to a contact effective range where their orbitals overlap, and the host material 141 in an excited state and the guest material 142 in a ground state exchange their electrons, which leads to energy transfer. Note that the rate constant $k_{h^* \to g}$ of Dexter mechanism is expressed by Formula 2.

$$k_{h^* \to g} = \left(\frac{2\pi}{h}\right) K^2 \exp\left(-\frac{2R}{L}\right) \int f'_h(v) \varepsilon'_g(v) dv \quad \text{[Formula 2]}$$

In Formula (2), h denotes a Planck constant, K denotes a constant having an energy dimension, v denotes a frequency, $f'_h(v)$ denotes a normalized emission spectrum of the host material 141 (a fluorescent spectrum in energy transfer from a singlet excited state, and a phosphorescent spectrum in energy transfer from a triplet excited state), $\varepsilon'_g(v)$ denotes a normalized absorption spectrum of the guest material 142, L denotes an effective molecular radius, and R denotes an intermolecular distance between the host material 141 and the guest material 142.

Here, the efficiency of energy transfer from the host material 141 to the guest material 142 (energy transfer efficiency $\phi_{ET}$) is expressed by Formula (3). In the formula, $k_r$ denotes a rate constant of a light-emission process (fluorescence in energy transfer from a singlet excited state, and phosphorescence in energy transfer from a triplet excited state) of the host material 141, $k_n$ denotes a rate constant of a non-light-emission process (thermal deactivation or intersystem crossing) of the host material 141, and T denotes a measured lifetime of an excited state of the host material 141.

$$\phi_{ET} = \frac{k_{h^* \to g}}{k_r + k_n + k_{h^* \to g}} = \frac{k_{h^* \to g}}{\left(\frac{1}{\tau}\right) + k_{h^* \to g}} \quad \text{[Formula 3]}$$

According to Formula 3, it is found that the energy transfer efficiency $\phi_{ET}$ can be increased by increasing the rate constant $k_{h^* \to g}$ of energy transfer so that another competing rate constant $k_r + k_n$ (=1/τ) becomes relatively small.

<<Concept for Promoting Energy Transfer>>

In energy transfer by Förster mechanism, high energy transfer efficiency $\phi_{ET}$ is obtained when quantum yield φ (a fluorescence quantum yield in the case where energy transfer from a singlet excited state is discussed, and a phosphorescence quantum yield in the case where energy transfer from a triplet excited state is discussed) is high. Furthermore, it is preferable that the emission spectrum (the fluorescence spectrum in the case where energy transfer from the singlet excited state is discussed) of the host material 141 largely overlap with the absorption spectrum (absorption corresponding to the transition from the singlet ground state to the triplet excited state) of the guest material 142. It is preferable that the molar absorption coefficient of the guest material 142 be also high. This means that the emission spectrum of the host material 141 overlaps with the absorption band of the guest material 142 which is on the longest wavelength side.

In energy transfer by Dexter mechanism, in order to make the rate constant $k_{h^* \to g}$ large, it is preferable that the emission spectrum (a fluorescence spectrum in the case where energy transfer from a singlet excited state is discussed, and a phosphorescence spectrum in the case where energy transfer from a triplet excited state is discussed) of the host material 141 largely overlap with the absorption spectrum (absorption corresponding to transition from a singlet ground state to a triplet excited state) of the guest material 142. Therefore, the energy transfer efficiency can be optimized by making the emission spectrum of the host material 141 overlap with the absorption band of the guest material 142 which is on the longest wavelength side.

In a manner similar to that of the energy transfer from the host material 141 to the guest material 142, the energy transfer by both Förster mechanism and Dexter mechanism also occurs in the energy transfer process from the exciplex to the guest material 142.

That is, the host material 141 includes the organic compounds 141_1 and 141_2 which are a combination for forming an exciplex functioning as an energy donor capable of efficiently transferring energy to the guest material 142. The excitation energy for forming the exciplex by the organic compound 141_1 and the organic compound 141_2 can be lower than the excitation energy of the organic compound 141_1 in the excited state and lower than the excitation energy of the organic compound 141_2 in the excited state. Therefore, driving voltage of the light emitting element can be reduced.

Furthermore, in order to facilitate the energy transfer from the S1 level of the exciplex to the T1 level of the guest material 142 serving as an energy acceptor, it is preferable that the emission spectrum of the exciplex overlap with the absorption band of the guest material 142 which is on the longest wavelength side (lowest energy side). Thus, the efficiency of generating the triplet excited state of the guest material 142 can be increased.

The exciplex generated in the light-emitting layer 140 has a feature in that the singlet excitation energy level is close to the triplet excitation energy level. Therefore, by overlapping the emission spectrum of the exciplex and the absorption band of the guest material 142 which is on the longest wavelength side (lowest energy side), energy transfer from the triplet excitation energy level of the exciplex to the triplet excitation energy level of the guest material 142 can be facilitated.

When the light-emitting layer 140 has the above-described structure, light emission from the guest material 142 (the phosphorescent compound) of the light-emitting layer 140 can be obtained efficiently.

Note that the above-described processes through Routes $E_7$, $E_8$, and $E_9$ may be referred to as exciplex-triplet energy transfer (ExTET) in this specification and the like. In other words, in the light-emitting layer 140, excitation energy is given from the exciplex to the guest material 142. In this case, the efficiency of reverse intersystem crossing from $T_{PE}$ to $S_{PE}$ and the emission quantum yield from $S_{PE}$ are not necessarily high; thus, materials can be selected from a wide range of options.

Note that in each of the above-described structures, the emission colors of the guest materials used in the light-emitting unit 208 and the light-emitting unit 210 may be the same or different. In the case where guest materials emitting light of the same color are used for the light-emitting unit 208 and the light-emitting unit 210, the light-emitting element 260 can exhibit high emission luminance at a small current value, which is preferable. In the case where guest materials emitting light of different colors are used for the light-emitting unit 208 and the light-emitting unit 210, the light-emitting element 260 can exhibit multi-color light emission, which is preferable. In that case, when a plurality of light-emitting materials with different emission wavelengths are used in one or both of the light-emitting layers 120 and 140, the light-emitting element 260 emits light obtained by synthesizing lights with different emission peaks. That is, the emission spectrum of the light-emitting element 260 has at least two local maximum values.

The above structure is also suitable for obtaining white light emission. When the light-emitting layer 120 and the light-emitting layer 140 emit light of complementary colors, white light emission can be obtained. It is particularly favorable to select the guest materials so that white light emission with high color rendering properties or light emission of at least red, green, and blue can be obtained.

In the case where the light-emitting units 208 and 210 contain guest materials whose emission colors are different, light emitted from the light-emitting layer 120 preferably has an emission peak on the shorter wavelength side than light emitted from the light-emitting layer 140. The luminance of a light-emitting element using a material having a high triplet excited energy level tends to degrade quickly. TTA is utilized in the light-emitting layer emitting light with a short wavelength so that a light-emitting element with less degradation of luminance can be provided.

At least one of the light-emitting layers 120 and 140 may be further divided into layers and the divided layers may contain different light-emitting materials. That is, at least one of the light-emitting layers 120 and 140 may consist of two or more layers. For example, in the case where the light-emitting layer is formed by stacking a first light-emitting layer and a second light-emitting layer in this order from the hole-transport layer side, the first light-emitting layer is formed using a material having a hole-transport property as the host material and the second light-emitting layer is formed using a material having an electron-transport property as the host material. In that case, a light-emitting material included in the first light-emitting layer may be the same as or different from a light-emitting material included in the second light-emitting layer. In addition, the materials may have functions of emitting light of the same color or light of different colors. White light emission with a high color rendering property that is formed of three primary colors or four or more colors can be obtained by using a plurality of light-emitting materials emitting light of different colors.

<Structural Example 2 of Light-Emitting Element>

Next, a structure example different from that of the light-emitting elements illustrated in FIGS. 14A to 14C and FIGS. 15A and 15B will be described below with reference to FIGS. 16A to 16C.

Figure 16A:
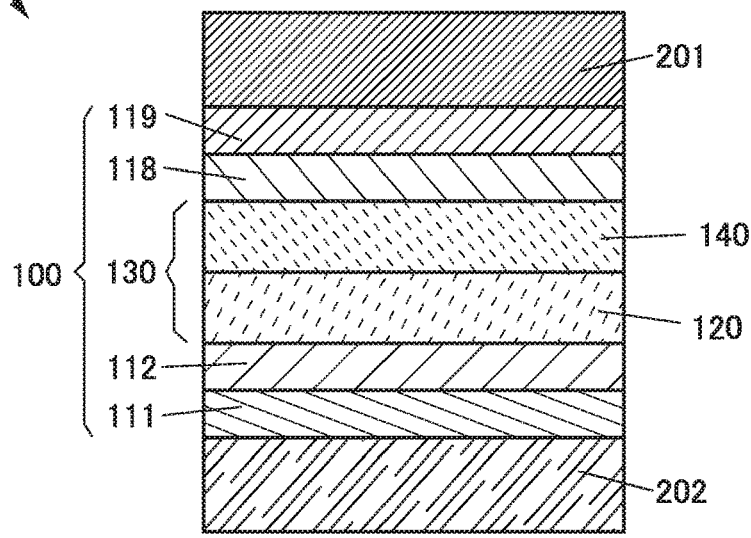
FIGS. 16A and 16B are cross-sectional schematic views of a light-emitting element of one embodiment of the present invention.

FIG. 16A is a schematic cross-sectional view of a light-emitting element 262.

In the light-emitting element 262 shown in FIG. 16A, the EL layer 100 is provided between a pair of electrodes (the electrodes 201 and 202). Note that the electrode 202 functions as an anode and the electrode 201 functions as a cathode in the following description of the light-emitting element 262; however, the functions may be interchanged in the light-emitting element 262. For the electrode 202, the structure of the electrode 102 or the electrode 103 (the electrode 103R, the electrode 103G, and the electrode 103B) may be used. For the electrode 201, the structure of the electrode 101 shown in Embodiment 1 may be used.

The EL layer 100 includes the light-emitting layer 130. The light-emitting layer 130 includes the light-emitting layer 120 and the light-emitting layer 140. In the light-emitting element 262, as the EL layer 100, the hole-injection layer 111, the hole-transport layer 112, the electron-transport layer 118, and the electron-injection layer 119 are illustrated in addition to the light-emitting layers. However, this stacked structure is an example, and the structure of the EL layer 100 in the light-emitting element 262 is not limited thereto. For example, the stacking order of the above layers of the EL layer 100 may be changed. Alternatively, in the EL layer 100, another functional layer other than the above layers may be provided. The functional layer may have a function of lowering a hole- or electron-injection barrier, a function of improving a hole- or electron-transport property, a function of inhibiting transport of holes or electrons, or a function of producing holes or electrons, for example.

Figure 16B:
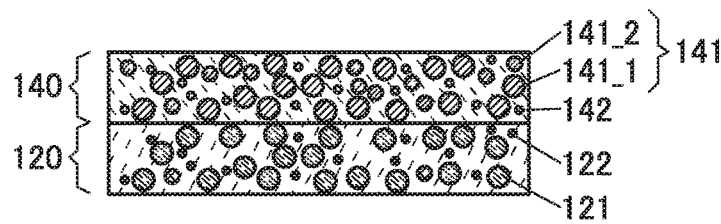

As illustrated in FIG. 16B, the light-emitting layer 120 contains the host material 121 and the guest material 122. The light-emitting layer 140 contains the host material 141 and the guest material 142. The host material 141 includes the organic compound 141_1 and the organic compound 141_2. Note that in the description below, the guest material 122 is a fluorescent compound and the guest material 142 is a phosphorescent compound.

<<Emission Mechanism of Light-Emitting Layer 130>>

The light emission mechanism of the light-emitting layer 120 is similar to that of the light-emitting layer 120 illustrated in FIGS. 14B and 14C. The light emission mechanism of the light-emitting layer 140 is similar to that of the light-emitting layer 140 illustrated in FIGS. 15A and 15B.

In the case where the light-emitting layers 120 and 140 are in contact with each other as illustrated in FIG. 16A, even when energy (in particular, triplet excitation level energy) is transferred from the exciplex of the light-emitting layer 140 to the host material 121 of the light-emitting layer 120 at an interface between the light-emitting layer 120 and the light-emitting layer 140, triplet excitation energy can be converted into light emission in the light-emitting layer 120.

Note that the T1 level of the host material 121 of the light-emitting layer 120 is preferably lower than the T1 levels of the organic compounds 141_1 and 141_2 of the light-emitting layer 140. In the light-emitting layer 120, the S1 level of the host material 121 is preferably higher than the S1 level of the guest material 122 (fluorescent compound) while the T1 level of the host material 121 is preferably lower than the T1 level of the guest material 122 (fluorescent compound).

Figure 16C:
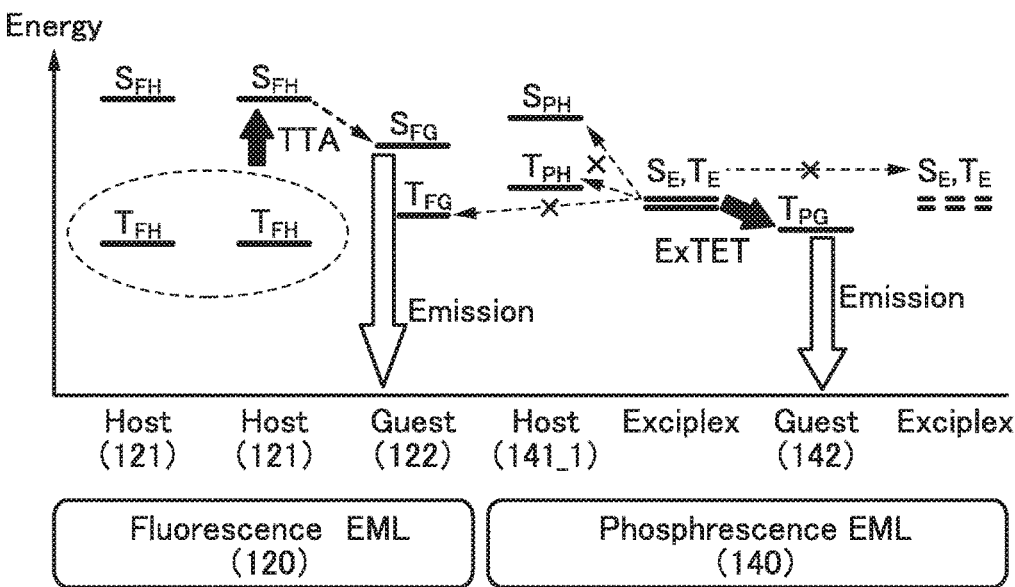
FIG. 16C illustrates a correlation between energy levels in a light-emitting layer.

FIG. 16C shows a correlation of energy levels in the case where TTA is utilized in the light-emitting layer 120 and ExTET is utilized in the light-emitting layer 140. The following explains what terms and signs in FIG. 16C represent:

Fluorescence EML (120): the light-emitting layer 120 (the fluorescent light-emitting layer);

Phosphorescence EML (140): the light-emitting layer 140 (phosphorescent light-emitting layer);

Host (121): the host material 121;

Guest (122): the guest material 122 (the fluorescent compound);

Host (141_1): the organic compound 141_1 (host material);

Guest (142): the guest material 142 (the phosphorescent compound);

Exciplex: the exciplex (the organic compounds 141_1 and 141_2);

$S_{FH}$: the S1 level the host material 121;

$T_{FH}$: the T1 level of the host material 121;

$S_{FG}$: the S1 level of the guest material 122 (the fluorescent compound); and $T_{FG}$: the T1 level of the guest material 122 (the fluorescent compound).

$S_{PH}$: the S1 level of the host material (the organic compound 141_1);

$T_{PH}$: the T1 level of the host material (the organic compound 141_1);

$T_{PG}$: the T1 level of the guest material 142 (the phosphorescent compound);

$S_E$: the S1 level of the exciplex; and $T_E$: the T1 level of the exciplex.

As shown in FIG. 16C, the exciplex exists only in an excited state; thus, exciton diffusion between the exciplexes is less likely to occur. In addition, because the excitation energy levels ($S_E$ and $T_E$) of the exciplex are lower than the excitation energy levels ($S_{PH}$ and $T_{PH}$) of the organic compound 141_1 (i.e., the host material of the phosphorescent compound) of the light-emitting layer 140, energy diffusion from the exciplex to the organic compound 141_1 does not occur. That is, the efficiency of the phosphorescent light-emitting layer (the light-emitting layer 140) can be maintained because an exciton diffusion distance of the exciplex is short in the phosphorescent light-emitting layer (the light-emitting layer 140). In addition, even when part of the triplet excitation energy of the exciplex of the phosphorescent light-emitting layer (the light-emitting layer 140) diffuses into the fluorescent light-emitting layer (the light-emitting layer 120) through the interface between the fluorescent light-emitting layer (the light-emitting layer 120) and the phosphorescent light-emitting layer (the light-emitting layer 140), energy loss can be reduced because the triplet excitation energy in the fluorescent light-emitting layer (the light-emitting layer 120) caused by the diffusion is converted into light emission through TTA.

As described above, ExTET is utilized in the light-emitting layer 140 and TTA is utilized in the light-emitting layer 120; thus, the light-emitting element 262 can have a reduced energy loss and a high emission efficiency. Furthermore, in the case where the light-emitting layer 120 and the light-emitting layer 140 are in contact with each other as in the light-emitting element 262, the number of the EL layers 100 as well as the energy loss can be reduced. Therefore, a light-emitting element with low manufacturing cost can be obtained.

Note that the light-emitting layer 120 and the light-emitting layer 140 are not necessarily in contact with each other. In that case, it is possible to prevent energy transfer by the Dexter mechanism (in particular, triplet energy transfer) from the organic compound 141_1 in an excited state, the organic compound 141_2 in an excited state, or the guest material 142 (phosphorescent compound) in an excited state which is generated in the light-emitting layer 140 to the host material 121 or the guest material 122 (fluorescent compound) in the light-emitting layer 120. Therefore, the thickness of a layer provided between the light-emitting layer 120 and the light-emitting layer 140 may be several nanometers. Specifically, the thickness is preferably greater than or equal to 1 nm and less than or equal to 5 nm, in which case an increase in driving voltage can be inhibited.

The layer provided between the light-emitting layer 120 and the light-emitting layer 140 may contain a single material or both a hole-transport material and an electron-transport material. In the case of a single material, a bipolar material may be used. The bipolar material here refers to a material in which the ratio between the electron mobility and the hole mobility is 100 or less. Alternatively, the hole-transport material, the electron-transport material, or the like may be used. At least one of materials contained in the layer may be the same as the host material (the organic compound 141_1 or 141_2) of the light-emitting layer 140. This facilitates the manufacture of the light-emitting element and reduces the drive voltage. Furthermore, the hole-transport material and the electron-transport material may form an exciplex, which effectively prevents exciton diffusion. Specifically, it is possible to prevent energy transfer from the host material (the organic compound 141_1 or 141_2) in an excited state or the guest material 142 (phosphorescent compound) in an excited state of the light-emitting layer 140 to the host material 121 or the guest material 122 (fluorescent compound) in the light-emitting layer 120.

In the light-emitting element 262, the light-emitting layer 120 and the light-emitting layer 140 have been described as being positioned on the hole-transport layer 112 side and the electron-transport layer 118 side, respectively; however, the light-emitting element of one embodiment of the present invention is not limited to this structure. The light-emitting layer 120 and the light-emitting layer 140 may be positioned on the electron-transport layer 118 side and the hole-transport layer 112 side, respectively.

In the light-emitting element 262, a carrier recombination region is preferably distributed to some extent. Therefore, it is preferable that the light-emitting layer 120 or 140 have an appropriate degree of carrier-trapping property. It is particularly preferable that the guest material 142 (phosphorescent compound) in the light-emitting layer 140 have an electron-trapping property. Alternatively, the guest material 122 (fluorescent compound) in the light-emitting layer 120 preferably has a hole-trapping property.

Note that light emitted from the light-emitting layer 120 preferably has a peak on the shorter wavelength side than light emitted from the light-emitting layer 140. The luminance of a light-emitting element using a phosphorescent compound emitting light with a short wavelength tends to degrade quickly. In view of the above, fluorescence is used for light emission with a short wavelength, so that a light-emitting element with less degradation of luminance can be provided.

Furthermore, the light-emitting layer 120 and the light-emitting layer 140 may be made to emit light with different emission wavelengths, so that the light-emitting element can be a multicolor light-emitting element. In that case, the emission spectrum is formed by combining light having different emission peaks, and thus has at least two peaks.

The above structure is also suitable for obtaining white light emission. When the light-emitting layer 120 and the light-emitting layer 140 emit light of complementary colors, white light emission can be obtained.

In addition, white light emission with a high color rendering property that is formed of three primary colors or four or more colors can be obtained by using a plurality of light-emitting materials emitting light of different emission wavelengths for one of the light-emitting layers 120 and 140 or both. In that case, the light-emitting layer may be divided into layers and each of the divided layers may contain a different light-emitting material from the others.

<Material that can be Used in Light-Emitting Layer>

Next, materials that can be used in the light-emitting layers 120 and 140 are described.

<<Material that can be Used in Light-Emitting Layer 120>>

In the light-emitting layer 120, the host material 121 is present in the largest proportion by weight, and the guest material 122 (the fluorescent compound) is dispersed in the host material 121. The S1 level of the host material 121 is preferably higher than the S1 level of the guest material 122 (the fluorescent compound) while the T1 level of the host material 121 is preferably lower than the T1 level of the guest material 122 (the fluorescent compound).

In the light-emitting layer 120, the guest material 122 is preferably, but not particularly limited to, an anthracene derivative, a tetracene derivative, a chrysene derivative, a phenanthrene derivative, a pyrene derivative, a perylene derivative, a stilbene derivative, an acridone derivative, a coumarin derivative, a phenoxazine derivative, a phenothiazine derivative, or the like. Specifically, the fluorescent compound described in Embodiment 1 can be used, for example.

Although there is no particular limitation on a material that can be used as the host material 121 in the light-emitting layer 120, any of the following materials can be used, for example: metal complexes such as tris(8-quinolinolato)aluminum(III) (abbreviation: Alq), tris(4-methyl-8-quinolinolato)aluminum(III)(abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc (II) (abbreviation: ZnPBO), and bis[2-(2-benzothiazolyl)phenolato]zinc(II) (abbreviation: ZnBTZ); heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2''-(1,3,5-benzenetriyl)-tris(1-phenyl-1H-benzimidazole) (abbreviation: TPBI), bathophenanthroline (abbreviation: BPhen), bathocuproine (abbreviation: BCP), and 9-[4-(5-phenyl-1,3,4-oxadiazol-2-yl)phenyl]-9H-carbazole (abbreviation: CO11); and aromatic amine compounds such as 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), and 4,4'-bis[N-(spiro-9,9'-bifluoren-2-yl)-N-phenylamino]biphenyl (abbreviation: BSPB). In addition, condensed polycyclic aromatic compounds such as anthracene derivatives, phenanthrene derivatives, pyrene derivatives, chrysene derivatives, and dibenzo[g,p]chrysene derivatives can be given, and specific examples are 9,10-diphenylanthracene (abbreviation: DPAnth), N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), 4-(9H-carbazol-9-yl)-4'-(10-phenyl-9-anthryl)triphenylamine (abbreviation: YGAPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N,9-diphenyl-N-(9,10-diphenyl-2-anthryl)-9H-carbazol-3-amine (abbreviation: 2PCAPA), 6,12-dimethoxy-5,11-diphenylchrysene, N,N,N',N',N'',N'',N''',N'''-octaphenyldibenzo[g,p]chrysene-2,7,10,15-tetramine (abbreviation: DBC1), 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 1,3,5-tri(1-pyrenyl)benzene (abbreviation: TPB3), and the like. One or more substances having a wider energy gap than the above-described guest material 122 is/are preferably selected from these and known substances.

The light-emitting layer 120 can have a structure in which two or more layers are stacked. For example, in the case where the light-emitting layer 120 is formed by stacking a first light-emitting layer and a second light-emitting layer in this order from the hole-transport layer side, the first light-emitting layer is formed using a substance having a hole-transport property as the host material and the second light-emitting layer is formed using a substance having an electron-transport property as the host material.

In the light-emitting layer 120, the host material 121 may be composed of one kind of compound or a plurality of compounds. The light-emitting layer 120 may include a material other than the host material 121 and the guest material 122.

The light-emitting layer 120 may have the structure of the light-emitting layer described in Embodiment 1. In that case, the host material and the light-emitting material (fluorescent compound) described in Embodiment 1 are preferably used.

<<Material that can be Used in Light-Emitting Layer 140>>

In the light-emitting layer 140, the host material 141 is present in the largest proportion by weight, and the guest material 142 (the phosphorescent compound) is dispersed in the host material 141. The T1 levels of the host materials 141 (organic compounds 141_1 and 141_2) of the light-emitting layer 140 are preferably higher than the T1 level of the guest material 142 of the light-emitting layer 140.

Examples of the organic compound 141_1 include a zinc- or aluminum-based metal complex, an oxadiazole derivative, a triazole derivative, a benzimidazole derivative, a quinoxaline derivative, a dibenzoquinoxaline derivative, a dibenzothiophene derivative, a dibenzofuran derivative, a pyrimidine derivative, a triazine derivative, a pyridine derivative, a bipyridine derivative, a phenanthroline derivative, and the like. Other examples are an aromatic amine and a carbazole derivative. Specifically, the electron-transport material and the hole-transport material described in Embodiment 1 can be used.

As the organic compound 141_2, a substance which can form an exciplex together with the organic compound 141_1 is preferably used. Specifically, the electron-transport material and the hole-transport material described in Embodiment 1 can be used, for example. In that case, it is preferable that the organic compound 141_1, the organic compound 141_2, and the guest material 142 (phosphorescent compound) be selected such that the emission peak of the exciplex formed by the organic compounds 141_1 and 141_2 overlaps with an absorption band, specifically an absorption band on the longest wavelength side, of a triplet metal to ligand charge transfer (MLCT) transition of the guest material 142 (phosphorescent compound). This makes it possible to provide a light-emitting element with drastically improved emission efficiency. Note that in the case where a thermally activated delayed fluorescent compound is used instead of the phosphorescent compound, it is preferable that the absorption band on the longest wavelength side be a singlet absorption band.

As the guest material 142 (phosphorescent compound), an iridium-, rhodium-, or platinum-based organometallic complex or metal complex can be used; in particular, an organoiridium complex such as an iridium-based ortho-metalated complex is preferable. As an ortho-metalated ligand, a 4H-triazole ligand, a 1H-triazole ligand, an imidazole ligand, a pyridine ligand, a pyrimidine ligand, a pyrazine ligand, an isoquinoline ligand, or the like can be given. As the metal complex, a platinum complex having a porphyrin ligand or the like can be given. Specifically, the phosphorescent compound described in Embodiment 1 as an example of the light-emitting material can be used, for example.

As the light-emitting material included in the light-emitting layer 140, any material can be used as long as the material can convert the triplet excitation energy into light emission. As an example of the material that can convert triplet excitation energy into light emission, a thermally activated delayed fluorescence compound can be given in addition to the phosphorescent compound. Therefore, the "phosphorescent compound" in the description can be replaced with the "thermally activated delayed fluorescence".

The material that exhibits thermally activated delayed fluorescence may be a material that can form a singlet excited state from a triplet excited state by reverse intersystem crossing or may be a combination of a plurality of materials which form an exciplex.

In the case where the thermally activated delayed fluorescent substance is formed of one kind of material, any of the thermally activated delayed fluorescent substances described in Embodiment 1 can be specifically used.

In the case where the thermally activated delayed fluorescent substance is used as the host material, it is preferable to use a combination of two kinds of compounds which form an exciplex. In this case, it is particularly preferable to use the above-described combination of a compound which easily accepts electrons and a compound which easily accepts holes, which forms an exciplex.

There is no limitation on the emission colors of the light-emitting materials contained in the light-emitting layers 120 and 140, and they may be the same or different. Light emitted from the light-emitting materials is mixed and extracted out of the element; therefore, for example, in the case where their emission colors are complementary colors, the light-emitting element can emit white light. In consideration of the reliability of the light-emitting element, the emission peak wavelength of the light-emitting material included in the light-emitting layer 120 is preferably shorter than that of the light-emitting material included in the light-emitting layer 140.

Note that the light-emitting units 208 and 210 and the charge-generation layer 115 can be formed by an evaporation method (including a vacuum evaporation method), an ink-jet method, a coating method, gravure printing, or the like.

The structure described in this embodiment can be used in combination with any of the structures described in the other embodiments as appropriate.

Embodiment 3

In this embodiment, a display device of one embodiment of the present invention is described below with reference to FIGS. 17A and 17B, FIGS. 18A and 18B, FIG. 19, FIGS. 20A to 20D, and FIG. 21.

<Configuration Example 1 of Display Device>

Figure 17A:
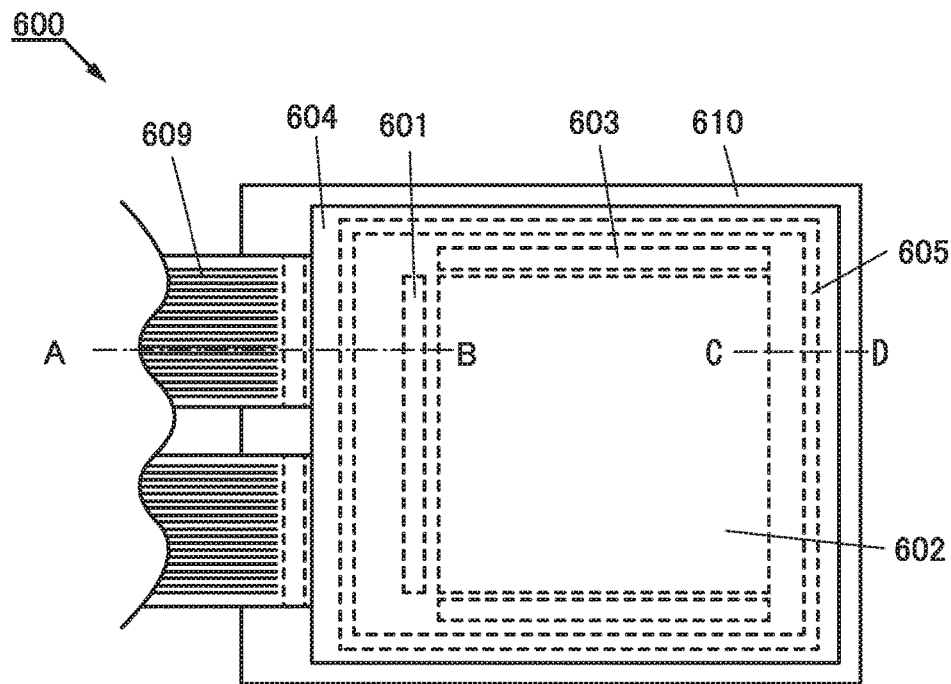
FIGS. 17A and 17B a top view and a cross-sectional schematic view of a display device of one embodiment of the present invention.
Figure 17B:
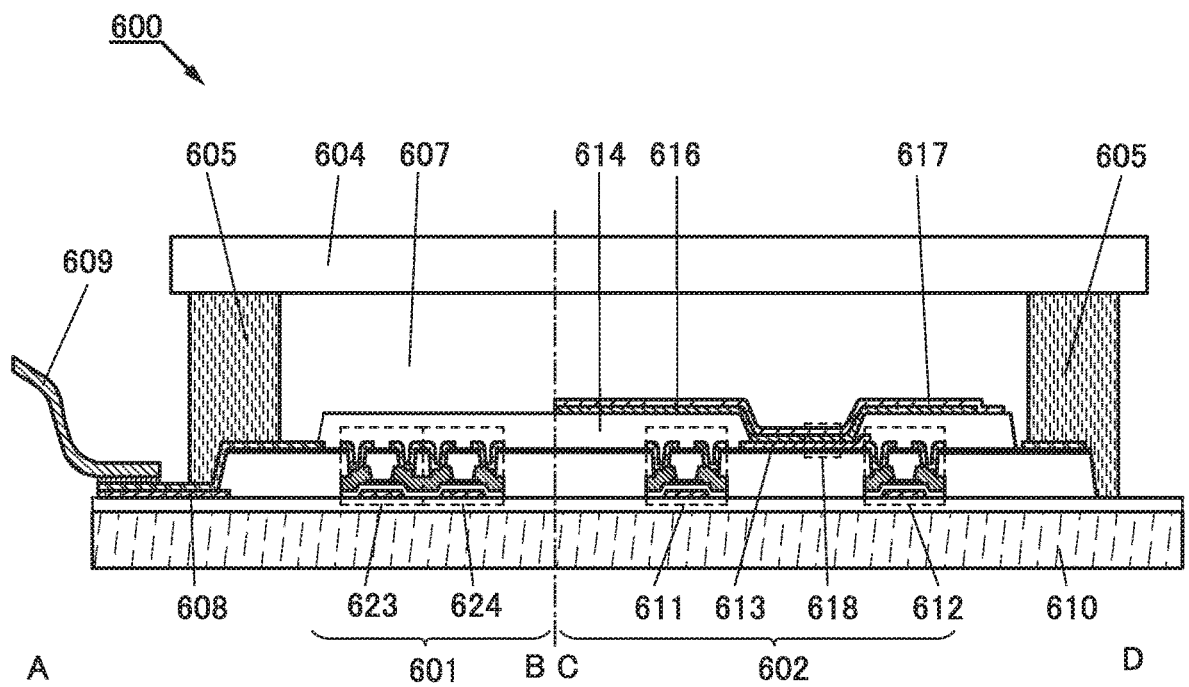

FIG. 17A is a top view illustrating a display device 600 and FIG. 17B is a cross-sectional view taken along the dashed-dotted line A-B and the dashed-dotted line C-D in FIG. 17A. The display device 600 includes driver circuit portions (a signal line driver circuit portion 601 and a scan line driver circuit portion 603) and a pixel portion 602. Note that the signal line driver circuit portion 601, the scan line driver circuit portion 603, and the pixel portion 602 have a function of controlling light emission from a light-emitting element.

The display device 600 also includes an element substrate 610, a sealing substrate 604, a sealant 605, a region 607 surrounded by the sealant 605, a lead wiring 608, and an FPC 609.

Note that the lead wiring 608 is a wiring for transmitting signals to be input to the signal line driver circuit portion 601 and the scan line driver circuit portion 603 and for receiving a video signal, a clock signal, a start signal, a reset signal, and the like from the FPC 609 serving as an external input terminal. Although only the FPC 609 is illustrated here, the FPC 609 may be provided with a printed wiring board (PWB).

As the signal line driver circuit portion 601, a CMOS circuit in which an n-channel transistor 623 and a p-channel transistor 624 are combined is formed. As the signal line driver circuit portion 601 or the scan line driver circuit portion 603, various types of circuits such as a CMOS circuit, a PMOS circuit, or an NMOS circuit can be used. Although a driver in which a driver circuit portion is formed and a pixel are formed over the same surface of a substrate in the display device of this embodiment, the driver circuit portion is not necessarily formed over the substrate and can be formed outside the substrate.

The pixel portion 602 includes a switching transistor 611, a current control transistor 612, and a lower electrode 613 electrically connected to a drain of the current control transistor 612. Note that a partition wall 614 is formed to cover end portions of the lower electrode 613. As the partition wall 614, for example, a positive type photosensitive acrylic resin film can be used.

In order to obtain favorable coverage, the partition wall 614 is formed to have a curved surface with curvature at its upper or lower end portion. For example, in the case of using a positive photosensitive acrylic as a material of the partition wall 614, it is preferable that only the upper end portion of the partition wall 614 have a curved surface with curvature (the radius of the curvature being 0.2 μm to 3 μm). As the partition wall 614, either a negative photosensitive resin or a positive photosensitive resin can be used.

Note that there is no particular limitation on a structure of each of the transistors (the transistors 611, 612, 623, and 624). For example, a staggered transistor can be used. In addition, there is no particular limitation on the polarity of these transistors. For these transistors, n-channel and p-channel transistors may be used, or either n-channel transistors or p-channel transistors may be used, for example. Furthermore, there is no particular limitation on the crystallinity of a semiconductor film used for the transistors. For example, an amorphous semiconductor film or a crystalline semiconductor film may be used. Examples of a semiconductor material include Group 14 semiconductors (e.g., a semiconductor including silicon), compound semiconductors (including oxide semiconductors), organic semiconductors, and the like. For example, it is preferable to use an oxide semiconductor that has an energy gap of 2 eV or more, preferably 2.5 eV or more and further preferably 3 eV or more, for the transistors, so that the off-state current of the transistors can be reduced. Examples of the oxide semiconductor include an In—Ga oxide and an In-M-Zn oxide (M is aluminum (Al), gallium (Ga), yttrium (Y), zirconium (Zr), lanthanum (La), cerium (Ce), tin (Sn), hafnium (Hf), or neodymium (Nd)).

An EL layer 616 and an upper electrode 617 are formed over the lower electrode 613. For example, the lower electrode 613 functions as an anode and the upper electrode 617 functions as a cathode.

In addition, the EL layer 616 is formed by various methods such as an evaporation method with an evaporation mask (including a vacuum evaporation method), an ink-jet method, a coating method such as a spin coating method, or a gravure printing method. As another material included in the EL layer 616, a low molecular compound or a high molecular compound (including an oligomer or a dendrimer) may be used.

Note that a light-emitting element 618 is formed with the lower electrode 613, the EL layer 616, and the upper electrode 617. The light-emitting element 618 preferably has the structure described in Embodiments 1 and 2. In the case where the pixel portion includes a plurality of light-emitting elements, the pixel portion may include both the light-emitting element described in Embodiments 1 and 2 and a light-emitting element having a different structure.

When the sealing substrate 604 and the element substrate 610 are attached to each other with the sealant 605, the light-emitting element 618 is provided in the region 607 surrounded by the element substrate 610, the sealing substrate 604, and the sealant 605. The region 607 is filled with a filler. In some cases, the region 607 is filled with an inert gas (nitrogen, argon, or the like) or filled with an ultraviolet curable resin or a thermosetting resin which can be used for the sealant 605. For example, a polyvinyl chloride (PVC)-based resin, an acrylic-based resin, a polyimide-based resin, an epoxy-based resin, a silicone-based resin, a polyvinyl butyral (PVB)-based resin, or an ethylene vinyl acetate (EVA)-based resin can be used. Alternatively, an inorganic material such as silicon oxide, silicon oxynitride, silicon nitride oxide, silicon nitride, aluminum oxide, or aluminum nitride can be used. It is preferable that the sealing substrate be provided with a recessed portion and a drying agent be provided in the recessed portion, in which case deterioration due to influence of moisture can be suppressed. Note that the region 607 preferably has a stacked structure of a resin and an inorganic material so that the impurities such as water can be effectively prevented from entering the light-emitting element 618 which is inside the display device from the outside of the display device 600. Furthermore, the sealant 605 or the sealing substrate 604 is not necessarily provided.

An optical element may be provided below the element substrate 610 to overlap with the light-emitting element 618. The optical element may have a structure similar to that of the optical element described in Embodiment 1.

An epoxy-based resin or glass frit is preferably used for the sealant 605. It is preferable that such a material do not transmit moisture or oxygen as much as possible. As the sealing substrate 604, a glass substrate, a quartz substrate, or a plastic substrate formed of fiber reinforced plastic (FRP), poly(vinyl fluoride) (PVF), polyester, acrylic, or the like can be used.

<<Formation Method of Light-Emitting Element by Droplet Discharge Method>>

Here, a method for forming the EL layer 616 by a droplet discharge method is described with reference to FIGS. 20A to 20D. FIGS. 20A to 20D are cross-sectional views illustrating the method for forming the EL layer 616.

Figure 20A:
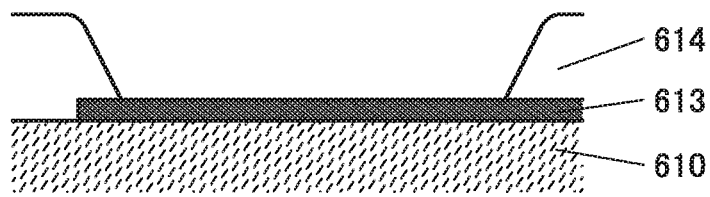
FIGS. 20A to 20D are cross-sectional schematic views of a method for manufacturing an EL layer.
Figure 20B:
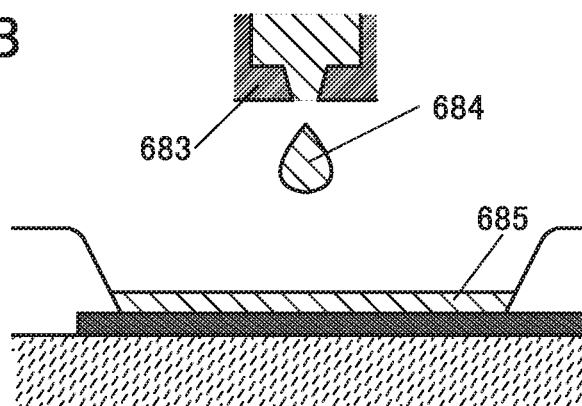

First, the element substrate 610 over which the lower electrode 613 and the partition wall 614 are formed is illustrated in FIG. 20A. However, as in FIG. 17B, the lower electrode 613 and the partition wall 614 may be formed over an insulating film over a substrate.

Next, in a portion where the lower electrode 613 is exposed, which is an opening portion of the partition wall 614, a droplet 684 is discharged from a droplet discharge apparatus 683 to form a layer 685 containing a composition. The droplet 684 is a composition containing a solvent and is attached to the lower electrode 613 (see FIG. 20B).

Note that the method for discharging the droplet 684 may be performed under reduced pressure.

Figure 20C:
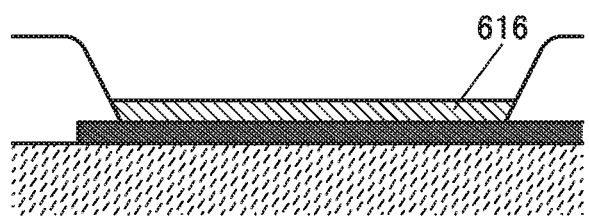

Then, the solvent is removed from the layer 685 containing the composition, and the resulting layer is solidified to form the EL layer 616 (see FIG. 20C).

The solvent may be removed by drying or heating.

Figure 20D:
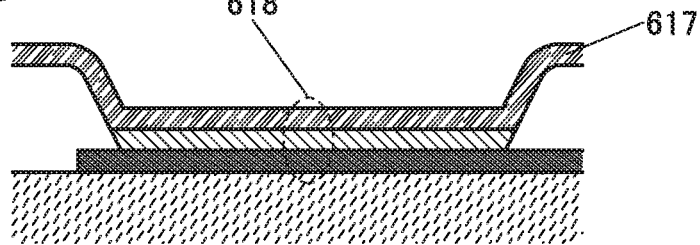

Next, the upper electrode 617 is formed over the EL layer 616, and the light-emitting element 618 is formed (see FIG. 20D).

When the EL layer 616 is formed by a droplet discharge method as described above, the composition can be selectively discharged, and accordingly, loss of materials can be reduced. Furthermore, a lithography process or the like for shaping is not needed, and thus, the process can be simplified and cost reduction can be achieved.

Note that FIGS. 20A to 20D illustrate a process for forming the EL layer 616 as a single layer. When the EL layer 616 includes functional layers in addition to the light-emitting layer, the layers are formed sequentially from the lower electrode 613 side. In that case, the hole-injection layer, the hole-transport layer, the light-emitting layer, the electron-transport layer, and the electron-injection layer may be formed by a droplet discharging method. Alternatively, the hole-injection layer, the hole-transport layer, and the light-emitting layer may be formed by a droplet discharging method, whereas the electron-transport layer and the electron-injection layer may be formed by an evaporation method or the like. The light-emitting layer may be formed by a combination of a droplet discharging method and an evaporation method or the like.

The hole-injection layer can be formed using poly(ethylenedioxythiophene)/poly(styrenesulfonic acid) by a coating method, such as a droplet discharging method or a spin coating method, for example. The hole-transport layer can be formed using a hole-transport material, e.g., polyvinylcarbazole, by a coating method, such as a droplet discharging method or a spin coating method, for example. After the formation of the hole-injection layer and after the formation of the hole-transport layer, heat treatment may be performed under an air atmosphere or an inert gas atmosphere such as nitrogen.

The light-emitting layer can be formed using a high molecular compound or a low molecular compound that emits at least one of violet light, blue light, blue green light, green light, yellow green light, yellow light, orange light, and red light. As the high molecular compound and the low molecular compound, a fluorescent or phosphorescent organic compound can be used. With use of a solvent in which the high molecular compound and the low molecular compound are dissolved, the light-emitting layer can be formed by a coating method, such as a droplet discharging method or a spin coating method. After the formation of the light-emitting layer, heat treatment may be performed under an air atmosphere or an inert gas atmosphere such as a nitrogen atmosphere. With use of the fluorescent or phosphorescent organic compound as a guest material, the guest material may be dispersed into a high molecular compound or a low molecular compound that has higher excitation energy than the guest material. The light-emitting organic compound may be deposited alone or the light-emitting organic compound mixed with another material may be deposited. The light-emitting layer may have a two-layered structure. In that case, each layer of the two-layer light-emitting layer preferably contains a light-emitting organic compound whose emission color is different from that of the other layer. When the light-emitting layer is formed using a low molecular compound, an evaporation method can be used.

The electron-transport layer can be formed using a substance having a high electron-transport property. The electron-injection layer can be formed using a substance having a high electron-injection property. Note that the electron-transport layer and the electron-injection layer can be formed by an evaporation method.

The upper electrode 617 can be formed by an evaporation method or a sputtering method. The upper electrode 617 can be formed using a reflective conductive film. Alternatively, the upper electrode 617 may have a stacked layer including a reflective conductive film and a light-transmitting conductive film.

The droplet discharge method described above is a general term for a means including a nozzle equipped with a composition discharge opening or a means to discharge droplets such as a head having one or a plurality of nozzles.

<<Droplet Discharge Apparatus>>

Figure 21:
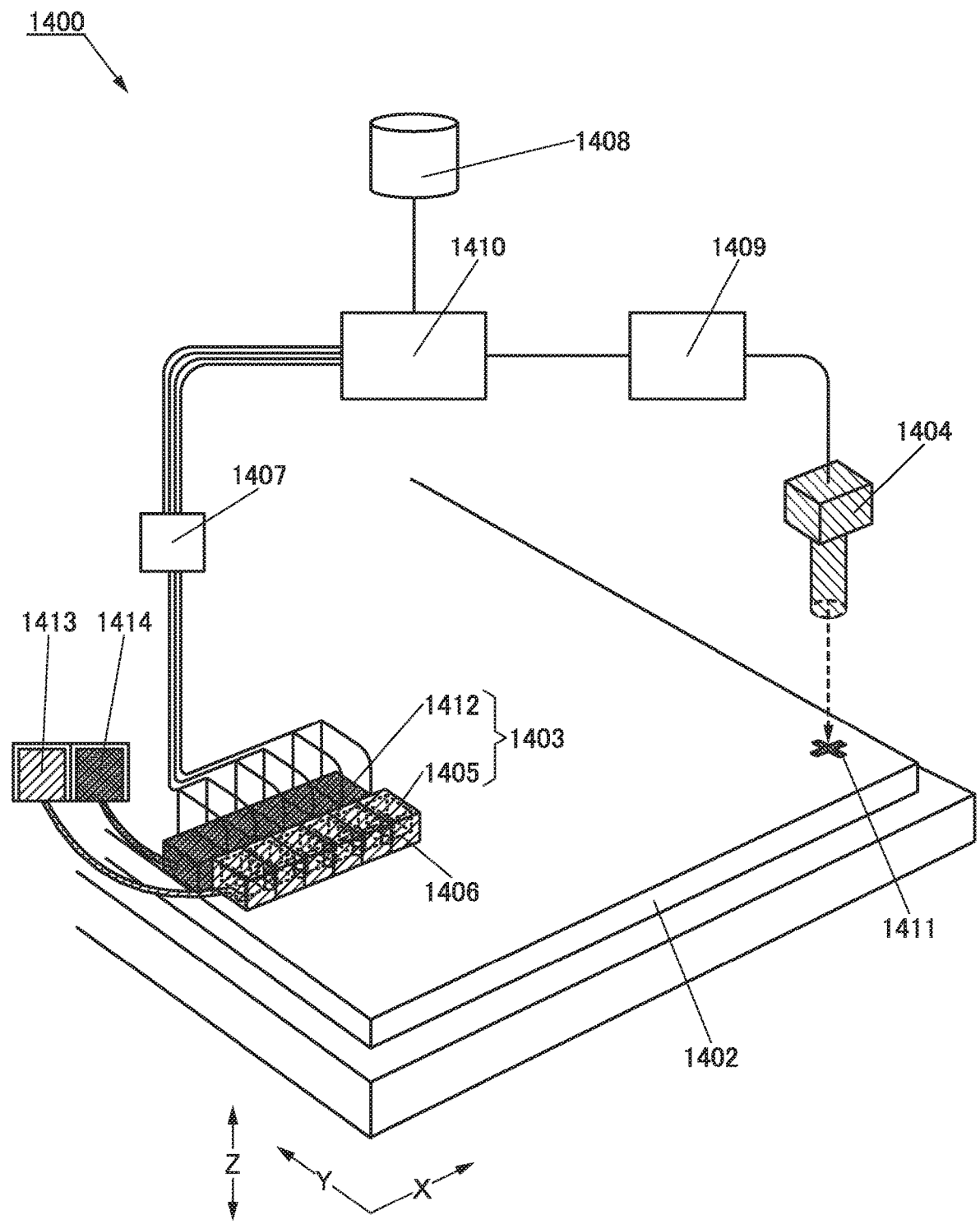
FIG. 21 is a conceptual diagram illustrating a droplet discharge apparatus.

Next, a droplet discharge apparatus used for the droplet discharge method is described with reference to FIG. 21. FIG. 21 is a conceptual diagram illustrating a droplet discharge apparatus 1400.

The droplet discharge apparatus 1400 includes a droplet discharge means 1403. In addition, the droplet discharge means 1403 is equipped with a head 1405 and a head 1412.

The heads 1405 and 1412 are connected to a control means 1407, and this control means 1407 is controlled by a computer 1410; thus, a preprogrammed pattern can be drawn.

The drawing may be conducted at a timing, for example, based on a marker 1411 formed over a substrate 1402. Alternatively, the reference point may be determined on the basis of an outer edge of the substrate 1402. Here, the marker 1411 is detected by an imaging means 1404 and converted into a digital signal by an image processing means 1409. Then, the digital signal is recognized by the computer 1410, and then, a control signal is generated and transmitted to the control means 1407.

An image sensor or the like using a charge coupled device (CCD) or a complementary metal oxide semiconductor (CMOS) can be used as the imaging means 1404. Note that information on a pattern to be formed over the substrate 1402 is stored in a storage medium 1408, and the control signal is transmitted to the control means 1407 on the basis of the information, whereby the head 1405 and the head 1412 of the droplet discharge means 1403 can be separately controlled. The heads 1405 and 1412 are supplied with a material to be discharged from material supply sources 1413 and 1414 through pipes, respectively.

Inside the head 1405, a space 1406 filled with a liquid material as indicated by a dotted line and a nozzle serving as a discharge opening are provided. Although it is not shown, an inside structure of the head 1412 is similar to that of the head 1405. When the nozzle sizes of the heads 1405 and 1412 are different from each other, different materials with different widths can be discharged simultaneously. Each head can discharge and draw a plurality of light emitting materials. In the case of drawing over a large area, the same material can be simultaneously discharged to be drawn from a plurality of nozzles in order to improve throughput. When a large substrate is used, the heads 1405 and 1412 can freely scan the substrate in directions indicated by arrows X, Y, and Z in FIG. 21, and a region in which a pattern is drawn can be freely set. Thus, a plurality of the same patterns can be drawn over one substrate.

Furthermore, a step of discharging the composition may be performed under reduced pressure. Also, a substrate may be heated when the composition is discharged. After discharging the composition, either drying or baking or the both is performed. Both the drying and baking steps are heat treatments but different in purpose, temperature, and time period. The steps of drying and baking are performed under normal pressure or under reduced pressure by laser irradiation, rapid thermal annealing, heating using a heating furnace, or the like. Note that the timing of the heat treatment and the number of times of the heat treatment are not particularly limited. The temperature for performing each of the steps of drying and baking in a favorable manner depends on the materials of the substrate and the properties of the composition.

As described above, the EL layer 616 can be formed with the droplet discharge apparatus.

In the above-described manner, the display device including the light-emitting device described in Embodiments 1 and 2 can be obtained.

<Structural Example 2 of Display Device>

Figure 19:
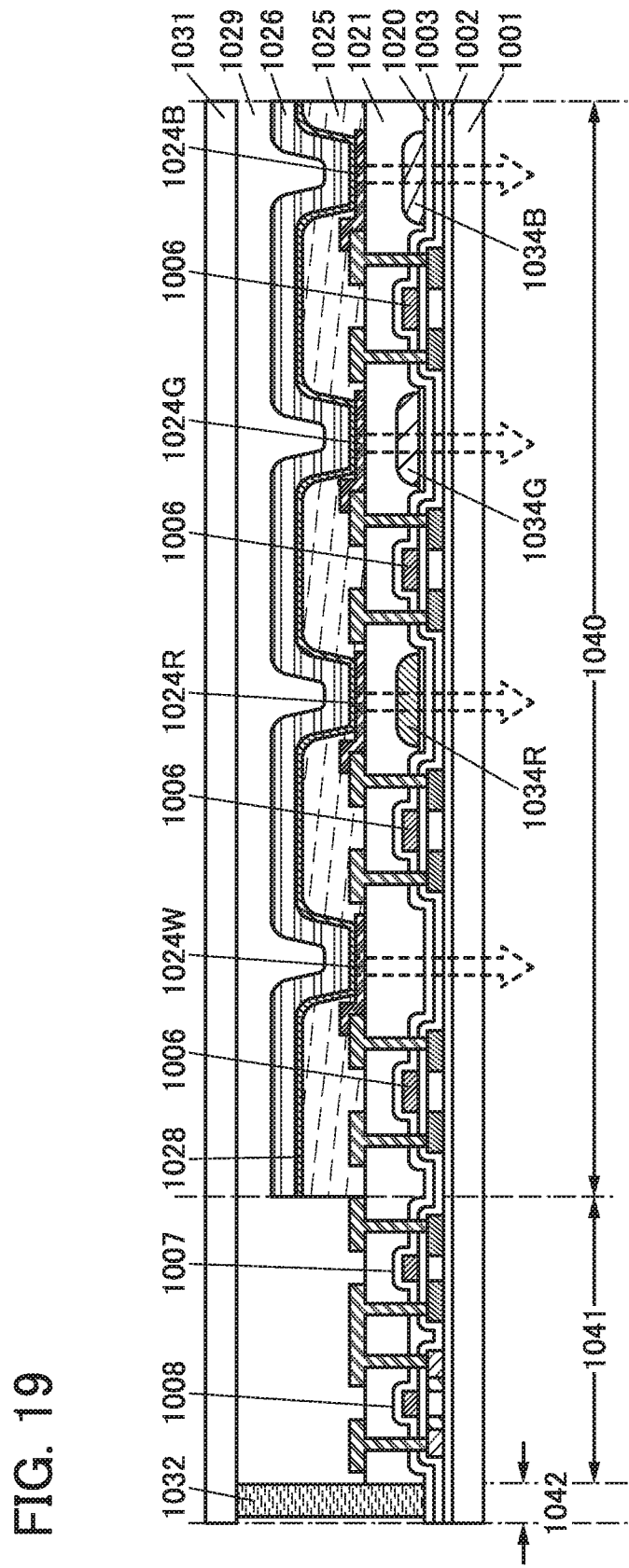
FIG. 19 is a cross-sectional schematic view of a display device of one embodiment of the present invention.

Next, another example of the display device is described with reference to FIGS. 18A and 18B and FIG. 19. Note that FIGS. 18A and 18B and FIG. 19 are each a cross-sectional view of a display device of one embodiment of the present invention.

FIG. 18A illustrates a substrate 1001, a base insulating film 1002, a gate insulating film 1003, gate electrodes 1006, 1007, and 1008, a first interlayer insulating film 1020, a second interlayer insulating film 1021, a peripheral portion 1042, a pixel portion 1040, a driver circuit portion 1041, lower electrodes 1024W, 1024R, 1024G, and 1024B of light-emitting elements, a partition wall 1025, an EL layer 1028, an upper electrode 1026 of the light-emitting elements, a sealing layer 1029, a sealing substrate 1031, a sealant 1032, and the like are illustrated.

In FIG. 18A, examples of the optical elements, coloring layers (a red coloring layer 1034R, a green coloring layer 1034G, and a blue coloring layer 1034B) are provided on a transparent base material 1033. Furthermore, a light-blocking layer 1035 may be provided. The transparent base material 1033 provided with the coloring layers and the light-blocking layer is positioned and fixed to the substrate 1001. Note that the coloring layers and the light-blocking layer are covered with an overcoat layer 1036. In FIG. 18A, the coloring layer 1034R transmits red light, the coloring layer 1034G transmits green light, and the coloring layer 1034B transmits blue light.

FIG. 18B illustrates an example in which, as examples of the optical elements, the coloring layers (the red coloring layer 1034R, the green coloring layer 1034G, and the blue coloring layer 1034B) are provided between the gate insulating film 1003 and the first interlayer insulating film 1020. As in this structure, the coloring layers may be provided between the substrate 1001 and the sealing substrate 1031.

FIG. 19 illustrates an example in which, as examples of the optical elements, the coloring layers (the red coloring layer 1034R, the green coloring layer 1034G, and the blue coloring layer 1034B) are provided between the first interlayer insulating film 1020 and the second interlayer insulating film 1021. As in this structure, the coloring layers may be provided between the substrate 1001 and the sealing substrate 1031.

The display device of one embodiment of the present invention includes subpixels for four colors (red, green, blue, and yellow or red, green, blue, and white). Since the light-emitting element which exhibits yellow or white light has high light emission efficiency, the display device including the subpixel for yellow or white can have lower power consumption.

The lower electrode 1024W preferably has a function of transmitting light. The upper electrode 1026 is provided over the EL layer 1028. In addition, it is preferable that the upper electrode 1026 have a function of reflecting light. It is preferable that the lower electrodes 1024R, 1024G, and 1024B have functions of transmitting light and reflecting light and that a microcavity structure be used between the upper electrode 1026 and the lower electrodes 1024R, 1024G, and 1024B, in which case the intensity of light having a specific wavelength is increased.

FIGS. 18A and 18B and FIG. 19 illustrate the structure provided with a plurality of light-emitting elements and the coloring layers for the light-emitting elements as an example; however, the structure is not limited thereto. For example, a structure in which any of the red coloring layer 1034R, the green coloring layer 1034G, or the blue coloring layer 1034B is not provided may be employed. The structure where the light-emitting elements are provided with the coloring layers is effective to suppress reflection of external light. In contrast, the structure without the coloring layer is less likely to cause the loss of light emitted from the light-emitting element and thus is effective to reduce power consumption.

The above-described display device has a structure in which light is extracted from the substrate 1001 side where the transistors are formed (a bottom-emission structure), but may have a structure in which light is extracted from the sealing substrate 1031 side (a top-emission structure).

Note that the sealing substrate 1031 has a function of protecting the light-emitting element. Thus, for the sealing substrate 1031, a flexible substrate or a film can be used.

The structures described in this embodiment can be combined as appropriate with any of the other structures in this embodiment and the other embodiments.

Embodiment 4

In this embodiment, a display device including a light-emitting device of one embodiment of the present invention will be described with reference to FIGS. 22A and 22B, FIGS. 23A and 23B, and FIGS. 24A and 24B.

Figure 22A:
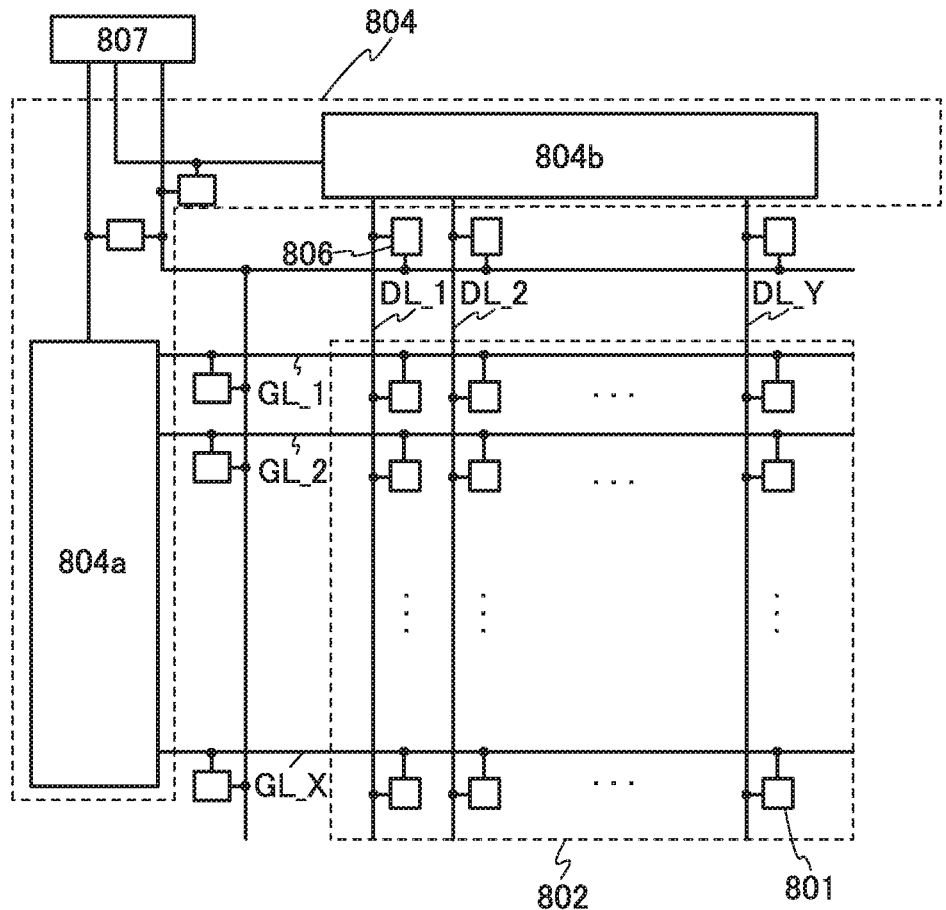
FIGS. 22A and 22B are a block diagram and a circuit diagram, respectively, of a display device of one embodiment of the present invention.
Figure 22B:
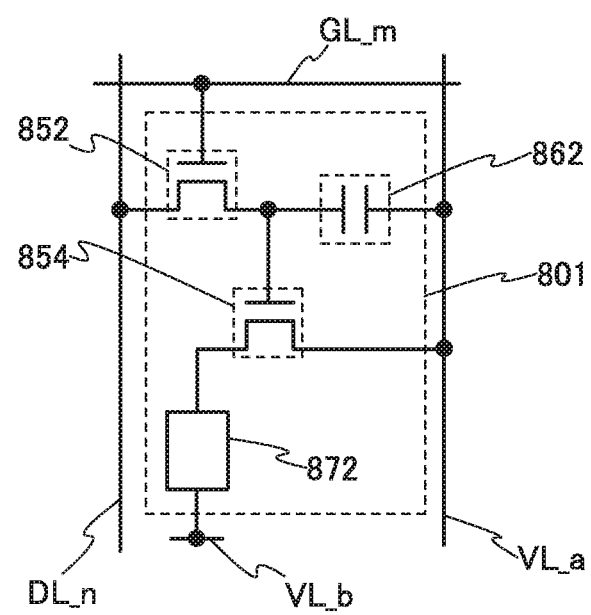

FIG. 22A is a block diagram showing the display device of one embodiment of the present invention, and FIG. 22B is a circuit diagram showing a pixel circuit of the display device of one embodiment of the present invention.

<Display Device>

The display device shown in FIG. 22A includes a region including pixels of display elements (the region is hereinafter referred to as a pixel portion 802), a circuit portion that is provided outside the pixel portion 802 and includes circuits for driving the pixels (the portion is hereinafter referred to as a driver circuit portion 804), circuits having a function of protecting elements (the circuits are hereinafter referred to as protection circuits 806), and a terminal portion 807. Note that the protection circuits 806 are not necessarily provided.

A part or the whole of the driver circuit portion 804 is preferably formed over a substrate over which the pixel portion 802 is formed. Thus, the number of components and the number of terminals can be reduced. When a part or the whole of the driver circuit portion 804 is not formed over the substrate over which the pixel portion 802 is formed, the part or the whole of the driver circuit portion 804 can be mounted by COG or tape automated bonding (TAB).

The pixel portion 802 includes a plurality of circuits for driving display elements arranged in X rows (X is a natural number of 2 or more) and Y columns (Y is a natural number of 2 or more) (such circuits are hereinafter referred to as pixel circuits 801). The driver circuit portion 804 includes driver circuits such as a circuit for supplying a signal (scan signal) to select a pixel (the circuit is hereinafter referred to as a scan line driver circuit 804a) and a circuit for supplying a signal (data signal) to drive a display element in a pixel (the circuit is hereinafter referred to as a signal line driver circuit 804b).

The scan line driver circuit 804a includes a shift register or the like. Through the terminal portion 807, the scan line driver circuit 804a receives a signal for driving the shift register and outputs a signal. For example, the scan line driver circuit 804a receives a start pulse signal, a clock signal, or the like and outputs a pulse signal. The scan line driver circuit 804a has a function of controlling the potentials of wirings supplied with scan signals (such wirings are hereinafter referred to as scan lines GL_1 to GL_X). Note that a plurality of scan line driver circuits 804a may be provided to control the scan lines GL_1 to GL_X separately. Alternatively, the scan line driver circuit 804a has a function of supplying an initialization signal. Without being limited thereto, the scan line driver circuit 804a can supply another signal.

The signal line driver circuit 804b includes a shift register or the like. The signal line driver circuit 804b receives a signal (image signal) from which a data signal is derived, as well as a signal for driving the shift register, through the terminal portion 807. The signal line driver circuit 804b has a function of generating a data signal to be written to the pixel circuit 801 which is based on the image signal. In addition, the signal line driver circuit 804b has a function of controlling output of a data signal in response to a pulse signal produced by input of a start pulse signal, a clock signal, or the like. Furthermore, the signal line driver circuit 804b has a function of controlling the potentials of wirings supplied with data signals (such wirings are hereinafter referred to as data lines DL_1 to DL_Y). Alternatively, the signal line driver circuit 804b has a function of supplying an initialization signal. Without being limited thereto, the signal line driver circuit 804b can supply another signal.

The signal line driver circuit 804b includes a plurality of analog switches or the like, for example. The signal line driver circuit 804b can output, as the data signals, signals obtained by time-dividing the image signal by sequentially turning on the plurality of analog switches. The signal line driver circuit 804b may include a shift register or the like.

A pulse signal and a data signal are input to each of the plurality of pixel circuits 801 through one of the plurality of scan lines GL supplied with scan signals and one of the plurality of data lines DL supplied with data signals, respectively. Writing and holding of the data signal to and in each of the plurality of pixel circuits 801 are controlled by the scan line driver circuit 804a. For example, to the pixel circuit 801 in the m-th row and the n-th column (m is a natural number less than or equal to X, and n is a natural number less than or equal to Y), a pulse signal is input from the scan line driver circuit 804a through the scan line GL_m, and a data signal is input from the signal line driver circuit 804b through the data line DL_n in accordance with the potential of the scan line GL_m.

The protection circuit 806 shown in FIG. 22A is connected to, for example, the scan line GL between the scan line driver circuit 804a and the pixel circuit 801. Alternatively, the protection circuit 806 is connected to the data line DL between the signal line driver circuit 804b and the pixel circuit 801. Alternatively, the protection circuit 806 can be connected to a wiring between the scan line driver circuit 804a and the terminal portion 807. Alternatively, the protection circuit 806 can be connected to a wiring between the signal line driver circuit 804b and the terminal portion 807. Note that the terminal portion 807 means a portion having terminals for inputting power, control signals, and image signals to the display device from external circuits.

The protection circuit 806 is a circuit that electrically connects a wiring connected to the protection circuit to another wiring when a potential out of a certain range is applied to the wiring connected to the protection circuit.

As illustrated in FIG. 22A, the protection circuits 806 are connected to the pixel portion 802 and the driver circuit portion 804, so that the resistance of the display device to overcurrent generated by electrostatic discharge (ESD) or the like can be improved. Note that the configuration of the protection circuits 806 is not limited to that, and for example, a configuration in which the protection circuits 806 are connected to the scan line driver circuit 804a or a configuration in which the protection circuits 806 are connected to the signal line driver circuit 804b may be employed. Alternatively, the protection circuits 806 may be configured to be connected to the terminal portion 807.

FIG. 22A shows an example in which the driver circuit portion 804 includes the scan line driver circuit 804a and the signal line driver circuit 804b; however, the configuration is not limited thereto. For example, only the scan line driver circuit 804a may be formed and a separately prepared substrate where a signal line driver circuit is formed (e.g., a driver circuit substrate formed with a single crystal semiconductor film or a polycrystalline semiconductor film) may be mounted.

<Structural Example of Pixel Circuit>

Each of the plurality of pixel circuits 801 in FIG. 22A can have a configuration shown in FIG. 22B, for example.

The pixel circuit 801 shown in FIG. 22B includes transistors 852 and 854, a capacitor 862, and a light-emitting element 872.

One of a source electrode and a drain electrode of the transistor 852 is electrically connected to a wiring to which a data signal is supplied (a data line DL_n). A gate electrode of the transistor 852 is electrically connected to a wiring to which a gate signal is supplied (a scan line GL_m).

The transistor 852 has a function of controlling whether to write a data signal.

One of a pair of electrodes of the capacitor 862 is electrically connected to a wiring to which a potential is supplied (hereinafter referred to as a potential supply line VL_a), and the other is electrically connected to the other of the source electrode and the drain electrode of the transistor 852.

The capacitor 862 functions as a storage capacitor for storing written data.

One of a source electrode and a drain electrode of the transistor 854 is electrically connected to the potential supply line VL_a. Furthermore, a gate electrode of the transistor 854 is electrically connected to the other of the source electrode and the drain electrode of the transistor 852.

One of an anode and a cathode of the light-emitting element 872 is electrically connected to a potential supply line VL_b, and the other is electrically connected to the other of the source electrode and the drain electrode of the transistor 854.

As the light-emitting element 872, any of the light-emitting elements described in Embodiments 1 and 2 can be used.

Note that a high power supply potential VDD is supplied to one of the potential supply line VL_a and the potential supply line VL_b, and a low power supply potential VSS is supplied to the other.

In the display device including the pixel circuits 801 in FIG. 22B, the pixel circuits 801 are sequentially selected row by row by the scan line driver circuit 804a in FIG. 22A, for example, whereby the transistors 852 are turned on and a data signal is written.

When the transistors 852 are turned off, the pixel circuits 801 in which the data has been written are brought into a holding state. Furthermore, the amount of current flowing between the source electrode and the drain electrode of the transistor 854 is controlled in accordance with the potential of the written data signal, whereby the light-emitting element 872 emits light with luminance in accordance with the amount of flowing current. This operation is sequentially performed row by row; thus, an image is displayed.

Alternatively, the pixel circuit can have a function of compensating variation in threshold voltages or the like of a transistor. FIGS. 23A and 23B and FIGS. 24A and 24B show examples of the pixel circuit.

Figure 23A:
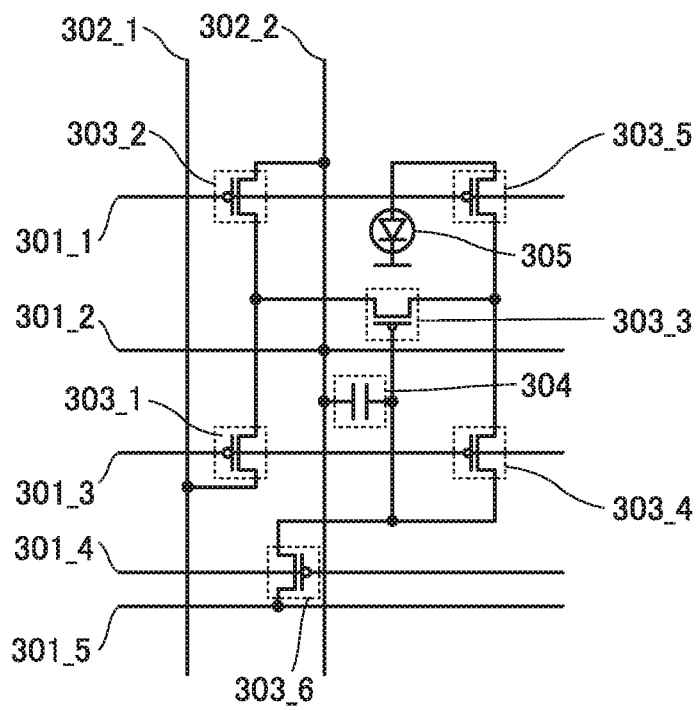
FIGS. 23A and 23B are each a circuit diagram of a pixel circuit of a display device of one embodiment of the present invention.

The pixel circuit shown in FIG. 23A includes six transistors (transistors 303_1 to 303_6), a capacitor 304, and a light-emitting element 305. To the pixel circuit shown in FIG. 23A, wirings 301_1 to 301_5 and wirings 302_1 and 302_2 are electrically connected. Note that as the transistors 303_1 to 303_6, for example, p-channel transistors can be used.

Figure 23B:
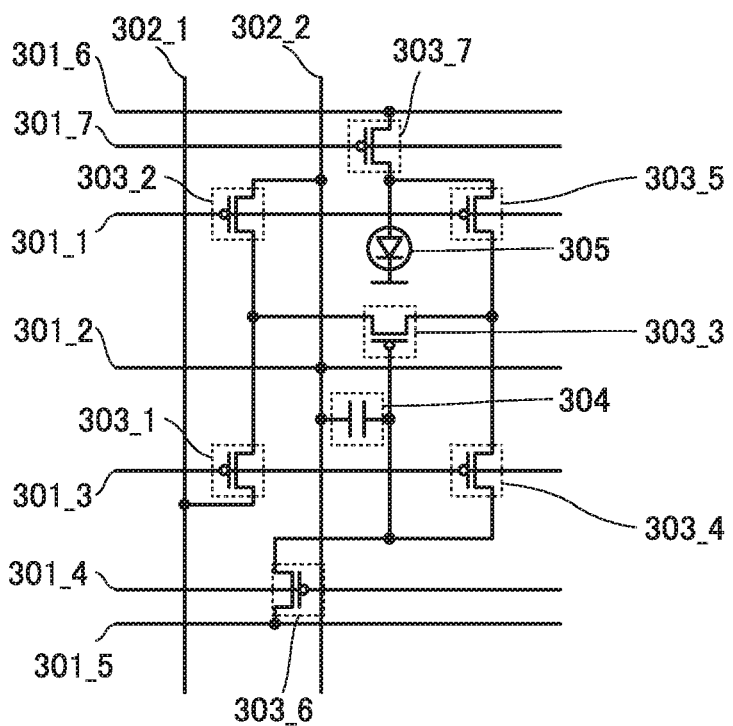

The pixel circuit shown in FIG. 23B has a configuration in which a transistor 303_7 is added to the pixel circuit shown in FIG. 23A. To the pixel circuit shown in FIG. 23B, wirings 301_6 and 301_7 are electrically connected. The wirings 301_5 and 301_6 may be electrically connected to each other. Note that as the transistor 3037, for example, a p-channel transistor can be used.

Figure 24A:
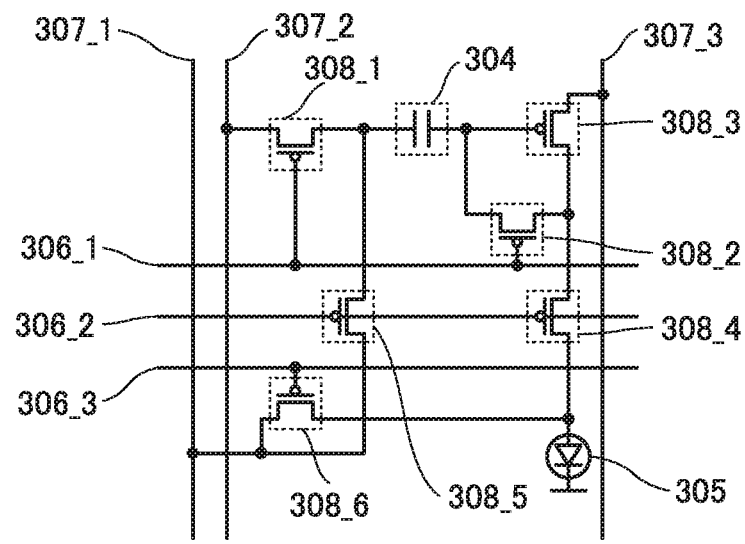
FIGS. 24A and 24B are each a circuit diagram of a pixel circuit of a display device of one embodiment of the present invention.

The pixel circuit shown in FIG. 24A includes six transistors (transistors 308_1 to 308_6), the capacitor 304, and the light-emitting element 305. To the pixel circuit shown in FIG. 24A, wirings 306_1 to 306_3 and wirings 307_1 to 307_3 are electrically connected. The wirings 306_1 and 306_3 may be electrically connected to each other. Note that as the transistors 308_1 to 3086, for example, p-channel transistors can be used.

Figure 24B:
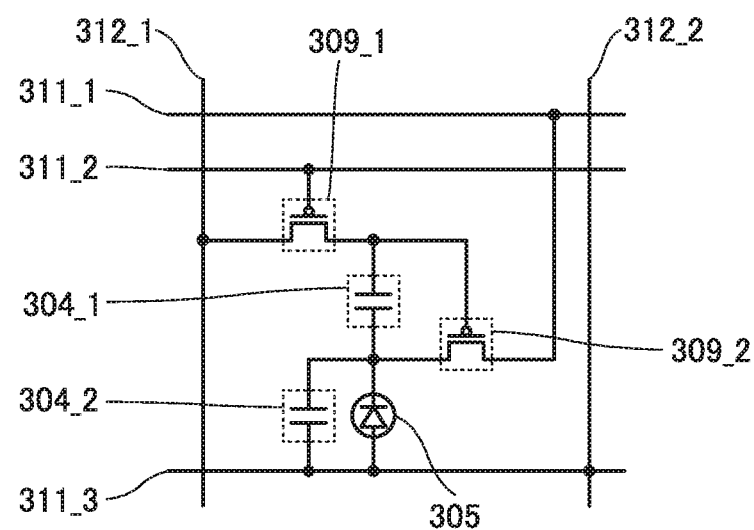

The pixel circuit shown in FIG. 24B includes two transistors (transistors 309_1 and 3092), two capacitors (capacitors 304_1 and 304_2), and the light-emitting element 305. To the pixel circuit illustrated in FIG. 24B, wirings 311_1 to 311_3 and wirings 312_1 and 312_2 are electrically connected. With the configuration of the pixel circuit shown in FIG. 24B, the pixel circuit can be driven by a voltage inputting current driving method (also referred to as a CVCC method). Note that as the transistors 309_1 and 309_2, for example, p-channel transistors can be used.

A light-emitting element of one embodiment of the present invention can be used for an active matrix method in which an active element is included in a pixel of a display device or a passive matrix method in which an active element is not included in a pixel of a display device.

In an active matrix method, as an active element (a non-linear element), not only a transistor but also various active elements (non-linear elements) can be used. For example, an MIM (metal insulator metal), a TFD (thin film diode), or the like can also be used. Since such an element has few numbers of manufacturing steps, manufacturing cost can be reduced or yield can be improved. Alternatively, since the size of the element is small, the aperture ratio can be improved, so that power consumption can be reduced or higher luminance can be achieved.

As a method other than the active matrix method, the passive matrix method in which an active element (a non-linear element) is not used can also be used. Since an active element (a non-linear element) is not used, the number of manufacturing steps is small, so that manufacturing cost can be reduced or yield can be improved. Alternatively, since an active element (a non-linear element) is not used, the aperture ratio can be improved, so that power consumption can be reduced or higher luminance can be achieved, for example.

The structure described in this embodiment can be used in appropriate combination with the structure described in any of the other embodiments.

Embodiment 5

In this embodiment, a display device including a light-emitting device of one embodiment of the present invention and an electronic device in which the display device is provided with an input device will be described with reference to FIGS. 25A and 25B, FIGS. 26A to 26C, FIG. 27, FIGS. 28A and 28B, and FIG. 29.

<Description 1 of Touch Panel>

In this embodiment, a touch panel 2000 including a display device and an input device will be described as an example of an electronic device. In addition, an example in which a touch sensor is included as an input device will be described.

Figure 25A:
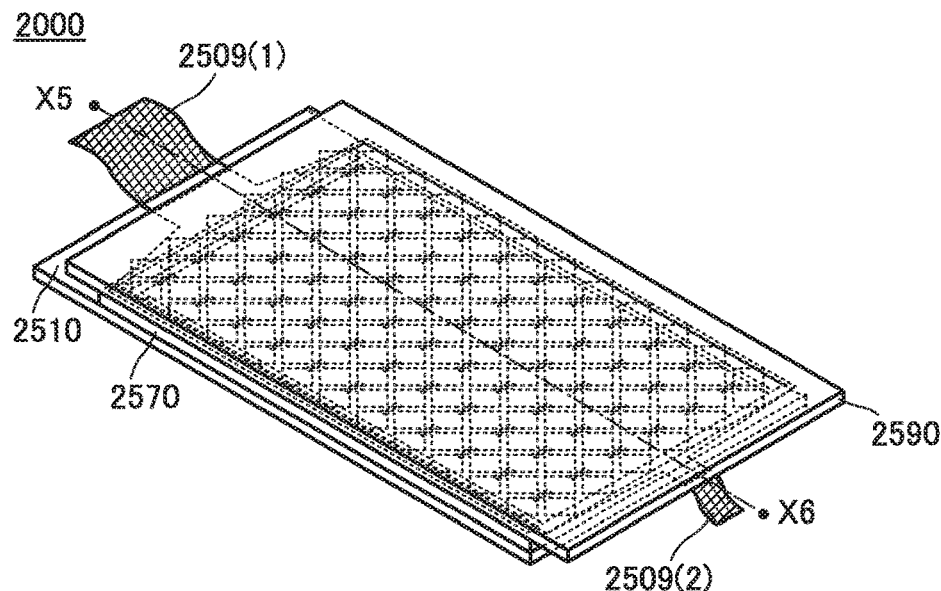
FIGS. 25A and 25B are perspective views illustrating an example of a touch panel of one embodiment of the present invention.
Figure 25B:
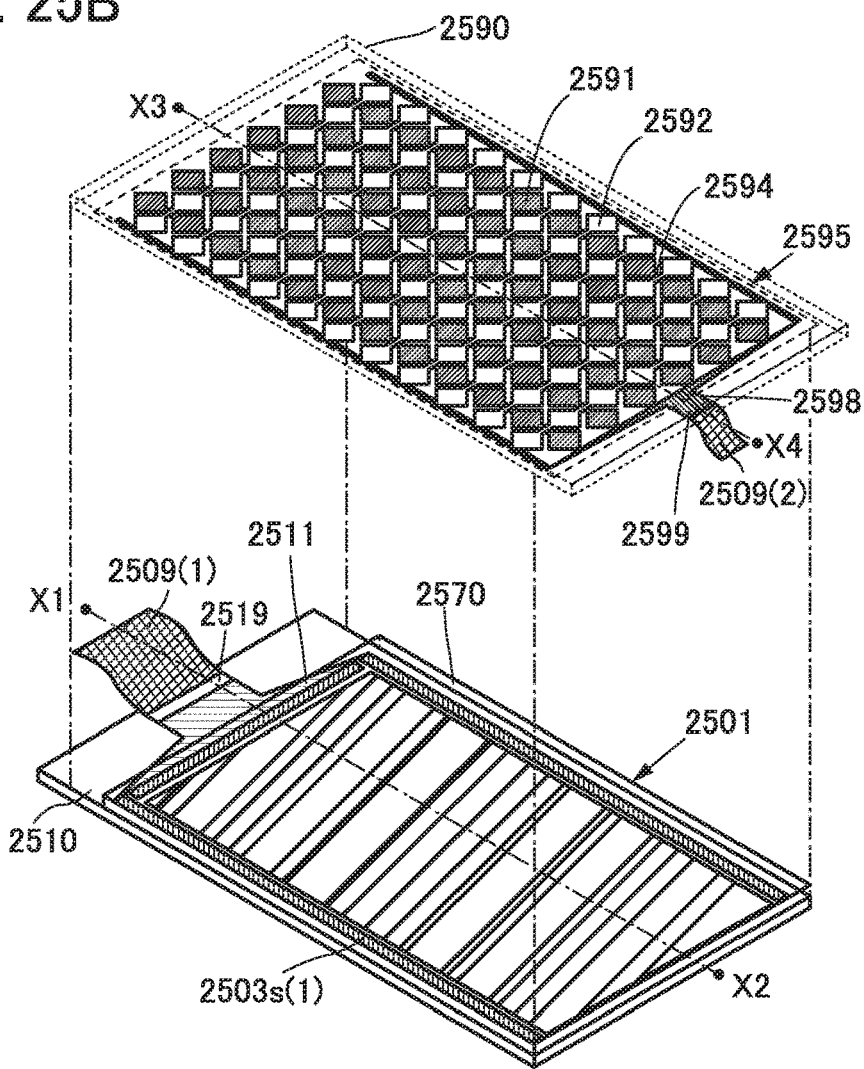

FIGS. 25A and 25B are perspective views of the touch panel 2000. Note that FIGS. 25A and 25B illustrate only main components of the touch panel 2000 for simplicity.

The touch panel 2000 includes a display device 2501 and a touch sensor 2595 (see FIG. 25B). Furthermore, the touch panel 2000 includes a substrate 2510, a substrate 2570, and a substrate 2590. Note that the substrate 2510, the substrate 2570, and the substrate 2590 each have flexibility. Note that one or all of the substrates 2510, 2570, and 2590 may be inflexible.

The display device 2501 includes a plurality of pixels over the substrate 2510 and a plurality of wirings 2511 through which signals are supplied to the pixels. The plurality of wirings 2511 are led to a peripheral portion of the substrate 2510, and part of the plurality of wirings 2511 forms a terminal 2519. The terminal 2519 is electrically connected to an FPC 2509(1). The plurality of wirings 2511 can supply signals from a signal line driver circuit 2503s(1) to the plurality of pixels.

The substrate 2590 includes the touch sensor 2595 and a plurality of wirings 2598 electrically connected to the touch sensor 2595. The plurality of wirings 2598 are led to a peripheral portion of the substrate 2590, and parts of the plurality of wirings 2598 form a terminal. The terminal is electrically connected to an FPC 2509(2). Note that in FIG. 25B, electrodes, wirings, and the like of the touch sensor 2595 provided on the back side of the substrate 2590 (the side facing the substrate 2510) are indicated by solid lines for clarity.

As the touch sensor 2595, a capacitive touch sensor can be used, for example. Examples of the capacitive touch sensor are a surface capacitive touch sensor and a projected capacitive touch sensor.

Examples of the projected capacitive touch sensor are a self capacitive touch sensor and a mutual capacitive touch sensor, which differ mainly in the driving method. The use of a mutual capacitive touch sensor is preferable because multiple points can be sensed simultaneously.

Note that the touch sensor 2595 illustrated in FIG. 25B is an example of using a projected capacitive touch sensor.

Note that a variety of sensors that can sense proximity or touch of a sensing target such as a finger can be used as the touch sensor 2595.

The projected capacitive touch sensor 2595 includes electrodes 2591 and electrodes 2592. The electrodes 2591 are electrically connected to any of the plurality of wirings 2598, and the electrodes 2592 are electrically connected to any of the other wirings 2598.

The electrodes 2592 each have a shape of a plurality of quadrangles arranged in one direction with one corner of a quadrangle connected to one corner of another quadrangle as illustrated in FIGS. 25A and 25B.

The electrodes 2591 each have a quadrangular shape and are arranged in a direction intersecting with the direction in which the electrodes 2592 extend.

A wiring 2594 electrically connects two electrodes 2591 between which the electrode 2592 is positioned. The intersecting area of the electrode 2592 and the wiring 2594 is preferably as small as possible. Such a structure allows a reduction in the area of a region where the electrodes are not provided, reducing unevenness in transmittance. As a result, unevenness in the luminance of light from the touch sensor 2595 can be reduced.

Note that the shapes of the electrodes 2591 and the electrodes 2592 are not limited to the above-mentioned shapes and can be any of a variety of shapes. For example, a structure may be employed in which the plurality of electrodes 2591 are arranged so that gaps between the electrodes 2591 are reduced as much as possible, and the electrodes 2592 are spaced apart from the electrodes 2591 with an insulating layer interposed therebetween to have regions not overlapping with the electrodes 2591. In that case, between two adjacent electrodes 2592, a dummy electrode which is electrically insulated from these electrodes is preferably provided, whereby the area of a region having a different transmittance can be reduced.

<Display Device>

Figure 26A:
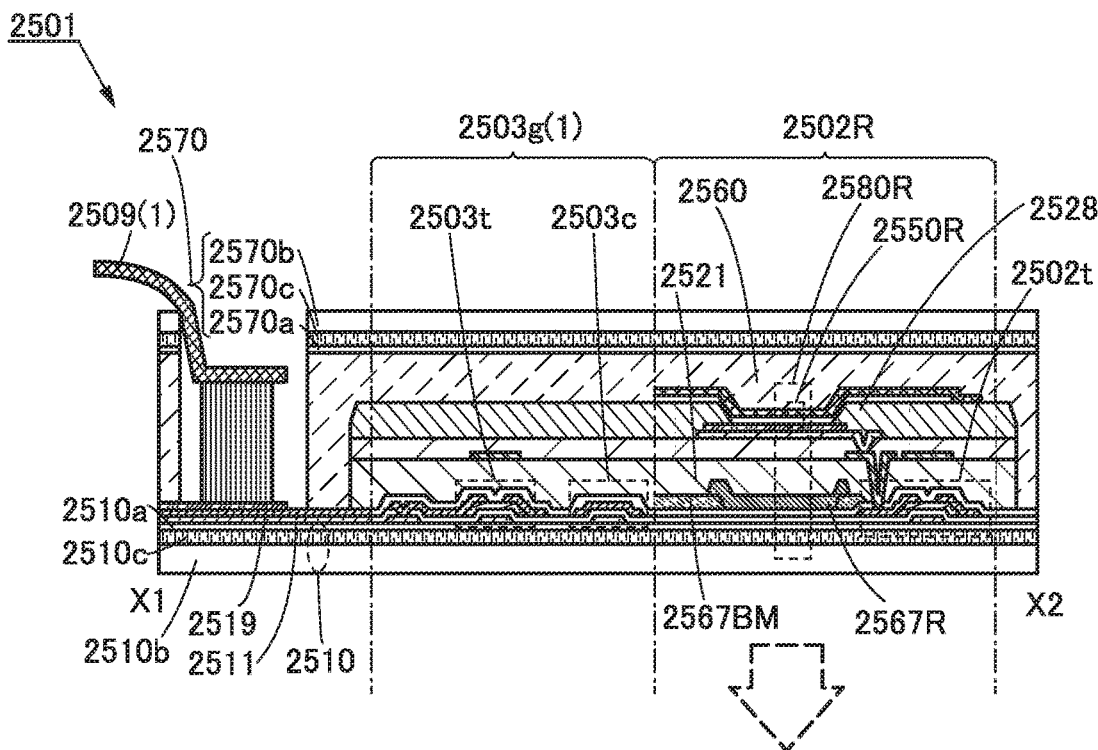
FIGS. 26A to 26C are cross-sectional views illustrating examples of a display device and a touch sensor of one embodiment of the present invention.

Next, the display device 2501 is described in detail with reference to FIG. 26A. FIG. 26A corresponds to a cross-sectional view taken along the dashed-dotted line X1-X2 in FIG. 25B.

The display device 2501 includes a plurality of pixels arranged in a matrix. Each of the pixels includes a display element and a pixel circuit for driving the display element.

In the following description, an example of using a light-emitting element that emits white light as a display element will be described; however, the display element is not limited to such an element. For example, light-emitting elements that emit light of different colors may be included so that the light of different colors can be emitted from adjacent pixels.

For the substrate 2510 and the substrate 2570, for example, a flexible material with a vapor permeability of lower than or equal to $1\times10^{-5}$ g·m$^{-2}$·day$^{-1}$, preferably lower than or equal to $1\times10^{-6}$ g·m$^{-2}$·day$^{-1}$ can be favorably used. Note that materials whose thermal expansion coefficients are substantially equal to each other are preferably used for the substrate 2510 and the substrate 2570 respectively. For example, the coefficient of linear expansion of the materials are preferably lower than or equal to $1\times10^{-3}$/K, further preferably lower than or equal to $5\times10^{-5}$/K, and still further preferably lower than or equal to $1\times10^{-5}$/K.

Note that the substrate 2510 is a stacked body including an insulating layer 2510a for preventing impurity diffusion into the light-emitting element, a flexible substrate 2510b, and an adhesive layer 2510c for attaching the insulating layer 2510a and the flexible substrate 2510b to each other. The substrate 2570 is a stacked body including an insulating layer 2570a for preventing impurity diffusion into the light-emitting element, a flexible substrate 2570b, and an adhesive layer 2570c for attaching the insulating layer 2570a and the flexible substrate 2570b to each other.

For the adhesive layer 2510c and the adhesive layer 2570c, for example, polyester, polyolefin, polyamide (e.g., nylon, aramid), polyimide, polycarbonate, or an acrylic resin, polyurethane, or an epoxy resin can be used. Alternatively, a material that includes a resin having a siloxane bond such as silicone can be used.

A sealing layer 2560 is provided between the substrate 2510 and the substrate 2570. The sealing layer 2560 preferably has a refractive index higher than that of air. In the case where light is extracted to the sealing layer 2560 side, the sealing layer 2560 can also serve as an optical adhesive layer.

A sealant may be formed in the peripheral portion of the sealing layer 2560. With use of the sealant, a light-emitting element 2550R can be provided in a region surrounded by the substrate 2510, the substrate 2570, the sealing layer 2560, and the sealant. Note that an inert gas (such as nitrogen or argon) may be used instead of the sealing layer 2560. A drying agent may be provided in the inert gas so as to adsorb moisture or the like. A resin such as an acrylic resin or an epoxy resin may be used. For example, an epoxy-based resin or a glass frit is preferably used as the sealant. As a material used for the sealant, a material which is impermeable to moisture or oxygen is preferably used.

The display device 2501 includes a pixel 2502R. The pixel 2502R includes a light-emitting module 2580R.

The pixel 2502R includes the light-emitting element 2550R and a transistor 2502t that can supply electric power to the light-emitting element 2550R. Note that the transistor 2502t functions as part of the pixel circuit. The light-emitting module 2580R includes the light-emitting element 2550R and a coloring layer 2567R.

The light-emitting element 2550R includes a lower electrode, an upper electrode, and an EL layer between the lower electrode and the upper electrode. As the light-emitting element 2550R, any of the light-emitting elements described in Embodiments 1 and 2 can be used.

A microcavity structure may be employed between the lower electrode and the upper electrode so as to increase the intensity of light having a specific wavelength.

The coloring layer 2567R overlaps with the light-emitting element 2550R. Accordingly, part of light emitted from the light-emitting element 2550R passes through the coloring layer 2567R and is emitted to the outside of the light-emitting module 2580R as indicated by an arrow in FIG. 26A.

The display device 2501 includes a light-blocking layer 2567BM on the light extraction side. The light-blocking layer 2567BM is provided so as to surround the coloring layer 2567R.

The coloring layer 2567R is a coloring layer having a function of transmitting light in a particular wavelength range. For example, a color filter for transmitting light in a red wavelength range, a color filter for transmitting light in a green wavelength range, a color filter for transmitting light in a blue wavelength range, a color filter for transmitting light in a yellow wavelength range, or the like can be used. Each color filter can be formed with any of various materials by a printing method, an inkjet method, an etching method using a photolithography technique, or the like.

An insulating layer 2521 is provided in the display device 2501. The insulating layer 2521 covers the transistor 2502t. With the insulating layer 2521, an unevenness surface caused by the pixel circuit is planarized. The insulating layer 2521 may serve also as a layer for preventing diffusion of impurities. This can prevent a reduction in the reliability of the transistor 2502t or the like due to diffusion of impurities.

The light-emitting element 2550R is formed above the insulating layer 2521. A partition 2528 is provided so as to cover end portions of the lower electrode in the light-emitting element 2550R. Note that a spacer for controlling the distance between the substrate 2510 and the substrate 2570 may be provided over the partition 2528.

A scan line driver circuit 2503g(1) includes a transistor 2503t and a capacitor 2503c. Note that the driver circuit can be formed in the same process and over the same substrate as those of the pixel circuits.

Over the substrate 2510, the wirings 2511 through which a signal can be supplied are provided. Over the wirings 2511, the terminal 2519 is provided. The FPC 2509(1) is electrically connected to the terminal 2519. The FPC 2509(1) has a function of supplying a video signal, a clock signal, a start signal, a reset signal, or the like. Note that a printed wiring board (PWB) may be attached to the FPC 2509(1).

Figure 26B:
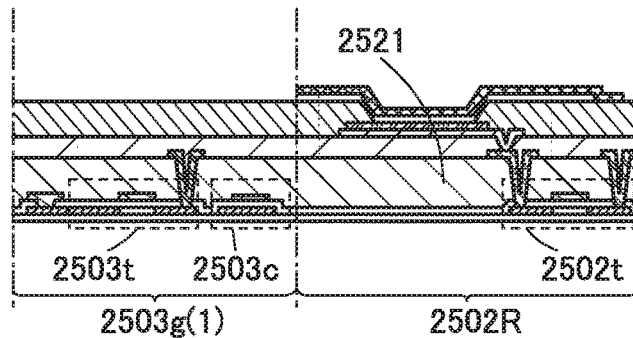

In the display device 2501, transistors with any of a variety of structures can be used. FIG. 26A illustrates an example of using bottom-gate transistors; however, the present invention is not limited to this example, and top-gate transistors may be used in the display device 2501 as illustrated in FIG. 26B.

In addition, there is no particular limitation on the polarity of the transistor 2502t and the transistor 2503t. For these transistors, n-channel and p-channel transistors may be used, or either n-channel transistors or p-channel transistors may be used, for example. Furthermore, there is no particular limitation on the crystallinity of a semiconductor film used for the transistors 2502t and 2503t. For example, an amorphous semiconductor film or a crystalline semiconductor film can be used. Examples of semiconductor materials include Group 14 semiconductors (e.g., a semiconductor including silicon), compound semiconductors (including oxide semiconductors), organic semiconductors, and the like. An oxide semiconductor that has an energy gap of 2 eV or more, preferably 2.5 eV or more, further preferably 3 eV or more is preferably used for one of the transistors 2502t and 2503t or both, so that the off-state current of the transistors can be reduced. Examples of the oxide semiconductors include an In—Ga oxide, an In-M-Zn oxide (M represents Al, Ga, Y, Zr, La, Ce, Sn, Hf, or Nd), and the like.

<Description of Touch Sensor>

Figure 26C:
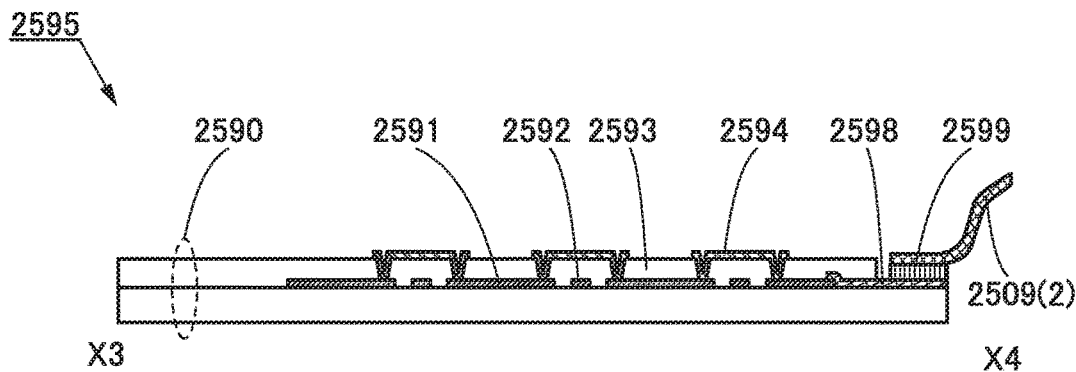

Next, the touch sensor 2595 is described in detail with reference to FIG. 26C. FIG. 26C corresponds to a cross-sectional view taken along the dashed-dotted line X3-X4 in FIG. 25B.

The touch sensor 2595 includes the electrodes 2591 and the electrodes 2592 provided in a staggered arrangement on the substrate 2590, an insulating layer 2593 covering the electrodes 2591 and the electrodes 2592, and the wiring 2594 that electrically connects the adjacent electrodes 2591 to each other.

The electrodes 2591 and the electrodes 2592 are formed using a light-transmitting conductive material. As a light-transmitting conductive material, a conductive oxide such as indium oxide, indium tin oxide, indium zinc oxide, zinc oxide, or zinc oxide to which gallium is added can be used. Note that a film including graphene can be used as well. The film including graphene can be formed, for example, by reducing a film containing graphene oxide. As a reducing method, a method with application of heat or the like can be employed.

The electrodes 2591 and the electrodes 2592 may be formed by, for example, depositing a light-transmitting conductive material on the substrate 2590 by a sputtering method and then removing an unnecessary portion by any of various pattern forming techniques such as photolithography.

Examples of a material for the insulating layer 2593 are a resin such as an acrylic resin or an epoxy resin, a resin having a siloxane bond such as silicone, and an inorganic insulating material such as silicon oxide, silicon oxynitride, or aluminum oxide.

Openings reaching the electrodes 2591 are formed in the insulating layer 2593, and the wiring 2594 electrically connects the adjacent electrodes 2591. A light-transmitting conductive material can be favorably used for the wiring 2594 because the aperture ratio of the touch panel can be increased. Moreover, a material having higher conductivity than the electrodes 2591 and 2592 can be favorably used for the wiring 2594 because electric resistance can be reduced.

One electrode 2592 extends in one direction, and a plurality of electrodes 2592 are provided in the form of stripes. The wiring 2594 intersects with the electrode 2592.

Adjacent electrodes 2591 are provided with one electrode 2592 provided therebetween. The wiring 2594 electrically connects the adjacent electrodes 2591.

Note that the plurality of electrodes 2591 are not necessarily arranged in the direction orthogonal to one electrode 2592 and may be arranged to intersect with one electrode 2592 at an angle of more than 0 degrees and less than 90 degrees.

One wiring 2598 is electrically connected to any of the electrodes 2591 and 2592. Part of the wiring 2598 functions as a terminal. For the wiring 2598, a metal material such as aluminum, gold, platinum, silver, nickel, titanium, tungsten, chromium, molybdenum, iron, cobalt, copper, or palladium or an alloy material containing any of these metal materials can be used.

Note that an insulating layer that covers the insulating layer 2593 and the wiring 2594 may be provided to protect the touch sensor 2595.

A connection layer 2599 electrically connects the wiring 2598 to the FPC 2509(2).

As the connection layer 2599, any of various anisotropic conductive films (ACF), anisotropic conductive pastes (ACP), or the like can be used.

<Description 2 of Touch Panel>

Figure 27:
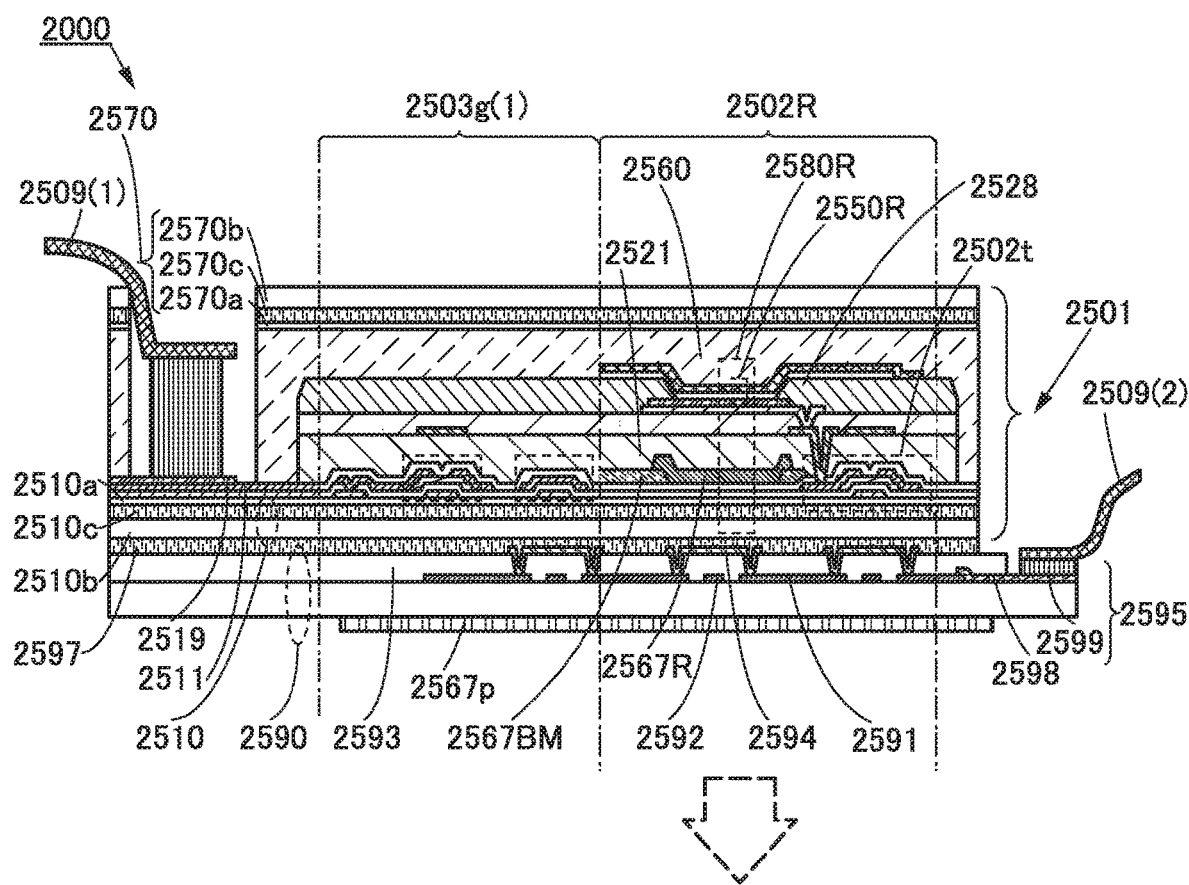
FIG. 27 is a cross-sectional view illustrating an example of a touch panel of one embodiment of the present invention.

Next, the touch panel 2000 is described in detail with reference to FIG. 27. FIG. 27 corresponds to a cross-sectional view taken along the dashed-dotted line X5-X6 in FIG. 25A.

In the touch panel 2000 illustrated in FIG. 27, the display device 2501 described with reference to FIG. 26A and the touch sensor 2595 described with reference to FIG. 26C are attached to each other.

The touch panel 2000 illustrated in FIG. 27 includes an adhesive layer 2597 and an anti-reflective layer 2567p in addition to the components described with reference to FIGS. 26A and 26C.

The touch sensor 2595 is provided on the substrate 2510 side of the display device 2501.

The adhesive layer 2597 is provided between the substrate 2510 and the substrate 2590 and attaches the touch sensor 2595 to the display device 2501.

The adhesive layer 2597 preferably has a light-transmitting property. A heat curable resin or an ultraviolet curable resin can be used for the adhesive layer 2597. For example, an acrylic resin, a urethane-based resin, an epoxy-based resin, or a siloxane-based resin can be used.

The anti-reflective layer 2567p is positioned in a region overlapping with pixels. As the anti-reflective layer 2567p, a circular polarizing plate can be used, for example.

The coloring layer 2567R is positioned in a region overlapping with the light-emitting element 2550R. The light-emitting element 2550R illustrated in FIG. 27 emits light to the side where the transistor 2502t is provided. Accordingly, part of light emitted from the light-emitting element 2550R passes through the coloring layer 2567R and is emitted to the outside of the light-emitting module 2580R as indicated by an arrow in FIG. 27.

<Method for Driving Touch Panel>

Next, an example of a method for driving a touch panel is described with reference to FIGS. 28A and 28B.

Figure 28A:
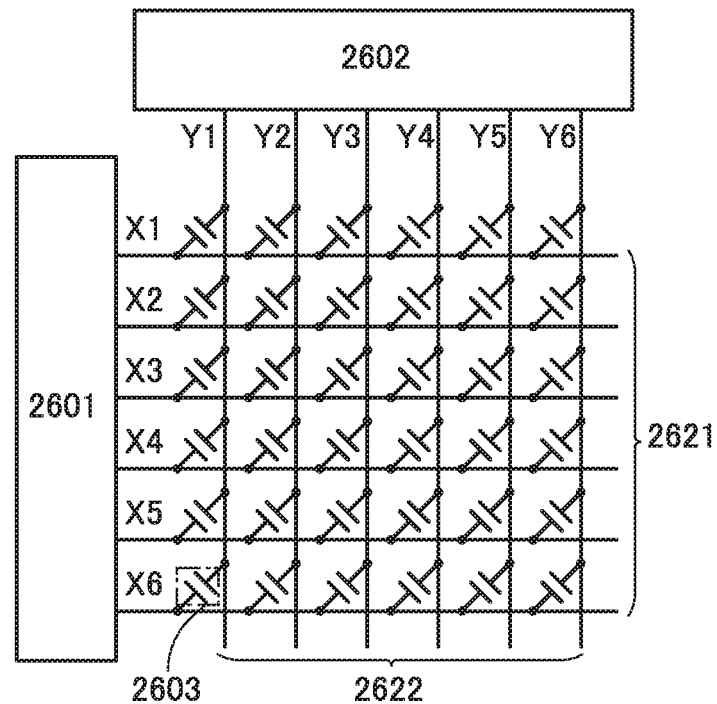
FIGS. 28A and 28B are a block diagram and a timing chart of a touch sensor of one embodiment of the present invention.

FIG. 28A is a block diagram illustrating the structure of a mutual capacitive touch sensor. FIG. 28A shows a pulse voltage output circuit 2601 and a current sensing circuit 2602. Note that in FIG. 28A, six wirings X1 to X6 represent the electrodes 2621 to which a pulse voltage is applied, and six wirings Y1 to Y6 represent the electrodes 2622 that detect changes in current. FIG. 28A also illustrates capacitors 2603 that are each formed in a region where the electrodes 2621 and 2622 overlap with each other. Note that functional replacement between the electrodes 2621 and 2622 is possible.

The pulse voltage output circuit 2601 is a circuit for sequentially applying a pulse voltage to the wirings X1 to X6. By application of a pulse voltage to the wirings X1 to X6, an electric field is generated between the electrodes 2621 and 2622 of the capacitor 2603. When the electric field between the electrodes is shielded, for example, a change occurs in the capacitor 2603 (mutual capacitance). The approach or contact of a sensing target can be sensed by utilizing this change.

The current sensing circuit 2602 is a circuit for detecting changes in current flowing through the wirings Y1 to Y6 that are caused by the change in mutual capacitance in the capacitor 2603. No change in current value is sensed in the wirings Y1 to Y6 when there is no approach or contact of a sensing target, whereas a decrease in current value is sensed when mutual capacitance is decreased owing to the approach or contact of a sensing target. Note that an integrator circuit or the like is used for sensing of current.

Figure 28B:
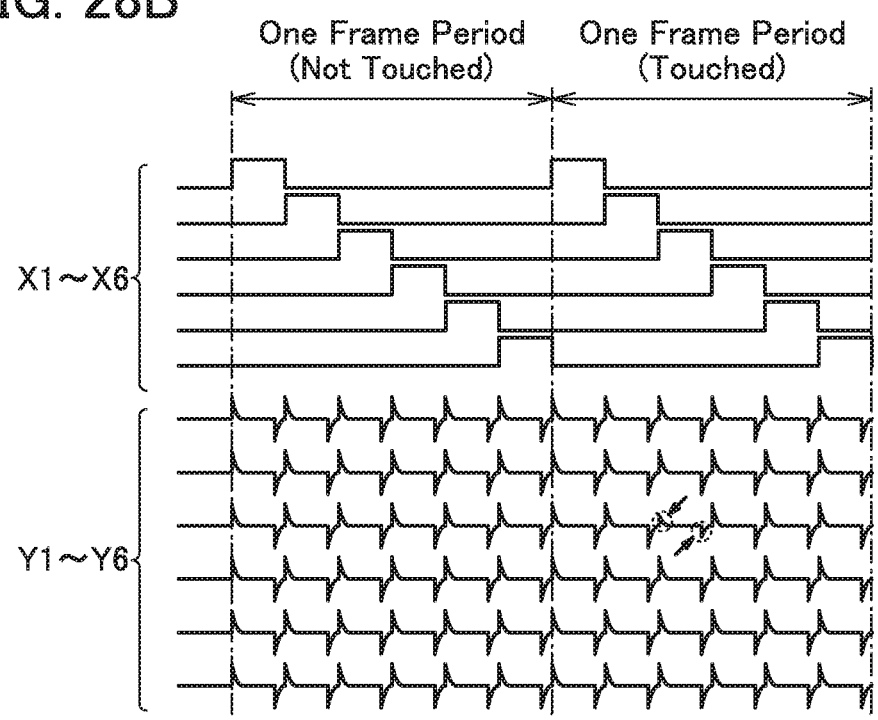

FIG. 28B is a timing chart showing input and output waveforms in the mutual capacitive touch sensor shown in FIG. 28A. In FIG. 28B, sensing of a sensing target is performed in all the rows and columns in one frame period. FIG. 28B shows a period when an object is not detected (not touched) and a period when an object is detected (touched). Sensed current values of the wirings Y1 to Y6 are shown as the waveforms of voltage values.

A pulse voltage is sequentially applied to the wirings X1 to X6, and the waveforms of the wirings Y1 to Y6 change in accordance with the pulse voltage. When there is no approach or contact of a sensing target, the waveforms of the wirings Y1 to Y6 change uniformly in accordance with changes in the voltages of the wirings X1 to X6. The current value is decreased at the point of approach or contact of a sensing target and accordingly the waveform of the voltage value changes.

By sensing a change in mutual capacitance in this manner, the approach or contact of a sensing target can be sensed.

<Description of Sensor Circuit>

Figure 29:
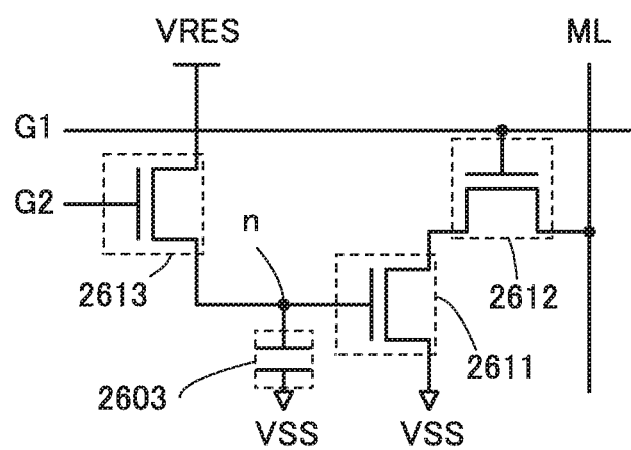
FIG. 29 is a circuit diagram of a touch sensor of one embodiment of the present invention.

Although FIG. 28A shows a passive matrix type touch sensor in which only the capacitor 2603 is provided at the intersection of wirings as a touch sensor, an active matrix type touch sensor including a transistor and a capacitor may be used. FIG. 29 shows an example of a sensor circuit included in an active matrix type touch sensor.

The sensor circuit in FIG. 29 includes the capacitor 2603 and transistors 2611, 2612, and 2613.

A signal G2 is input to a gate of the transistor 2613. A voltage VRES is applied to one of a source and a drain of the transistor 2613, and one electrode of the capacitor 2603 and a gate of the transistor 2611 are electrically connected to the other of the source and the drain of the transistor 2613. One of a source and a drain of the transistor 2611 is electrically connected to one of a source and a drain of the transistor 2612, and a voltage VSS is applied to the other of the source and the drain of the transistor 2611. The signal G1 is input to a gate of the transistor 2612, and a wiring ML is electrically connected to the other of the source and the drain of the transistor 2612. The voltage VSS is applied to the other electrode of the capacitor 2603.

Next, the operation of the sensor circuit in FIG. 29 is described. First, a potential for turning on the transistor 2613 is supplied as the signal G2, and a potential with respect to the voltage VRES is thus applied to the node n connected to the gate of the transistor 2611. Then, a potential for turning off the transistor 2613 is applied as the signal G2, whereby the potential of the node n is maintained.

Then, mutual capacitance of the capacitor 2603 changes owing to the approach or contact of a sensing target such as a finger, and accordingly the potential of the node n is changed from VRES.

In reading operation, a potential for turning on the transistor 2612 is supplied as the signal G1. A current flowing through the transistor 2611, that is, a current flowing through the wiring ML is changed in accordance with the potential of the node n. By sensing this current, the approach or contact of a sensing target can be sensed.

In each of the transistors 2611, 2612, and 2613, an oxide semiconductor layer is preferably used as a semiconductor layer in which a channel region is formed. In particular, such a transistor is preferably used as the transistor 2613 so that the potential of the node n can be held for a long time and the frequency of operation of resupplying VRES to the node n (refresh operation) can be reduced.

The structure described in this embodiment can be used in appropriate combination with the structure described in any of the other embodiments.

Embodiment 6

In this embodiment, a display device including the light-emitting device of one embodiment of the present invention and a reflective liquid crystal element, which can display images in both a transmissive mode and a reflective mode, will be described with reference to FIGS. 30A and 30B, FIG. 31, FIG. 32, and FIGS. 33A, 33B1, and 33B2.

Figure 30A:
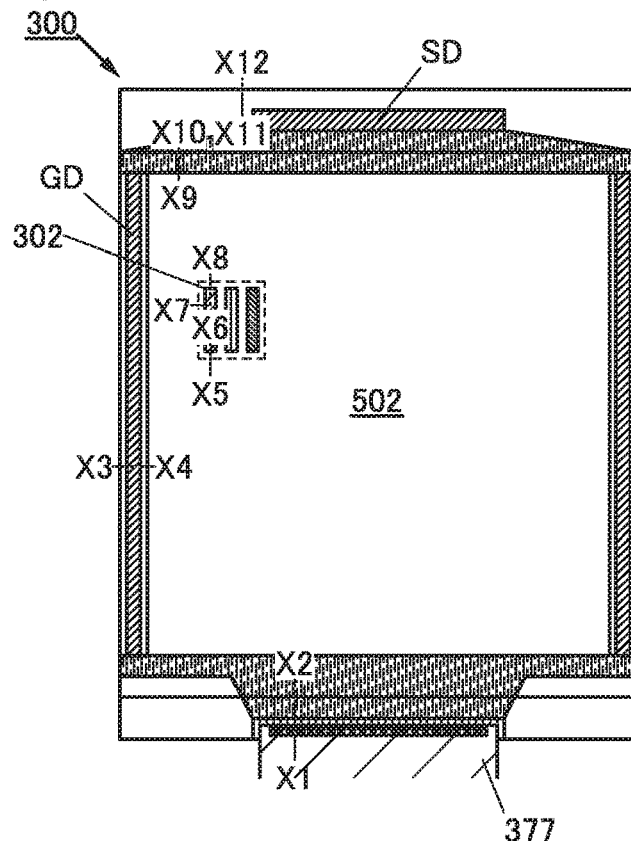
FIGS. 30A and 30B illustrate a structure of a display device of one embodiment of the present invention.
Figure 30B:
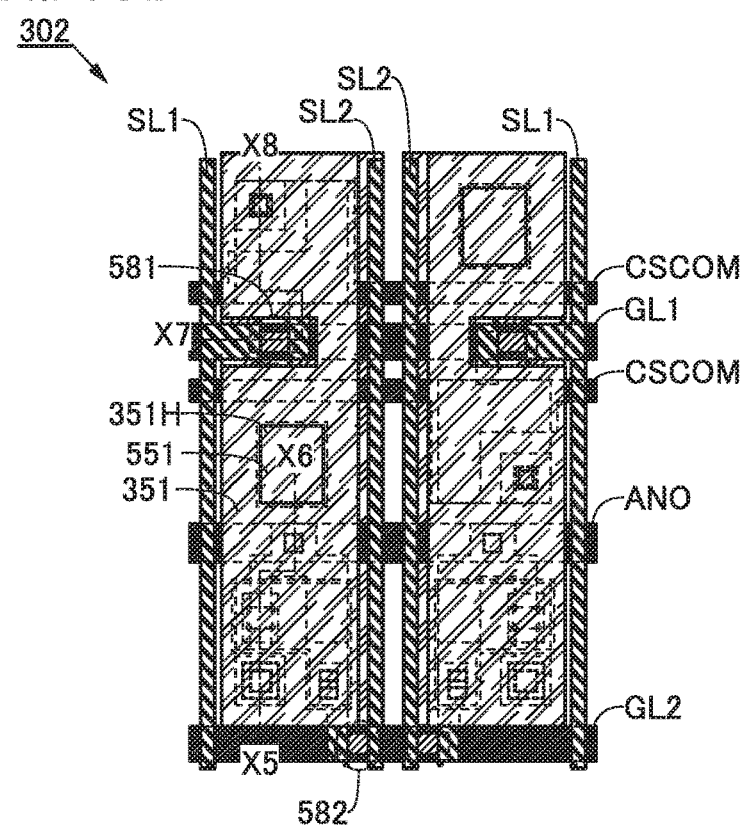

FIG. 30A is a bottom view illustrating the structure of a display device 300 of one embodiment of the present invention. FIG. 30B is a bottom view illustrating part of FIG. 30A. Note that in FIG. 30B, some components are not illustrated in order to avoid complexity of the drawing.

Figure 31:
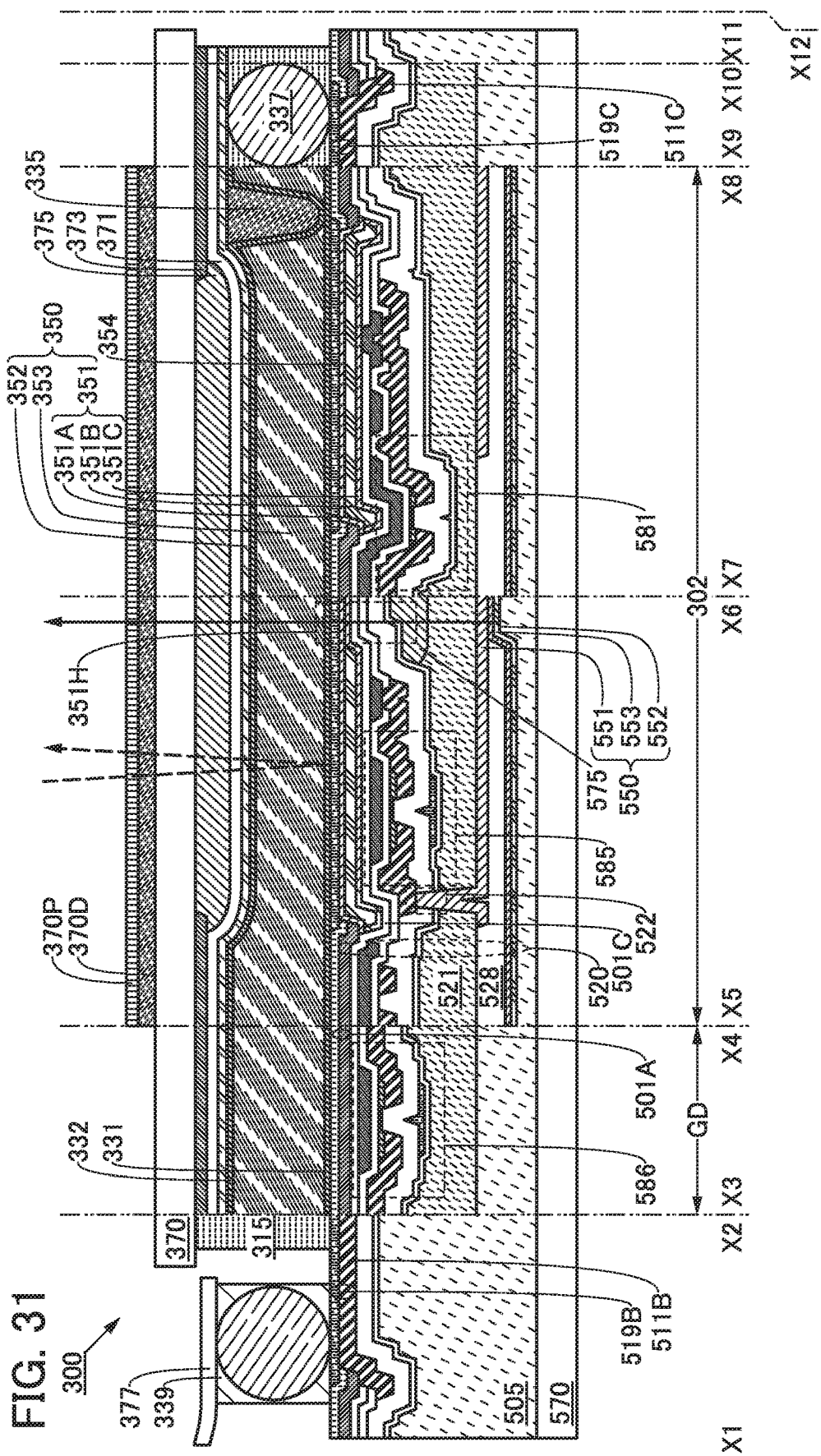
FIG. 31 is a cross-sectional view illustrating a structure of a display device of one embodiment of the present invention.

FIG. 31 is a cross-sectional view illustrating the structure of the display device 300 of one embodiment of the present invention. FIG. 31 is a cross-sectional view taken along section lines X1-X2, X3-X4, X5-X6, X7-X8, X9-X10, and X11-X12 shown in FIG. 30A.

Figure 32:
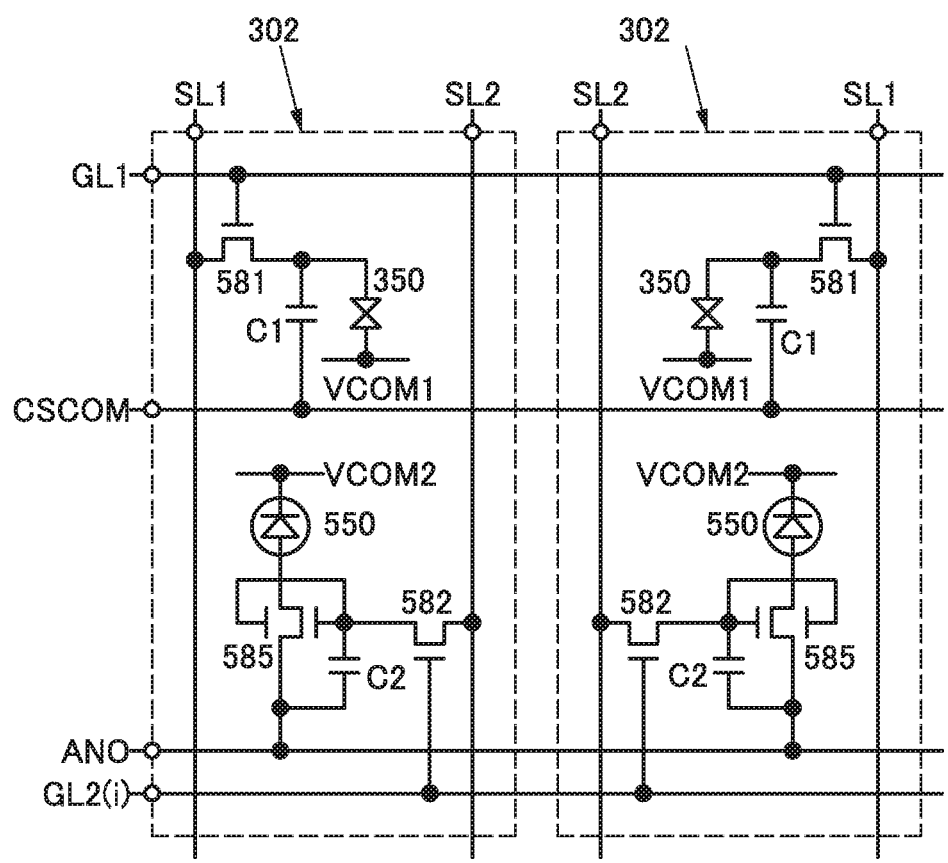
FIG. 32 illustrates a circuit of pixels of a display device of one embodiment of the present invention.

FIG. 32 illustrates a circuit of a pixel 302 included in the display device 300 of one embodiment of the present invention.

<Structural Example of Display Device>

As illustrated in FIG. 30A, the display device 300 of one embodiment of the present invention includes a pixel portion 502, and a driver circuit GD and a driver circuit SD placed outside the pixel portion 502. The pixel portion 502 includes the pixel 302.

The pixel 302 includes a liquid crystal element 350 and a light-emitting element 550. In addition, the pixel 302 includes a transistor 581. Moreover, the pixel 302 includes a transistor 585 and a transistor 586 (see FIG. 31).

The liquid crystal element 350 and the light-emitting element 550 perform display in the same direction. For example, a dashed line arrow in FIG. 31 denotes the direction in which the liquid crystal element 350 performs display by controlling the intensity of external light reflection. A solid line arrow in FIG. 31 denotes the direction in which the light-emitting element 550 performs display.

The liquid crystal element 350 thus includes a reflective film 351B having a function of reflecting incident light and a liquid crystal layer 353 containing a material having a function of adjusting the intensity of the reflected light. The liquid crystal element 350 has a function of reflecting incident light and a function of adjusting the intensity of the reflected light.

A reflective liquid crystal element is preferably used as the liquid crystal element 350. Specifically, the liquid crystal element 350 preferably includes a liquid crystal layer 353, an electrode 351, and an electrode 352. The electrode 351 preferably includes the reflective film 351B having a function of reflecting light. In addition, the liquid crystal layer 353 contains a liquid crystal material. Note that the electrode 352 is provided so that an electric field for controlling the alignment of the liquid crystal material is generated between the electrode 352 and the electrode 351. In addition, the liquid crystal layer 353 preferably has a function of adjusting the intensity of light which enters the liquid crystal element 350 and is reflected by the reflective film 351B.

The electrode 351 is electrically connected to the transistor 581. It is preferable that the electrode 351 have a structure in which a conductive film 351A and a conductive film 351C are provided so as to interpose the reflective film 351B therebetween. Interposing the reflective film 351B between the conductive films 351A and 351C suppresses diffusion of an element contained in the reflective film 351B into another layer. Moreover, it is possible to suppress contamination of the reflective film 351B due to impurities entering from the outside.

It is preferable that the conductive films 351A and 351C each have a function of transmitting light. Light incident on the liquid crystal element 350 from the outside can be efficiently reflected by the reflective film 351B owing to the function of transmitting light of the conductive film 351A. Moreover, light emitted from the light-emitting element 550 as will be shown later can be efficiently extracted to the outside owing to the function of transmitting light of the conductive film 351C.

In addition, the display device 300 includes an alignment film 331 and an alignment film 332. The liquid crystal layer 353 is sandwiched between the alignment films 331 and 332.

The display device 300 includes a coloring layer 375, a light-blocking layer 373, an insulating film 371, a functional film 370D, and a functional film 370P in a region overlapping with the pixel 302.

The coloring layer 375 has a region overlapping with the liquid crystal element 350. The light-blocking layer 373 has an opening in a region overlapping with the liquid crystal element 350. With the coloring layer 375, light incident on the liquid crystal element 350 from the outside enters the reflective film 351B through the coloring layer 375 and light reflected by the reflective film 351B is extracted to the outside through the coloring layer 375. Accordingly, light incident on the liquid crystal element 350 from the outside and reflected can be extracted to the outside with a predetermined color.

The insulating film 371 is provided between the coloring layer 375 and the liquid crystal layer 353 or between the light-blocking layer 373 and the liquid crystal layer 353. Owing to this, impurity diffusion from the light-blocking layer 373, the coloring layer 375, or the like to the liquid crystal layer 353 can be suppressed. The insulating film 371 may be provided to eliminate unevenness due to the thickness of the coloring layer 375.

The functional films 370D and 370P each include a region overlapping with the liquid crystal element 350. A substrate 370 is interposed between the functional film 370D and the liquid crystal element 350. As the functional films 370D and 370P, a film having a function of displaying clearer images of the liquid crystal element 350 and the light-emitting element 550, a film having a function of protecting the surface of the display device 300, or the like can be used. Note that either the functional film 370D or 370P may be used.

The display device 300 includes the substrate 370, a substrate 570, and a functional layer 520.

The substrate 370 has a region overlapping with the substrate 570. The functional layer 520 is provided between the substrates 570 and 370.

The functional layer 520 includes the transistor included in the pixel 302, the light-emitting element 550, an insulating film 521, and an insulating film 528.

The insulating film 521 is provided between the transistor included in the pixel 302 and the light-emitting element 550. The insulating film 521 is preferably formed so that steps due to components overlapping with the insulating film 521 can be covered to form a flat surface.

As the structure of the light-emitting element 550, any of the structures of the light-emitting device of one embodiment of the present invention, which is shown in Embodiment 1 or 2, is preferably used.

The light-emitting element 550 includes an electrode 551, an electrode 552, and a light-emitting layer 553. The electrode 552 has a region overlapping with the electrode 551. The light-emitting layer 553 is provided between the electrodes 551 and 552. The electrode 551 is electrically connected to the transistor 585 included in the pixel 302 in a connection portion 522.

In the case where the light-emitting element 550 has a bottom-emission structure, the electrode 552 preferably has a function of reflecting light. Therefore, it is preferable that the electrode 552 include a reflective film having a function of reflecting light. The electrode 551 preferably has a function of transmitting light.

In addition, the insulating film 528 has a region sandwiched between the electrodes 551 and 552. The insulating film 528 has an insulating property and thus can avoid a short circuit between the electrodes 551 and 552. In order to avoid a short circuit, an end portion of the electrode 551 preferably has a region in contact with the insulating film 528. In addition, the insulating film 528 has an opening in a region overlapping with the light-emitting element 550. In the opening, the light-emitting element 550 emits light.

The light-emitting layer 553 preferably contains an organic material or an inorganic material as a light-emitting material. Specifically, a fluorescent organic light-emitting material or a phosphorescent organic light-emitting material can be used. In addition, an inorganic light-emitting material such as quantum dots can be used.

The reflective film 351B of the liquid crystal element 350 includes an opening 351H. The opening 351H has a region overlapping with the conductive films 351A and 351C each having a function of transmitting light. The light-emitting element 550 has a function of emitting light toward the opening 351H. In other words, the liquid crystal element 350 has a function of performing display in a region overlapping with the reflective film 351B, and the light-emitting element 550 has a function of performing display in a region overlapping with the opening 351H.

In addition, the liquid crystal element has a function of performing display in a region overlapping with the reflective film 351B, and the light-emitting element has a function of performing display in a region overlapping with the opening 351H; therefore, the light-emitting element 550 has a function of performing display in a region surrounded by the display region of the liquid crystal element 350 (see FIG. 30B).

With the above-described structure in which a reflective liquid crystal element and a light-emitting element are used as the liquid crystal element 350 and the light-emitting element 550, respectively, the display device can perform display using the reflective liquid crystal element 350 in a bright environment, whereas using light from the light-emitting element 550 in a dark environment. Thus, a convenient display device with high visibility and low power consumption both in bright and dark environments can be provided. In addition, the display device can perform display in a dim environment using both the reflective liquid crystal element (utilizing external light) and light from the light-emitting element. Thus, a convenient display device with high visibility and low power consumption can be provided.

In the display device of one embodiment of the present invention, the coloring layer 375, the functional film 370D, and the functional film 370P each functioning as an optical element (e.g., a coloring layer, a color conversion layer (e.g., quantum dot), a polarizing plate, and an anti-reflective film) are provided in a region overlapping with the light-emitting element 550. Therefore, the color purity of light emitted from the light-emitting element 550 can be improved and thus the color purity of the display device 300 can be improved. Alternatively, the contrast ratio of the display device 300 can be enhanced. For example, a polarizing plate, a retardation plate, a diffusing film, an anti-reflective film, a condensing film, or the like can be used as the functional films 370D and 370P. Alternatively, a polarizing plate containing a dichromatic pigment can be used. Alternatively, an antistatic film preventing the attachment of a foreign substance, a water repellent film suppressing the attachment of stain, a hard coat film suppressing generation of a scratch in use, or the like can be used as the functional films 370D and 370P.

Furthermore, the coloring layer 575 may be provided in a region overlapping the opening 351H sandwiched between the liquid crystal element 350 and the light-emitting element 550. With such a structure, light emitted from the light-emitting element 550 is extracted to the outside through the coloring layers 575 and 375; therefore, the color purity of the light emitted from the light-emitting element 550 can be improved and the intensity of light emitted from the light-emitting element 550 can be increased.

A material that transmits light of a predetermined color can be used for the coloring layers 375 and 575. Thus, the coloring layers 375 and 575 can be used as, for example, a color filter. For example, the coloring layers 375 and 575 can be formed using a material transmitting light of blue, green, red, yellow, or white.

A touch panel may be provided in the display device 300 illustrated in FIG. 31. As the touch panel, a capacitive touch panel (a surface capacitive touch panel or a projected capacitive touch panel) can be preferably used.

<Arrangement Example of Pixel and Wiring>

The driver circuit GD is electrically connected to scan lines GL1 and GL2. The driver circuit GD includes a transistor 586, for example. Specifically, a transistor including a semiconductor film which can be formed through the same process as the transistor included in the pixel 302 (e.g., the transistor 581) can be used as the transistor 586 (see FIG. 31).

The driver circuit SD is electrically connected to signal lines SL1 and SL2. The driver circuit SD is electrically connected to a terminal which can be formed in the same process as the terminal 519B or 519C with a conductive material, for example.

The pixel 302 is electrically connected to a signal line SL1 (see FIG. 32). Note that it is preferable that one of a source electrode and a drain electrode of the transistor 581 be electrically connected to the signal line SL1 (see FIGS. 31 and 32).

Figure 33A:
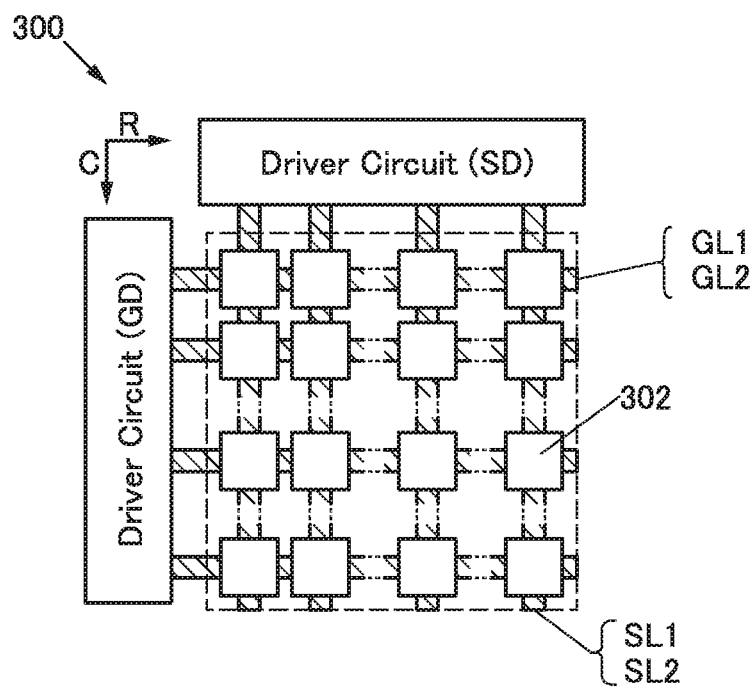
Figures 1, 33B:
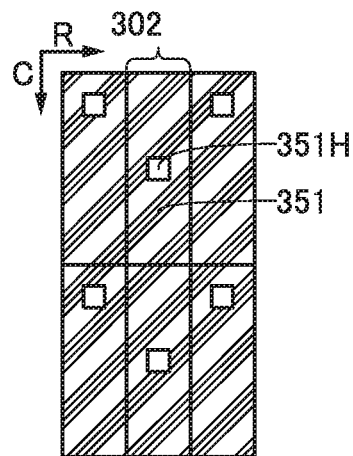
Figures 2, 33B:
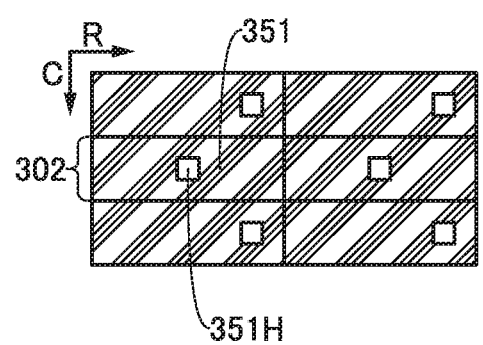

FIG. 33A is a block diagram illustrating arrangement of pixel circuits, wirings, and the like which can be used for the display device 300 of one embodiment of the present invention. FIGS. 33B1 and 33B2 are schematic views illustrating arrangement of the openings 351H which can be included in the display device 300 of one embodiment of the present invention.

The display device 300 of one embodiment of the present invention includes a plurality of pixels 302. Each pixel 302 includes the liquid crystal element 350, the light-emitting element 550, the transistor 581, the transistor 585, and the like. The pixels 302 are provided in a row direction (a direction indicated by an arrow R in FIG. 33A) and in a column direction ((a direction indicated by an arrow C in FIG. 33A) that intersects the row direction.

The group of pixels 302 arranged in the row direction are electrically connected to the scan line GL1. The group of pixels 302 arranged in the column direction are electrically connected to the signal line SL1.

For example, the pixel adjacent to the pixel 302 in the row direction (the direction indicated by the arrow R in FIG. 33B1) includes an opening that does not align with the opening 351H in the pixel 302. In addition, for example, the pixel adjacent to the pixel 302 in the column direction (the direction indicated by an arrow C in FIG. 33B2) includes an opening that does not align with the opening 351H in the pixel 302.

The opening 351H can have a polygonal shape (e.g., a quadrangular shape or a cross-like shape), an elliptical shape, a circular shape, or the like. The opening 351H may have a stripe shape, a slit-like shape, or a checkered pattern. The opening 351H may be moved to the side of an adjacent pixel. Preferably, the opening 351H is provided to the side of another pixel for emitting light of the same color. With this structure, a phenomenon in which light emitted from the light-emitting element 550 enters a coloring film of the adjacent pixel (i.e., cross talk), can be suppressed.

As described above, the display device 300 of one embodiment of the present invention includes the pixel 302; the pixel 302 includes the liquid crystal element 350 and the light-emitting element 550; the electrode 351 included in the liquid crystal element 350 is electrically connected to the transistor 581 included in the pixel 302; the electrode 551 included in the light-emitting element 550 is electrically connected to the transistor 585 included in the pixel 302; the light-emitting element 550 has a function of emitting light through the opening 351H; and the liquid crystal element 350 has a function of reflecting light entering the display device 300.

Thus, the liquid crystal element 350 and the light-emitting element 550 can be driven using transistors that can be formed through the same process, for example.

<Components of Display Device>

The pixel 302 is electrically connected to the signal line SL1, a signal line SL2, the scan line GL1, a scan line GL2, a wiring CSCOM, and a wiring ANO (see FIG. 32).

In the case where the voltage of a signal supplied to the signal line SL2 is different from the voltage of a signal supplied to the signal line SL1 of an adjacent pixel, the signal line SL1 of the adjacent pixel is positioned apart from the signal line SL2. Specifically, the signal line SL2 is positioned adjacent to the signal line SL2.

The pixel 302 includes the transistor 581, a capacitor C1, a transistor 582, the transistor 585, and a capacitor C2.

For example, a transistor including a gate electrode electrically connected to the scan line GL1 and a first electrode (one of a source electrode and a drain electrode) electrically connected to the signal line SL1 can be used as the transistor 581.

The capacitor C1 includes a first electrode electrically connected to a second electrode (the electrode corresponds to the other of the source electrode and the drain electrode of the transistor 581) and a second electrode electrically connected to the wiring CSCOM.

For example, a transistor including a gate electrode electrically connected to the scan line GL2 and a first electrode (one of a source electrode and a drain electrode) electrically connected to the signal line SL2 can be used as the transistor 582.

The transistor 585 includes a gate electrode electrically connected to a second electrode (the electrode corresponds to the other of the source electrode and the drain electrode of the transistor 582) and a first electrode (one of a source electrode and a drain electrode) electrically connected to the wiring ANO.

A transistor in which a semiconductor film is sandwiched between a conductive film and a gate electrode can be used as the transistor 585. For example, a conductive film electrically connected to the wiring capable of supplying a potential equal to that supplied to the first electrode (the one of the source electrode and the drain electrode) of the transistor 585 can be used.

The capacitor C2 includes a first electrode electrically connected to a second electrode of the transistor 582 (the electrode corresponds to the other of the source electrode and the drain electrode) and a second electrode electrically connected to the first electrode (the one of the source electrode and the drain electrode) of the transistor 585.

Note that a first electrode of the liquid crystal element 350 is electrically connected to the second electrode (the other of the source electrode and the drain electrode) of the transistor 581, and a second electrode of the liquid crystal element 350 is electrically connected to a wiring VCOM1. This enables the liquid crystal element 350 to be driven.

In addition, a first electrode of the light-emitting element 550 is electrically connected to the second electrode (the other of the source electrode and the drain electrode) of the transistor 585, and a second electrode of the light-emitting element 550 is electrically connected to and a wiring VCOM2. This enables the light-emitting element 550 to be driven.

<<Components of Pixel>>>

The pixel 302 includes an insulating film 501C and an intermediate film 354. The pixel 302 includes the transistor 581. In addition, the pixel 302 includes the transistor 585 and the transistor 586. The semiconductor film used for these transistors is preferably an oxide semiconductor.

The display device 300 includes a terminal 519B, and the terminal 519B includes a conductive film 511B and the intermediate film 354. In addition, the display device 300 includes a terminal 519C and a conductor 337, and the terminal 519C includes a conductive film 511C and the intermediate film 354 (see FIG. 31). For example, a material having a function of allowing hydrogen passage and supplying hydrogen can be used for the intermediate film 354. A conductive material can be used for the intermediate film 354. A light-transmitting material can be used for the intermediate film 354.

The insulating film 501C has a region sandwiched between an insulating film 501A and a conductive film 511B.

The conductive film 511B is electrically connected to the pixel 302. For example, when the electrode 351 or the first conductive film is used as the reflective film 351B, a surface functioning as a contact with the terminal 519B is oriented in the same direction as a surface of the electrode 351 facing light incident on the liquid crystal element 350.

A flexible printed board 377 can be electrically connected to the terminal 519B with the conductive material 339. Thus, power or signals can be supplied to the pixel 302 through the terminal 519B.

The conductive film 511C is electrically connected to the pixel 302. For example, when the electrode 351 or the first conductive film is used as the reflective film 351B, a surface functioning as a contact with the terminal 519C is oriented in the same direction as a surface of the electrode 351 facing light incident on the first liquid crystal element 350.

The conductor 337 is sandwiched between the terminal 519C and the electrode 352 to electrically connect them. A conductive particle can be used as the conductor 337, for example.

The display device 300 includes a bonding layer 505, a sealant 315 and a structure 335.

The bonding layer 505 is provided between the functional layer 520 and the substrate 570 to bond them together. For the bonding layer 505, a material that can be used for the sealant 315 can be used, for example.

The sealant 315 is provided between the functional layer 520 and the substrate 570 to bond them together.

The structure 335 has a function of making a predetermined gap between the functional layer 520 and the substrate 570.

An organic material, an inorganic material, or a composite material of an organic material and an inorganic material can be used for the structure 335. Accordingly, components between which the structure 335 or the like is interposed can have a predetermined gap. Specifically, polyester, polyolefin, polyamide, polyimide, polycarbonate, polysiloxane, an acrylic resin, or the like, or a composite material of a plurality of kinds of resins selected from these can be used. Alternatively, a photosensitive material may be used.

<<Components of Liquid Crystal Element>>

Next, a structure example of the liquid crystal element that forms the display device of one embodiment of the present invention is described.

The liquid crystal element 350 has a function of controlling transmission or reflection of light. For example, a combined structure of a polarizing plate and a liquid crystal element or a MEMS shutter display element can be used. The use of a reflective display element can reduce power consumption of a display device. Specifically, a reflective liquid crystal display element is preferably used as the liquid crystal element 350.

Specifically, a liquid crystal element driven in any of the following driving modes can be used: an in-plane switching (IPS) mode, a twisted nematic (TN) mode, a fringe field switching (FFS) mode, an axially symmetric aligned microcell (ASM) mode, an optically compensated birefringence (OCB) mode, a ferroelectric liquid crystal (FLC) mode, an antiferroelectric liquid crystal (AFLC) mode, and the like.

In addition, a liquid crystal element that can be driven by, for example, a vertical alignment (VA) mode such as a multi-domain vertical alignment (MVA) mode, a patterned vertical alignment (PVA) mode, an electrically controlled birefringence (ECB) mode, a continuous pinwheel alignment (CPA) mode, or an advanced super view (ASV) mode can be used.

Other examples of the driving method of the liquid crystal element 350 include a polymer dispersed liquid crystal (PDLC) mode, a polymer network liquid crystal (PNLC) mode, and a guest-host mode. Note that one embodiment of the present invention is not limited thereto, and various liquid crystal elements and driving methods can be used.

A liquid crystal material or the like which can be used for a liquid crystal element is used for the liquid crystal element 350. For example, thermotropic liquid crystal, low-molecular liquid crystal, high-molecular liquid crystal, polymer dispersed liquid crystal, ferroelectric liquid crystal, or antiferroelectric liquid crystal can be used. Alternatively, a liquid crystal material which exhibits a cholesteric phase, a smectic phase, a cubic phase, a chiral nematic phase, an isotropic phase, or the like can be used. Alternatively, a liquid crystal material which exhibits a blue phase can be used.

Alternatively, liquid crystal exhibiting a blue phase for which an alignment film is not involved may be used. A blue phase is one of liquid crystal phases, which is generated just before a cholesteric phase changes into an isotropic phase while temperature of cholesteric liquid crystal is increased. Since the blue phase is generated only in a narrow temperature range, a liquid crystal composition in which 5 wt. % or more of a chiral material is mixed is used for the liquid crystal layer in order to improve the temperature range. The liquid crystal composition that includes the liquid crystal exhibiting a blue phase and a chiral material has a short response time of 1 msec or less, and has optical isotropy, which makes the alignment process unnecessary and the viewing angle dependence small. An alignment film does not need to be provided and rubbing treatment is thus not necessary; accordingly, electrostatic discharge damage caused by the rubbing treatment can be prevented and defects and damage of the liquid crystal display device in the manufacturing process can be reduced. Thus, productivity of the liquid crystal display device can be increased.

Moreover, it is possible to use a method called domain multiplication or multi-domain design, in which a pixel is divided into some regions (subpixels) and molecules are aligned in different directions in their respective regions.

<<Components of Transistor>>

For example, a bottom-gate transistor, a top-gate transistor, or the like can be used as the transistor 581, the transistor 582, the transistor 585, the transistor 586, or the like.

For example, a semiconductor containing an element belonging to Group 14 can be used for a semiconductor film of the transistor. Specifically, a semiconductor containing silicon can be used for the semiconductor film of the transistor. For example, single crystal silicon, polysilicon, microcrystalline silicon, or amorphous silicon can be used for the semiconductor film of the transistor.

For example, a transistor whose semiconductor film includes an oxide semiconductor can be used for the transistor 581, the transistor 582, the transistor 585, the transistor 586, or the like. Specifically, an oxide semiconductor containing indium or an oxide semiconductor containing indium, gallium, and zinc can be used for a semiconductor film.

When the transistor 581, the transistor 582, the transistor 585, the transistor 586, or the like includes an oxide semiconductor, a pixel circuit can hold an image signal for a longer time than a pixel circuit including a transistor in which amorphous silicon is used for a semiconductor film. Specifically, the selection signal can be supplied at a frequency lower than 30 Hz, preferably lower than 1 Hz, further preferably less than once per minute while flickering is suppressed. Consequently, eyestrain on a user of the information processing device can be reduced, and power consumption for driving can be reduced.

The structure and method described in this embodiment can be implemented by being combined as appropriate with structures and methods described in the other embodiments.

Embodiment 7

In this embodiment, a display module and electronic devices including a light-emitting device of one embodiment of the present invention are described with reference to FIG. 34, FIGS. 35A to 35G, FIGS. 36A to 36F, FIGS. 37A to 37D, and FIGS. 38A to 38D.

<Description of Display Module>

Figure 34:
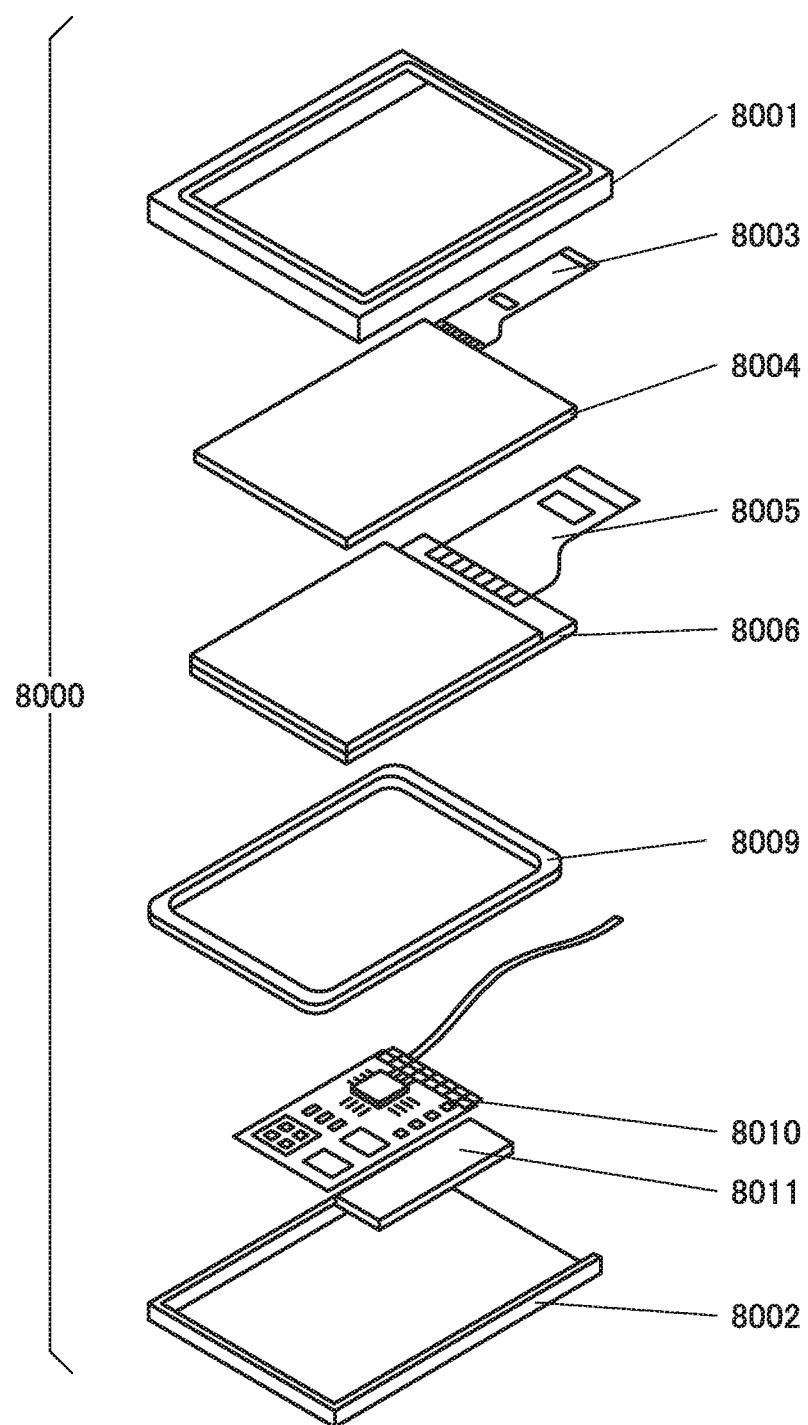
FIG. 34 illustrates an electronic device one embodiment of the present invention.

In a display module 8000 in FIG. 34, a touch sensor 8004 connected to an FPC 8003, a display device 8006 connected to an FPC 8005, a frame 8009, a printed board 8010, and a battery 8011 are provided between an upper cover 8001 and a lower cover 8002.

The light-emitting device of one embodiment of the present invention can be used for the display device 8006, for example.

The shapes and sizes of the upper cover 8001 and the lower cover 8002 can be changed as appropriate in accordance with the sizes of the touch sensor 8004 and the display device 8006.

The touch sensor 8004 can be a resistive touch sensor or a capacitive touch sensor and may be formed to overlap with the display device 8006. A counter substrate (sealing substrate) of the display device 8006 can have a touch sensor function. A photosensor may be provided in each pixel of the display device 8006 so that an optical touch sensor is obtained.

The frame 8009 protects the display device 8006 and also serves as an electromagnetic shield for blocking electromagnetic waves generated by the operation of the printed board 8010. The frame 8009 can also function as a radiator plate.

The printed board 8010 has a power supply circuit and a signal processing circuit for outputting a video signal and a clock signal. As a power source for supplying power to the power supply circuit, an external commercial power source or the battery 8011 provided separately may be used. The battery 8011 can be omitted in the case of using a commercial power source.

The display module 8000 may be additionally provided with a member such as a polarizing plate, a retardation plate, or a prism sheet.

<Description of Electronic Device>

FIGS. 35A to 35G illustrate electronic devices. These electronic devices can include a housing 9000, a display portion 9001, a speaker 9003, operation keys 9005 (including a power switch or an operation switch), a connection terminal 9006, a sensor 9007 (a sensor having a function of measuring or sensing force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 9008, and the like. In addition, the sensor 9007 may have a function of measuring biological information like a pulse sensor and a finger print sensor.

The electronic devices illustrated in FIGS. 35A to 35G can have a variety of functions, for example, a function of displaying a variety of data (a still image, a moving image, a text image, and the like) on the display portion, a touch sensor function, a function of displaying a calendar, date, time, and the like, a function of controlling a process with a variety of software (programs), a wireless communication function, a function of being connected to a variety of computer networks with a wireless communication function, a function of transmitting and receiving a variety of data with a wireless communication function, a function of reading a program or data stored in a memory medium and displaying the program or data on the display portion, and the like. Note that functions of the electronic devices in FIGS. 35A to 35G are not limited thereto, and the electronic devices can have a variety of functions. Although not illustrated in FIGS. 35A to 35G, the electronic devices may each have a plurality of display portions. The electronic devices may have a camera or the like and a function of taking a still image, a function of taking a moving image, a function of storing the taken image in a memory medium (an external memory medium or a memory medium incorporated in the camera), a function of displaying the taken image on the display portion, or the like.

The electronic devices in FIGS. 35A to 35G will be described in detail below.

Figure 35A:
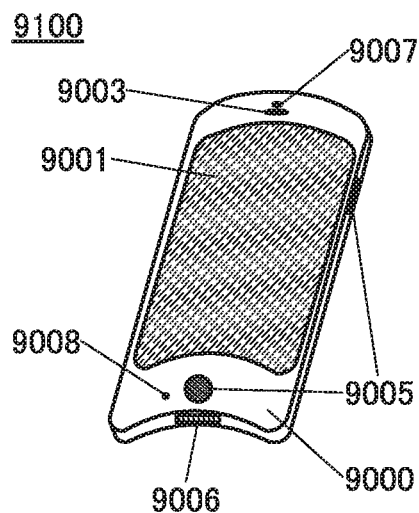
FIGS. 35A to 35G illustrate electronic devices of embodiments of the present invention.

FIG. 35A is a perspective view of a portable information terminal 9100. The display portion 9001 of the portable information terminal 9100 is flexible. Therefore, the display portion 9001 can be incorporated along a bent surface of a bent housing 9000. In addition, the display portion 9001 includes a touch sensor, and operation can be performed by touching the screen with a finger, a stylus, or the like. For example, when an icon displayed on the display portion 9001 is touched, an application can be started.

Figure 35D:
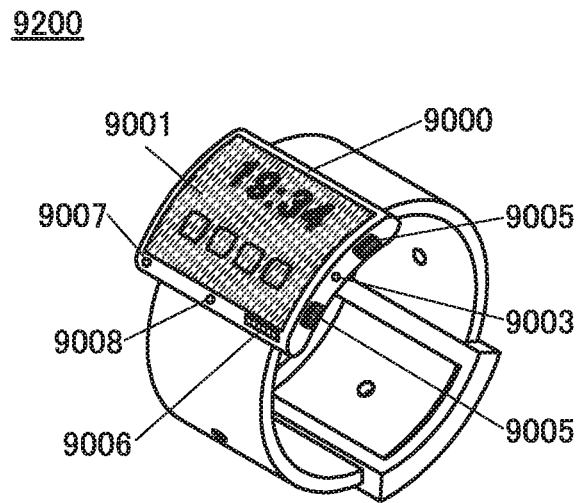
Figure 35B:
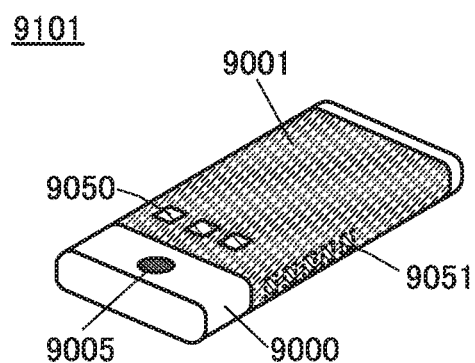

FIG. 35B is a perspective view of a portable information terminal 9101. The portable information terminal 9101 functions as, for example, one or more of a telephone set, a notebook, and an information browsing system. Specifically, the portable information terminal can be used as a smartphone. Note that the speaker 9003, the connection terminal 9006, the sensor 9007, and the like, which are not illustrated, can be positioned in the portable information terminal 9101 as in the portable information terminal 9100 illustrated in FIG. 35A. The portable information terminal 9101 can display characters and image information on its plurality of surfaces. For example, three operation buttons 9050 (also referred to as operation icons, or simply, icons) can be displayed on one surface of the display portion 9001. Furthermore, information 9051 indicated by dashed rectangles can be displayed on another surface of the display portion 9001. Examples of the information 9051 include display indicating reception of an incoming email, social networking service (SNS) message, call, and the like; the title and sender of an email and SNS message; the date; the time; remaining battery; and display indicating the strength of a received signal such as a radio wave. Instead of the information 9051, the operation buttons 9050 or the like may be displayed on the position where the information 9051 is displayed.

As a material of the housing 9000, an alloy, plastic, or ceramic can be used, for example. As the plastic, reinforced plastic can be used. A carbon fiber reinforced plastic (CFRP), which is a kind of reinforced plastic, has advantages of lightweight and corrosion-free. As other examples of the reinforced plastic, reinforced plastic using a glass fiber and reinforced plastic using an aramid fiber are given. The alloy includes aluminum alloy and magnesium alloy. In particular, amorphous alloy (also referred to as metal glass) containing zirconium, copper, nickel, and titanium is superior in terms of high elastic strength. This amorphous alloy includes a glass transition region at room temperature, which is also referred to as a bulk-solidifying amorphous alloy and substantially has an amorphous atomic structure. By a solidification casting method, an alloy material is molded in a mold of at least part of the housing and coagulated so that the part of the housing is formed using a bulk-solidifying amorphous alloy. The amorphous alloy may include beryllium, silicon, niobium, boron, gallium, molybdenum, tungsten, manganese, iron, cobalt, yttrium, vanadium, phosphorus, carbon, or the like in addition to zirconium, copper, nickel, and titanium. The amorphous alloy may be formed by a vacuum evaporation method, a sputtering method, an electroplating method, an electroless plating method, or the like instead of the solidification casting method. The amorphous alloy may include a microcrystal or a nanocrystal as long as a state without a long-range order (a periodic structure) is maintained as a whole.

Note that the term alloy refer to both a complete solid solution alloy which has a single solid phase structure and a partial solution that has two or more phases. The housing 9000 using the amorphous alloy can have high elastic strength. Even if the portable information terminal 9101 is dropped and the impact causes temporary deformation, the use of the amorphous alloy in the housing 9000 allows a return to the original shape; thus, the impact resistance of the portable information terminal 9101 can be improved.

Figure 35E:
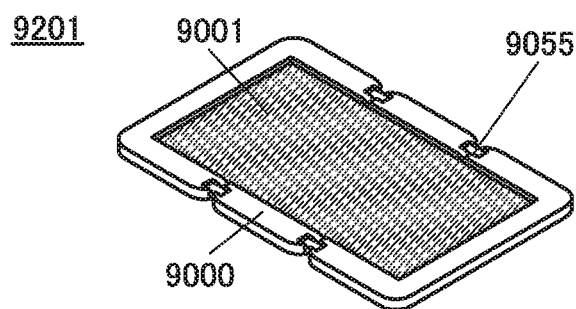
Figure 35C:
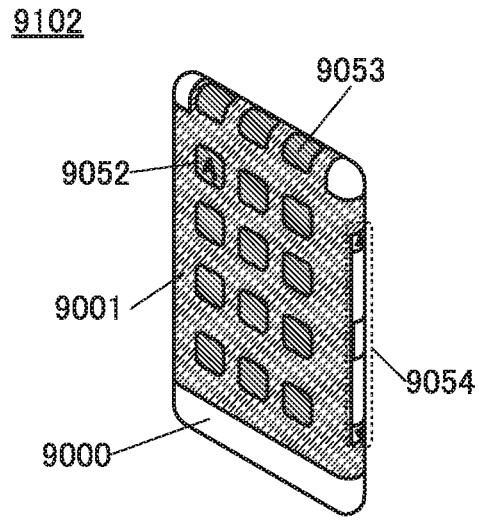

FIG. 35C is a perspective view of a portable information terminal 9102. The portable information terminal 9102 has a function of displaying information on three or more surfaces of the display portion 9001. Here, information 9052, information 9053, and information 9054 are displayed on different surfaces. For example, a user of the portable information terminal 9102 can see the display (here, the information 9053) with the portable information terminal 9102 put in a breast pocket of his/her clothes. Specifically, a caller's phone number, name, or the like of an incoming call is displayed in a position that can be seen from above the portable information terminal 9102. Thus, the user can see the display without taking out the portable information terminal 9102 from the pocket and decide whether to answer the call.

FIG. 35D is a perspective view of a watch-type portable information terminal 9200. The portable information terminal 9200 is capable of executing a variety of applications such as mobile phone calls, e-mailing, viewing and editing texts, music reproduction, Internet communication, and computer games. The display surface of the display portion 9001 is bent, and images can be displayed on the bent display surface. The portable information terminal 9200 can employ near field communication that is a communication method based on an existing communication standard. In that case, for example, mutual communication between the portable information terminal and a headset capable of wireless communication can be performed, and thus hands-free calling is possible. The portable information terminal 9200 includes the connection terminal 9006, and data can be directly transmitted to and received from another information terminal via a connector. Power charging through the connection terminal 9006 is possible. Note that the charging operation may be performed by wireless power feeding without using the connection terminal 9006.

Figure 35F:
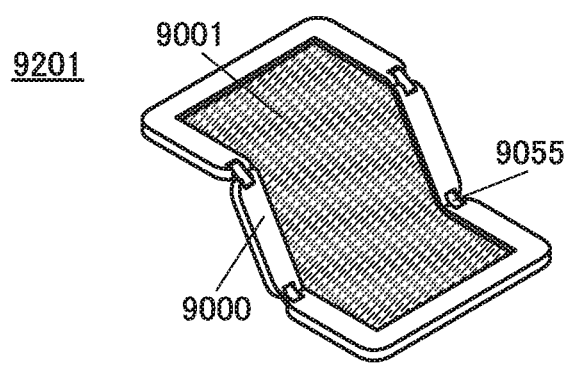
Figure 35G:
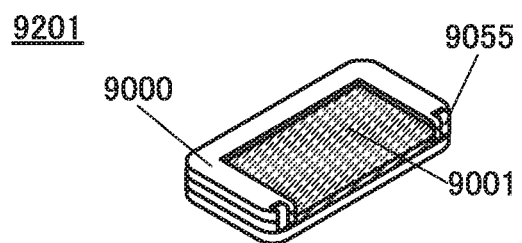

FIGS. 35E, 35F, and 35G are perspective views of a foldable portable information terminal 9201 that is opened, that is shifted from the opened state to the folded state or from the folded state to the opened state, and that is folded, respectively. The portable information terminal 9201 is highly portable when folded. When the portable information terminal 9201 is opened, a seamless large display region is highly browsable. The display portion 9001 of the portable information terminal 9201 is supported by three housings 9000 joined together by hinges 9055. By folding the portable information terminal 9201 at a connection portion between two housings 9000 with the hinges 9055, the portable information terminal 9201 can be reversibly changed in shape from an opened state to a folded state. For example, the portable information terminal 9201 can be bent with a radius of curvature greater than or equal to 1 mm and less than or equal to 150 mm.

Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a goggle-type display (head mounted display), a portable game machine, a portable information terminal, an audio reproducing device, and a large-sized game machine such as a pachinko machine.

Furthermore, the electronic device of one embodiment of the present invention may include a secondary battery. It is preferable that the secondary battery be capable of being charged by non-contact power transmission.

Examples of the secondary battery include a lithium ion secondary battery such as a lithium polymer battery using a gel electrolyte (lithium ion polymer battery), a lithium-ion battery, a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. When a signal is received by the antenna, the electronic device can display an image, data, or the like on a display portion. When the electronic device includes a secondary battery, the antenna may be used for non-contact power transmission.

Figure 36A:
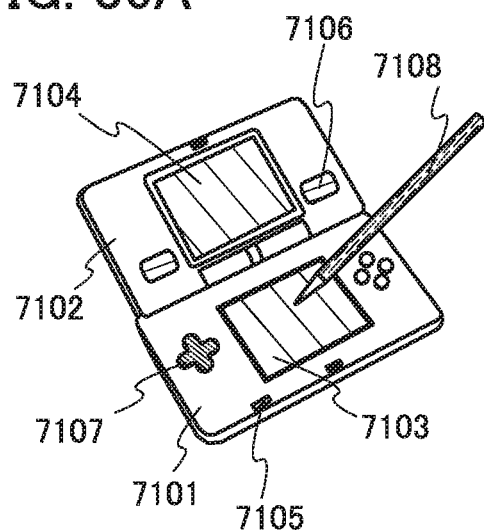
FIGS. 36A to 36F illustrate electronic devices of embodiments of the present invention.

FIG. 36A illustrates a portable game machine including a housing 7101, a housing 7102, a display portion 7103, a display portion 7104, a microphone 7105, speakers 7106, an operation key 7107, a stylus 7108, and the like. When the display device according to one embodiment of the present invention is used as the display portion 7103 or 7104, it is possible to provide a user-friendly portable game machine with quality that hardly deteriorates. Although the portable game machine illustrated in FIG. 36A includes two display portions, the display portion 7103 and the display portion 7104, the number of display portions included in the portable game machine is not limited to two.

Figure 36B:
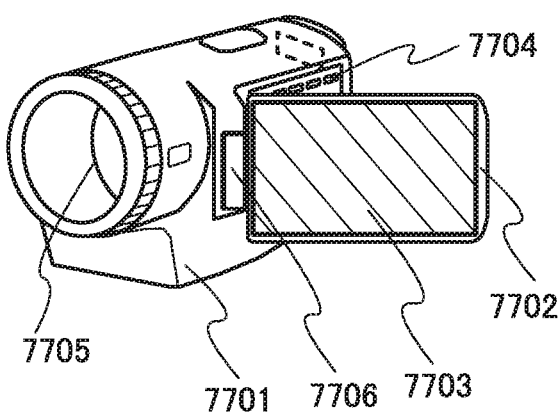

FIG. 36B illustrates a video camera including a housing 7701, a housing 7702, a display portion 7703, operation keys 7704, a lens 7705, a joint 7706, and the like. The operation keys 7704 and the lens 7705 are provided for the housing 7701, and the display portion 7703 is provided for the housing 7702. The housing 7701 and the housing 7702 are connected to each other with the joint 7706, and the angle between the housing 7701 and the housing 7702 can be changed with the joint 7706. Images displayed on the display portion 7703 may be switched in accordance with the angle at the joint 7706 between the housing 7701 and the housing 7702.

Figure 36C:
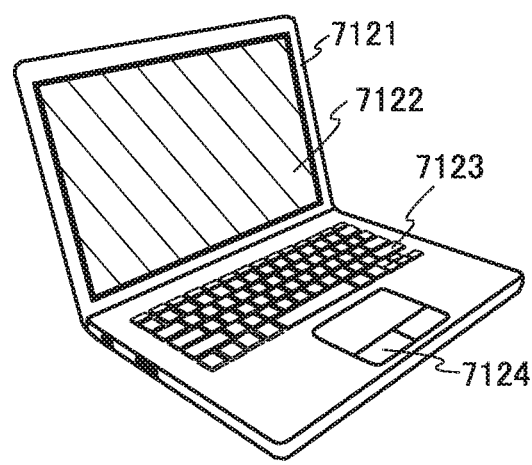

FIG. 36C illustrates a notebook personal computer including a housing 7121, a display portion 7122, a keyboard 7123, a pointing device 7124, and the like. Note that the display portion 7122 is small- or medium-sized but can perform 8 k display because it has greatly high pixel density and high resolution; therefore, a significantly clear image can be obtained.

Figure 36D:
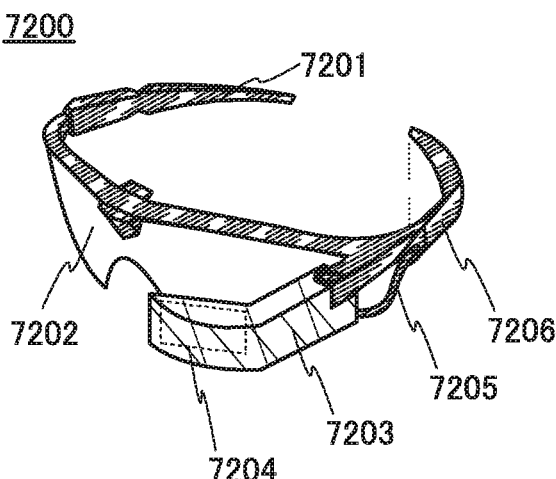

FIG. 36D is an external view of a head-mounted display 7200.

The head-mounted display 7200 includes a mounting portion 7201, a lens 7202, a main body 7203, a display portion 7204, a cable 7205, and the like. The mounting portion 7201 includes a battery 7206.

Power is supplied from the battery 7206 to the main body 7203 through the cable 7205. The main body 7203 includes a wireless receiver or the like to receive video data, such as image data, and display it on the display portion 7204. The movement of the eyeball and the eyelid of a user is captured by a camera in the main body 7203 and then coordinates of the points the user looks at are calculated using the captured data to utilize the eye point of the user as an input means.

The mounting portion 7201 may include a plurality of electrodes so as to be in contact with the user. The main body 7203 may be configured to sense current flowing through the electrodes with the movement of the user's eyeball to recognize the direction of his or her eyes. The main body 7203 may be configured to sense current flowing through the electrodes to monitor the user's pulse. The mounting portion 7201 may include sensors, such as a temperature sensor, a pressure sensor, or an acceleration sensor, so that the user's biological information can be displayed on the display portion 7204. The main body 7203 may be configured to sense the movement of the user's head or the like to move an image displayed on the display portion 7204 in synchronization with the movement of the user's head or the like.

Figure 36E:
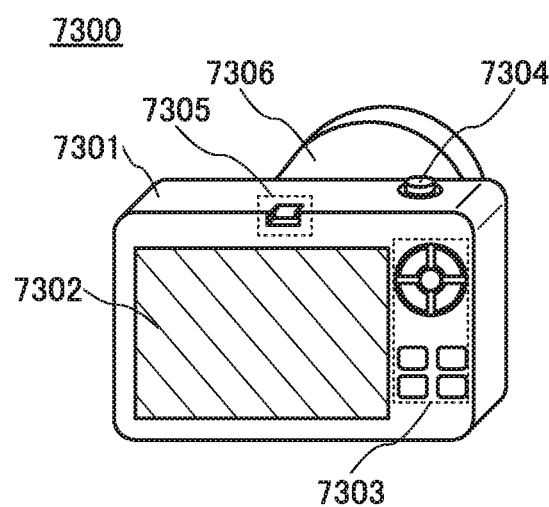

FIG. 36E is an external view of a camera 7300. The camera 7300 includes a housing 7301, a display portion 7302, an operation button 7303, a shutter button 7304, a connection portion 7305, and the like. A lens 7306 can be put on the camera 7300.

The connection portion 7305 includes an electrode to connect with a finder 7400, which is described below, a stroboscope, or the like.

Although the lens 7306 of the camera 7300 here is detachable from the housing 7301 for replacement, the lens 7306 may be included in the housing 7301.

Images can be taken at the touch of the shutter button 7304. In addition, images can be taken by operation of the display portion 7302 including a touch sensor.

In the display portion 7302, the display device of one embodiment of the present invention or a touch sensor can be used.

Figure 36F:
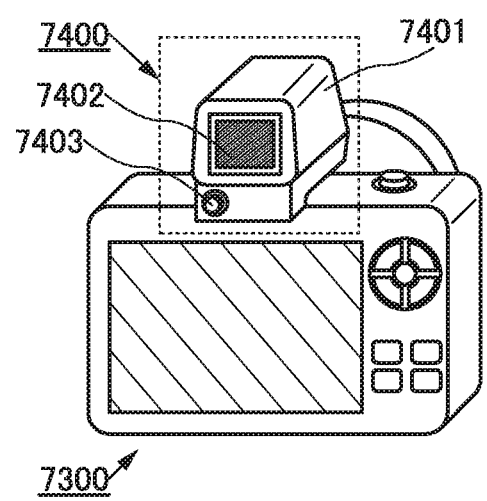

FIG. 36F shows the camera 7300 with the finder 7400 connected.

The finder 7400 includes a housing 7401, a display portion 7402, and a button 7403.

The housing 7401 includes a connection portion for engagement with the connection portion 7305 of the camera 7300 so that the finder 7400 can be connected to the camera 7300. The connection portion includes an electrode, and an image or the like received from the camera 7300 through the electrode can be displayed on the display portion 7402.

The button 7403 functions as a power supply button. With the button 7403, on/off of display on the display portion 7402 can be switched.

Although the camera 7300 and the finder 7400 are separate and detachable electronic devices in FIGS. 36E and 30F, the housing 7301 of the camera 7300 may include a finder having a display device of one embodiment of the present invention or a touch sensor.

FIGS. 37A to 37E illustrate outward appearances of head-mounted display 7500 and 7510.

The head-mounted display 7500 includes a housing 7501, two display portions 7502, an operation button 7503, and an object for fixing, such as a band, 7504.

The head-mounted display 7500 has the functions of the above-described head-mounted display 7200 and further includes two display portions.

With the two display portions 7502, the user can see one display portion with one eye and the other display portion with the other eye. Thus, a high-resolution image can be displayed even when a three-dimensional display using parallax or the like is performed. The display portion 7502 is curved around an arc with the user's eye as an approximate center. Thus, distances between the user's eye and display surfaces of the display portion become equal; thus, the user can see a more natural image. Even when the luminance or chromaticity of light from the display portion is changed depending on the angle at which the user see it, since the user's eye is positioned in a normal direction of the display surface of the display portion, the influence of the change can be substantially ignorable and thus a more realistic image can be displayed.

The operation button 7503 serves as a power button or the like. A button other than the operation button 7503 may be included.

The head-mounted display 7510 includes the housing 7501, the display portion 7502, the object for fixing, such as a band, 7504, and a pair of lenses 7505.

A user can see display on the display portion 7502 through the lenses 7505. It is favorable that the display portion 7502 be curved. When the display portion 7502 is curved, a user can feel high realistic sensation of images.

Figure 37A:
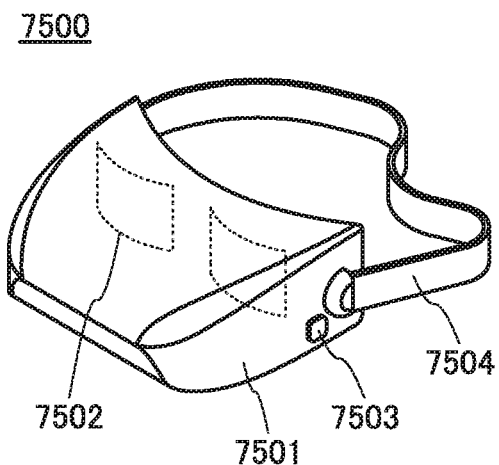
FIGS. 37A to 37E illustrate an electronic device of one embodiment of the present invention.
Figure 37B:
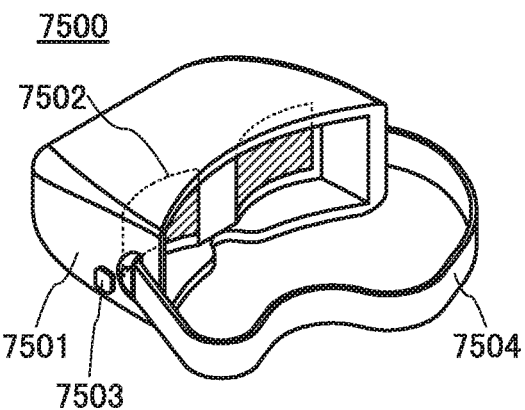
Figure 37C:
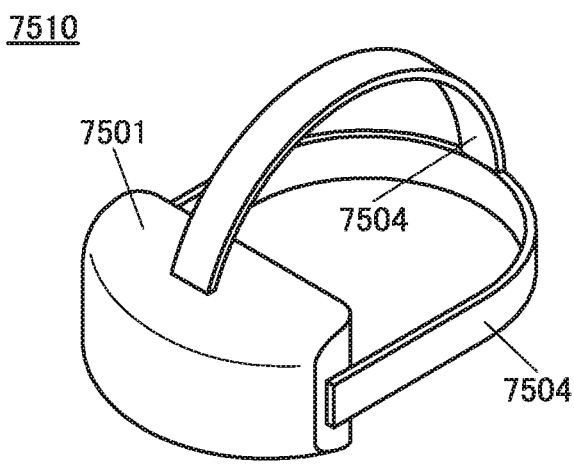
Figure 37D:
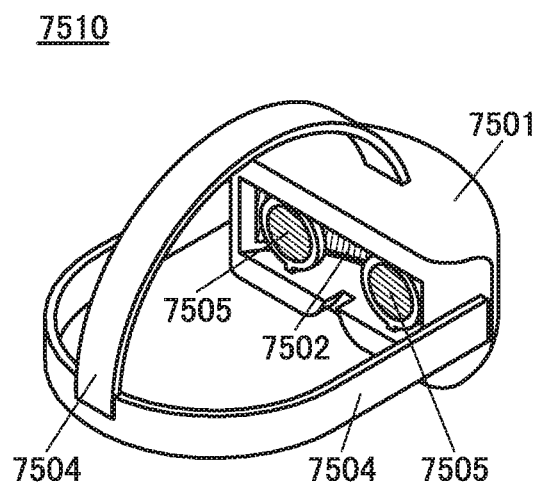
Figure 37E:
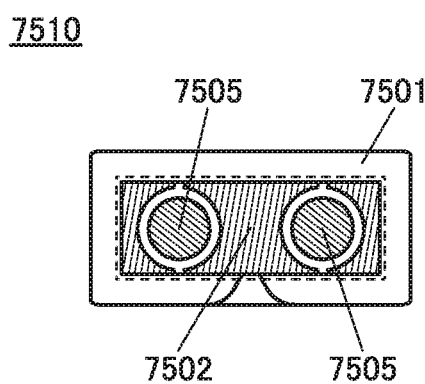

The display device of one embodiment of the present invention can be used in the display portion 7502. The display device of one embodiment of the present invention can have a high resolution; thus, even when an image is magnified using the lenses 7505 as illustrated in FIG. 37E, the user does not perceive pixels, and thus a more realistic image can be displayed.

Figure 38A:
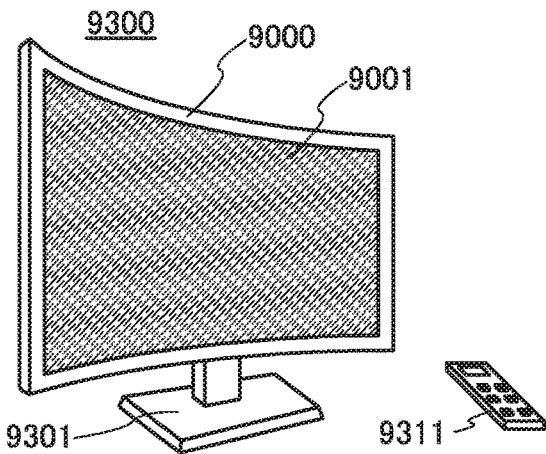
FIGS. 38A to 38D illustrate electronic devices of one embodiment of the present invention.

FIG. 38A illustrates an example of a television set. In the television set 9300, the display portion 9001 is incorporated into the housing 9000. Here, the housing 9000 is supported by a stand 9301.

The television set 9300 illustrated in FIG. 38A can be operated with an operation switch of the housing 9000 or a separate remote controller 9311. The display portion 9001 may include a touch sensor. The television set 9300 can be operated by touching the display portion 9001 with a finger or the like. The remote controller 9311 may be provided with a display portion for displaying data output from the remote controller 9311. With operation keys or a touch panel of the remote controller 9311, channels or volume can be controlled and images displayed on the display portion 9001 can be controlled.

The television set 9300 is provided with a receiver, a modem, or the like. With use of the receiver, general television broadcasting can be received. Moreover, when the television device is connected to a communication network with or without wires via the modem, one-way (from a sender to a receiver) or two-way (between a sender and a receiver or between receivers) information communication can be performed.

The electronic device or the lighting device of one embodiment of the present invention has flexibility and therefore can be incorporated along a curved inside/outside wall surface of a house or a building or a curved interior/exterior surface of a car.

Figure 38B:
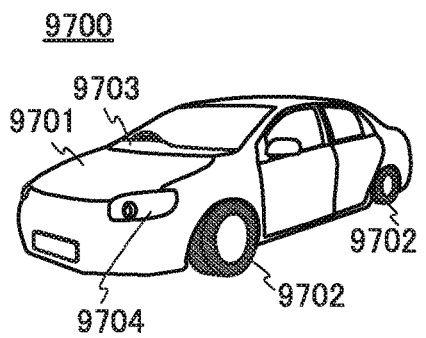
Figure 38C:
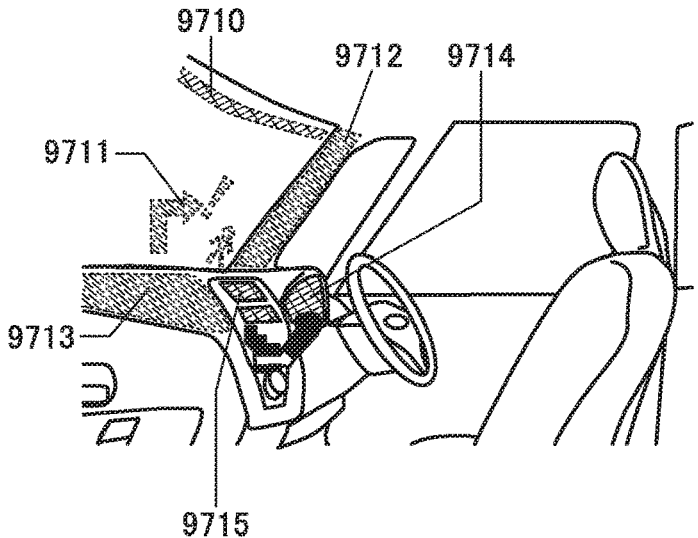

FIG. 38B is an external view of an automobile 9700. FIG. 38C illustrates a driver's seat of the automobile 9700. The automobile 9700 includes a car body 9701, wheels 9702, a dashboard 9703, lights 9704, and the like. The display device, the light-emitting device, or the like of one embodiment of the present invention can be used in a display portion or the like of the automobile 9700. For example, the display device, the light-emitting device, or the like of one embodiment of the present invention can be used in display portions 9710 to 9715 illustrated in FIG. 38C.

The display portion 9710 and the display portion 9711 are display devices provided in an automobile windshield. The display device, the light-emitting device, or the like of one embodiment of the present invention can be a see-through display device, through which the opposite side can be seen, using a light-transmitting conductive material for its electrodes and wirings. Such a see-through display portion 9710 or 9711 does not hinder driver's vision during driving the automobile 9700. Thus, the display device, the light-emitting device, or the like of one embodiment of the present invention can be provided in the windshield of the automobile 9700. Note that in the case where a transistor or the like for driving the display device, the light-emitting device, or the like is provided, a transistor having a light-transmitting property, such as an organic transistor using an organic semiconductor material or a transistor using an oxide semiconductor, is preferably used.

The display portion 9712 is a display device provided on a pillar portion. For example, the display portion 9712 can compensate for the view hindered by the pillar portion by showing an image taken by an imaging unit provided on the car body. The display portion 9713 is a display device provided on the dashboard. For example, the display portion 9713 can compensate for the view hindered by the dashboard portion by showing an image taken by an imaging unit provided on the car body. That is, showing an image taken by an imaging unit provided on the outside of the car body leads to elimination of blind areas and enhancement of safety. In addition, showing an image so as to compensate for the area which a driver cannot see makes it possible for the driver to confirm safety easily and comfortably.

Figure 38D:
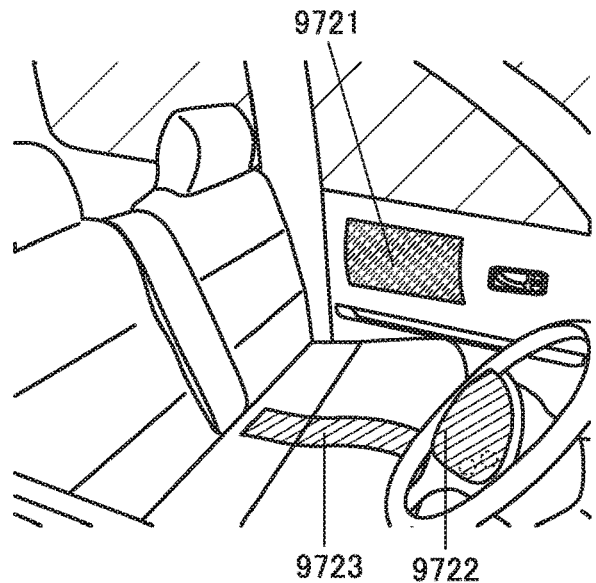

FIG. 38D illustrates the inside of a car in which bench seats are used for a driver seat and a front passenger seat. A display portion 9721 is a display device provided in a door portion. For example, the display portion 9721 can compensate for the view hindered by the door portion by showing an image taken by an imaging unit provided on the car body. A display portion 9722 is a display device provided in a steering wheel. A display portion 9723 is a display device provided in the middle of a seating face of the bench seat. Note that the display device can be used as a seat heater by providing the display device on the seating face or backrest and by using heat generation of the display device as a heat source.

The display portion 9714, the display portion 9715, and the display portion 9722 can display a variety of kinds of information such as navigation data, a speedometer, a tachometer, a mileage, a fuel meter, a gearshift indicator, and air-condition setting. The content, layout, or the like of the display on the display portions can be changed freely by a user as appropriate. The information listed above can also be displayed on the display portions 9710 to 9713, 9721, and 9723. The display portions 9710 to 9715 and 9721 to 9723 can also be used as lighting devices. The display portions 9710 to 9715 and 9721 to 9723 can also be used as heating devices.

Figure 39A:
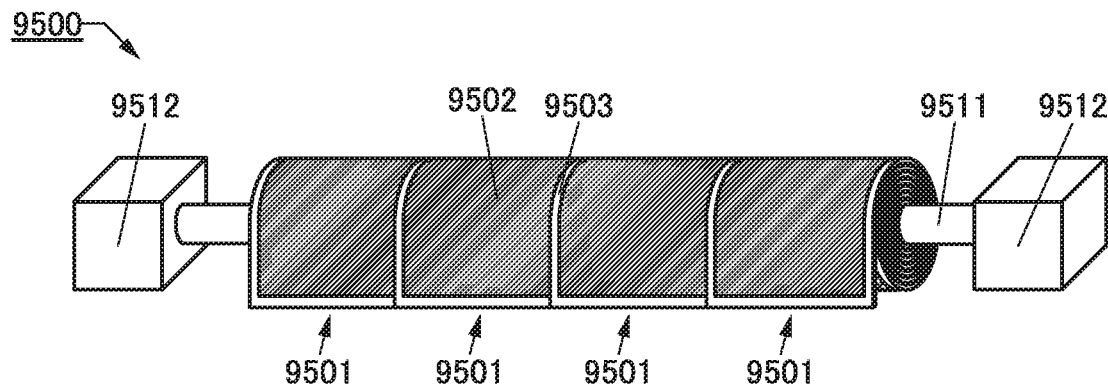
FIGS. 39A and 39B are perspective views of a display device of one embodiment of the present invention.
Figure 39B:
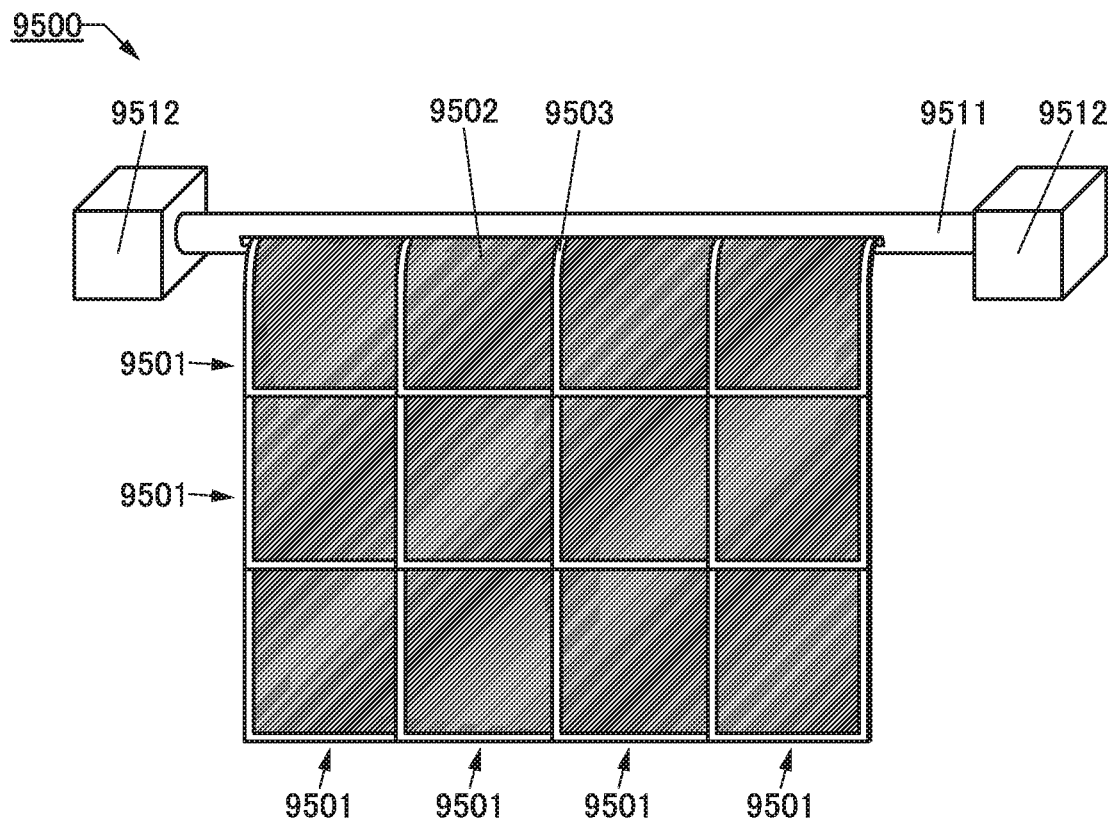

A display device 9500 illustrated in FIGS. 39A and 39B includes a plurality of display panels 9501, a hinge 9511, and a bearing 9512. The plurality of display panels 9501 each include a display region 9502 and a light-transmitting region 9503.

Each of the plurality of display panels 9501 is flexible. Two adjacent display panels 9501 are provided so as to partly overlap with each other. For example, the light-transmitting regions 9503 of the two adjacent display panels 9501 can be overlapped each other. A display device having a large screen can be obtained with the plurality of display panels 9501. The display device is highly versatile because the display panels 9501 can be wound depending on its use.

Moreover, although the display regions 9502 of the adjacent display panels 9501 are separated from each other in FIGS. 39A and 39B, without limitation to this structure, the display regions 9502 of the adjacent display panels 9501 may overlap with each other without any space so that a continuous display region 9502 is obtained, for example.

The electronic devices described in this embodiment each include the display portion for displaying some sort of data. Note that the light-emitting device of one embodiment of the present invention can also be used for an electronic device which does not have a display portion. The structure in which the display portion of the electronic device described in this embodiment is flexible and display can be performed on the bent display surface or the structure in which the display portion of the electronic device is foldable is described as an example; however, the structure is not limited thereto and a structure in which the display portion of the electronic device is not flexible and display is performed on a plane portion may be employed.

The structure described in this embodiment can be used in appropriate combination with the structure described in any of the other embodiments.

Embodiment 8

In this embodiment, a light-emitting device of one embodiment of the present invention is described with reference to FIGS. 40A to 40C, FIGS. 2A and 2B and FIGS. 41A to 41D.

Figure 40A:
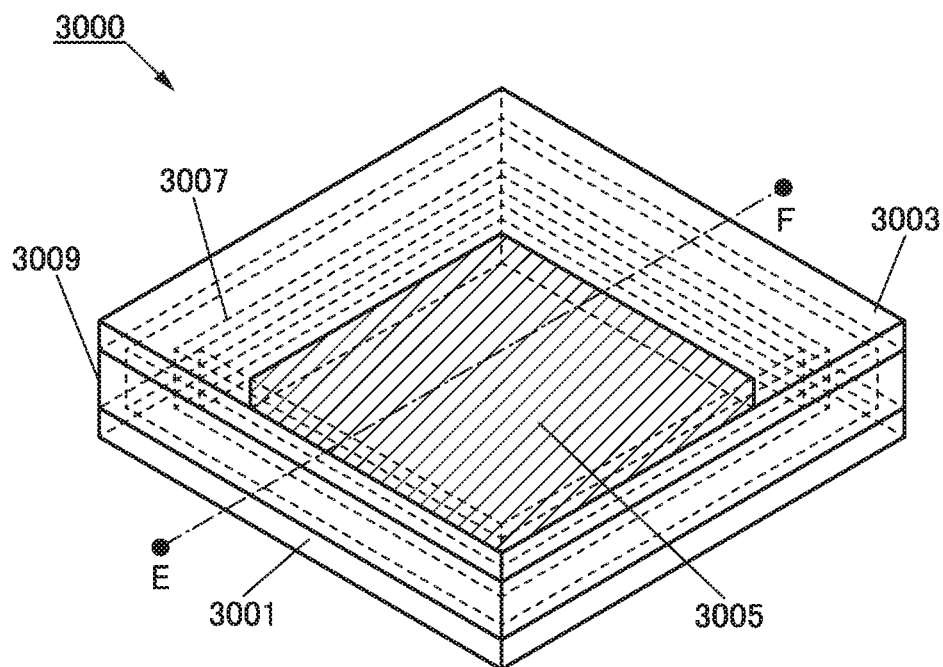
FIGS. 40A to 40C are a perspective view and cross-sectional views of a light-emitting device of one embodiment of the present invention.
Figure 40B:
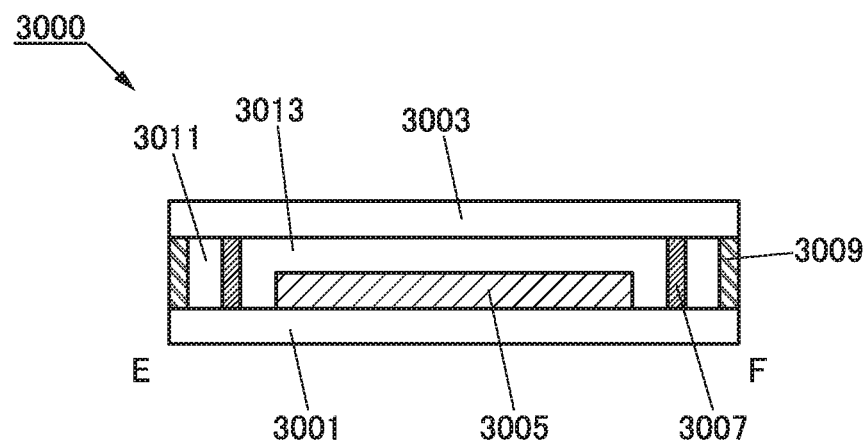

FIG. 40A is a perspective view of a light-emitting device 3000 shown in this embodiment, and FIG. 40B is a cross-sectional view along dashed-dotted line E-F in FIG. 40A. Note that in FIG. 40A, some components are illustrated by broken lines in order to avoid complexity of the drawing.

The light-emitting device 3000 illustrated in FIGS. 40A and 40B includes a substrate 3001, a light-emitting element 3005 over the substrate 3001, a first sealing region 3007 provided around the light-emitting element 3005, and a second sealing region 3009 provided around the first sealing region 3007.

Light is emitted from the light-emitting element 3005 through one or both of the substrate 3001 and a substrate 3003. In FIGS. 40A and 40B, a structure in which light is emitted from the light-emitting element 3005 to the lower side (the substrate 3001 side) is illustrated.

As illustrated in FIGS. 40A and 40B, the light-emitting device 3000 has a double sealing structure in which the light-emitting element 3005 is surrounded by the first sealing region 3007 and the second sealing region 3009. With the double sealing structure, entry of impurities (e.g., water, oxygen, and the like) from the outside into the light-emitting element 3005 can be favorably suppressed. Note that it is not necessary to provide both the first sealing region 3007 and the second sealing region 3009. For example, only the first sealing region 3007 may be provided.

Note that in FIG. 40B, the first sealing region 3007 and the second sealing region 3009 are each provided in contact with the substrate 3001 and the substrate 3003. However, without limitation to such a structure, for example, one or both of the first sealing region 3007 and the second sealing region 3009 may be provided in contact with an insulating film or a conductive film provided on the substrate 3001. Alternatively, one or both of the first sealing region 3007 and the second sealing region 3009 may be provided in contact with an insulating film or a conductive film provided on the substrate 3003.

The substrate 3001 and the substrate 3003 can have structures similar to those of the substrate 200 and the substrate 220 described in the above embodiment, respectively. The light-emitting element 3005 can have a structure similar to that of any of the light-emitting elements described in the above embodiments.

For the first sealing region 3007, a material containing glass (e.g., a glass frit, a glass ribbon, and the like) can be used. For the second sealing region 3009, a material containing a resin can be used. With the use of the material containing glass for the first sealing region 3007, productivity and a sealing property can be improved. Moreover, with use of the material containing a resin for the second sealing region 3009, impact resistance and heat resistance can be improved. However, the materials used for the first sealing region 3007 and the second sealing region 3009 are not limited to the above, and the first sealing region 3007 may be formed using the material containing a resin and the second sealing region 3009 may be formed using the material containing glass.

The glass frit may contain, for example, magnesium oxide, calcium oxide, strontium oxide, barium oxide, cesium oxide, sodium oxide, potassium oxide, boron oxide, vanadium oxide, zinc oxide, tellurium oxide, aluminum oxide, silicon dioxide, lead oxide, tin oxide, phosphorus oxide, ruthenium oxide, rhodium oxide, iron oxide, copper oxide, manganese dioxide, molybdenum oxide, niobium oxide, titanium oxide, tungsten oxide, bismuth oxide, zirconium oxide, lithium oxide, antimony oxide, lead borate glass, tin phosphate glass, vanadate glass, or borosilicate glass. The glass frit preferably contains at least one kind of transition metal to absorb infrared light.

As the above glass frits, for example, a frit paste is applied to a substrate and is subjected to heat treatment, laser light irradiation, or the like. The frit paste contains the glass frit and a resin (also referred to as a binder) diluted by an organic solvent. Note that an absorber which absorbs light having the wavelength of laser light may be added to the glass frit. For example, an Nd:YAG laser or a semiconductor laser is preferably used as the laser. The shape of laser light may be circular or quadrangular.

As the above material containing a resin, for example, polyester, polyolefin, polyamide (e.g., nylon, aramid), polyimide, polycarbonate, or an acrylic resin, polyurethane, or an epoxy resin can be used. Alternatively, a material that includes a resin having a siloxane bond such as silicone can be used.

Note that in the case where the material containing glass is used for one or both of the first sealing region 3007 and the second sealing region 3009, the material containing glass preferably has a thermal expansion coefficient close to that of the substrate 3001. With the above structure, generation of a crack in the material containing glass or the substrate 3001 due to thermal stress can be suppressed.

For example, the following advantageous effect can be obtained in the case where the material containing glass is used for the first sealing region 3007 and the material containing a resin is used for the second sealing region 3009.

The second sealing region 3009 is provided closer to an outer portion of the light-emitting device 3000 than the first sealing region 3007 is. In the light-emitting device 3000, distortion due to external force or the like increases toward the outer portion. Thus, the outer portion of the light-emitting device 3000 where a larger amount of distortion is generated, that is, the second sealing region 3009 is sealed using the material containing a resin and the first sealing region 3007 provided on an inner side of the second sealing region 3009 is sealed using the material containing glass, whereby the light-emitting device 3000 is less likely to be damaged even when distortion due to external force or the like is generated.

Furthermore, as illustrated in FIG. 40B, a first region 3011 corresponds to the region surrounded by the substrate 3001, the substrate 3003, the first sealing region 3007, and the second sealing region 3009. A second region 3013 corresponds to the region surrounded by the substrate 3001, the substrate 3003, the light-emitting element 3005, and the first sealing region 3007.

The first region 3011 and the second region 3013 are preferably filled with, for example, an inert gas such as a rare gas or a nitrogen gas. Alternatively, the first region 3011 and the second region 3013 are preferably filled with a resin such as an acrylic resin or an epoxy resin. Note that for the first region 3011 and the second region 3013, a reduced pressure state is preferred to an atmospheric pressure state.

Figure 40C:
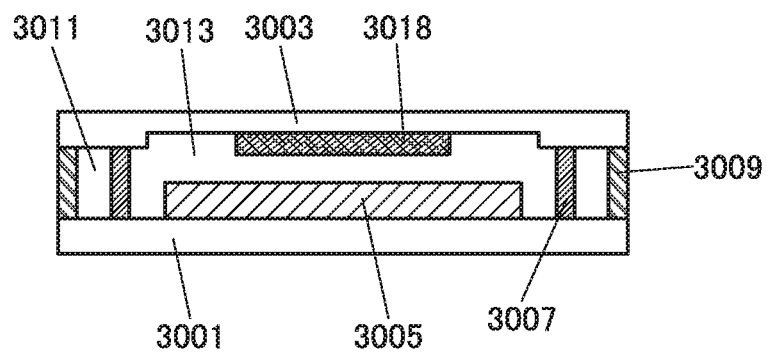

FIG. 40C illustrates a modification example of the structure in FIG. 40B. FIG. 40C is a cross-sectional view illustrating the modification example of the light-emitting device 3000.

FIG. 40C illustrates a structure in which a desiccant 3018 is provided in a recessed portion provided in part of the substrate 3003. The other components are the same as those of the structure illustrated in FIG. 40B.

As the desiccant 3018, a substance which adsorbs moisture and the like by chemical adsorption or a substance which adsorbs moisture and the like by physical adsorption can be used. Examples of the substance that can be used as the desiccant 3018 include alkali metal oxides, alkaline earth metal oxide (e.g., calcium oxide, barium oxide, and the like), sulfate, metal halides, perchlorate, zeolite, silica gel, and the like.

Next, modification examples of the light-emitting device 3000 which is illustrated in FIG. 40B are described with reference to FIGS. 41A to 41D. Note that FIGS. 41A to 41D are cross-sectional views illustrating the modification examples of the light-emitting device 3000 illustrated in FIG. 40B.

In each of the light-emitting devices illustrated in FIGS. 41A to 41D, the second sealing region 3009 is not provided but only the first sealing region 3007 is provided. Moreover, in each of the light-emitting devices illustrated in FIGS. 41A to 41D, a region 3014 is provided instead of the second region 3013 illustrated in FIG. 40B.

For the region 3014, for example, polyester, polyolefin, polyamide (e.g., nylon, aramid), polyimide, polycarbonate, an acrylic resin, polyurethane, or an epoxy resin can be used. Alternatively, a material that includes a resin having a siloxane bond such as silicone can be used.

When the above-described material is used for the region 3014, what is called a solid-sealing light-emitting device can be obtained.

Figure 41A:
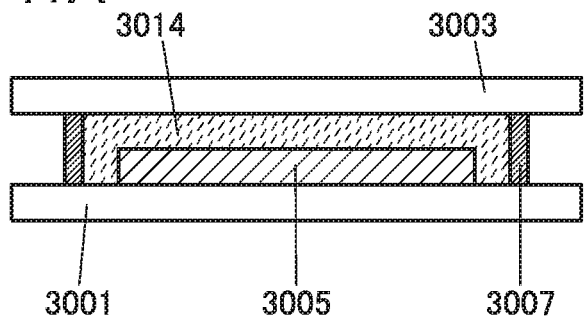
FIGS. 41A to 41D are cross-sectional views of a light-emitting device of one embodiment of the present invention.
Figure 41B:
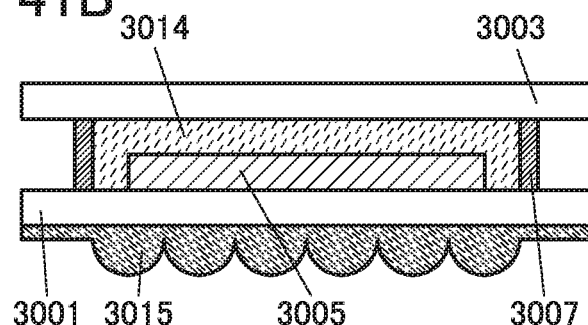

In the light-emitting device illustrated in FIG. 41B, a substrate 3015 is provided on the substrate 3001 side of the light-emitting device illustrated in FIG. 41A.

The substrate 3015 has unevenness as illustrated in FIG. 41B. With a structure in which the substrate 3015 having unevenness is provided on the side through which light emitted from the light-emitting element 3005 is extracted, the efficiency of extraction of light from the light-emitting element 3005 can be improved. Note that instead of the structure having unevenness and illustrated in FIG. 41B, a substrate having a function as a diffusion plate may be provided.

Figure 41C:
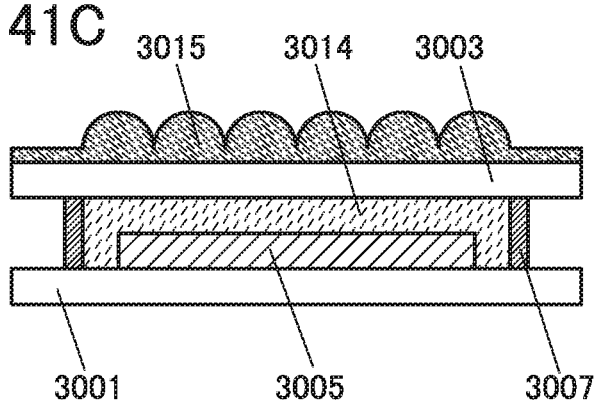

In the light-emitting device illustrated in FIG. 41C, light is extracted through the substrate 3001 side, unlike in the light-emitting device illustrated in FIG. 28A, in which light is extracted through the substrate 3003 side.

The light-emitting device illustrated in FIG. 41C includes the substrate 3015 on the substrate 3003 side. The other components are the same as those of the light-emitting device illustrated in FIG. 41B.

Figure 41D:
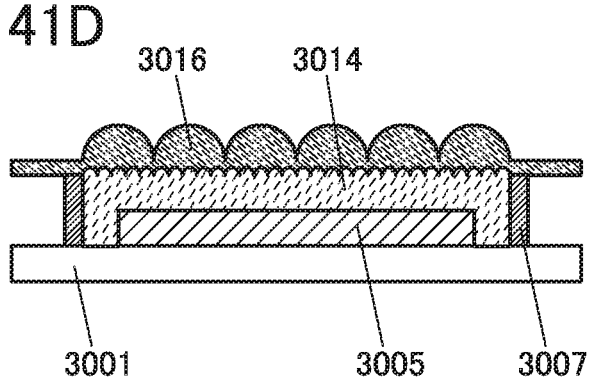

In the light-emitting device illustrated in FIG. 41D, the substrate 3003 and the substrate 3015 included in the light-emitting device illustrated in FIG. 41C are not provided but a substrate 3016 is provided.

The substrate 3016 includes first unevenness positioned closer to the light-emitting element 3005 and second unevenness positioned farther from the light-emitting element 3005. With the structure illustrated in FIG. 41D, the efficiency of extraction of light from the light-emitting element 3005 can be further improved.

Thus, the use of the structure described in this embodiment can obtain a light-emitting device in which deterioration of a light-emitting device due to impurities such as moisture and oxygen is suppressed. Alternatively, with the structure described in this embodiment, a light-emitting device having high light extraction efficiency can be obtained.

Note that the structure described in this embodiment can be combined as appropriate with any of the structures described in the other embodiments.

Embodiment 9

In this embodiment, examples in which the light-emitting device of one embodiment of the present invention is applied to various lighting devices and electronic devices will be described with reference to FIGS. 42A to 42C and FIG. 43.

An electronic device or a lighting device that has a light-emitting region with a curved surface can be obtained with use of the light-emitting device of one embodiment of the present invention which is manufactured over a substrate having flexibility.

Furthermore, a light-emitting device to which one embodiment of the present invention is applied can also be used for lighting for motor vehicles, examples of which are lighting for a dashboard, a windshield, a ceiling, and the like.

Figure 42A:
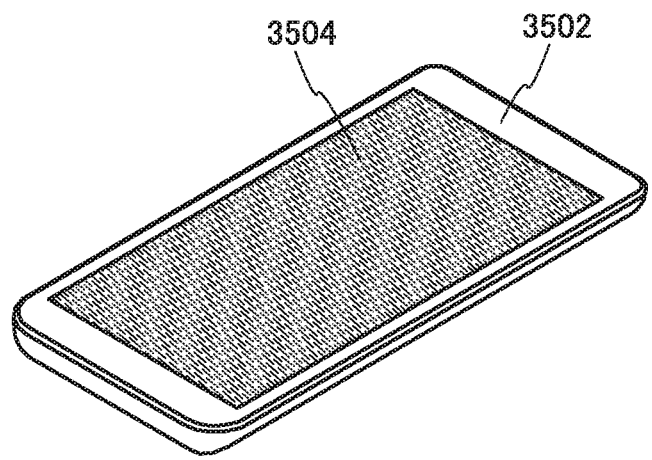
FIGS. 42A and 42B illustrate an electronic device of one embodiment of the present invention.
Figure 42B:
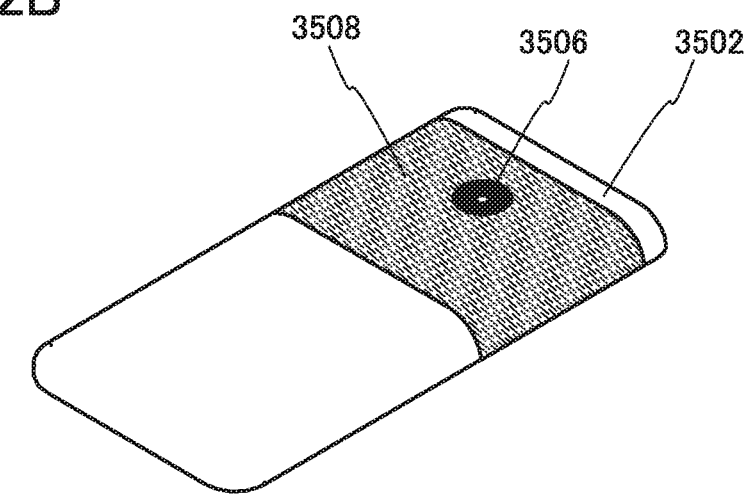

FIG. 42A is a perspective view illustrating one surface of a multifunction terminal 3500, and FIG. 42B is a perspective view illustrating the other surface of the multifunction terminal 3500. In a housing 3502 of the multifunction terminal 3500, a display portion 3504, a camera 3506, lighting 3508, and the like are incorporated. The light-emitting device of one embodiment of the present invention can be used for the lighting 3508.

The lighting 3508 that includes the light-emitting device of one embodiment of the present invention functions as a planar light source. Thus, unlike a point light source typified by an LED, the lighting 3508 can provide light emission with low directivity. When the lighting 3508 and the camera 3506 are used in combination, for example, imaging can be performed by the camera 3506 with the lighting 3508 lighting or flashing. Because the lighting 3508 functions as a planar light source, a photograph as if taken under natural light can be taken.

Note that the multifunction terminal 3500 illustrated in FIGS. 42A and 42B can have a variety of functions as in the electronic devices illustrated in FIGS. 35A to 35G.

The housing 3502 can include a speaker, a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone, and the like. When a detection device including a sensor for detecting inclination, such as a gyroscope or an acceleration sensor, is provided inside the multifunction terminal 3500, display on the screen of the display portion 3504 can be automatically switched by determining the orientation of the multifunction terminal 3500 (whether the multifunction terminal is placed horizontally or vertically for a landscape mode or a portrait mode).

The display portion 3504 may function as an image sensor. For example, an image of a palm print, a fingerprint, or the like is taken when the display portion 3504 is touched with the palm or the finger, whereby personal authentication can be performed. Furthermore, by providing a backlight or a sensing light source which emits near-infrared light in the display portion 3504, an image of a finger vein, a palm vein, or the like can be taken. Note that the light-emitting device of one embodiment of the present invention may be used for the display portion 3504.

Figure 42C:
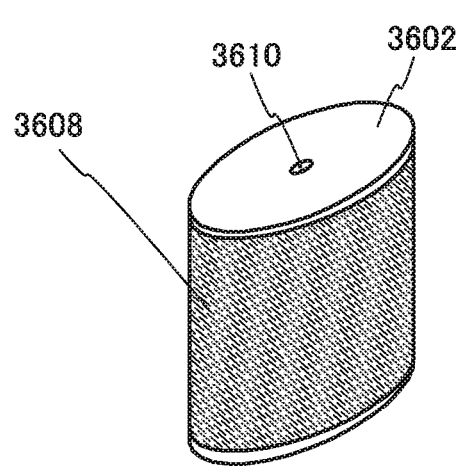
FIG. 42C illustrates a lighting device of one embodiment of the present invention.

FIG. 42C is a perspective view of a security light 3600. The security light 3600 includes lighting 3608 on the outside of the housing 3602, and a speaker 3610 and the like are incorporated in the housing 3602. The light-emitting device of one embodiment of the present invention can be used for the lighting 3608.

The security light 3600 emits light when the lighting 3608 is gripped or held, for example. An electronic circuit that can control the manner of light emission from the security light 3600 may be provided in the housing 3602. The electronic circuit may be a circuit that enables light emission once or intermittently a plurality of times or may be a circuit that can adjust the amount of emitted light by controlling the current value for light emission. A circuit with which a loud audible alarm is output from the speaker 3610 at the same time as light emission from the lighting 3608 may be incorporated.

The security light 3600 can emit light in various directions; therefore, it is possible to intimidate a thug or the like with light, or light and sound. Moreover, the security light 3600 may include a camera such as a digital still camera to have a photography function.

Figure 43:
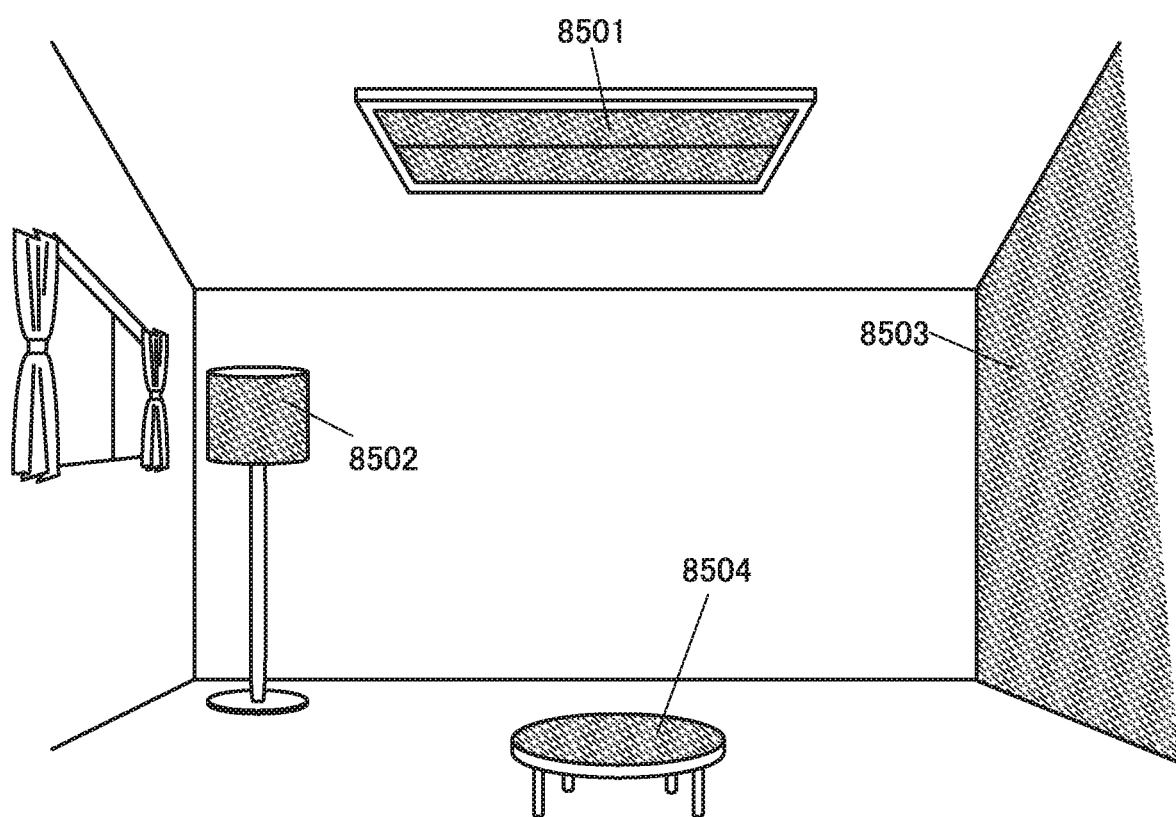
FIG. 43 illustrates lighting devices of one embodiment of the present invention.

FIG. 43 illustrates an example in which the light-emitting device is used for an interior lighting device 8501. Since the light-emitting device can have a large area, it can be used for a lighting device having a large area. In addition, a lighting device 8502 in which a light-emitting region has a curved surface can also be formed with use of a housing with a curved surface. A light-emitting device described in this embodiment is in the form of a thin film, which allows the housing to be designed more freely. Therefore, the lighting device can be elaborately designed in a variety of ways. Furthermore, a wall of the room may be provided with a large-sized lighting device 8503. Touch sensors may be provided in the lighting devices 8501, 8502, and 8503 to control the power on/off of the lighting devices.

Moreover, when the light-emitting device is used on the surface side of a table, a lighting device 8504 which has a function as a table can be obtained. When the light-emitting device is used as part of other furniture, a lighting device that functions as the furniture can be obtained.

As described above, lighting devices and electronic devices can be obtained by application of the light-emitting device of one embodiment of the present invention. Note that the light-emitting device can be used for electronic devices in a variety of fields without being limited to the lighting devices and the electronic devices described in this embodiment.

The structure described in this embodiment can be combined with any of the structures described in the other embodiments as appropriate.

Example 1

Figure 44A:
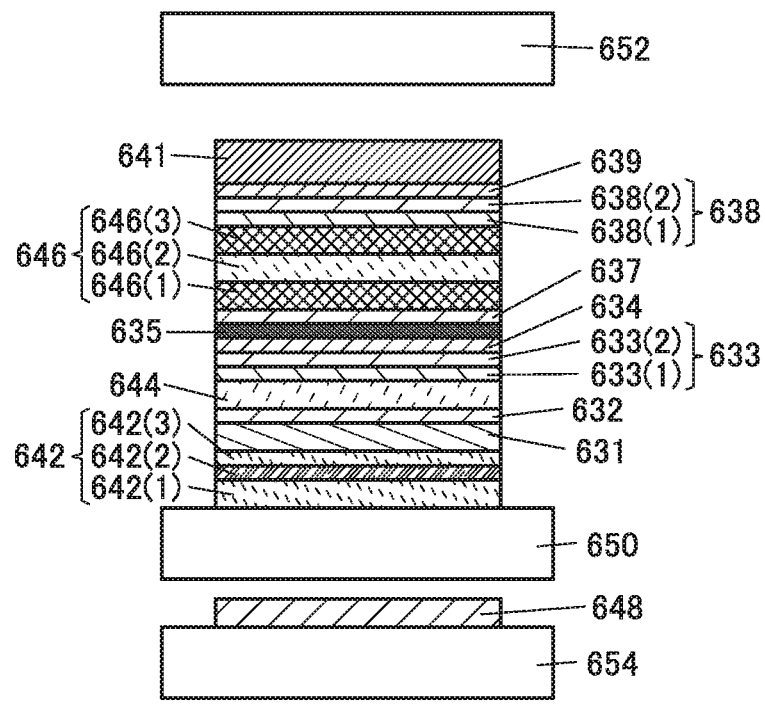
FIGS. 44A and 44B are cross-sectional views of light-emitting elements in Example.
Figure 44B:
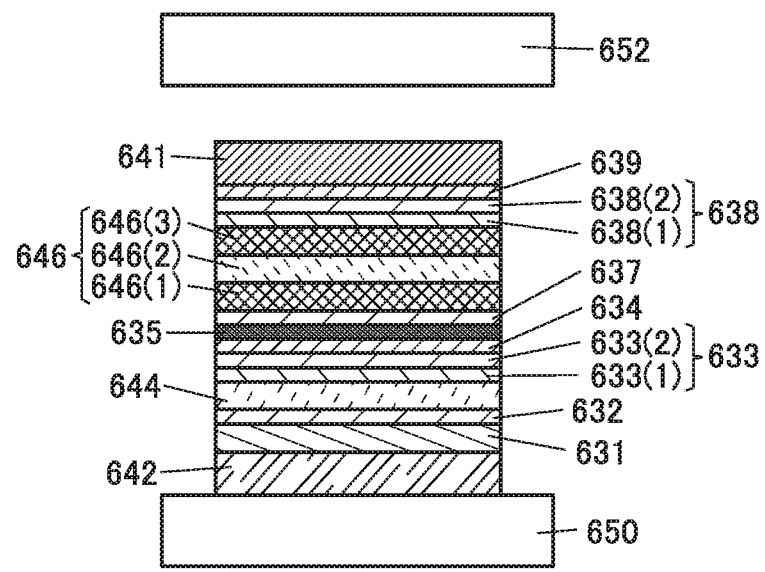

In this example, examples of fabricating light-emitting devices of embodiments of the present invention are described. FIGS. 44A and 44B are each a cross-sectional schematic view of a light-emitting element in the light-emitting device fabricated in this example. Tables 1 to 4 show the details of the element structures of the light-emitting devices. In addition, structures and abbreviations of compounds used here are given below.

[Chemical Formula 1]

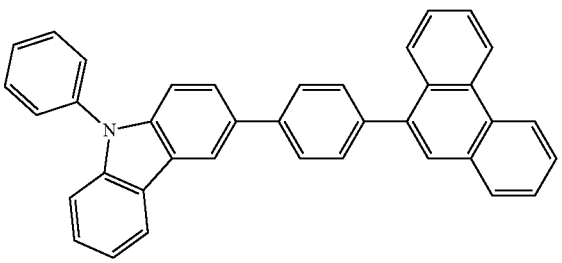

PCPPn

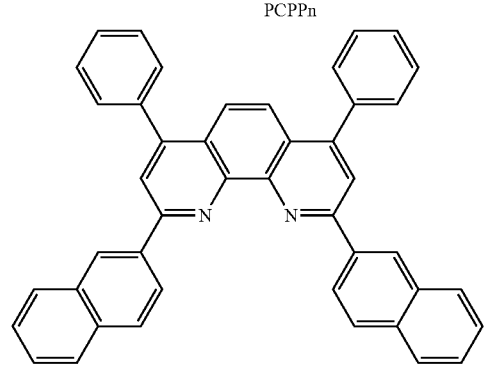

NBphen

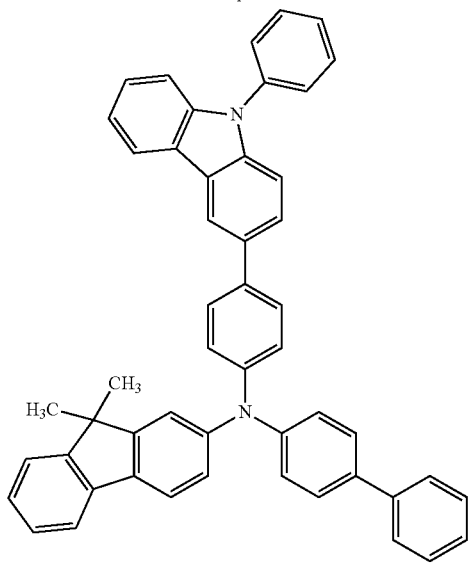

PCBBiF

101
-continued
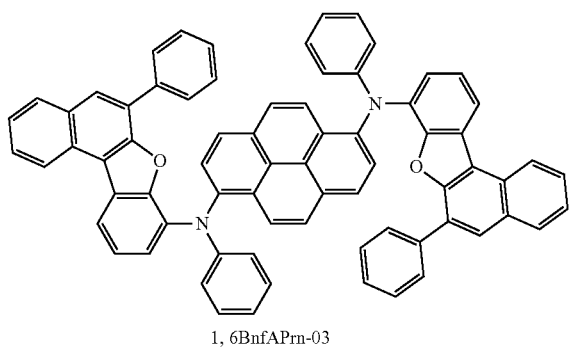
1,6BnfAPrn-03
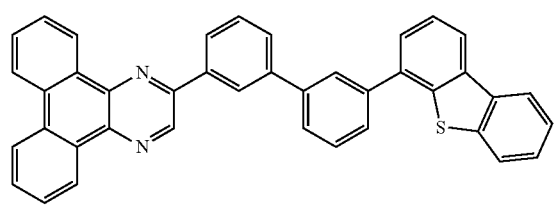
2mSBTBPDBq-II
[Chemical Formula 2]
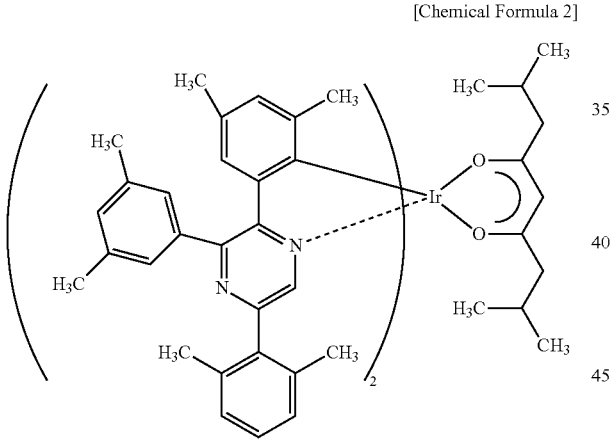
Ir(dmdppr-dmp)$_2$(divm)
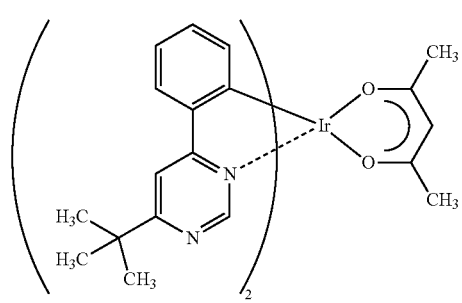
Ir(tBuppm)$_2$(acac)
102
-continued
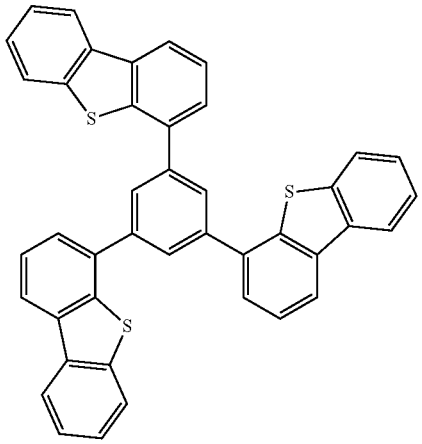
DBT3P-II
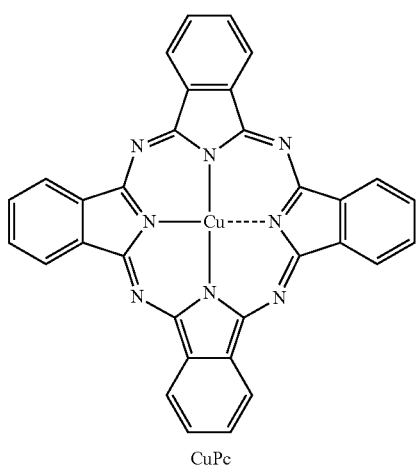
CuPc
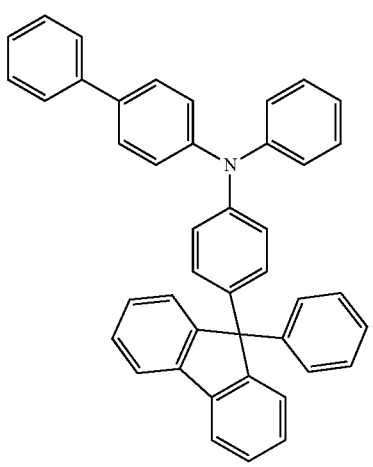
BPAFLP

TABLE 1

| Layer | | Reference numeral | Thickness (nm) | Material | Weight ratio |
|---|---|---|---|---|---|
| Light-emitting element 1 | Electrode | 641 | 120 | Al | — |
| | Electron-injection layer | 639 | 1 | LiF | — |
| | Electron-transport layer | 638(2) | 15 | NBphen | — |
| | | 638(1) | 30 | 2mDBTBPDBq-II | — |
| | Light-emitting layer | 646(3) | 10 | 2mDBTBPDBq-II:PCBBiF:Ir(tBuppm)$_2$(acac) | 0.8:0.2:0.06 |
| | | 646(2) | 10 | 2mDBTBPDBq-II:PCBBiF:Ir(dmdppr-dmp)$_2$(divm) | 0.8:0.2:0.06 |
| | | 646(1) | 20 | 2mDBTBPDBq-II:PCBBiF:Ir(tBuppm)$_2$(acac) | 0.8:0.2:0.06 |
| | Hole-transport layer | 637 | 15 | BPAFLP | — |
| | Intermediate layer | 635 | 10 | DBT3P-II:MoO$_3$ | 1:0.5 |
| | Electron-injection layer | 634(2) | 2 | CuPc | — |
| | | 634(1) | 0.1 | Li$_2$O | — |
| | Electron-transport layer | 633(2) | 15 | NBPhen | — |
| | | 633(1) | 10 | cgDBCzPA | — |
| | Light-emitting layer | 644 | 25 | cgDBCzPA:1,6BnfAPrn-03 | 1:0.03 |
| | Hole-transport layer | 632 | 15 | PCPPn | — |
| | Hole-injection layer | 631 | 95 | PCPPn:MoO$_3$ | 1:0.5 |
| | Electrode | 642(3) | 10 | ITSO | — |
| | | 642(2) | 20 | APC | — |
| | | 642(1) | 70 | ITSO | — |
| Light-emitting element 2 | Electrode | 641 | 120 | Al | — |
| | Electron-injection layer | 639 | 1 | LiF | — |
| | Electron-transport layer | 638(2) | 15 | NBphen | — |
| | | 638(1) | 30 | 2mDBTBPDBq-II | — |
| | Light-emitting layer | 646(3) | 10 | 2mDBTBPDBq-II:PCBBiF:Ir(tBuppm)$_2$(acac) | 0.8:0.2:0.06 |
| | | 646(2) | 10 | 2mDBTBPDBq-II:PCBBiF:Ir(dmdppr-dmp)$_2$(divm) | 0.8:0.2:0.06 |
| | | 646(1) | 20 | 2mDBTBPDBq-II:PCBBiF:Ir(tBuppm)$_2$(acac) | 0.8:0.2:0.06 |
| | Hole-transport layer | 637 | 15 | BPAFLP | — |
| | Intermediate layer | 635 | 10 | DBT3P-II:MoO$_3$ | 1:0.5 |
| | Electron-injection layer | 634(2) | 2 | CuPc | — |
| | | 634(1) | 0.1 | Li$_2$O | — |
| | Electron-transport layer | 633(2) | 15 | NBPhen | — |
| | | 633(1) | 10 | cgDBCzPA | — |
| | Light-emitting layer | 644 | 25 | cgDBCzPA:1,6BnfAPrn-03 | 1:0.03 |
| | Hole-transport layer | 632 | 15 | PCPPn | — |
| | Hole-injection layer | 631 | 50 | PCPPn:MoO$_3$ | 1:0.5 |
| | Electrode | 642(3) | 10 | ITSO | — |
| | | 642(2) | 20 | APC | — |
| | | 642(1) | 70 | ITSO | — |

TABLE 2

| Layer | | Reference numeral | Thickness (nm) | Material | Weight ratio |
|---|---|---|---|---|---|
| Light-emitting element 3 | Electrode | 641 | 120 | Al | — |
| | Electron-injection layer | 639 | 1 | LiF | — |
| | Electron-transport layer | 638(2) | 15 | NBphen | — |
| | | 638(1) | 30 | 2mDBTBPDBq-II | — |
| | Light-emitting layer | 646(3) | 10 | 2mDBTBPDBq-II:PCBBiF:Ir(tBuppm)$_2$(acac) | 0.8:0.2:0.06 |
| | | 646(2) | 10 | 2mDBTBPDBq-II:PCBBiF:Ir(dmdppr-dmp)$_2$(divm) | 0.8:0.2:0.06 |
| | | 646(1) | 20 | 2mDBTBPDBq-II:PCBBiF:Ir(tBuppm)$_2$(acac) | 0.8:0.2:0.06 |
| | Hole-transport layer | 637 | 15 | BPAFLP | — |
| | Intermediate layer | 635 | 10 | DBT3P-II:MoO$_3$ | 1:0.5 |
| | Electron-injection layer | 634(2) | 2 | CuPc | — |
| | | 634(1) | 0.1 | Li$_2$O | — |
| | Electron-transport layer | 633(2) | 15 | NBPhen | — |
| | | 633(1) | 10 | cgDBCzPA | — |
| | Light-emitting layer | 644 | 25 | cgDBCzPA:1,6BnfAPrn-03 | 1:0.03 |
| | Hole-transport layer | 632 | 15 | PCPPn | — |
| | Hole-injection layer | 631 | 5 | PCPPn:MoO$_3$ | 1:0.5 |
| | Electrode | 642(3) | 10 | ITSO | — |
| | | 642(2) | 20 | APC | — |
| | | 642(1) | 70 | ITSO | — |

TABLE 3

| Layer | | Reference numeral | Thickness (nm) | Material | Weight ratio |
|---|---|---|---|---|---|
| Light-emitting element 4 | Electrode | 641 | 120 | Al | — |
| | Electron-injection layer | 639 | 1 | LiF | — |
| | Electron-transport layer | 638(2) | 15 | NBphen | — |
| | | 638(1) | 30 | 2mDBTBPDBq-II | — |

TABLE 3-continued

| Layer | | Reference numeral | Thickness (nm) | Material | Weight ratio |
|---|---|---|---|---|---|
| | Light-emitting layer | 646(3) | 10 | 2mDBTBPDBq-II:PCBBiF:Ir(tBuppm)$_2$(acac) | 0.8:0.2:0.06 |
| | | 646(2) | 10 | 2mDBTBPDBq-II:PCBBiF:Ir(dmdppr-dmp)$_2$(divm) | 0.8:0.2:0.06 |
| | | 646(1) | 20 | 2mDBTBPDBq-II:PCBBiF:Ir(tBuppm)$_2$(acac) | 0.8:0.2:0.06 |
| | Hole-transport layer | 637 | 15 | BPAFLP | — |
| | Intermediate layer | 635 | 10 | DBT3P-II:MoO$_3$ | 1:0.5 |
| | Electron-injection layer | 634(2) | 2 | CuPc | — |
| | | 634(1) | 0.1 | Li$_2$O | — |
| | Electron-transport layer | 633(2) | 15 | NBPhen | — |
| | | 633(1) | 10 | cgDBCzPA | — |
| | Light-emitting layer | 644 | 25 | cgDBCzPA:1,6BnfAPrn-03 | 1:0.03 |
| | Hole-transport layer | 632 | 15 | PCPPn | — |
| | Hole-injection layer | 631 | 5 | PCPPn:MoO$_3$ | 1:0.5 |
| | Electrode | 642 | 70 | ITSO | — |
| Light-emitting element 5 | Electrode | 641 | 120 | Al | — |
| | Electron-injection layer | 639 | 1 | LiF | — |
| | Electron-transport layer | 638(2) | 15 | NBphen | — |
| | | 638(1) | 30 | 2mDBTBPDBq-II | — |
| | Light-emitting layer | 646(3) | 10 | 2mDBTBPDBq-II:PCBBiF:Ir(tBuppm)$_2$(acac) | 0.8:0.2:0.06 |
| | | 646(2) | 10 | 2mDBTBPDBq-II:PCBBiF:Ir(dmdppr-dmp)$_2$(divm) | 0.8:0.2:0.06 |
| | | 646(1) | 20 | 2mDBTBPDBq-II:PCBBiF:Ir(tBuppm)$_2$(acac) | 0.8:0.2:0.06 |
| | Hole-transport layer | 637 | 15 | BPAFLP | — |
| | Intermediate layer | 635 | 10 | DBT3P-II:MoO$_3$ | 1:0.5 |
| | Electron-injection layer | 634(2) | 2 | CuPc | — |
| | | 634(1) | 0.1 | Li$_2$O | — |
| | Electron-transport layer | 633(2) | 15 | NBPhen | — |
| | | 633(1) | 10 | cgDBCzPA | — |
| | Light-emitting layer | 644 | 25 | cgDBCzPA:1,6BnfAPrn-03 | 1:0.03 |
| | Hole-transport layer | 632 | 15 | PCPPn | — |
| | Hole-injection layer | 631 | 20 | PCPPn:MoO$_3$ | 1:0.5 |
| | Electrode | 642 | 70 | ITSO | — |

TABLE 4

| Layer | | Reference numeral | Thickness (nm) | Material | Weight ratio |
|---|---|---|---|---|---|
| Light-emitting element 6 | Electrode | 641 | 120 | Al | — |
| | Electron-injection layer | 639 | 1 | LiF | — |
| | Electron-transport layer | 638(2) | 15 | NBphen | — |
| | | 638(1) | 30 | 2mDBTBPDBq-II | — |
| | Light-emitting layer | 646(3) | 10 | 2mDBTBPDBq-II:PCBBiF:Ir(tBuppm)$_2$(acac) | 0.8:0.2:0.06 |
| | | 646(2) | 10 | 2mDBTBPDBq-II:PCBBiF:Ir(dmdppr-dmp)$_2$(divm) | 0.8:0.2:0.06 |
| | | 646(1) | 20 | 2mDBTBPDBq-II:PCBBiF:Ir(tBuppm)$_2$(acac) | 0.8:0.2:0.06 |
| | Hole-transport layer | 637 | 15 | BPAFLP | — |
| | Intermediate layer | 635 | 10 | DBT3P-II:MoO$_3$ | 1:0.5 |
| | Electron-injection layer | 634(2) | 2 | CuPc | — |
| | | 634(1) | 0.1 | Li$_2$O | — |
| | Electron-transport layer | 633(2) | 15 | NBPhen | — |
| | | 633(1) | 10 | cgDBCzPA | — |
| | Light-emitting layer | 644 | 25 | cgDBCzPA:1,6BnfAPrn-03 | 1:0.03 |
| | Hole-transport layer | 632 | 15 | PCPPn | — |
| | Hole-injection layer | 631 | 35 | PCPPn:MoO$_3$ | 1:0.5 |
| | Electrode | 642 | 70 | ITSO | — |
| Light-emitting element 7 | Electrode | 641 | 120 | Al | — |
| | Electron-injection layer | 639 | 1 | LiF | — |
| | Electron-transport layer | 638(2) | 15 | NBphen | — |
| | | 638(1) | 30 | 2mDBTBPDBq-II | — |
| | Light-emitting layer | 646(3) | 10 | 2mDBTBPDBq-II:PCBBiF:Ir(tBuppm)$_2$(acac) | 0.8:0.2:0.06 |
| | | 646(2) | 10 | 2mDBTBPDBq-II:PCBBiF:Ir(dmdppr-dmp)$_2$(divm) | 0.8:0.2:0.06 |
| | | 646(1) | 20 | 2mDBTBPDBq-II:PCBBiF:Ir(tBuppm)$_2$(acac) | 0.8:0.2:0.06 |
| | Hole-transport layer | 637 | 15 | BPAFLP | — |
| | Intermediate layer | 635 | 10 | DBT3P-II:MoO$_3$ | 1:0.5 |
| | Electron-injection layer | 634(2) | 2 | CuPc | — |
| | | 634(1) | 0.1 | Li$_2$O | — |
| | Electron-transport layer | 633(2) | 15 | NBPhen | — |
| | | 633(1) | 10 | cgDBCzPA | — |
| | Light-emitting layer | 644 | 25 | cgDBCzPA:1,6BnfAPrn-03 | 1:0.03 |
| | Hole-transport layer | 632 | 15 | PCPPn | — |
| | Hole-injection layer | 631 | 50 | PCPPn:MoO$_3$ | 1:0.5 |
| | Electrode | 642 | 70 | ITSO | — |

<Fabrication of Light-Emitting Element>
<<Fabrication of Light-Emitting Element 1>>

An electrode 642 was formed such that ITSO, an alloy of silver, palladium, and copper (also referred to as Ag—Pd—Cu or APC), and ITSO were deposited over a substrate 650 in this order to a thickness of 70 nm, a thickness of 20 nm, and a thickness of 10 nm, respectively. The ITSO is a conductive film having a function of transmitting light, the APC film is a conductive film having functions of reflecting light and transmitting light. The electrode area of the electrode 642 was set to 4 mm$^2$ (2 mm×2 mm).

As a hole-injection layer 631, 3-[4-(9-phenanthryl)-phenyl]-9-phenyl-9H-carbazole (abbreviation: PCPPn) and molybdenum oxide (MoO$_3$) were deposited over the electrode 642 by co-evaporation to a thickness of 95 nm such that the weight ratio of PCPPn to MoO$_3$ was 1:0.5.

As a hole-transport layer 632, PCPPn was deposited over the hole-injection layer 631 by evaporation to a thickness of 15 nm.

Next, as a light-emitting layer 644, 7-[4-(10-phenyl-9-anthryl)phenyl]-7H-dibenzo[c,g]carbazole (abbreviation: cgDBCzPA) and N,N'-(pyrene-1,6-diyl)bis[(6,N-diphenyl-benzo[b]naphtho[1,2-d]furan)-8-amine](abbreviation: 1,6BnfAPrn-03) were deposited over the hole-transport layer 632 by co-evaporation such that the deposited layer has a weight ratio of cgDBCzPA: 1,6BnfAPrn-03=1:0.03 and a thickness of 25 nm.

Next, as an electron-transport layer 633, cgDBCzPA and 2,9-bis(naphthalen-2-yl)-4,7-diphenyl-1,10-phenanthroline (abbreviation: NBPhen) were deposited sequentially over the light-emitting layer 644 by evaporation to thicknesses of 10 nm and 15 nm, respectively.

As an electron-injection layer 634, lithium oxide (abbreviation: Li$_2$O) and copper phthalocyanine (abbreviation: CuPc) were sequentially deposited over the electron-transport layer 633 by evaporation to thicknesses of 0.1 nm and 2 nm, respectively.

As a charge-generation layer 635 serving as a hole-injection layer, 4,4',4"-(benzene-1,3,5-triyl)tri(dibenzothiophene) (abbreviation: DBT3P-II) and molybdenum oxide (MoO$_3$) were deposited by co-evaporation in a weight ratio of DBT3P-II:MoO$_3$=1:0.5 to a thickness of 10 nm.

Then, as a hole-transport layer 637, 4-phenyl-4'-(9-phenylfluoren-9-yl)triphenylamine (abbreviation: BPAFLP) was deposited over the charge-generation layer 635 by evaporation to a thickness of 15 nm.

A light-emitting layer 646 was formed in the following manner. First, 2-[3'-(dibenzothiophen-4-yl)biphenyl-3-yl]dibenzo[f,h]quinoxaline (abbreviation: 2mDBTBPDBq-II), N-(1,1'-biphenyl-4-yl)-N-[4-(9-phenyl-9H-carbazol-3-yl)phenyl]-9,9-dimethyl-9H-fluor en-2-amine (abbreviation: PCBBiF), and (acetylacetonato)bis(6-tert-butyl-4-phenylpyrimidinato)iridium(III) (abbreviation: Ir(tBuppm)$_2$(acac)) were deposited by co-evaporation in a weight ratio of 2mDBTBPDBq-II: PCBBiF: Ir(tBuppm)$_2$(acac)=0.8:0.2: 0.06 to a thickness of 20 nm. Then, 2mDBTBPDBq-II, PCBBiF, and bis{4,6-dimethyl-2-[5-(2,6-dimethylphenyl)-3-(3,5-dimethylphenyl)-2-pyrazinyl-κN]phenyl-κC}(2,8-dimethyl-4,6-nonanedionato-κ$^2$O,O')iridium(III) (abbreviation: Ir(dmdppr-dmp)$_2$(divm)) were deposited by co-evaporation in a weight ratio of 2mDBTBPDBq-II:PCBBiF:Ir(dmdppr-dmp)$_2$(divm)=0.8:0.2:0.06 to a thickness of 10 nm. Then, 2mDBTBPDBq-II, PCBBiF, and Ir(tBuppm)$_2$(acac) were deposited by co-evaporation in a weight ratio of 2mDBTBPDBq-II: PCBBiF: Ir(tBuppm)$_2$(acac)=0.8:0.2:0.06 to a thickness of 10 nm.

Next, as an electron-transport layer 638, 2mDBTBPDBq-II and NBPhen were sequentially deposited over the light-emitting layer 646 by evaporation to thicknesses of 30 nm and 15 nm, respectively. As an electron-injection layer 639, lithium fluoride (LiF) was deposited over the electron-transport layer 638 by evaporation to a thickness of 1 nm.

As an electrode 641, an aluminum (Al) film was formed over the electron-injection layer 639 to a thickness of 120 nm.

Next, in a glove box containing a nitrogen atmosphere, light-emitting element 1 was sealed by fixing a substrate 652 to the substrate 650 over which the organic material was deposited using a sealant for an organic EL device. Specifically, after the sealant was applied to surround the organic materials over the substrate 650 and the substrate 652 was bonded to the substrate 650, the sealant was irradiated with ultraviolet light having a wavelength of 365 nm at 6 J/cm$^2$ and heat treatment was performed at 80° C. for 1 hour. Through the process, the light-emitting element 1 was obtained.

As an optical element 648 with which the light-emitting element 1 overlaps, a red color filter (CF red) was formed to a thickness of 2.1 m over a substrate 654.

<<Fabrication of Light-Emitting Elements 2 and 3>>

Light-emitting elements 2 and 3 were fabricated through the same steps and materials as those for the light-emitting element 1 described above except for the step of forming the hole-injection layer 631 and the material of the optical element 648.

The hole-injection layer 631 of the light-emitting element 2 was deposited by co-evaporation of PCPPn and MoO$_3$ such that the deposited layer has a weight ratio of PCPPn: MoO$_3$=1:0.5 and a thickness of 50 nm.

As the optical element 648 with which the light-emitting element 2 overlaps, a green color filter (CF Green) was formed to a thickness of 1.2 m over a substrate 654.

The hole-injection layer 631 of the light-emitting element 3 was deposited by co-evaporation of PCPPn and MoO$_3$ such that the deposited layer has a weight ratio of PCPPn: MoO$_3$=1:0.5 and a thickness of 35 nm.

As the optical element 648 with which the light-emitting element 3 overlaps, a blue color filter (CF Blue) was formed to a thickness of 0.8 m over a substrate 654.

<<Fabrication of Light-Emitting Element 4>>

A light-emitting element 4 was fabricated through the same steps as those for the light-emitting element 1 described above except for the steps of forming the electrode 642, the hole-injection layer 631, and the optical element 648. The light-emitting element 4 is not provided with an optical element.

As the electrode 642 of the light-emitting element 4, ITSO was formed over the substrate 650 to a thickness of 70 nm. The ITSO film was a conductive film having a function of transmitting light. The electrode area of the electrode 642 was set to 4 mm$^2$ (2 mm×2 mm).

Next, as the hole-injection layer 631 of the light-emitting element 4 was deposited by co-evaporation of PCPPn and MoO$_3$ over the electrode 642 such that the deposited layer has a weight ratio of PCPPn:MoO$_3$=1:0.5 and a thickness of 5 nm.

<<Fabrication of Light-Emitting Elements 5 to 7>>

The light-emitting elements 5 to 7 were fabricated through the same steps as those for the light-emitting element 4 except for the step of forming the hole-injection layer 631.

The hole-injection layer 631 of the light-emitting element 5 was deposited by co-evaporation of PCPPn and MoO$_3$ such that the deposited layer has a weight ratio of PCPPn:MoO$_3$=1:0.5 and a thickness of 20 nm.

The hole-injection layer 631 of the light-emitting element 6 was deposited by co-evaporation of PCPPn and MoO$_3$ such that the deposited layer has a weight ratio of PCPPn:MoO$_3$=1:0.5 and a thickness of 35 nm.

The hole-injection layer 631 of the light-emitting element 7 was deposited by co-evaporation of PCPPn and MoO$_3$ such that the deposited layer has a weight ratio of PCPPn:MoO$_3$=1:0.5 and a thickness of 50 nm.

<Characteristics of Light-Emitting Element>

Figure 45:
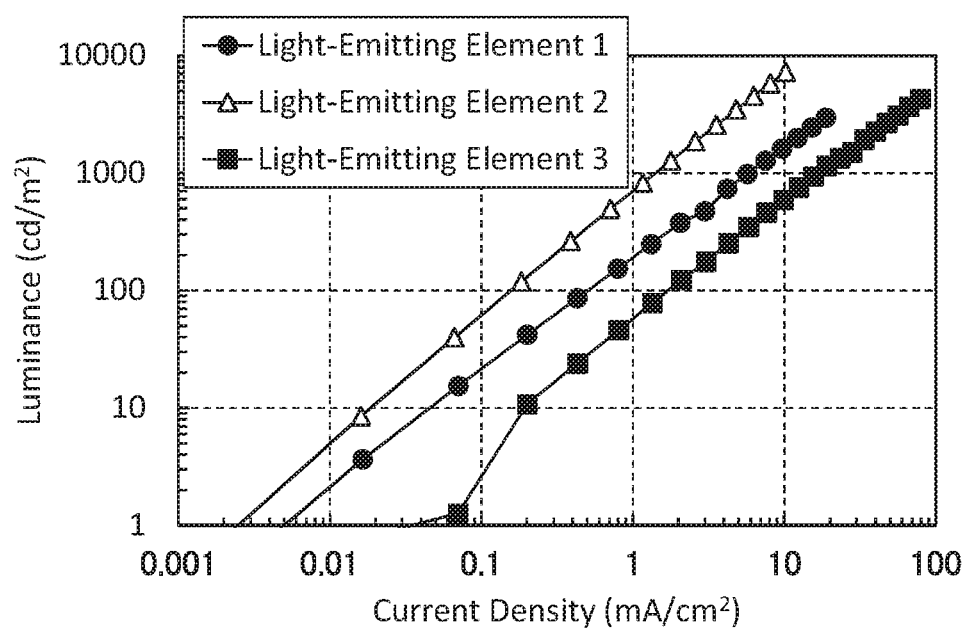
FIG. 45 is a graph showing luminance-current density characteristics of light-emitting elements in Example.
Figure 46:
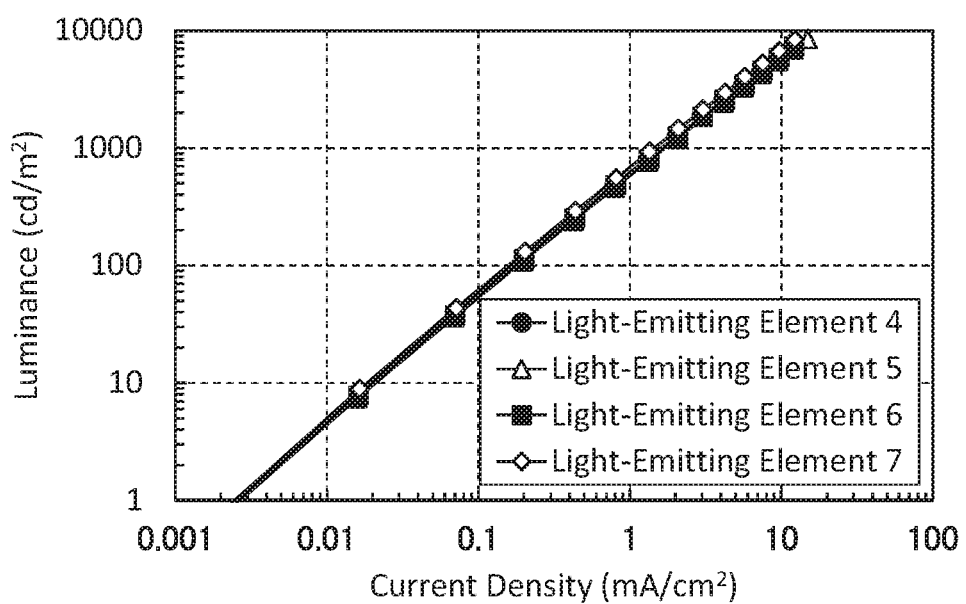
FIG. 46 is a graph showing luminance-current density characteristics of light-emitting elements in Example.
Figure 47:
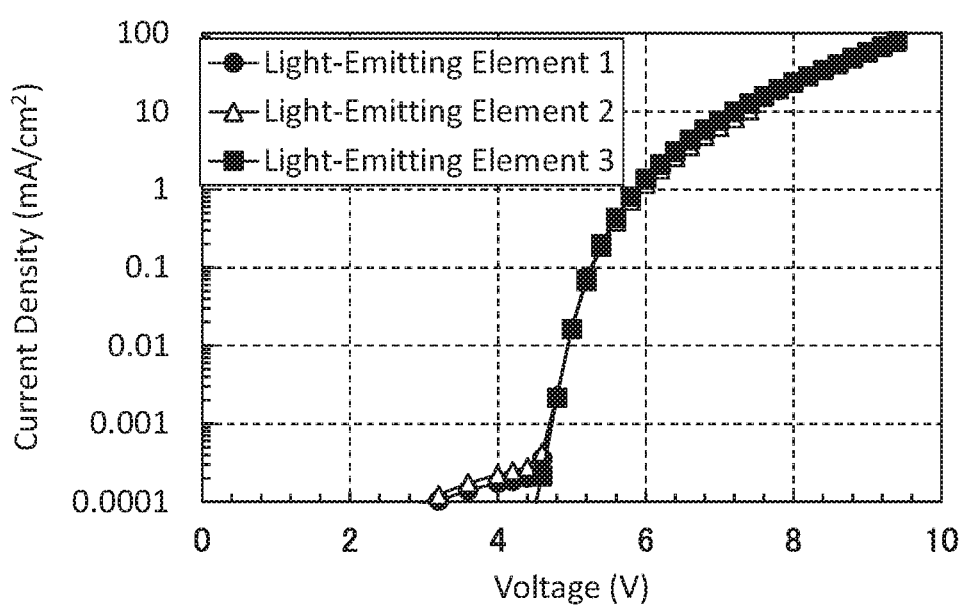
FIG. 47 is a graph showing current density-voltage characteristics of light-emitting elements in Example.
Figure 48:
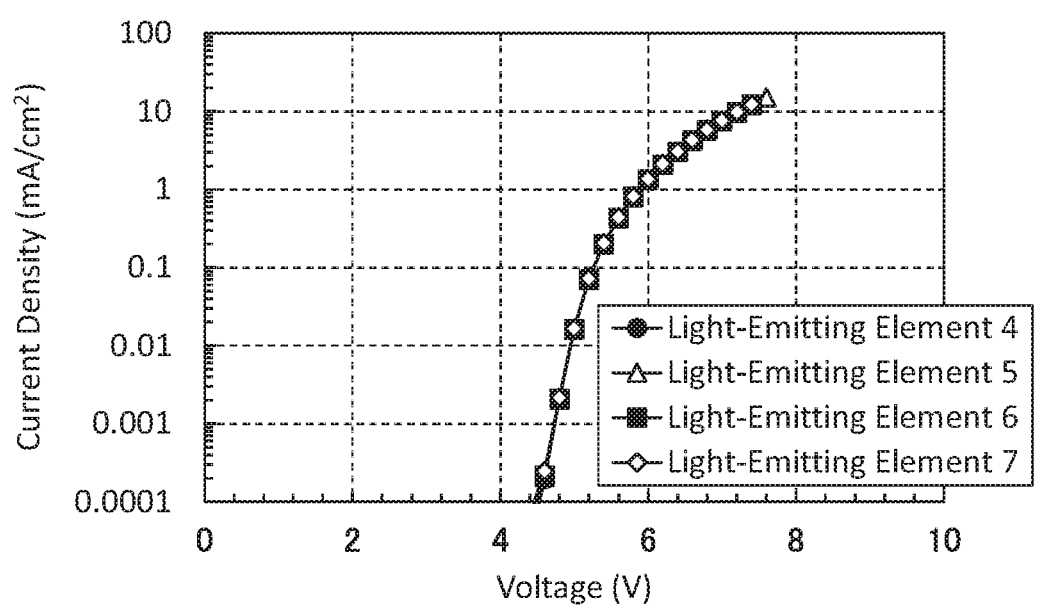
FIG. 48 is a graph showing current density-voltage characteristics of light-emitting elements in Example.
Figure 49:
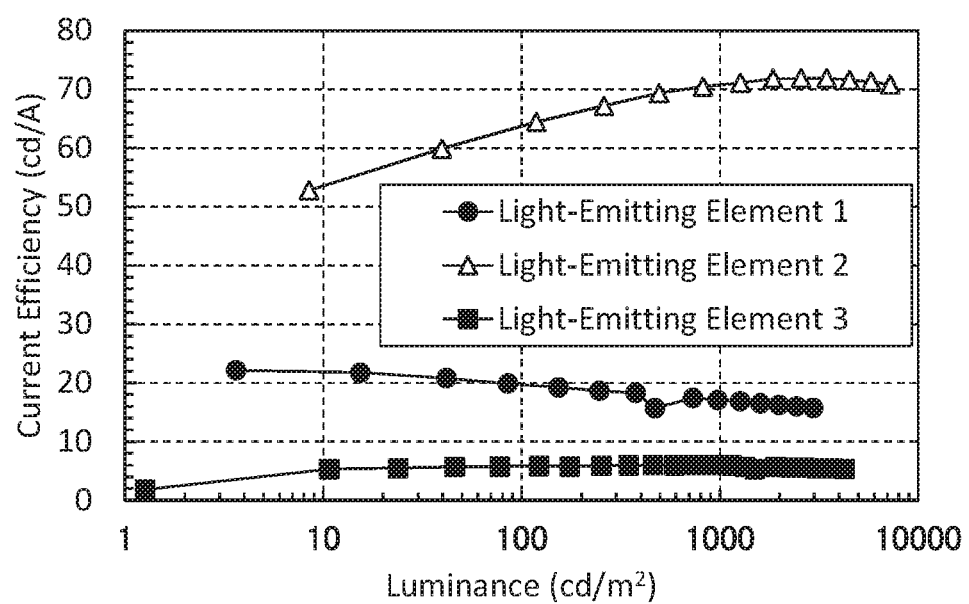
FIG. 49 is a graph showing current efficiency-luminance characteristics of light-emitting elements in Example.
Figure 50:
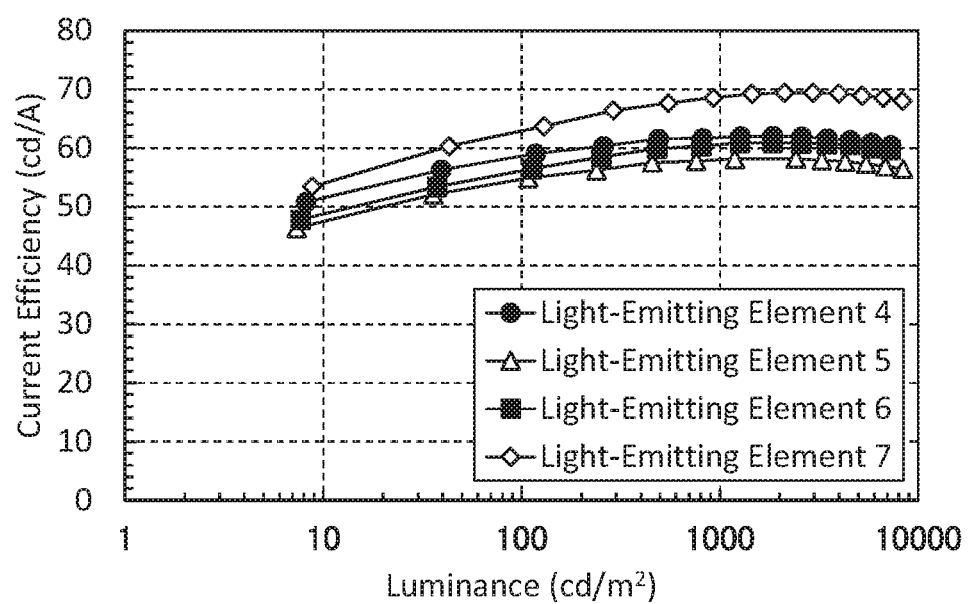
FIG. 50 is a graph showing current efficiency-luminance characteristics of light-emitting elements in Example.

FIGS. 45 and 46 show luminance-current density characteristics of the fabricated light-emitting elements 1 to 7. FIGS. 47 and 48 show current density-voltage characteristics thereof. FIGS. 49 and 50 show current efficiency-luminance characteristics thereof. For measuring the luminance and the CIE chromaticity, a luminance colorimeter (BM-5A produced by Topcon Technohouse Corporation) was used. The measurement was performed at room temperature (an atmosphere where a temperature of 23° C. was held).

Figure 51:
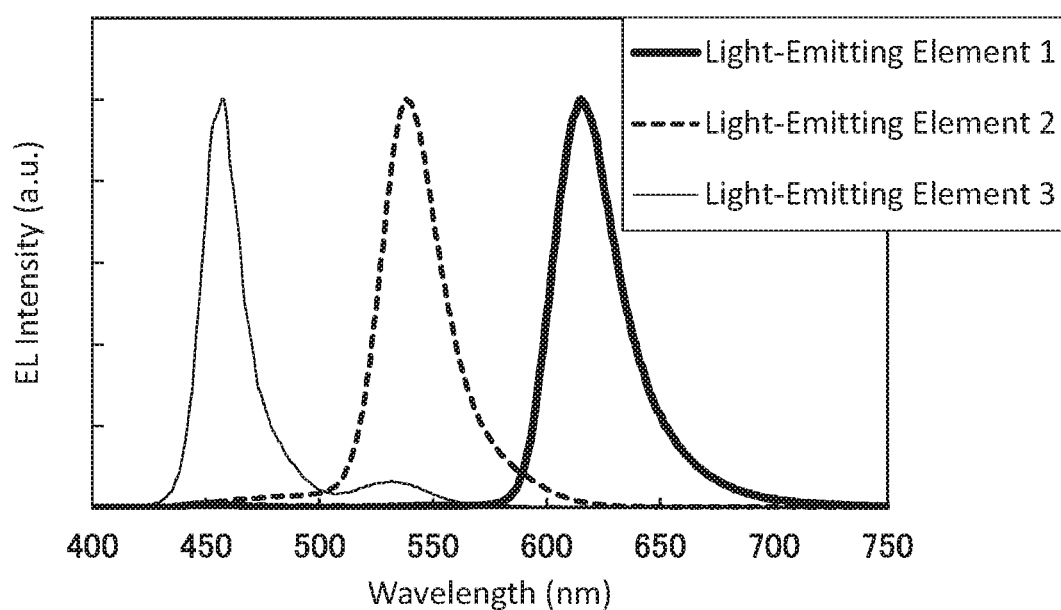
FIG. 51 is a graph showing electroluminescence spectra of light-emitting elements in Example.
Figure 52:
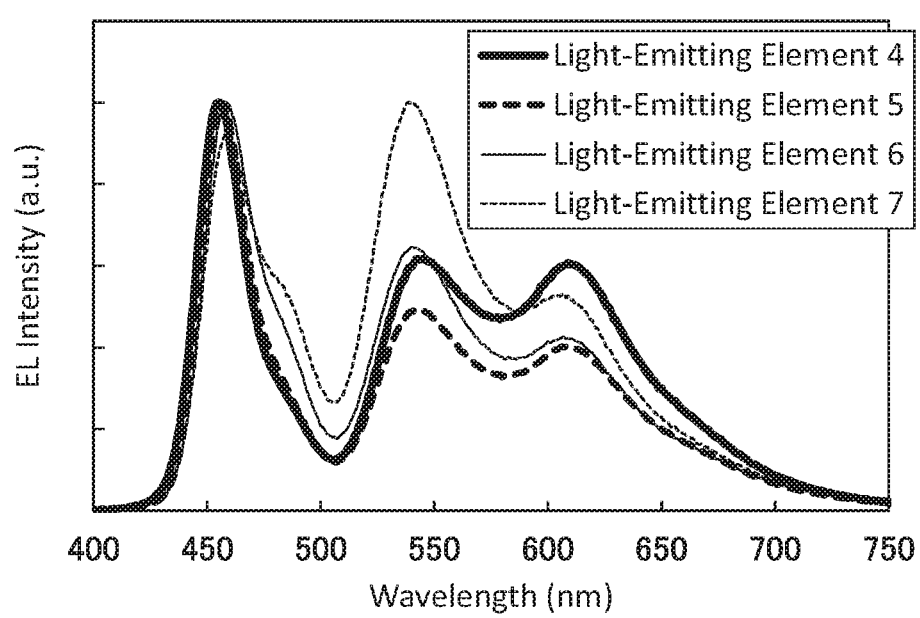
FIG. 52 is a graph showing electroluminescence spectra of light-emitting elements in Example.

FIGS. 51 and 52 show electroluminescence spectra (EL spectra) when a current at a current density of 2.5 mA/cm$^2$ was supplied to the light-emitting elements 1 to 7. For measuring the electroluminescence spectrum, a multi-channel spectrometer (PMA-11 produced by Hamamatsu Photonics K.K.) was used. Note that in FIGS. 51 and 52, the vertical axis represents the emission intensity (EL intensity) normalized by the maximum values of the electroluminescence spectra.

Tables 5 and 6 show element characteristics of the light-emitting elements 1 to 7 at around 1000 cd/m$^2$.

TABLE 5

|  | Voltage (V) | Current density (mA/cm$^2$) | CIR chromaticity (x, y) | Luminance (cd/m$^2$) | Current efficiency (cd/A) |
|---|---|---|---|---|---|
| Light-emitting element 1 | 6.8 | 5.72 | (0.670, 0.323) | 980 | 17 |
| Light-emitting element 2 | 6.0 | 1.17 | (0.278, 0.688) | 820 | 70 |
| Light-emitting element 3 | 7.6 | 15.6 | (0.148, 0.078) | 930 | 6.0 |

TABLE 6

|  | Voltage (V) | Current density (mA/cm$^2$) | CIR chromaticity (x, y) | Luminance (cd/m$^2$) | Current efficiency (cd/A) |
|---|---|---|---|---|---|
| Light-emitting element 4 | 6.0 | 1.33 | (0.350, 0.332) | 820 | 62 |
| Light-emitting element 5 | 6.2 | 2.05 | (0.316, 0.312) | 1200 | 58 |
| Light-emitting element 6 | 6.0 | 1.34 | (0.316, 0.345) | 810 | 60 |
| Light-emitting element 7 | 6.0 | 1.35 | (0.327, 0.403) | 930 | 69 |

As shown in FIG. 51, the light-emitting element 1 has a peak wavelength of the electroluminescence spectrum of 615 nm and emits red light, the light-emitting element 2 has a peak wavelength of 538 nm and emits green light, and the light-emitting element 3 has a peak wavelength of 457 nm and emits blue light. In addition, in the light-emitting elements 1, 2, and 3, the full widths at half maximum of the electroluminescence spectra are 34 nm, 31 nm, and 20 nm, respectively. Each light-emitting element enabled light to be emitted with high color purity.

As shown in FIG. 52, each of the light-emitting elements 4 to 7 has peaks in the red wavelength range, the green wavelength range, and the blue wavelength range in the electroluminescence spectrum, and emits white light.

Each of the light-emitting layers 644 and 646, the hole-transport layers 632 and 637, the electron-transport layers 633 and 638, the electron-injection layers 634 and 639, and the charge-generation layer 635, and the electrode 641 has the same structure between the light-emitting elements 1 to 7. Furthermore, each of the light-emitting elements 1 to 3 where the electrode 642 includes the conductive film having functions of reflecting light and transmitting light has a microcavity structure. Each of the light-emitting elements 4 to 7 where the electrode 642 includes the conductive film having a function of transmitting light has no microcavity structure. It is found that a color of light emitted from the light-emitting element to the outside can be changed when the structures of the electrode 642 and the hole-injection layer 631 in the light-emitting element are just changed.

As shown in FIG. 45 to FIG. 50, Table 5, and Table 6, the light-emitting elements 1 to 3 emitting red light, green light, and blue light, respectively, have high current efficiency, and the light-emitting elements 4 to 7 emitting white light have high current efficiency. Thus, each structure of the light-emitting elements can be suitably used for the light-emitting device.

<Estimation of Power Consumption of Light-Emitting Device>

Next, the power consumption of the light-emitting device including the above light-emitting element was estimated.

A light-emitting device 1 includes the light-emitting element 1, the light-emitting element 2, and the light-emitting element 3. A light-emitting device 2 includes the light-emitting element 1, the light-emitting element 2, the light-emitting element 3, and the light-emitting element 4. A light-emitting device 3 includes the light-emitting element 1, the light-emitting element 2, the light-emitting element 3, and the light-emitting element 5. A light-emitting device 4 includes the light-emitting element 1, the light-emitting element 2, the light-emitting element 3, and the light-emitting element 6. A light-emitting device 5 includes the light-emitting element 1, the light-emitting element 2, the light-emitting element 3, and the light-emitting element 7. The structure of the light-emitting device is shown in Table 7.

TABLE 7

|  | Subpixel 1 | Subpixel 2 | Subpixel 3 | Subpixel 4 |
|---|---|---|---|---|
| Light-emitting device 1 | Light-emitting element 1 | Light-emitting element 2 | Light-emitting element 3 | — |
| Light-emitting device 2 | Light-emitting element 1 | Light-emitting element 2 | Light-emitting element 3 | Light-emitting element 4 |
| Light-emitting device 3 | Light-emitting element 1 | Light-emitting element 2 | Light-emitting element 3 | Light-emitting element 5 |
| Light-emitting device 4 | Light-emitting element 1 | Light-emitting element 2 | Light-emitting element 3 | Light-emitting element 6 |
| Light-emitting device 5 | Light-emitting element 1 | Light-emitting element 2 | Light-emitting element 3 | Light-emitting element 7 |

In this example, the power consumption of the light-emitting devices was estimated on the assumption that the display region of the light-emitting device had an aspect ratio of 16:9, a diagonal of 4.3 inches, and an area of 50.97 cm$^2$, and the aperture ratio was 35%. Table 8 shows characteristics of the light-emitting elements and the light-emitting devices with the above specifications in the case where the entire surface of the display region displayed white (chromaticity coordinates (x,y)=(0.313,0.329)) with a color temperature of 6500 K at 300 cd/m$^2$.

White color (chromaticity coordinates (x,y)=(0.313, 0.329)) with a color temperature of 6500 K was able to be displayed at 300 cd/m$^2$ on the entire display region in the light-emitting device 3 having the above specifications when luminance of the light-emitting element 1 was 71 cd/m$^2$, luminance of the light-emitting element 2 was 429 cd/m$^2$, luminance of the light-emitting element 3 was 0 cd/m$^2$, and luminance of the light-emitting element 5 was 2929 cd/m$^2$.

TABLE 8

| | | Voltage (V) | Current density (mA/cm$^2$) | CIR chromaticity (x, y) | Luminance (cd/m$^2$) | Current efficiency (cd/A) | Power consumption (mW) |
|---|---|---|---|---|---|---|---|
| Light-emitting device 1 | Light-emitting element 1 | 6.5 | 3.6 | (0.670, 0.323) | 603 | 16.6 | 141 |
| | Light-emitting element 2 | 6.3 | 2.4 | (0.277, 0.690) | 1689 | 71.6 | 89 |
| | Light-emitting element 3 | 6.7 | 4.7 | (0.148, 0.080) | 280 | 5.91 | 187 |
| Light-emitting device 2 | Light-emitting element 1 | 0.0 | 0.0 | (0.674, 0.321) | 0 | — | 0 |
| | Light-emitting element 2 | 5.8 | 0.8 | (0.278, 0.689) | 573 | 69.6 | 21 |
| | Light-emitting element 3 | 6.1 | 1.6 | (0.149, 0.083) | 95 | 5.79 | 44 |
| | Light-emitting element 4 | 6.6 | 4.5 | (0.339, 0.327) | 2761 | 61.9 | 132 |
| Light-emitting device 3 | Light-emitting element 1 | 5.5 | 0.3 | (0.674, 0.321) | 71 | 20.2 | 9 |
| | Light-emitting element 2 | 5.7 | 0.6 | (0.278, 0.689) | 429 | 68.7 | 16 |
| | Light-emitting element 3 | 0.0 | 0.0 | (0.149, 0.085) | 0 | — | 0 |
| | Light-emitting element 5 | 6.7 | 5.0 | (0.307, 0.306) | 2929 | 58.0 | 151 |
| Light-emitting device 4 | Light-emitting element 1 | 5.7 | 0.7 | (0.671, 0.323) | 127 | 19.5 | 17 |
| | Light-emitting element 2 | 0.0 | 0.0 | (0.278, 0.689) | 0 | — | 0 |
| | Light-emitting element 3 | 5.6 | 0.5 | (0.149, 0.085) | 28 | 5.5 | 13 |
| | Light-emitting element 6 | 6.8 | 5.4 | (0.304, 0.338) | 3274 | 60.7 | 162 |
| Light-emitting device 5 | Light-emitting element 1 | 6.1 | 1.5 | (0.670, 0.324) | 284 | 18.5 | 41 |
| | Light-emitting element 2 | 0.0 | 0.0 | (0.278, 0.689) | 0 | — | 0 |
| | Light-emitting element 3 | 6.4 | 2.9 | (0.149, 0.082) | 173 | 5.9 | 84 |
| | Light-emitting element 7 | 6.6 | 4.3 | (0.317, 0.399) | 2972 | 69.4 | 126 |

As shown in Table 8, white color (chromaticity coordinates (x,y)=(0.313,0.329)) with a color temperature of 6500 K was able to be displayed at 300 cd/m$^2$ on the entire display region in the light-emitting device 1 having the above specifications when luminance of the light-emitting element 1 was 603 cd/m$^2$, luminance of the light-emitting element 2 was 1689 cd/m$^2$, and luminance of the light-emitting element 3 was 280 cd/m$^2$. At this time, power consumption of the light-emitting device 1 was able to be estimated to be 417 mW.

White color (chromaticity coordinates (x,y)=(0.313, 0.329)) with a color temperature of 6500 K was able to be displayed at 300 cd/m$^2$ on the entire display region in the light-emitting device 2 having the above specifications when luminance of the light-emitting element 1 was 0 cd/m$^2$, luminance of the light-emitting element 2 was 573 cd/m$^2$, luminance of the light-emitting element 3 was 95 cd/m$^2$, and luminance of the light-emitting element 4 was 2761 cd/m$^2$. At this time, power consumption of the light-emitting device 2 was able to be estimated to be 198 mW.

At this time, power consumption of the light-emitting device 3 was able to be estimated to be 176 mW.

White color (chromaticity coordinates (x,y)=(0.313, 0.329)) with a color temperature of 6500 K was able to be displayed at 300 cd/m$^2$ on the entire display region in the light-emitting device 4 having the above specifications when luminance of the light-emitting element 1 was 127 cd/m$^2$, luminance of the light-emitting element 2 was 0 cd/m$^2$, luminance of the light-emitting element 3 was 28 cd/m$^2$, and luminance of the light-emitting element 4 was 3274 cd/m$^2$. At this time, power consumption of the light-emitting device 4 was able to be estimated to be 192 mW.

White color (chromaticity coordinates (x,y)=(0.313, 0.329)) with a color temperature of 6500 K was able to be displayed at 300 cd/m$^2$ on the entire display region in the light-emitting device 5 having the above specifications when luminance of the light-emitting element 1 was 284 cd/m$^2$, luminance of the light-emitting element 2 was 0 cd/m$^2$, luminance of the light-emitting element 3 was 173 cd/m$^2$, and luminance of the light-emitting element 4 was 2792 cd/m². At this time, power consumption of the light-emitting device 5 was able to be estimated to be 251 mW.

The regions where the color gamut according to the National Television System Committee (NTSC) can be displayed in the light-emitting devices 1 to 5 were each estimated to be 96% by an area ratio (NTSC ratio) of the CIE 1976 chromaticity coordinates, which indicates that the light-emitting devices 1 to 5 have high color reproducibility.

Through the above, it is found that the light-emitting devices 2 to 5 consume lower power than that in the light-emitting device 1. In particular, the power consumed by each of the light-emitting devices 2 to 4 is lower than or equal to half of the power consumed by the light-emitting device 1. In other words, when a light-emitting device includes red, green, and blue light-emitting elements with microcavity structures and a white light-emitting element without a microcavity structure, the light-emitting device has low power consumption.

As described above, according to one embodiment of the present invention, a light-emitting device with low power consumption can be provided. Furthermore, according to one embodiment of the present invention, a light-emitting device with low power consumption and high color reproducibility can be provided.

The structures described in this example can be used in an appropriate combination with any of the other embodiments.

This application is based on Japanese Patent Application serial no. 2016-011518 filed with Japan Patent Office on Jan. 25, 2016, and Japanese Patent Application serial no. 2016-015550 filed with Japan Patent Office on Jan. 29, 2016, the entire contents of which are hereby incorporated by reference.

What is claimed is:

1. A light-emitting device comprising:
a plurality of light-emitting elements overlapping with a plurality of optical elements;
a light-emitting element not overlapping with an optical element;
a plurality of transistors electrically connected to the plurality of light-emitting elements;
a glass substrate below the plurality of transistors;
a first conductive layer over the glass substrate;
a first insulating layer over the first conductive layer;
an oxide semiconductor layer comprising In, Ga, and Zn over the first insulating layer;
a second conductive layer over and in contact with the oxide semiconductor layer;
a second insulating layer over the second conductive layer and below one of the plurality of optical elements;
a first transparent conductive layer over and electrically connected to the second conductive layer;
a light-emitting layer over the first transparent conductive layer;
a third conductive layer over the light-emitting layer;
a third insulating layer;
a fourth insulating layer;
a partition; and
a fourth conductive layer,
wherein the plurality of transistors are provided below the plurality of optical elements,
wherein the one of the plurality of optical elements comprises a curved surface,
wherein a portion of the oxide semiconductor layer is configured to function as a channel of any one of the plurality of transistors,
wherein the first transparent conductive layer is over the one of the plurality of optical elements with the third insulating layer provided therebetween,
wherein, in a cross-sectional view, the one of the plurality of optical elements does not overlap with the portion of the oxide semiconductor layer,
wherein light from the plurality of light-emitting elements is emitted towards the plurality of transistors,
wherein the plurality of optical elements are color filters,
wherein the fourth insulating layer is provided over the fourth conductive layer and below the one of the plurality of optical elements,
wherein the fourth conductive layer is provided over the second insulating layer,
wherein the fourth conductive layer overlaps with the first conductive layer with the oxide semiconductor layer provided therebetween, and
wherein, in the cross-sectional view, the partition is provided over the first transparent conductive layer and overlaps the oxide semiconductor layer, the first conductive layer, the second conductive layer, an end portion of the first transparent conductive layer, and a top surface and the curved surface of the one of the plurality of optical elements.

2. The light-emitting device according to claim 1,
wherein one of the plurality of light-emitting elements emits blue light,
wherein another of the plurality of light-emitting elements emits green light, and
wherein the light-emitting element not overlapping with an optical element emits white light.

3. The light-emitting device according to claim 1,
wherein the plurality of light-emitting elements and the light-emitting element not overlapping with an optical element share the light-emitting layer, and
wherein an exciplex is formed in the light-emitting layer.

4. The light-emitting device according to claim 1,
wherein a bottom surface of the third insulating layer is provided below a top surface of the second insulating layer, and
wherein a bottom surface of the oxide semiconductor layer is provided below a top surface of the first conductive layer.

5. A light-emitting device comprising:
a first light-emitting element overlapping with a first optical element;
a second light-emitting element overlapping with a second optical element;
a third light-emitting element overlapping with a third optical element;
a fourth light-emitting element not overlapping with an optical element;
a first transistor electrically connected to the first light-emitting element;
a second transistor electrically connected to the second light-emitting element;
a third transistor electrically connected to the third light-emitting element;
a fourth transistor electrically connected to the fourth light-emitting element;
a glass substrate below the first to fourth transistors;
a first conductive layer over the glass substrate;
a first insulating layer over the first conductive layer;
an oxide semiconductor layer comprising In, Ga, and Zn over the first insulating layer;
a second conductive layer over and in contact with the oxide semiconductor layer;

a second insulating layer over the second conductive layer and below the first optical element;
a first transparent conductive layer over and electrically connected to the second conductive layer;
a light-emitting layer over the first transparent conductive layer;
a third conductive layer over the light-emitting layer;
a third insulating layer;
a fourth insulating layer;
a partition; and
a fourth conductive layer,
wherein the first to fourth transistors are provided below the first to third optical elements,
wherein the first optical element comprises a curved surface,
wherein a portion of the oxide semiconductor layer is configured to function as a channel of the first transistor,
wherein the first transparent conductive layer is over the first optical element with the third insulating layer provided therebetween,
wherein, in a cross-sectional view, the first transparent conductive layer comprises a region not overlapping with the first optical element,
wherein light from the first to fourth light-emitting elements is emitted towards the first to fourth transistors,
wherein each of the first to third optical elements is a color filter,
wherein the fourth insulating layer is provided over the fourth conductive layer and below the first optical element,
wherein the fourth conductive layer is provided over the second insulating layer,
wherein the fourth conductive layer overlaps with the first conductive layer with the oxide semiconductor layer provided therebetween, and
wherein, in the cross-sectional view, the partition is provided over the first transparent conductive layer and overlaps the oxide semiconductor layer, the first conductive layer, the second conductive layer, an end portion of the first transparent conductive layer, and a top surface and the curved surface of the first optical element.

6. The light-emitting device according to claim 5,
wherein the first light-emitting element emits blue light,
wherein the second light-emitting element emits red light,
wherein the third light-emitting element emits green light, and
wherein the fourth light-emitting element emits white light.

7. The light-emitting device according to claim 5, wherein the light-emitting layer is shared by the first to fourth light-emitting elements.

8. The light-emitting device according to claim 5,
wherein a bottom surface of the third insulating layer is provided below a top surface of the second insulating layer, and
wherein a bottom surface of the oxide semiconductor layer is provided below a top surface of the first conductive layer.

9. A light-emitting device comprising:
a first light-emitting element overlapping with a first optical element;
a second light-emitting element overlapping with a second optical element;
a third light-emitting element overlapping with a third optical element;
a fourth light-emitting element not overlapping with an optical element;
a first transistor electrically connected to the first light-emitting element;
a second transistor electrically connected to the second light-emitting element;
a third transistor electrically connected to the third light-emitting element;
a fourth transistor electrically connected to the fourth light-emitting element;
a glass substrate below the first to fourth transistors;
a first conductive layer over the glass substrate;
a first insulating layer over the first conductive layer;
an oxide semiconductor layer comprising In, Ga, and Zn over the first insulating layer;
a second conductive layer over and in contact with the oxide semiconductor layer;
a second insulating layer over the second conductive layer and below the first optical element;
a first transparent conductive layer over and electrically connected to the second conductive layer;
a light-emitting layer over the first transparent conductive layer;
a third conductive layer over the light-emitting layer;
a third insulating layer;
a fourth insulating layer;
a partition; and
a fourth conductive layer,
wherein the first to third optical elements are provided between the first to fourth transistors and the first to fourth light-emitting elements,
wherein the first optical element comprises a curved surface,
wherein a portion of the oxide semiconductor layer is configured to function as a channel of the first transistor,
wherein the first transparent conductive layer is over the first optical element with the third insulating layer provided therebetween,
wherein light from the first to fourth light-emitting elements is emitted towards the first to fourth transistors,
wherein each of the first to third optical elements is a color filter,
wherein the fourth insulating layer is provided over the fourth conductive layer and below the first optical element,
wherein the fourth conductive layer is provided over the second insulating layer,
wherein the fourth conductive layer overlaps with the first conductive layer with the oxide semiconductor layer provided therebetween, and
wherein, in a cross-sectional view, the partition is provided over the first transparent conductive layer and overlaps the oxide semiconductor layer, the first conductive layer, the second conductive layer, an end portion of the first transparent conductive layer, and a top surface and the curved surface of the first optical element.

10. The light-emitting device according to claim 9,
wherein the first light-emitting element emits blue light,
wherein the second light-emitting element emits red light,
wherein the third light-emitting element emits green light, and
wherein the fourth light-emitting element emits white light.

11. The light-emitting device according to claim 9, wherein the light-emitting layer is shared by the first to fourth light-emitting elements.

12. The light-emitting device according to claim 9,
wherein the first to fourth light-emitting elements share the light-emitting layer, and
wherein an exciplex is formed in the light-emitting layer.

13. The light-emitting device according to claim 9,
wherein a bottom surface of the third insulating layer is provided below a top surface of the second insulating layer, and
wherein a bottom surface of the oxide semiconductor layer is provided below a top surface of the first conductive layer.

* * * * *